United States Patent [19]
Murai et al.

[11] Patent Number: 5,404,338
[45] Date of Patent: Apr. 4, 1995

[54] SYNCHRONOUS TYPE SEMICONDUCTOR MEMORY DEVICE OPERATING IN SYNCHRONIZATION WITH AN EXTERNAL CLOCK SIGNAL

[75] Inventors: Yasumitsu Murai; Hisashi Iwamoto; Yasuhiro Konishi; Naoya Watanabe; Seiji Sawada, all of Hyogo, Japan

[73] Assignees: Mitsubishi Denki Kabushiki Kaisha; Mitsubishi Electric Engineering Co., Ltd., Tokyo, Japan

[21] Appl. No.: 189,247

[22] Filed: Jan. 31, 1994

[30] Foreign Application Priority Data

Jan. 29, 1993 [JP] Japan ................................ 5-094810
Nov. 26, 1993 [JP] Japan ................................ 5-296339

[51] Int. Cl.[6] .......................................... G11C 13/00
[52] U.S. Cl. ................................. 365/233; 365/203; 365/210
[58] Field of Search ................ 365/233, 203, 210, 219

[56] References Cited

U.S. PATENT DOCUMENTS

3,691,538  4/1972  Haney et al. .................... 365/219
4,106,109  8/1978  Fassbender .
5,083,296  1/1992  Hara et al. .

OTHER PUBLICATIONS

ISSCC 92 Session 9/Non–Volatile and Dynamic RAMs/Paper 9.1, 1992 IEEE International Solid-State Circuits Conference.
A 100-MHZ 4-MB Cache DRAM with Fast Copy-Back Scheme, Katsumi Dosaka et al., IEEE Journal of Solid–State Circuits, vol. 27, No. 11, Nov. 1992, pp. 1534–1539.

*Primary Examiner*—Terrell W. Fears
*Attorney, Agent, or Firm*—Lowe, Price, LeBlanc & Becker

[57] ABSTRACT

In a synchronous semiconductor memory device, memory arrays (MA) forming activation units each are divided into a plurality of small memory arrays (MK). There are provided local I/O line pairs (LIO) each for two small memory arrays. The global I/O line pairs (GIO) crossing word lines are arranged in word line shunt regions (WS). The connection switches (BS) are arranged in the crossing between the local I/O line pairs and global I/O line pairs. Each small memory array in the activated memory array is connected to the corresponding global I/O line pair through the local I/O line pair. Thereby, a plurality of bits can be simultaneously read without increasing an area occupied by interconnections. The control of connection switch is made using a sense amplifier activation signal. Global I/O lines are precharged/equalized after data are transferred to read data registers provided for data output terminal for sequential data output or into selected memory cells. External clock signal is frequency-divided to produce phase-shifted internal clock signals which are used for producing internal voltage through charge operation.

71 Claims, 122 Drawing Sheets

FIG.1
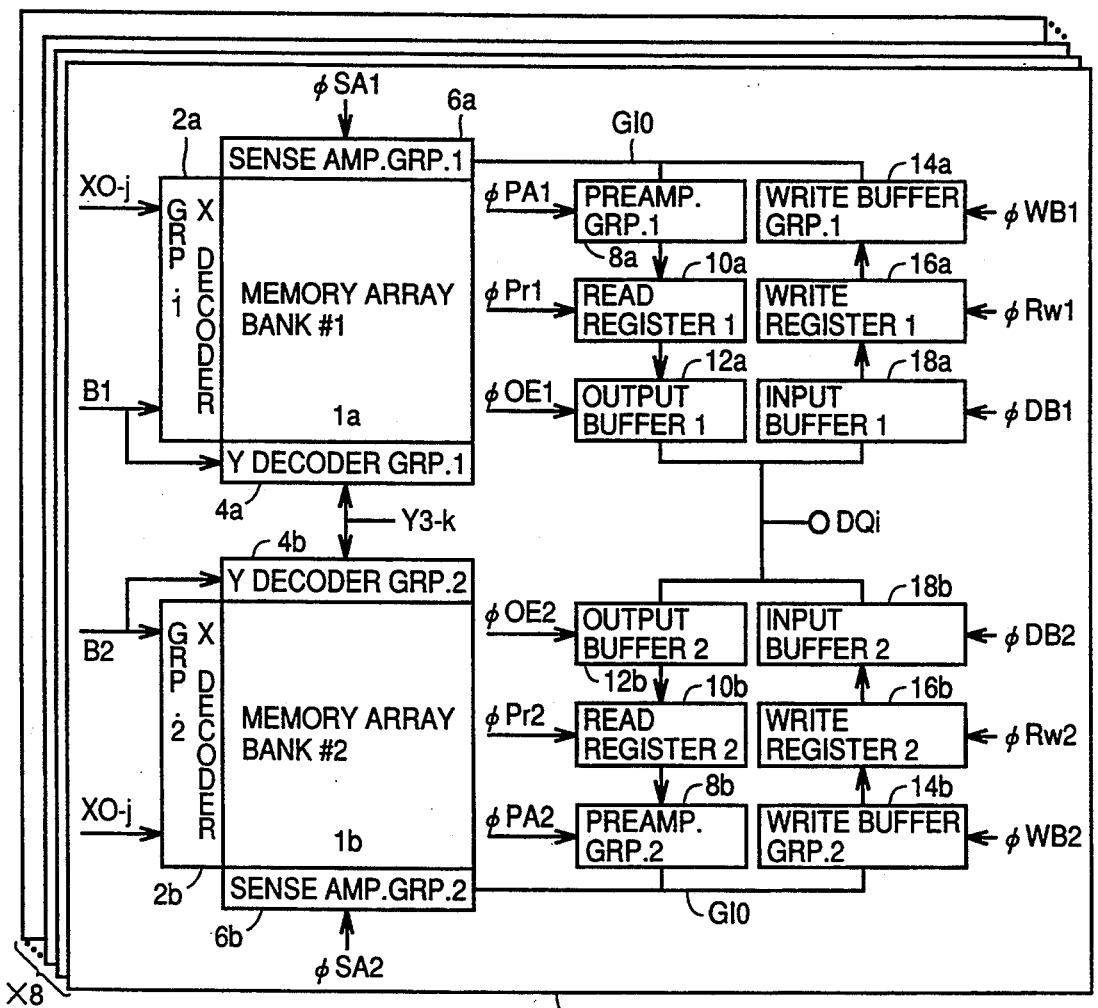
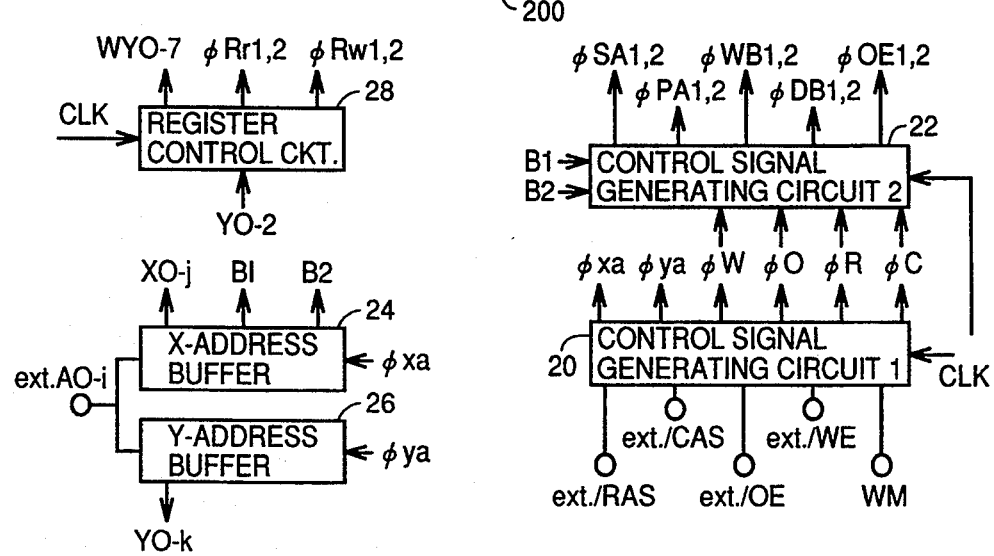

FREQUENCY - LATENCY

| SET ADDRESS | | MAX. FREQ. | tRAC | tCAC | tRP | tRCD min. |
|---|---|---|---|---|---|---|
| A5 | A4 | | | | | |
| 0 | 0 | 100 MHz | 6 | 4 | 4 | 2 |
| 0 | 1 | 66 MHz | 4 | 3 | 3 | 1 |
| 1 | 0 | 50 MHz | 3 | 2 | 2 | 1 |

WRAP LENGTH

| A2 | A1 | A0 | LENGTH |
|----|----|----|--------|
| 0 | 0 | 0 | 4 |
| 0 | 0 | 1 | 8 |
| 0 | 1 | 0 | 16 |
| 0 | 1 | 1 | 32 |
| 1 | 1 | 1 | FULL PAGE |

FIG.39

| FUNCTION | /CS | /RAS | /CAS | /WE | DQM |
|---|---|---|---|---|---|
| ROW ADDRESS STROBE AND ARRAY ACTIVATION | L | L | H | H | — |
| COLUMN ADDRESS STROBE AND READ | L | H | L | H | — |
| COLUMN ADDRESS STROBE AND WRITE | L | H | L | L | — |
| TERMINATION OF PRECHARGE/SELF-REFRESH | L | L | H | L | — |
| START OF PRECHARGE/SELF-REFRESH | L | L | L | H | — |
| SET MODE REGISTER | L | L | L | L | — |
| WRITE ENABLE AND OUTPUT ENABLE | — | — | — | — | L |
| WRITE MASK AND OUTPUT DISABLE | — | — | — | — | H |
| NO CHANGE OF OPERATION | L | H | H | H | — |
| IGNORE /RAS, /CAS, /WE | H | X | X | X | — |

FIG.61

| WRAP SEQUENCE ( WRAP LENGTH = 8 ) ||| ||
|---|---|---|---|---|
| INITIAL INPUT ADDRESS ||| OUTPUT ADDRESS SEQUENCE ||
| A2 | A1 | A0 | SEQUENTIAL | INTERLEAVE |
| 0 | 0 | 0 | 0,1,2,3,4,5,6,7 | 0,1,2,3,4,5,6,7 |
| 0 | 0 | 1 | 1,2,3,4,5,6,7,0 | 1,0,3,2,5,4,7,6 |
| 0 | 1 | 0 | 2,3,4,5,6,7,0,1 | 2,3,0,1,6,7,4,5 |
| 0 | 1 | 1 | 3,4,5,6,7,0,1,2 | 3,2,1,0,7,6,5,4 |
| 1 | 0 | 0 | 4,5,6,7,0,1,2,3 | 4,5,6,7,0,1,2,3 |
| 1 | 0 | 1 | 5,6,7,0,1,2,3,4 | 5,4,7,6,1,0,3,2 |
| 1 | 1 | 0 | 6,7,0,1,2,3,4,5 | 6,7,4,5,2,3,0,1 |
| 1 | 1 | 1 | 7,0,1,2,3,4,5,6 | 7,6,5,4,3,2,1,0 |

A6 = 0 → SEQUENTIAL
A6 = 1 → INTERLEAVE

LATENCY : 3

LATENCY = 1

LATENCY 1a OF 2 OR MORE

F I G. 1 1 0
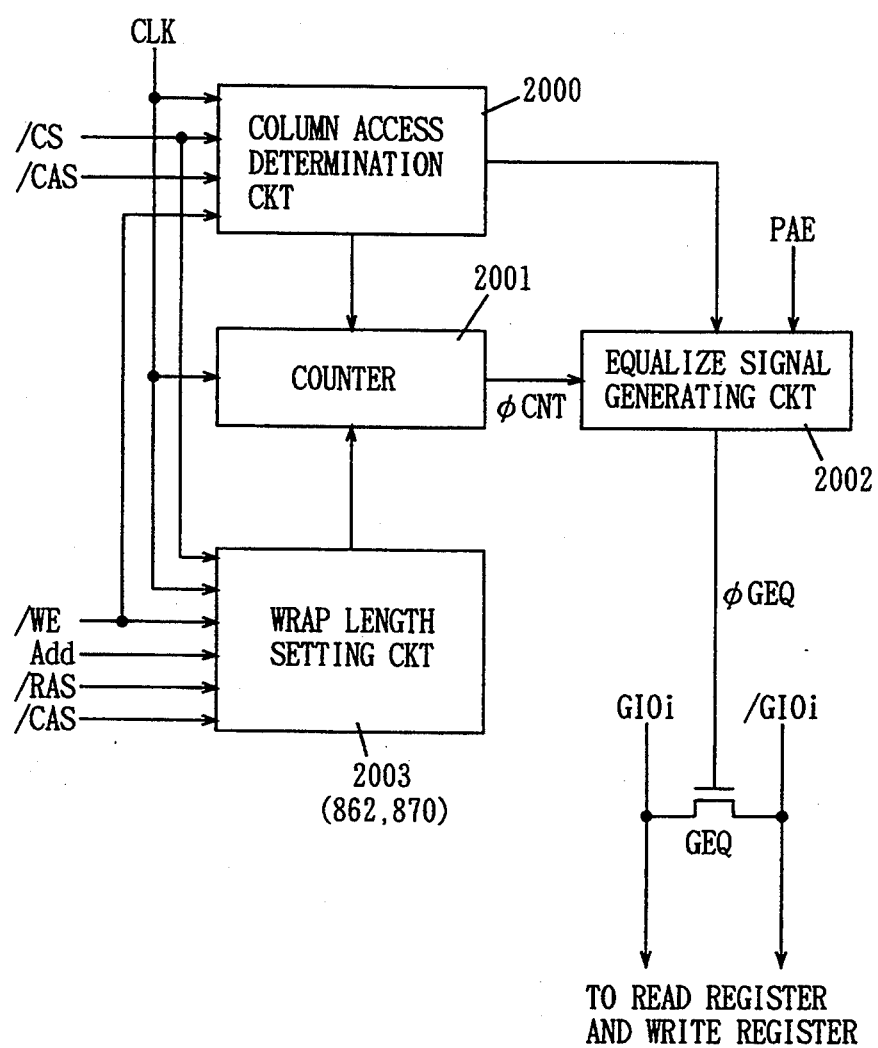

COLUMN SELECTION START INSTRUCTION (WRITE COMMAND)

(REFER TO FIGS. 100~107)

SYNCHRONOUS TYPE SEMICONDUCTOR MEMORY DEVICE OPERATING IN SYNCHRONIZATION WITH AN EXTERNAL CLOCK SIGNAL

BACKGROUND OF THE INVENTION

1. Field of the Invention

The present invention relates to a semiconductor memory device, and in particular relates to a synchronous type semiconductor memory device which takes in external signals in synchronization with a clock signal which is externally and periodically fed thereto. More particularly, the invention relates to a random accessible synchronous semiconductor memory device (SDRAM).

2. Description of the Related Art

In recent years, microprocessing units (MPUs) have been improved to achieve a higher operation speed. Meanwhile, an operation speed of dynamic random access memories (will be referred to as "DRAMs" hereinafter), which have been used as a main storage, cannot yet follow the operation speed of the MPUs, although the DRAMs have also been improved to achieve a higher speed. Therefore, an access time and a cycle time of the DRAMs may form bottleneck reducing an overall performance of a system in many cases.

A high-speed memory, i.e., a so-called cache memory formed of a high-speed static random access memory (will be referred to as an "SRAM" hereinafter) has often been used in a position between a DRAM and an MPU in order to improve the performance of the system. Data which will be frequently used is stored in the cache memory, and the high-speed cache memory is accessed if data required by the MPU is stored in the cache memory. The DRAM is accessed only when the cache memory does not contain the data required by the MPU. Since the data to be used frequently is stored in the high-speed cache memory, a frequency of access to the DRAM is significantly reduced, so that the performance of the system cannot be affected by the access time and cycle time of the DRAM and thus can be improved.

Since SRAMs are more expensive than DRAMs, the cache memories are not suitable to relatively inexpensive apparatuses such as personal computers. Therefore, it has been desired to improve the system performance with inexpensive DRAMs.

Mere synchronization of the MPU and DRAM can be achieved by applying a system clock to the DRAM to operate the same in synchronization with the system clock. A configuration for synchronizing the DRAM with the system clock is disclosed in the U.S. Pat. No. 5,083,296 to Hara.

The DRAM disclosed in Hara latches a chip select signal /CS and a write enable signal /WE in synchronization with a clock signal CLK. If the latched chip select signal /CS is active and thus indicates that the DRAM is selected, an internal RAS signal and an internal CAS signal are generated in synchronization with the clock signal. In response to the internal RAS signal and internal CAS signal, address signals are latched, and an internal row address signal and an internal column address signal are produced. Input and output of data are also performed in synchronization with the clock signal CLK.

In Hara, the DRAM performs the clock synchronous operation in order to overcome a problem such as deviation of timing which may be caused during operations based on control signals such as a row address strobe signal RAS and a column address strobe signal CAS.

The DRAM of Hara described above is intended merely to perform the clock synchronous operation of the DRAM. The address signal is latched by the internal RAS signal and internal CAS signal generated in synchronization with the clock signal CLK. If a speed of the clock signal is relatively low, or the address signal has a sufficient margin in setup time and a hold time, a desired internal address signal can be produced in response to the external address signal.

However, if the clock signal CLK has a high speed, or the address signal has an insufficient margin in setup time and hold time, such a situation may be caused that the internal address signal has already changed into an invalid state at the time of generation of the internal RAS signal and CAS signal. Therefore, the DRAM of Hara cannot operate in synchronization with a high-speed clock signal, and thus cannot be utilized as a high-speed main storage for a high-speed MPU.

The DRAM of Hara has an internal configuration similar to that of the conventional standard DRAM, and its distinctive feature is only provision of a latch circuit which operates only for external control signals and a data I/O part in accordance with the clock.

Meanwhile, the U.S. JEDEC (Joint Electron Device Engineering Council) has employed synchronous DRAMs (will be referred to as "SDRAMs" hereinafter) which operate in synchronization with clock signals and function as main storages for high-speed MPUs. The U.S. JEDEC is now conducting operations for standardizing specifications of the SDRAMs. The details of these standard specifications have not yet been published. According to the article in "NIKKEI ELECTRONICS", Feb. 3, 1992, page 85, following configurations were proposed.

(1) Synchronization is achieved with a clock signal having a cycle between 10 and 15 ns (nanoseconds).

(2) In a first random access, data is accessed after four to six clocks from input of a row address signal. Thereafter, the data at the consecutive addresses can be accessed at every clock.

(3) A circuit in a chip is operated in a pipelined manner, and a serial I/O buffer is provided in a data I/O part so as to reduce an access time.

The configuration described above is a mere proposal, and specific matters for practically realizing them have not been disclosed at all.

SUMMARY OF THE INVENTION

An object of the invention is to provide an SDRAM having novel configurations and achieving a high-speed operation.

Another object of the invention is to provide an SDRAM of which chip occupying area is small.

Still another object of the invention is to provide a semiconductor memory device of which chip occupying area is small.

A semiconductor memory device according to a first aspect of the invention includes a plurality of memory cell array blocks. Each array block includes a plurality of pairs of bit lines and a dummy bit line for providing a capacitance balance. The semiconductor memory device further includes a plurality of local I/O lines provided corresponding to a plurality of memory cell array blocks for supplying and receiving a data signal to and from a selected memory cell in a corresponding memory cell array block, a global I/O line commonly provided to the plurality of local I/O lines for transferring data with a local I/O line provided correspondingly to a selected memory cell array, and precharge means responsive to a precharge instructing signal for electrically connecting the dummy bit lines to corresponding local I/O lines and for supplying a predetermined precharge potential onto each local I/O line through the dummy bit line.

A semiconductor memory device of a second aspect includes a data output terminal and a plurality of data registers provided commonly to the data output terminal and receiving data in parallel from a plurality of simultaneously selected memory cells.

The semiconductor memory device further includes selection means responsive for sequentially selecting the data registers in a predetermined sequence, latch means for latching data from the data register selected by the selection means; output means for transferring data latched in the latch means to the data output terminal, and drive means for driving the latch means and the output means in a pipelined manner.

According to a third aspect, there is provided a synchronous type semiconductor memory device for taking in external signals including a control signal, an address signal and an input data in synchronization with a clock signal of a series of pulses. In the synchronous type semiconductor memory device, a memory cell array includes a plurality of memory cells arranged in rows and columns, and a predetermined plurality of memory cells are simultaneously selected in the memory cell array.

This synchronous type semiconductor memory device includes a plurality of first latch provided commonly to a data input terminal and being operable to be sequentially coupled to the data input terminal in a predetermined order, a plurality of second latches provided corresponding to the plurality of first latches for latching data latched in corresponding first latch in response to a first control signal, writing means for transferring the data latched in the second latch to the corresponding memory cell, and control means being responsive to a column selecting instruction to sequentially generate the first control signals for latching the data in the second latch after the latching of the data in the corresponding first latch.

In the semiconductor memory device according to the first aspect, the local I/O line is precharged to the predetermined potential through the dummy bit line. It is not necessary to provide a transistor to be used only for precharging the local I/O line, so that a chip area is reduced.

In the semiconductor memory device according to the second aspect, the data can be read from the registers in the pipelined manner. Thereby, the data can be read at a high speed.

In the synchronous type semiconductor memory device according to the third aspect, the first latch in a write register latches the data in the current access cycle, while the second latch can latch the data in the former cycle preceding by one access cycle the current access cycle. In the successive data write operation, writing of erroneous data can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows an overall configuration of an SDRAM of a first type to which the present invention is applied;

FIG. 39 is a table showing correlation between states of external signals and operation modes designated thereby in the SDRAM of the second type;

FIG. 61 shows an example of a sequence for generating the wrap addresses;

FIG. 110 schematically shows a structure of an equalize signal generating system;

FIG. 120 shows a modification of a second equalize signal timing controlling method during data writing;

FIG. 121 shows a structure of an equalize signal generating circuit achieving a timing control shown in FIG. 120;

FIG. 122 shows a modification of a second equalize signal timing controlling method;

FIG. 123 shows a modification of a second equalize signal timing controlling method;

FIG. 124 is a timing chart showing a third equalize signal timing controlling method during data writing;

FIG. 125 shows a circuit structure achieving a third equalize signal timing control;

FIG. 126 shows a modification of a third equalize signal timing controlling method;

FIG. 127 is a signal waveform diagram showing a method of generating an internal write mask signal;

FIG. 128 is an example of a structure of an internal write mask signal generating system shown in FIG. 127;

FIG. 129 shows an example of a structure of a dynamic latch shown in FIG. 128;

FIG. 130 is a signal waveform diagram showing an operation of a dynamic latch shown in FIG. 129;

FIG. 131 is a signal waveform diagram showing an operation of a circuit shown in FIG. 128;

Figure 108:
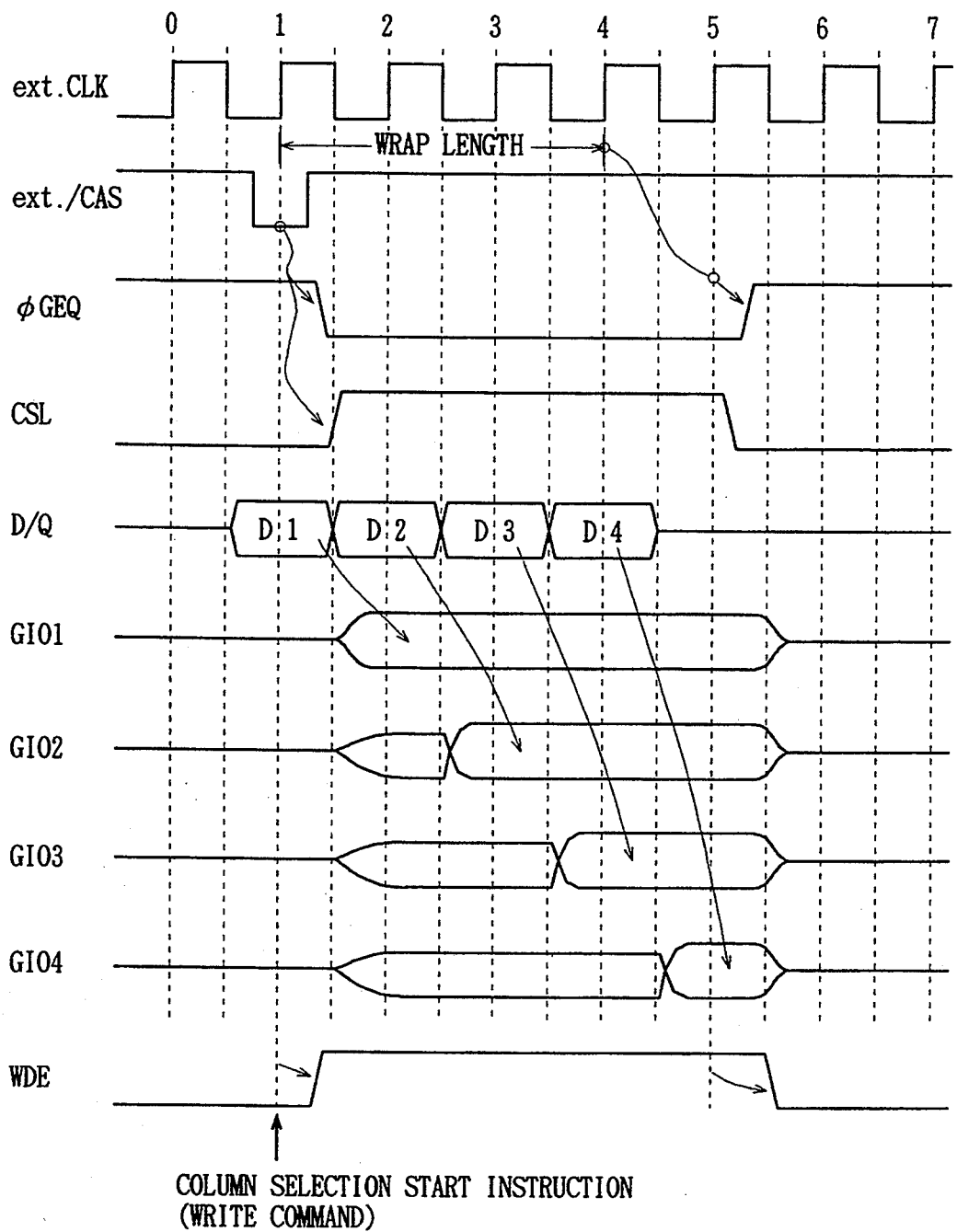
FIG. 108 is a timing chart showing a first equalize signal control timing operation.
Figure 121:
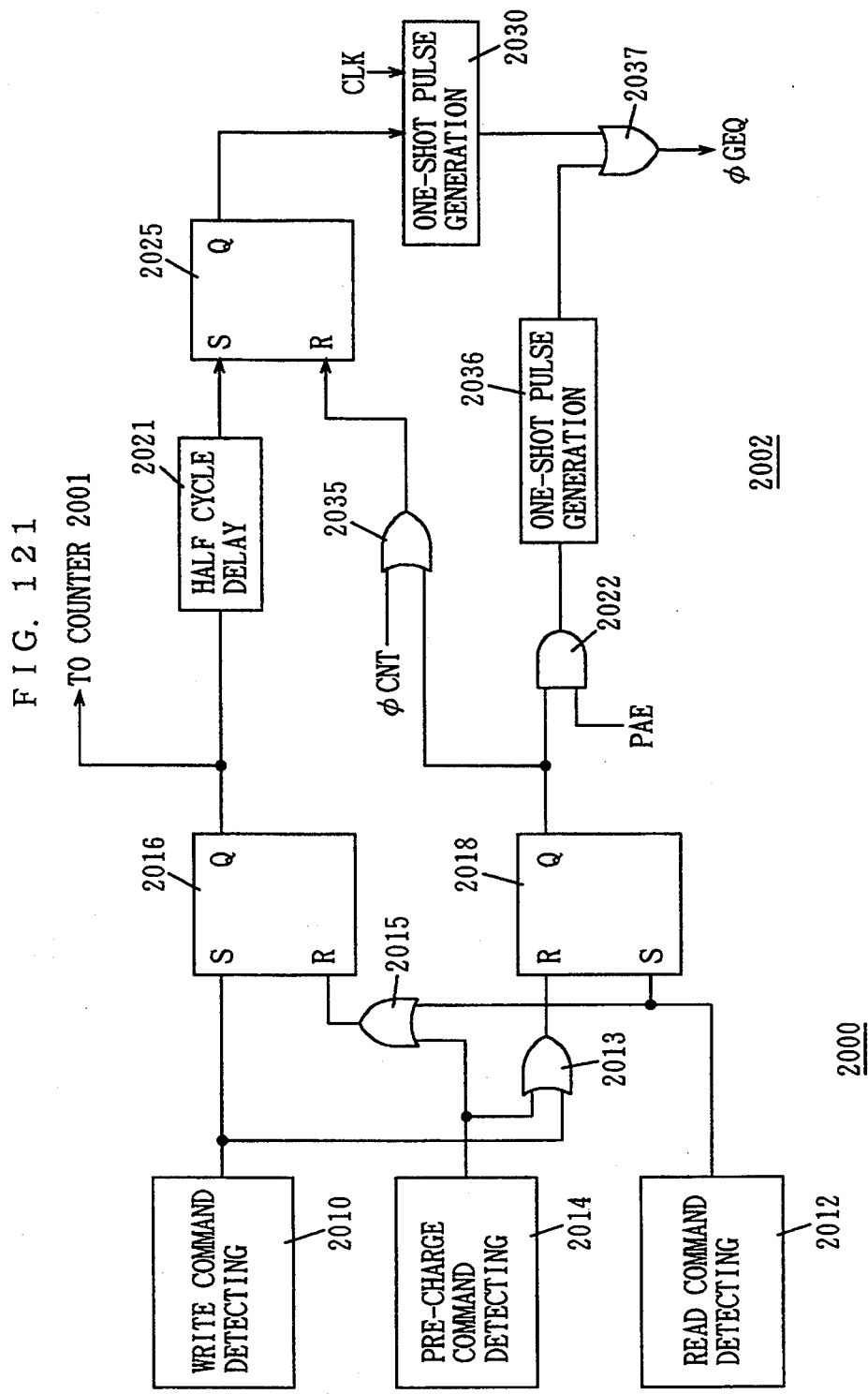
Figure 128:
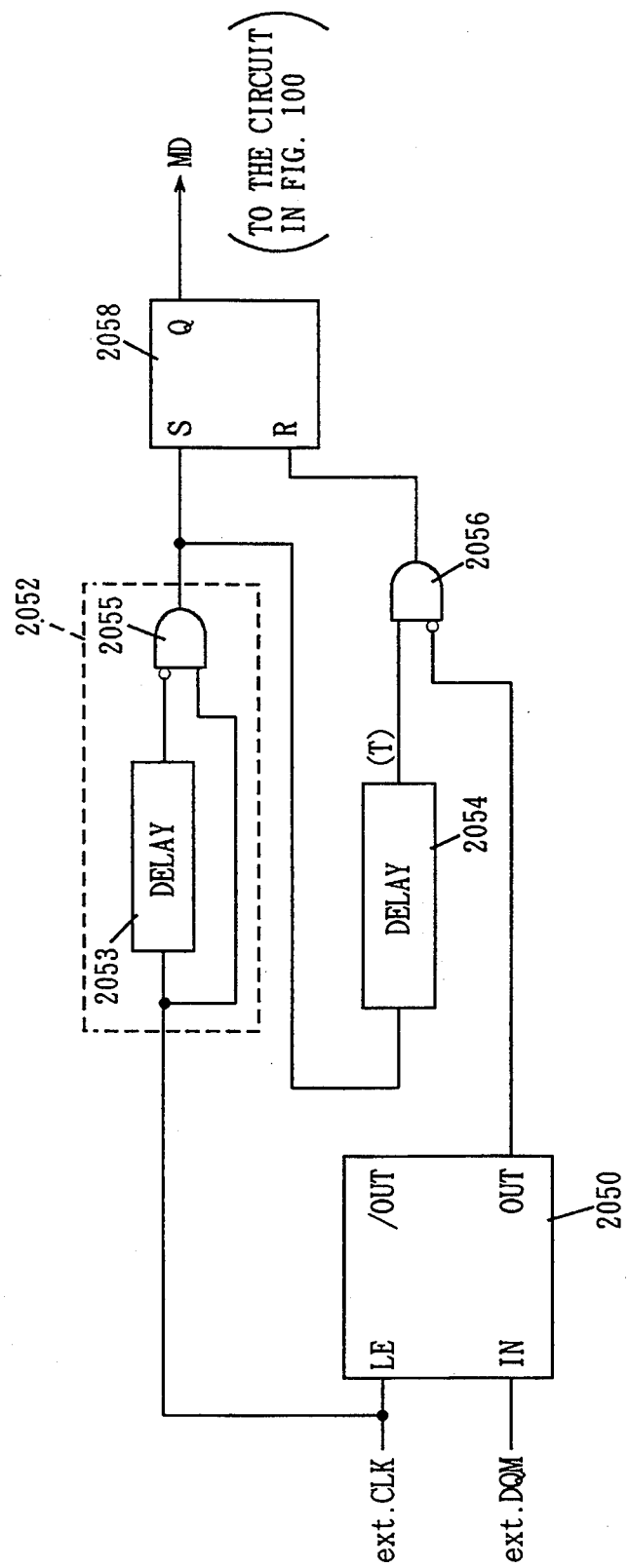
Figure 132:
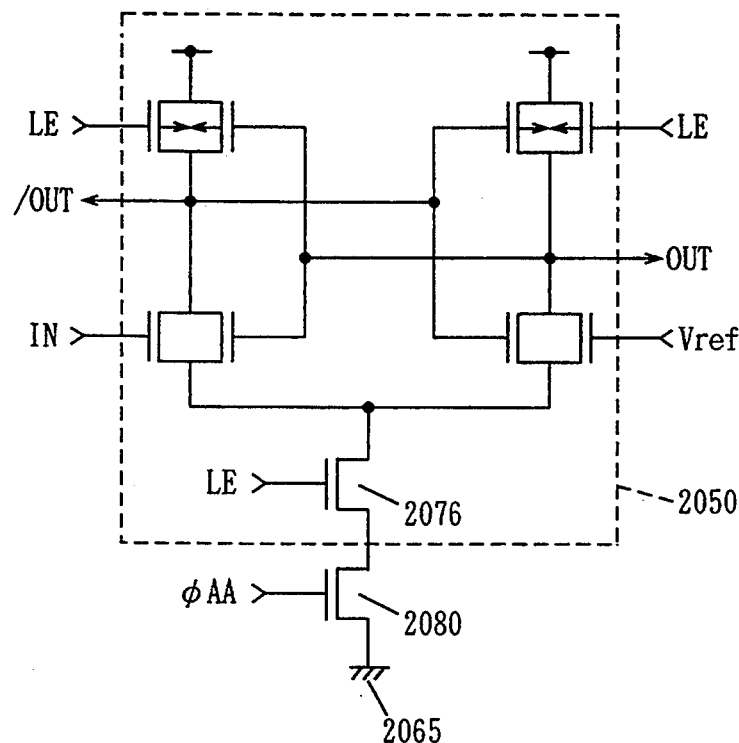
Figure 133:
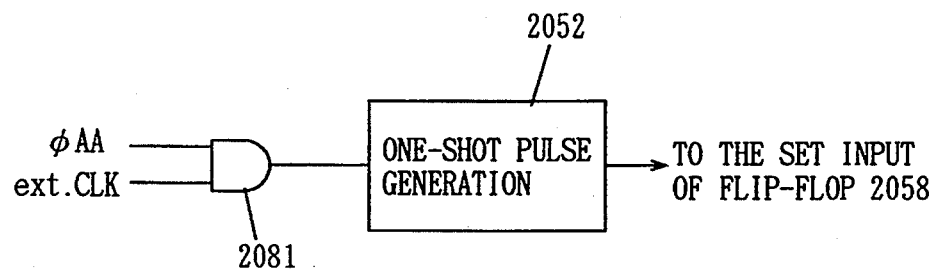
Figure 134:
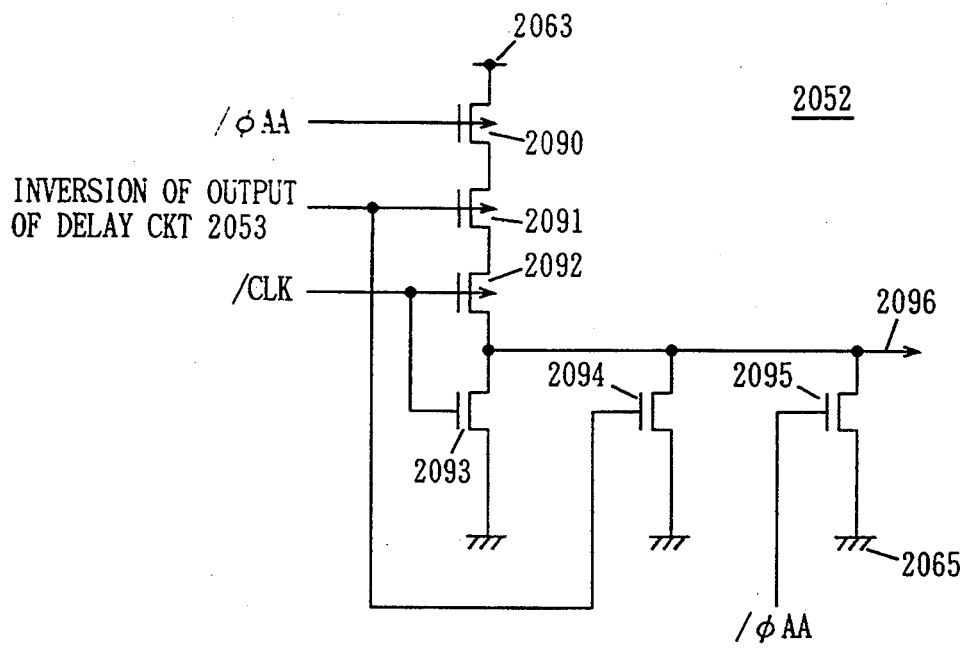
Figure 135:
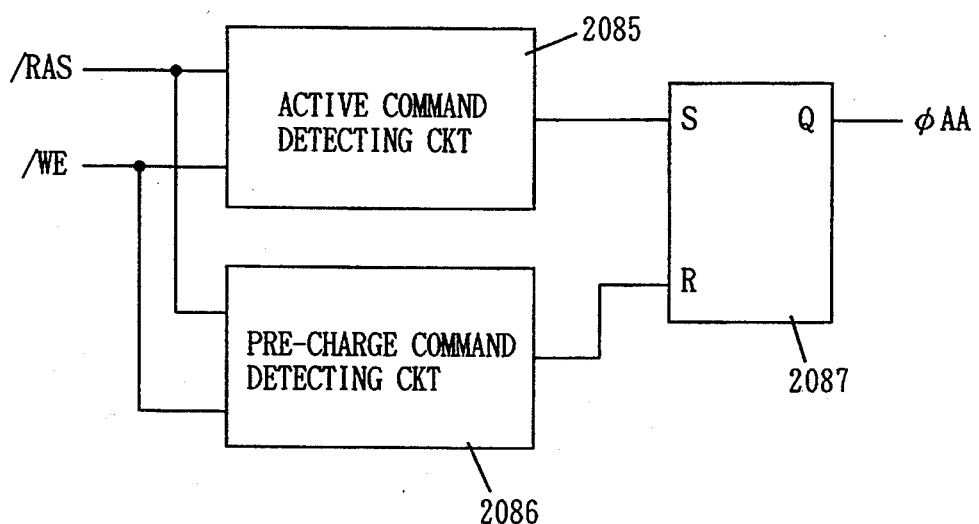
Figure 136A:
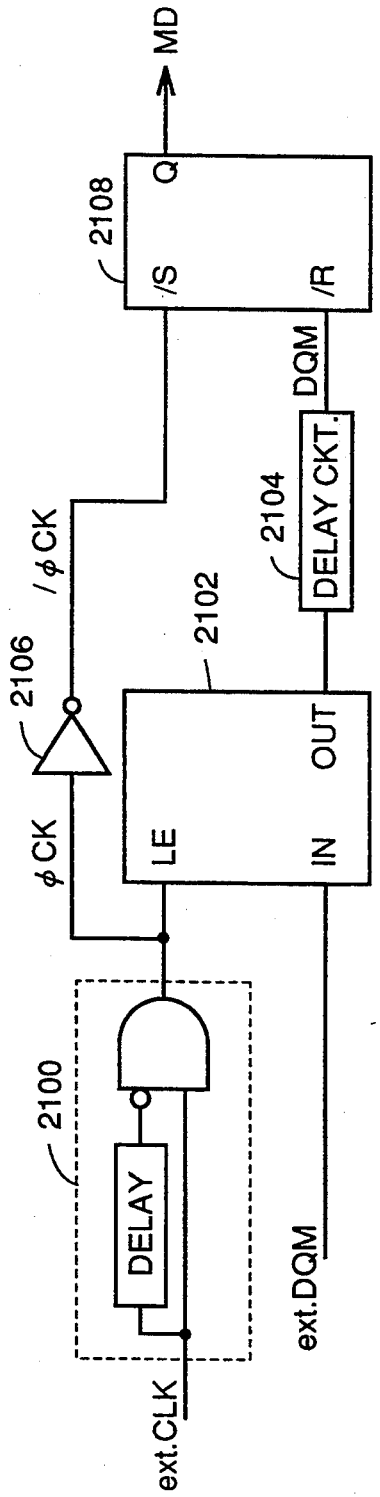
Figure 136B:
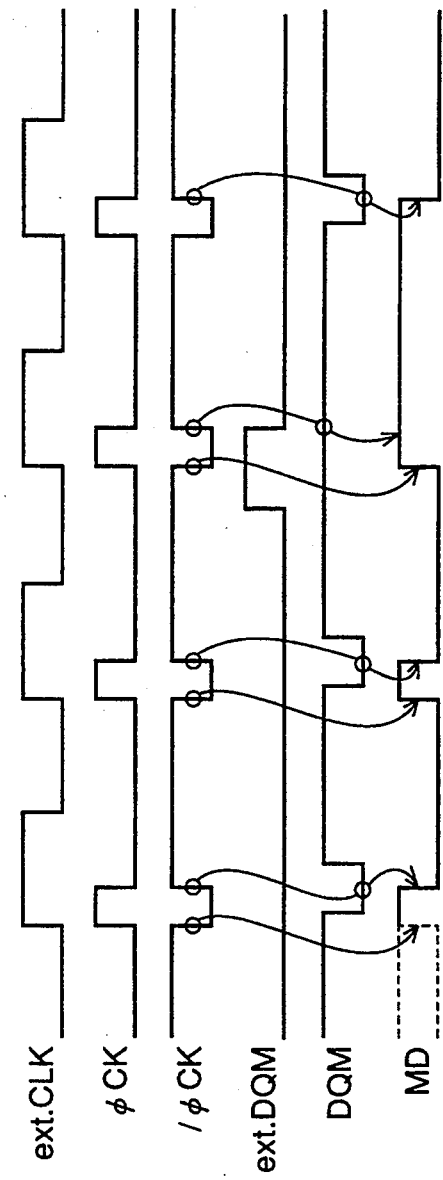
Figure 137:
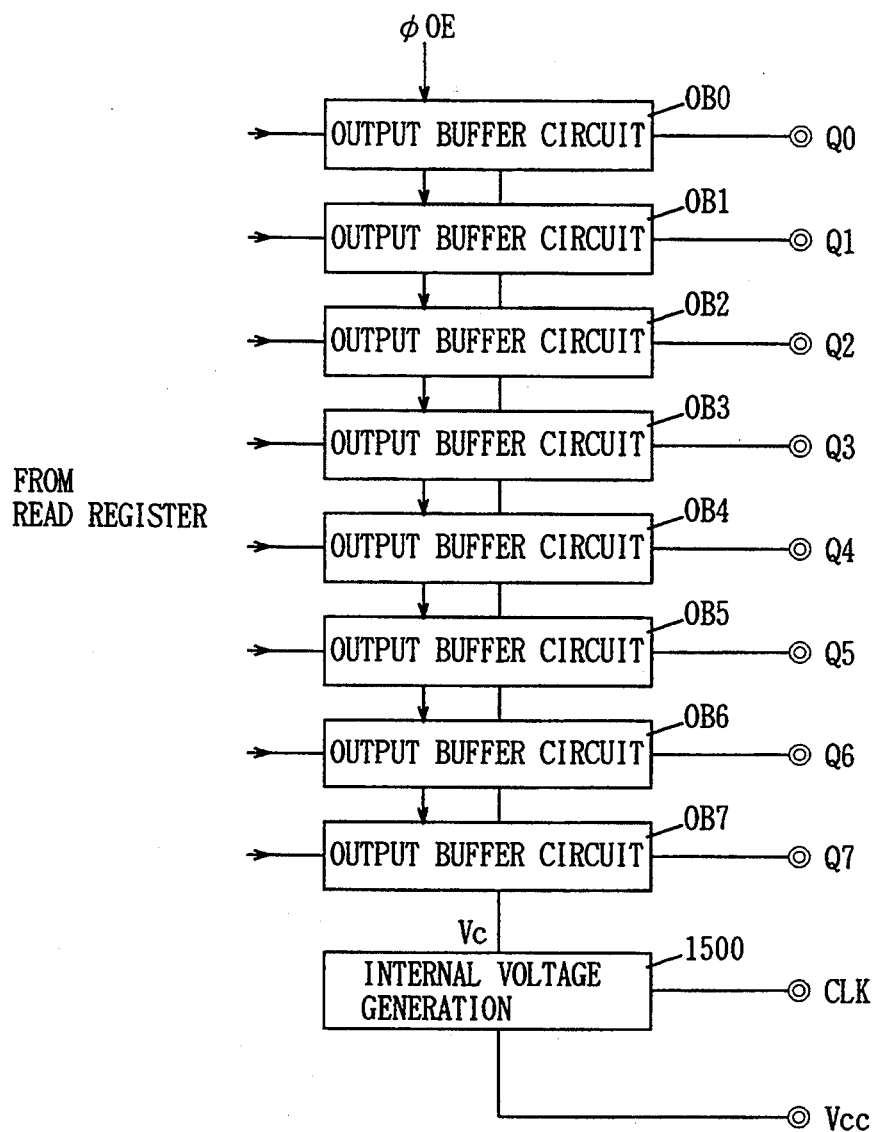
Figure 138:
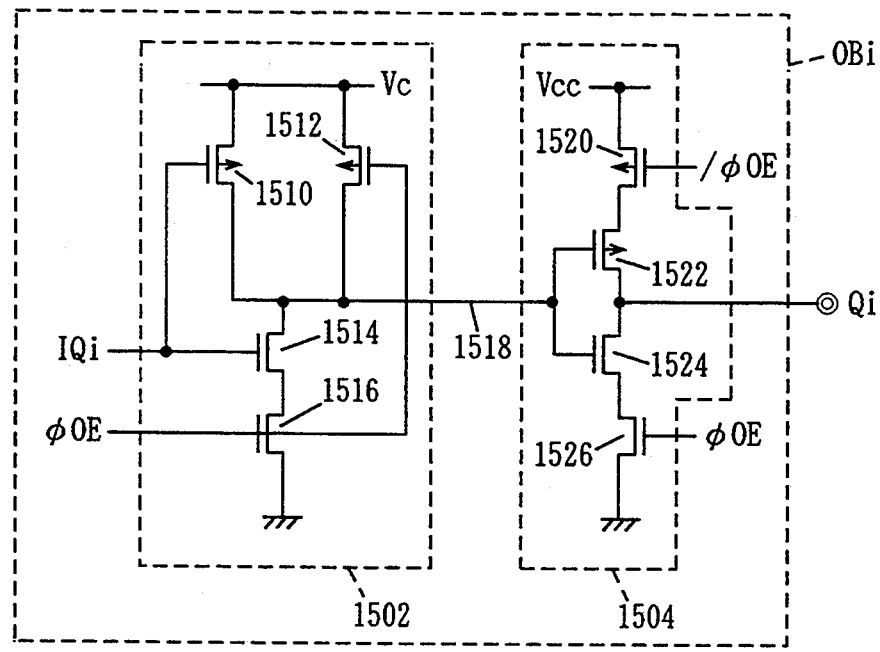
Figure 139:
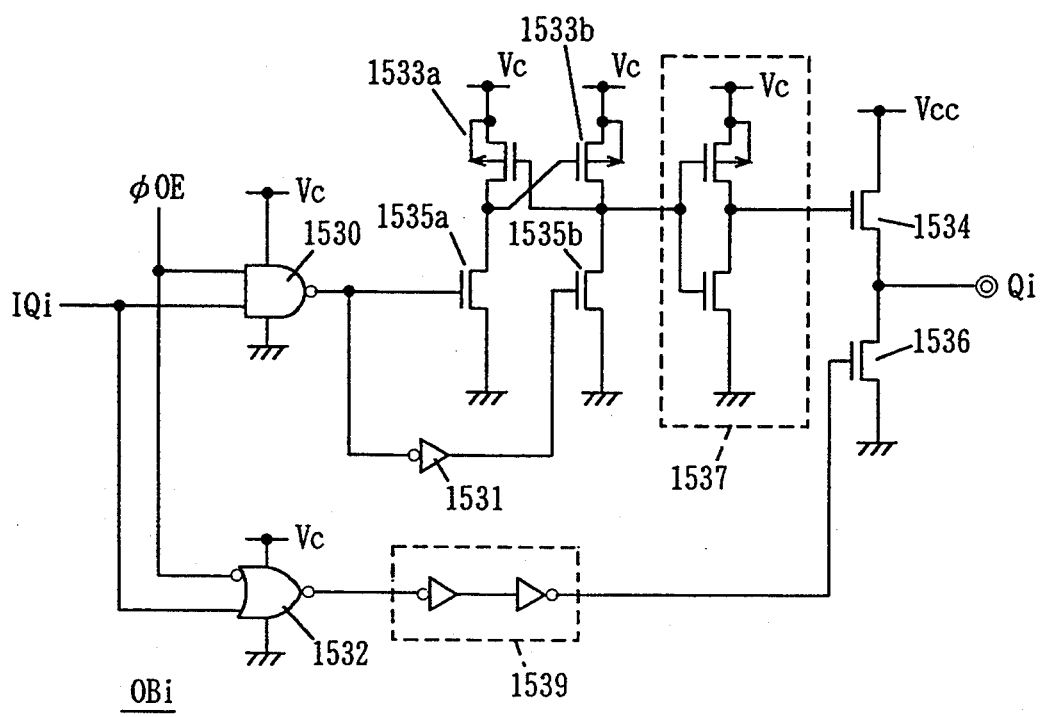
Figure 140:
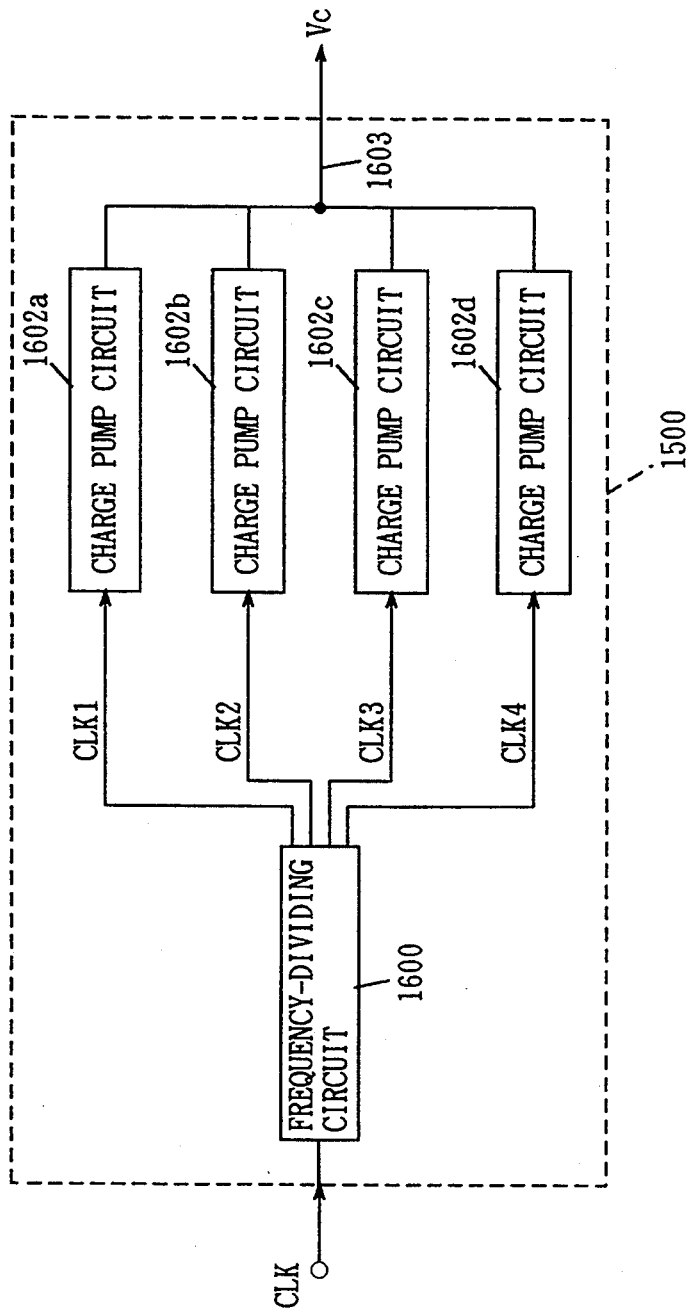
Figure 141:
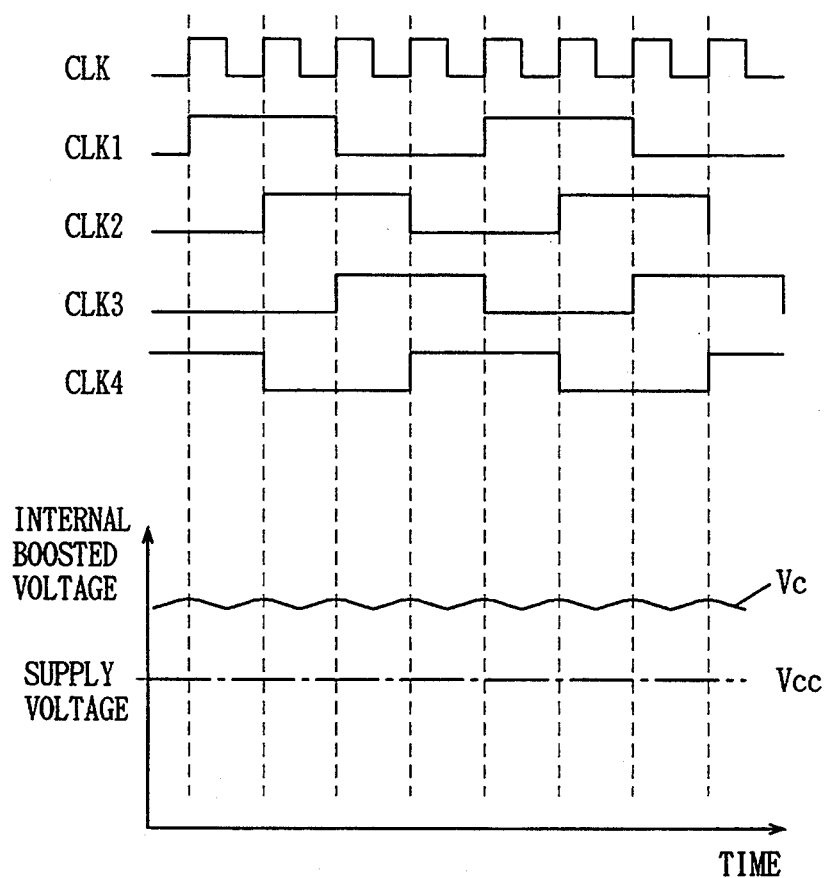
Figure 142:
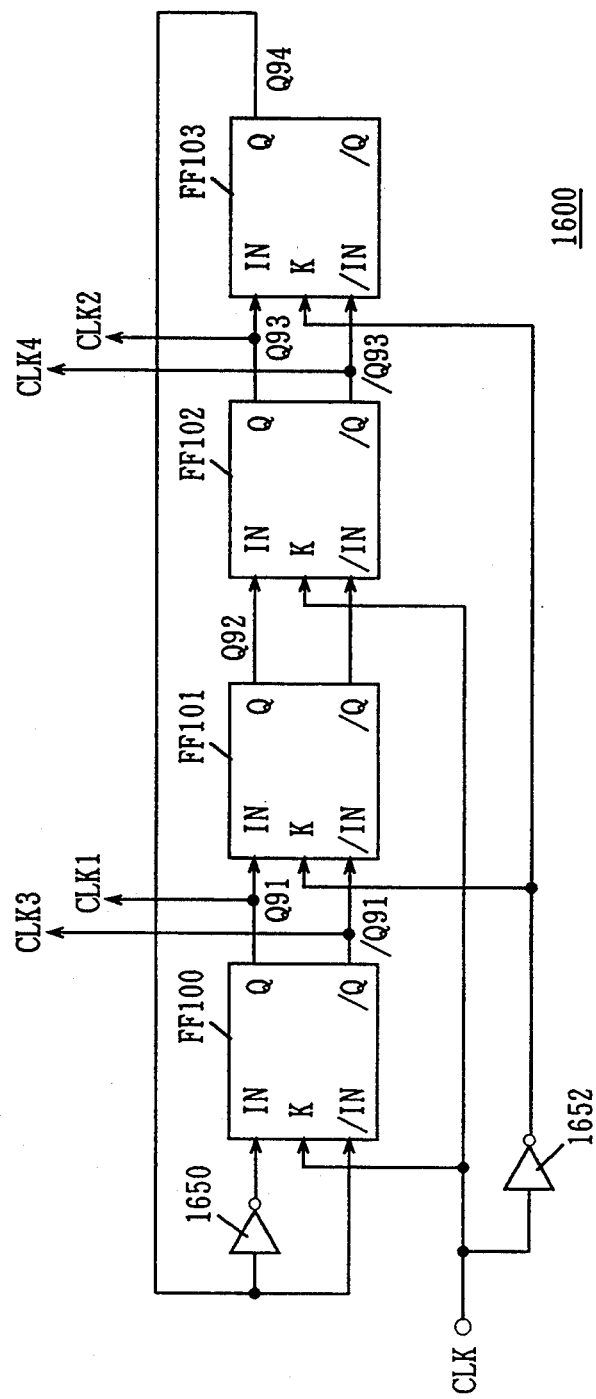
Figure 143:
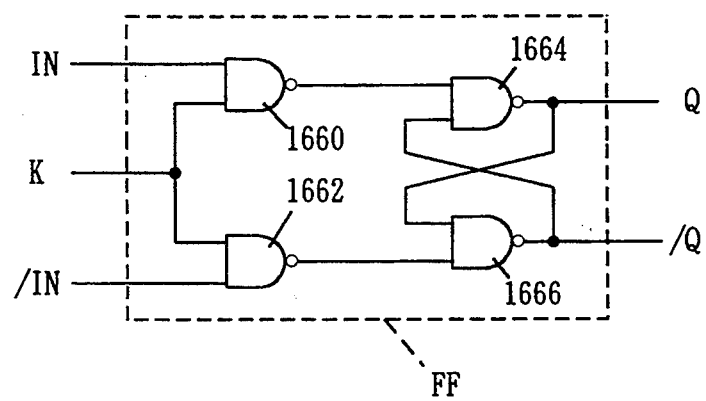
Figure 144:
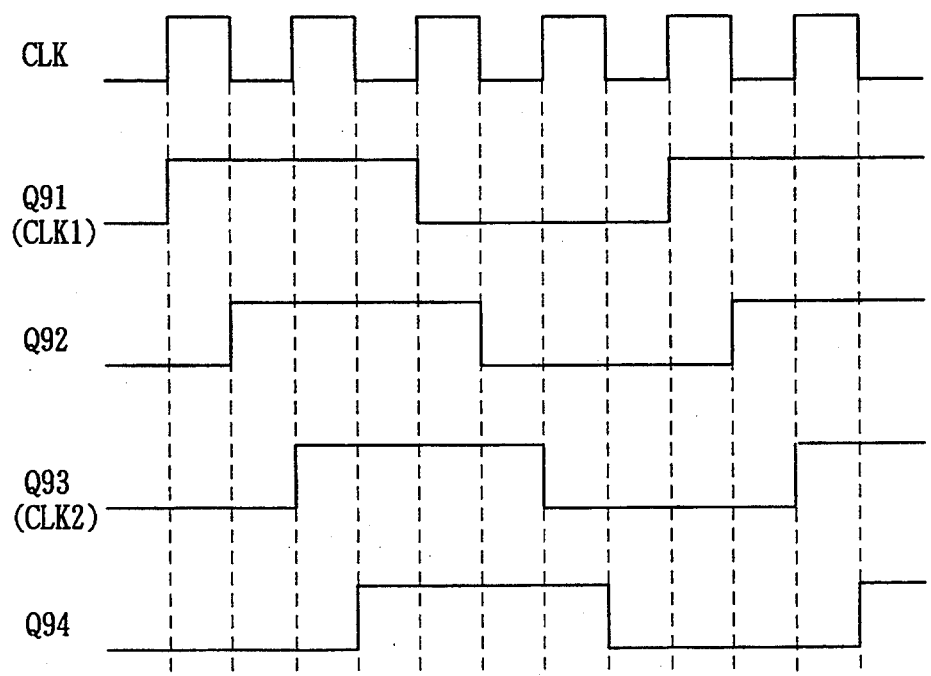
Figure 145:
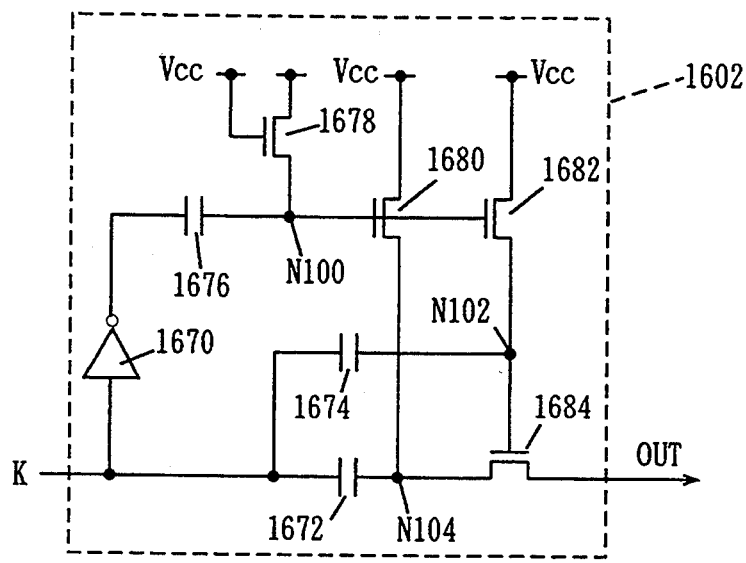
Figure 146:
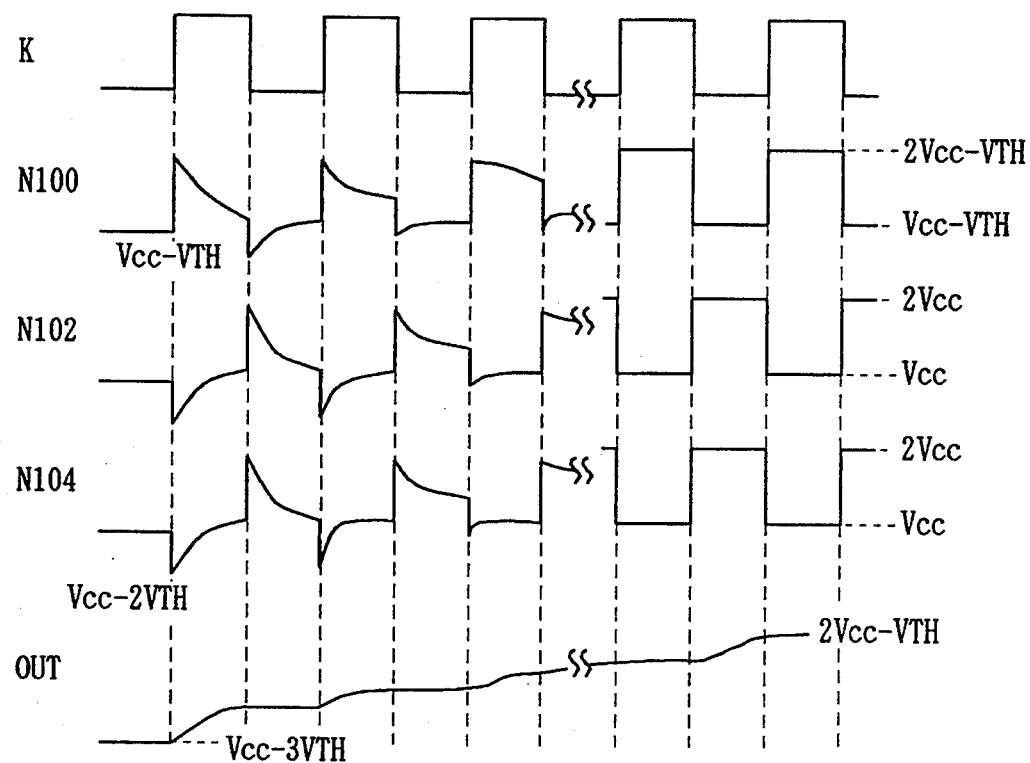
Figure 147:
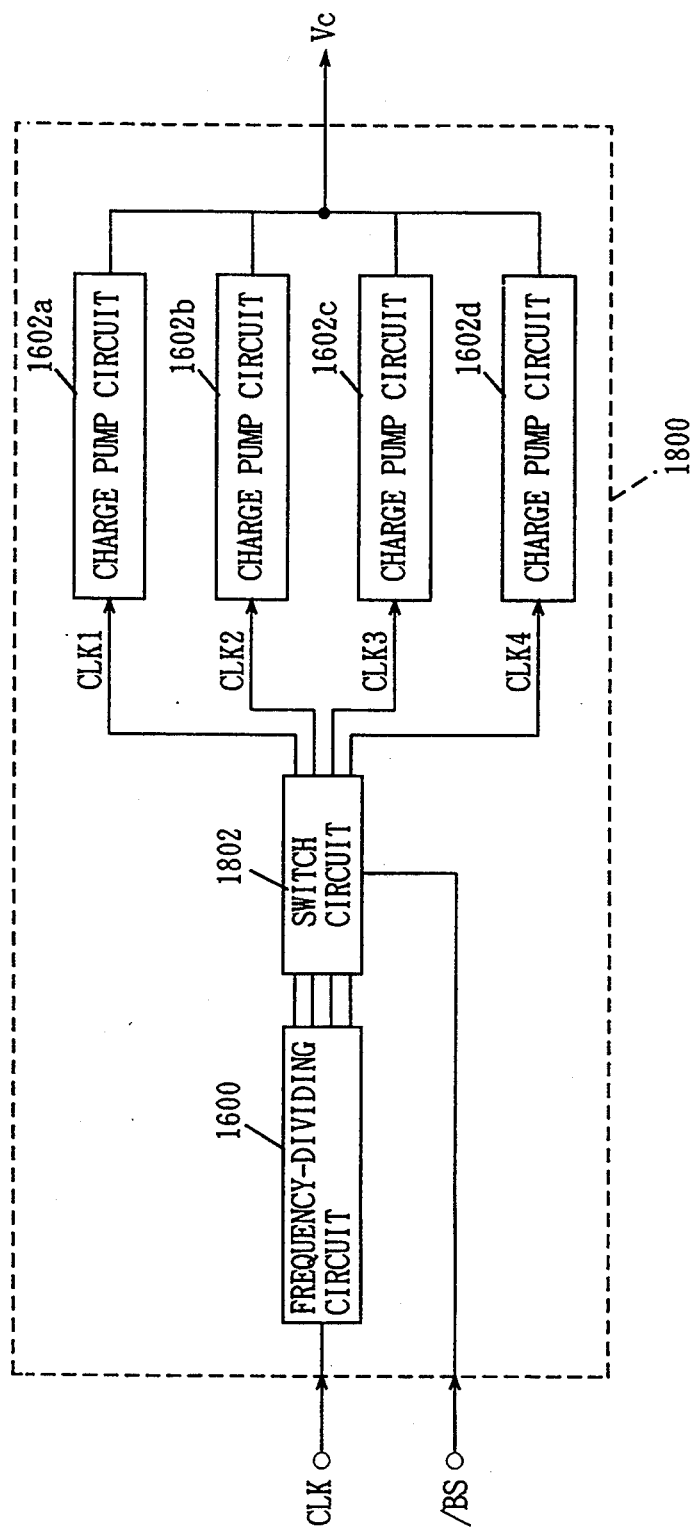
Figure 148:
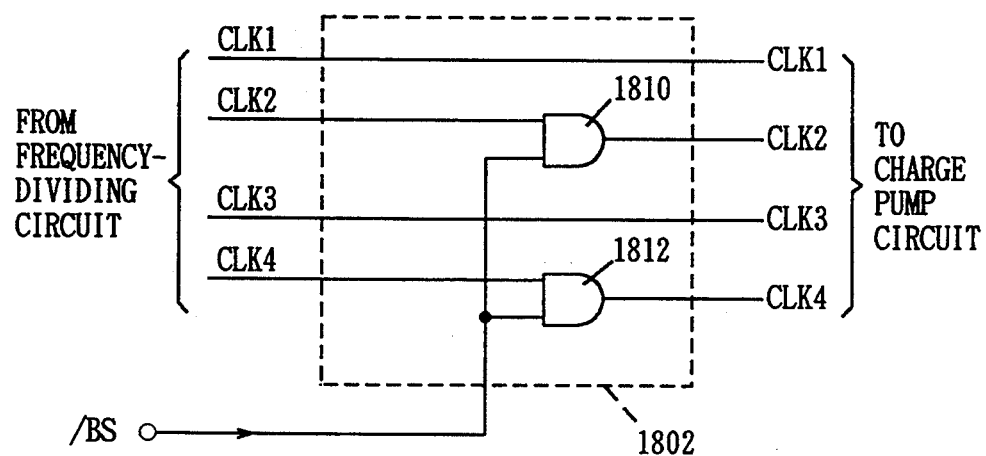
Figure 149:
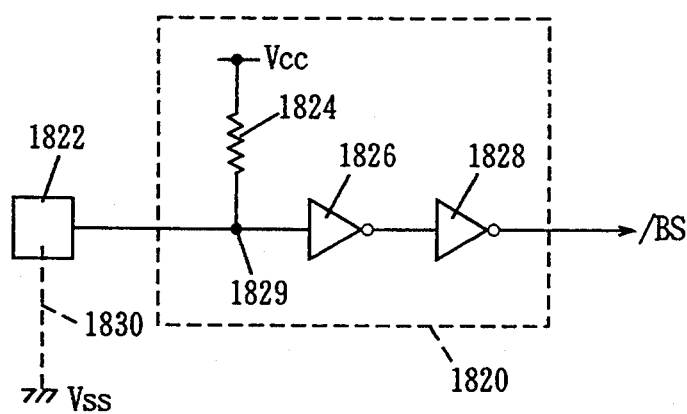
Figure 150:
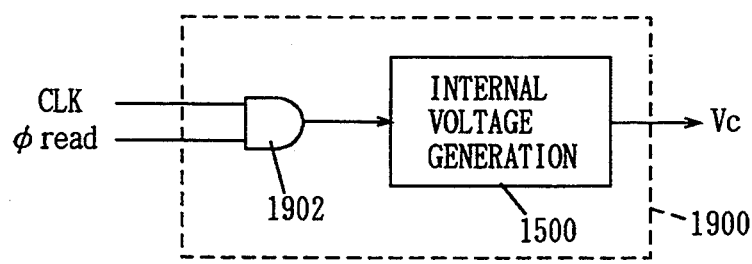
Figure 151:
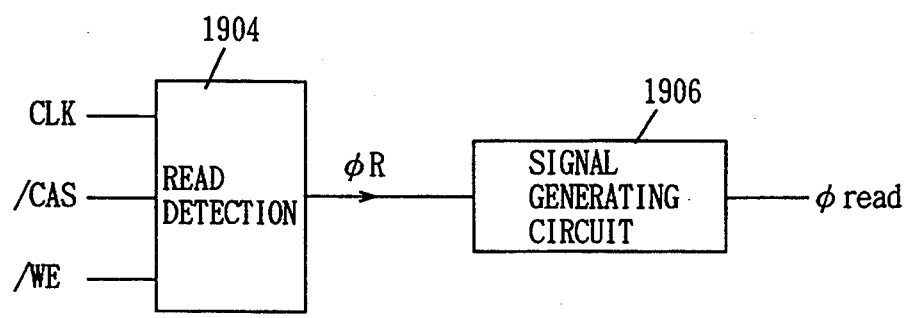
Figure 152:
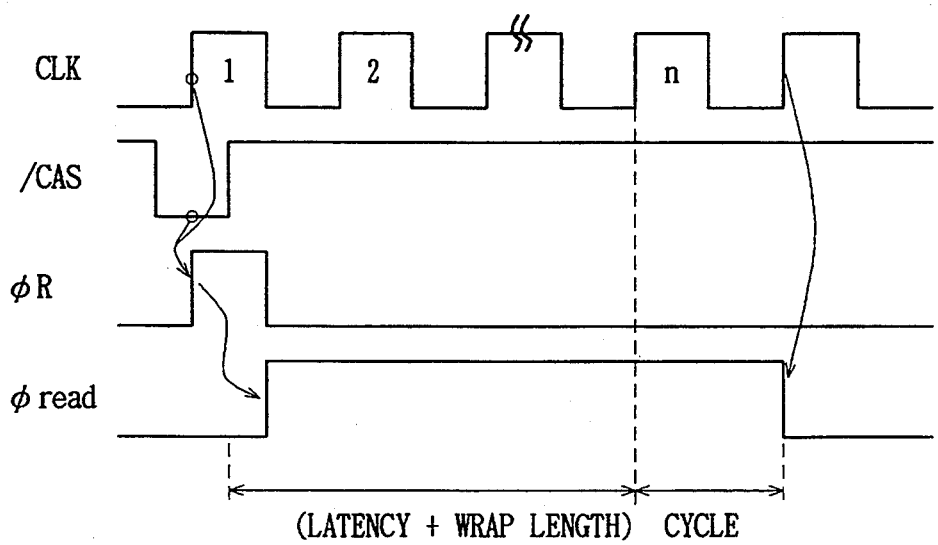
Figure 153:
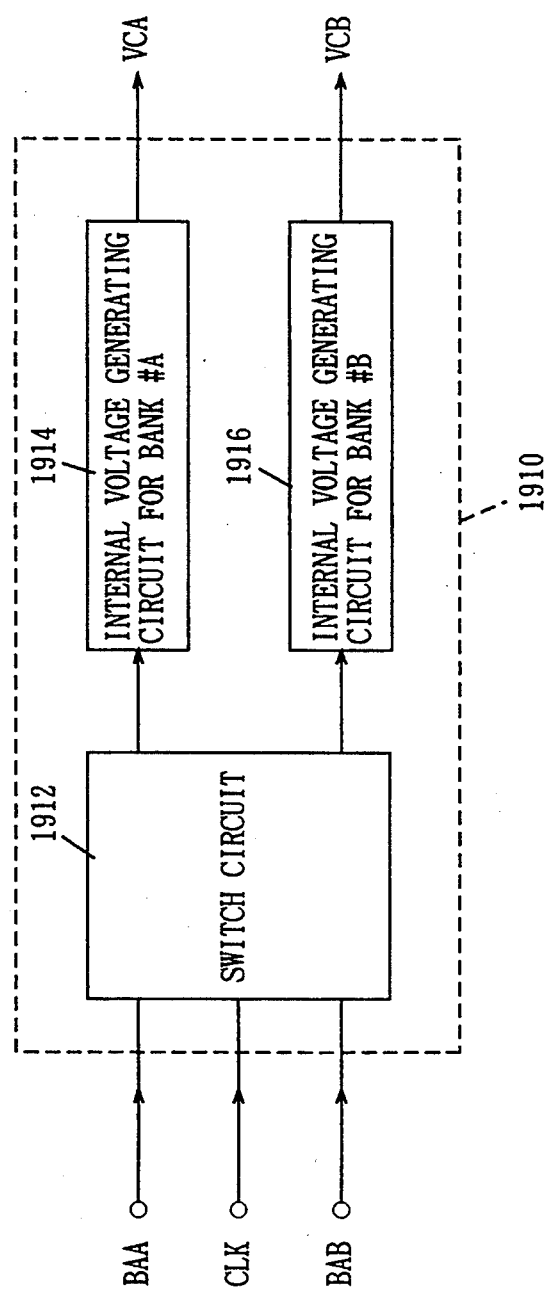
Figure 154:
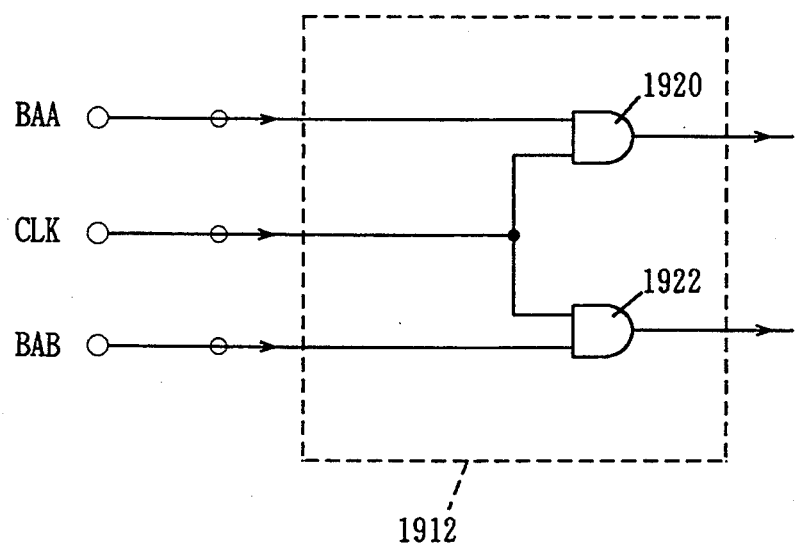
Figure 155:
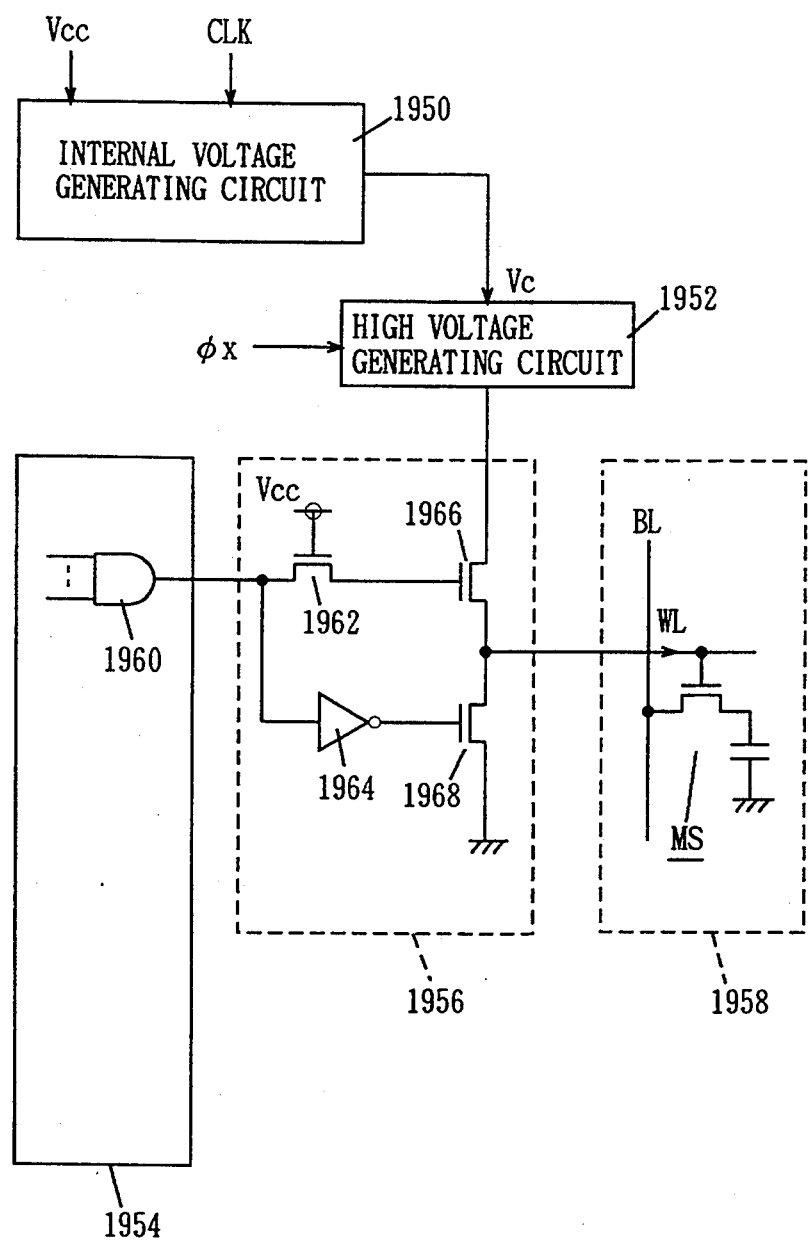
Figure 156:
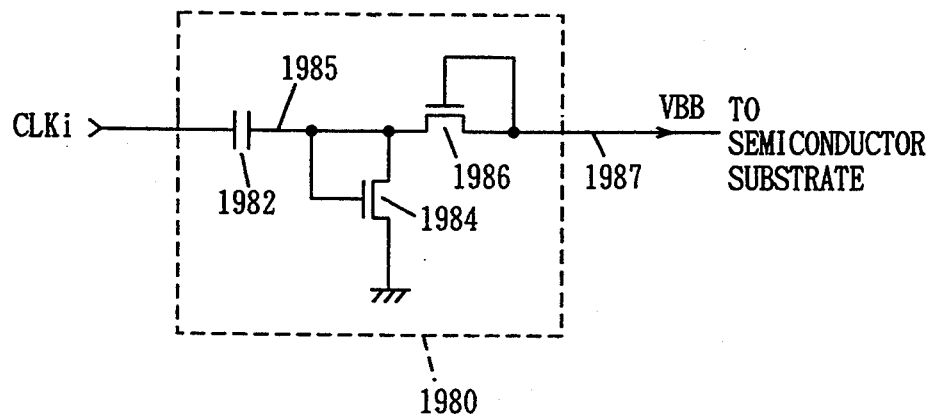

FIG. 132 shows a modification of a dynamic latch;

FIG. 133 shows a modification of an one-shot pulse generating part operable to set a flip-flop for generating an internal write mask;

FIG. 134 shows a modification of a gate circuit contained in an one-shot pulse generating circuit shown in FIG. 128;

FIG. 135 shows a structure of an array active detection signal generating system used in FIGS. 132-134;

FIGS. 136A and 136B show another structure of an internal write mask signal generating circuit and its operation waveform;

FIG. 137 shows a structure of a data output of an SDRAM;

FIG. 138 shows an example of a structure of a data output of an output buffer circuit shown in FIG. 137;

FIG. 139 shows another structural example of a data output of an output buffer circuit shown in FIG. 108;

FIG. 140 shows a structure of an internal voltage generating circuit shown in FIG. 137;

FIG. 141 is a signal waveform diagram showing an operation of an internal voltage generating circuit shown in FIG. 140;

FIG. 142 shows an example of a structure of a frequency dividing circuit shown in FIG. 140;

FIG. 143 shows a structure of a flip-flop shown in FIG. 142;

FIG. 144 is a timing chart showing an operation of a frequency dividing circuit shown in FIG. 142;

FIG. 145 shows a structure of a charge pump circuit shown in FIG. 140;

FIG. 146 is a signal waveform diagram showing an operation of a charge pump circuit shown in FIG. 145;

FIG. 147 shows another structural example of an internal voltage generating circuit;

FIG. 148 shows an example of a structure of a switch circuit shown in FIG. 147;

FIG. 149 shows a circuit structure for generating an output bit size selecting signal /BS shown in FIG. 148;

FIG. 150 shows another structure of an internal voltage generating circuit;

FIG. 151 shows a circuit structure for generating a read mode detection signal shown in FIG. 121;

FIG. 152 is a signal waveform diagram showing an operation of a circuitry shown in a FIG. 150;

FIG. 153 shows still another structure of an internal voltage generating circuit;

FIG. 154 shows a specific structure of a switch circuit shown in FIG. 153;

FIG. 155 shows another applicable example of an internal voltage generating circuit; and FIG. 156 shows another structural example of a charge pump circuit.

DESCRIPTION OF THE PREFERRED EMBODIMENT

[Memory Array Arrangement]

For high speed access in an SDRAM, such a specification has been proposed that a plurality of (e.g., eight) consecutive bits (for one data I/O terminal) are accessed at a high speed in synchronization with a system clock signal. A standard timing which satisfies this specification of the successive access is shown in FIG. 2.

Figure 2:
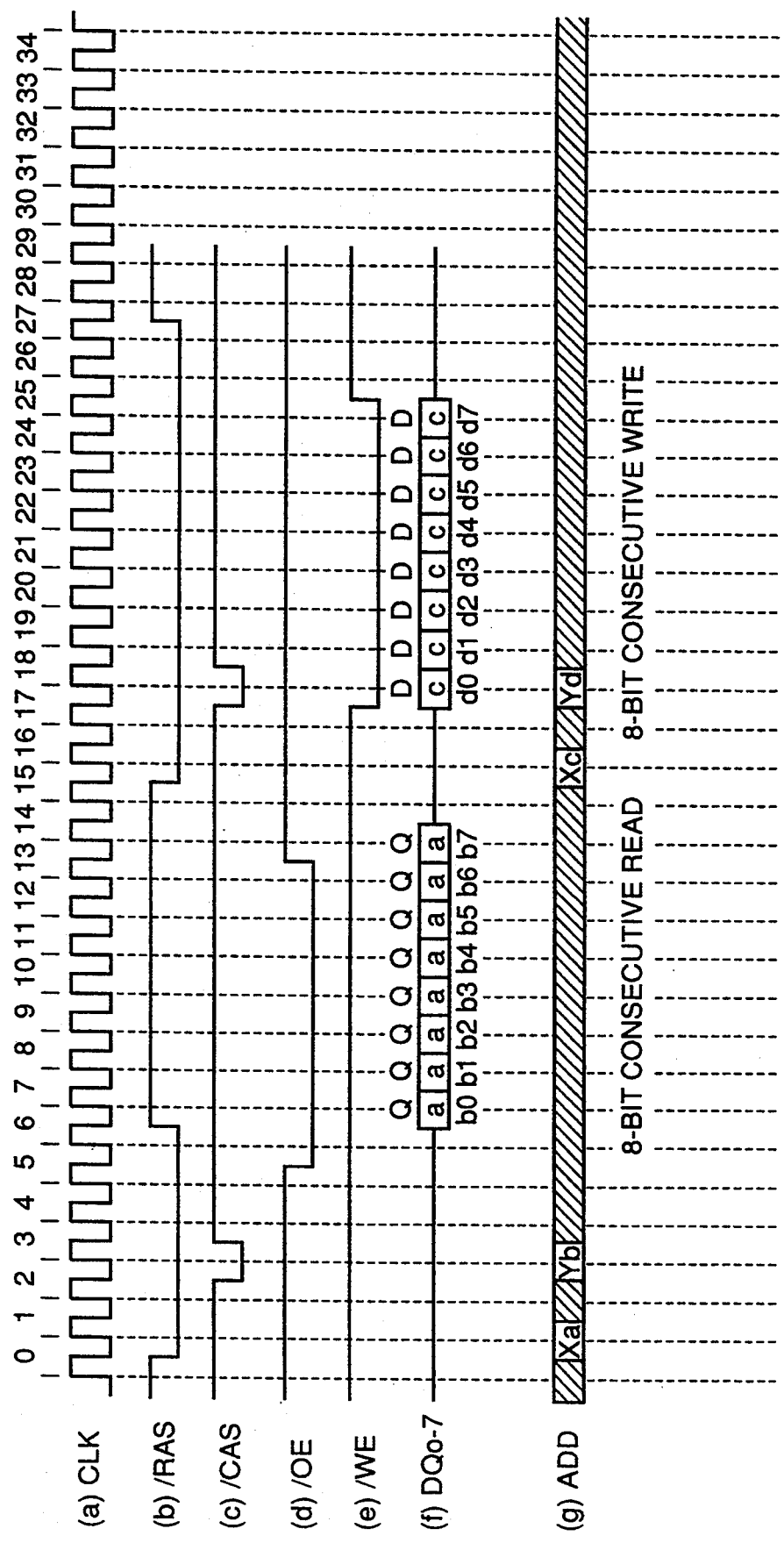
FIG. 2 is a timing chart showing standard operations of the SDRAM shown in FIG. 1.

FIG. 2 shows an operation for successively writing or reading data of 8 bits through a terminal ($8 \times 8 = 64$ bits in total) in the SDRAM including data I/O terminals DQ0–DQ7 allowing the write and read of data of 8 bits (byte data).

As shows in FIG. 2, the SDRAM takes in externally applied signals, i.e., a control signal, a row address strobe signal /RAS, a column address strobe signal /CAS, an output enable signal /OE, a write enable signal /WE and an address signal ADD, for example, at a rising edge of an externally supplied clock signal CLK which is a system clock. The address signal ADD is formed of a row address signal X and a column address signal Y which are multiplexed in a time division manner. If the row address strobe signal /RAS is in the active state of "L" at the rising edge of the clock signal CLK, a currently applied address signal ADD is taken in as the row address signal X.

If the column address strobe signal /CAS is in the active state of "L" at the rising edge of the clock signal CLK, the currently applied address signal ADD is taken in as the column address signal Y. Selection of the row and column is carried out in the SDRAM in accordance with a row address signal Xa and a column address signal Yb thus taken in. Upon elapse of a predetermined clock period (i.e., six clock cycles in FIG. 2) after the row address strobe signal /RAS fell to "L", initial 8-bit data is output if the output enable signal /OE is "L". Thereafter, data are output in response to the rise of the clock signal CLK.

In the write operation, a row address signal Xc is taken in similarly to the data reading operation. If both the column address strobe signal /CAS and write enable signal /WE are in the active state of "L" at the rising edge of the clock signal CLK, a column address signal Yd is taken in, and currently applied data d0 is taken in as initial write data. In response to the fall of the signals /RAS and /CAS, row and column selecting operations are internally performed in the SDRAM. In synchronization with the clock signal CLK, input data d1, d2, ..., d7 are sequentially taken in, and thereafter are written into consecutive memory cells.

In contrast to the scheme of the conventional DRAM in which the operation is performed by taking in address signal, input data and others in synchronization with the external signals such as the row address strobe signal /RAS and column address strobe signal /CAS, the external signals such as the address strobe signals /RAS and /CAS as well as the address signal and input data are taken in, for example, at the rising edge of the clock signal CLK which is the externally applied system clock as described above.

Execution of the synchronous operation, in which externally applied signals and data are introduced in synchronization with the externally applied clock signal, brings about, for example, an advantage that it is not necessary to ensure a margin for a data input/output time required due to skew (deviation of timing) of the address signal, so that the cycle time can be reduced. In some of the systems using the SDRAMs, the memory cells of several bits at consecutive addresses may be frequently accessed. In the above scheme in which the write and read of consecutive data can be executed in synchronization with the clock signal, the successive access time can be reduced and the high-speed access is implemented. Therefore, the SDRAM can have a reduced average access time comparable to that of the SRAM.

In the SDRAM, memory cells of 64 bits ($8 \times 8$) may be simultaneously maintained in the selected state, which is considered to be the simplest manner for realizing the above 8-time successive write/read operations of 8-bit data.

An SDRAM having an array arrangement shown in FIG. 3 will be discussed below.

Figure 3:
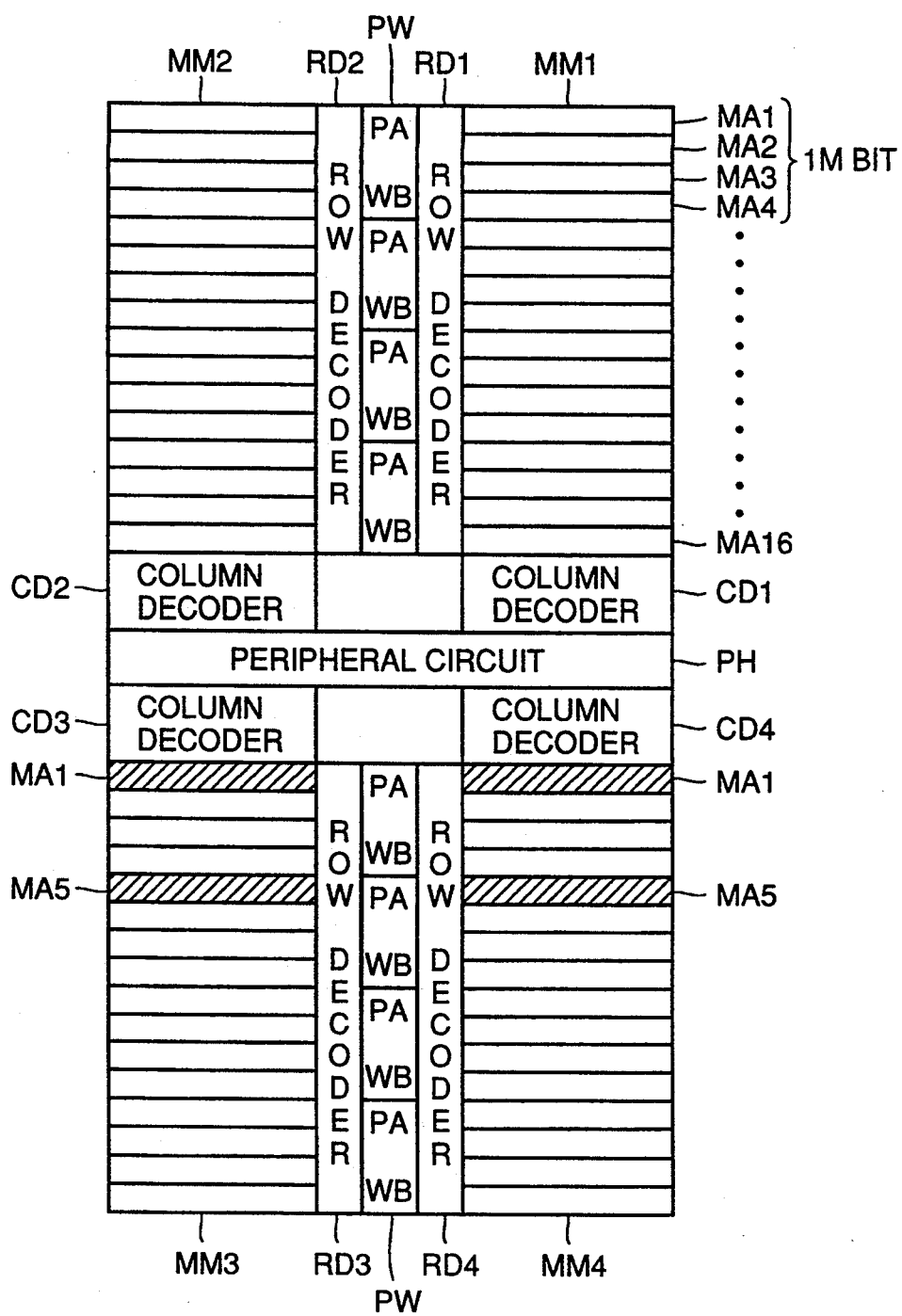
FIG. 3 shows a memory array arrangement in the SDRAM of the invention.

FIG. 3 shows a chip configuration of a standard 16-Mbit DRAM. In FIG. 3, the DRAM includes four memory mats MM1, MM2, MM3 and MM4 each having a storage capacity of 4 Mbits. Each of the memory mats MM1–MM4 includes 16 memory arrays MA1–MA16 each having a storage capacity of 256 Kbits. Row decoders RD1, RD2, RD3 and RD4 are arranged near the memory mats MM1–MM4, respectively, and each are disposed along one of sides of the corresponding memory mat extending along a chip long side direction (i.e., longitudinal direction in FIG. 3). Preamplifier circuits PA for amplifying read data and write buffers WB for amplifying write data and transmitting the same to the selected memory cells are disposed between the row decoders for the two memory mats which are adjacent to each other in the short side direction of the chip. There are provided blocks, each of which is formed of the preamplifier circuit PA and write buffer WB and is provided for four memory array blocks, i.e., for an array of 1 Mbit.

Near the short sides of the memory mats MM1–MM4 located at a central area of the chip, there are disposed column decoders CD1, CD2, CD3 and CD4 along the short sides. A peripheral circuit PH including address buffers, control signal generating circuits and others are disposed in the central area of the chip, i.e., between the column decoders.

The configuration of the 16M-DRAM shown in FIG. 3 constitutes a configuration of 2 megawords $\times$ 8 bits. Four memory arrays are selected in the operation. FIG. 3 shows the state in which the memory arrays MA1 and MA5 in the memory mat MM3 and the memory arrays MA1 and MA5 in the memory mat MM4 are selected. Memory cells of 4 bits are selected in each memory array. Therefore, memory cells of 16 bits can be simultaneously accessed in the configuration shown in FIG. 3. Ultimately, 8 bits are selected among these 16 bits.

In each of the memory mats MM1–MM4, selection is initially carried out in units of 1 Mbits (4 memory arrays), and then up to one memory array is selected in the selected array block of 1 Mbit. As shown in FIG. 3, four 256-Kbit arrays are selected in one RAS cycle (i.e., 1 cycle defined by the signal /RAS). Such partial activation reduces power consumption. The memory arrays except for the activated memory arrays are maintained in the precharged state.

Figure 4:
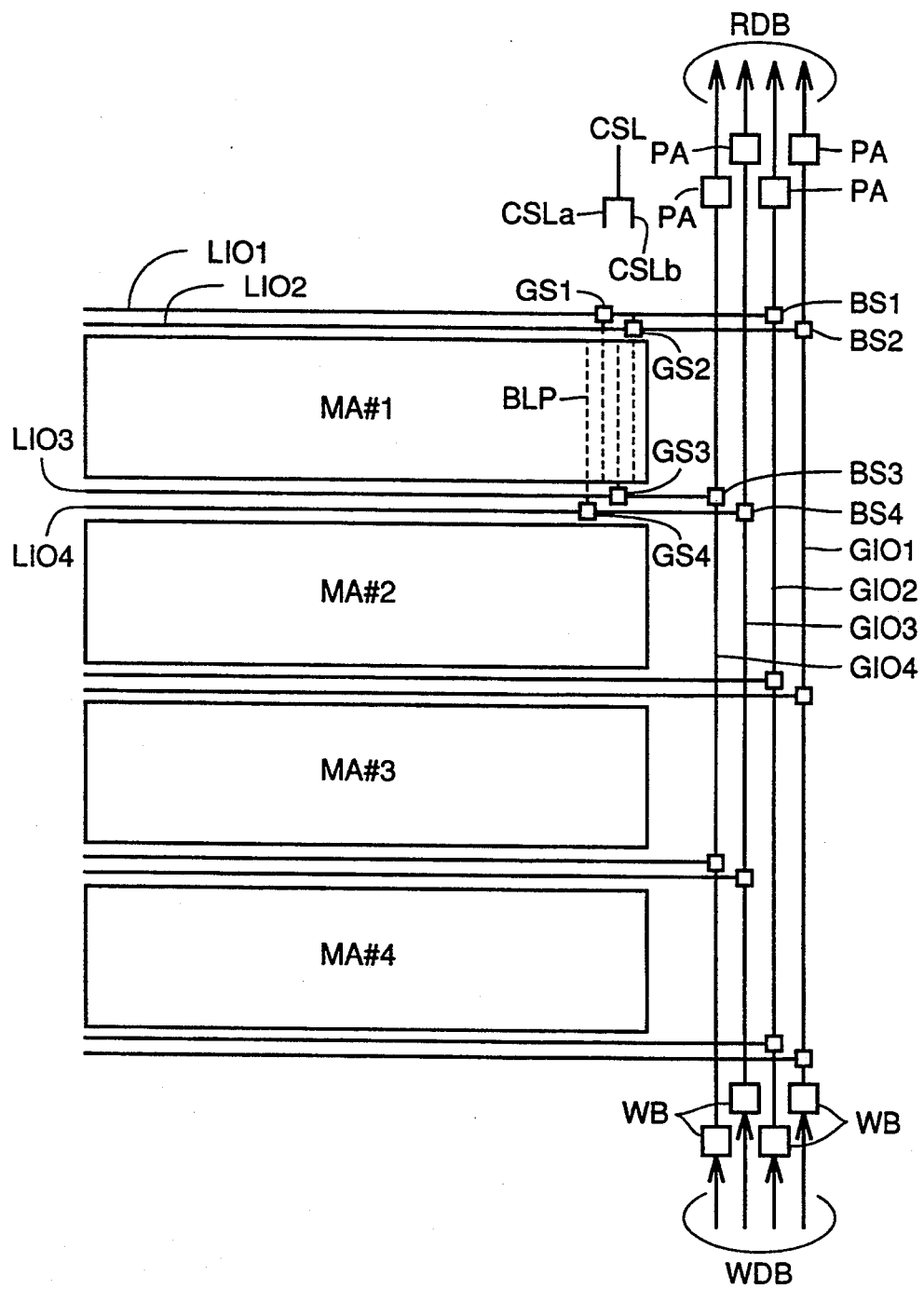
FIG. 4 shows a memory array arrangement in a standard DRAM.

FIG. 4 schematically shows a configuration of four memory array parts in the DRAM shown in FIG. 3.

Among four 256-Kbit memory arrays MA#1–MA#4, only one memory array at most is activated, and specifically selection of the word line, charging and discharging of the bit lines and others are executed for the activated memory array during the operation.

In FIG. 4, local I/O line pairs LIO1, LIO2, LIO3 and LIO4, each of which is provided for one memory array for transmitting selected memory cell data from memory arrays, are disposed along the longitudinal direction of the memory arrays (i.e., the short side direction of the chip). The adjacent memory arrays commonly use the local I/O line pairs disposed therebetween. For example, the local I/O line pairs LIO3 and LIO4 are commonly used by the memory arrays MA#1 and MA#2 in FIG. 4. Each bit line pair BLP in the memory array is connected to the local I/O line pair LIO (the local I/O line pair will also be indicated generally by "LIO" hereafter) in accordance with an output of the column decoder. For this purpose, there are provided I/O switches GS1, GS2, GS3 and GS4. The I/O switches GS1–GS4 function as follows. The output signal (column selecting signal) of the column decoder CD (reference characters "CD" is used to generally indicate the column decoder) is transmitted to one column selecting line CSL. The column selecting line CSL is divided into two signal lines CSLa and CSLb. Each of the divided column selecting lines CSLa and CSLb selects two bit line pairs BLP. Thus, one column selecting line CSL selects four bit line pairs BLP to be connected to the local I/O line pairs LIO.

The memory array MA, of which specific structure will be described later, has a shared sense amplifier structure of an alternate arrangement type, in which sense amplifiers are alternately arranged at opposite ends of the bit line pairs BLP, and the sense amplifiers are commonly used by the adjacent memory arrays. Thus, each memory array has the shared sense amplifier structure of the alternate arrangement type.

The shared sense amplifier structure and the common use of the local I/O line pairs reduce the areas required by signal interconnections and sense amplifiers. Owing to the alternate arrangement of the sense amplifiers, a pitch between the sense amplifiers is ensured even if the bit line pitch is small. The column selecting lines extend in the memory array along a vertical or longitudinal direction in FIG. 4.

The global I/O line pairs GIO1–GIO4 are provided commonly to the four memory arrays MA#1–MA#4. Block selecting switches BS1, BS2, BS3 and BS4, which are responsive to a block selecting signal to connect the local I/O line pairs LIO1–LIO4 and the global I/O line pairs GIO1–GIO4, are disposed at crossings of the global I/O line pairs GIO1–GIO4 and the local I/O line pairs LIO1–LIO4. Owing to this structure, only the memory array which is selected and thus is active can transmit data to and from the global I/O line pairs GIO ("GIO" generally indicates the global I/O line pair(s)).

The global I/O line pairs GIO1–GIO4 are connected to a read data bus RDB and a write data bus WDB through the preamplifiers PA and write buffers WB provided in corresponding I/O circuits PW, respectively. Each of the preamplifiers PA and write buffers WB included in the data I/O circuits PW is activated in response to the block selecting signal and read instructing signal or the write enable signal, respectively.

According to the above configurations, data of the memory cells of 4 bits can be read from or written into four 1 Mbit memory arrays. Therefore, the memory cells of 16 bits can be simultaneously accessed in the 16-Mbit DRAM configuration.

The read data bus RDB and the write data bus WDB extend through the I/O circuit PWs and are connected through a peripheral circuit PH to the data I/O terminal. If input and output in units of 8 bits are required, the peripheral circuit PH executes selection of data of 8 bits from data of 16 bits. Alternatively, such a configuration may be employed that only one memory mat is activated.

In the case where the configuration of 2 megawords×8 bits is utilized to form the SDRAM allowing the access of consecutive 8 bits (for one data I/O terminal) as described above, it is necessary to access the memory cells, of which number is four times as large as that of the memory cells accessed in the 16-Mbit DRAM shown in FIG. 3. It is rather difficult to increase the number of the 256-Kbit memory arrays which can be activated in view of power consumption. If the memory arrays are activated, the sense amplifiers operate for charging and discharging bit lines. Therefore, the current is consumed by operations such as charging and discharging of the bit lines by the sense amplifier as well as charging and discharging for precharging the bit lines in order to return to the precharge cycle.

In order to increase the number of memory cells which can be accessed simultaneously without increasing the number of memory arrays which can be activated simultaneously, it is necessary to increase the number of memory cells to be selected simultaneously in each memory array. Thus, it is necessary to increase four times the numbers of the local I/O line pairs LIO, global I/O line pairs GIO, preamplifiers PA and write buffers WB as shown in FIG. 5.

Figure 5:
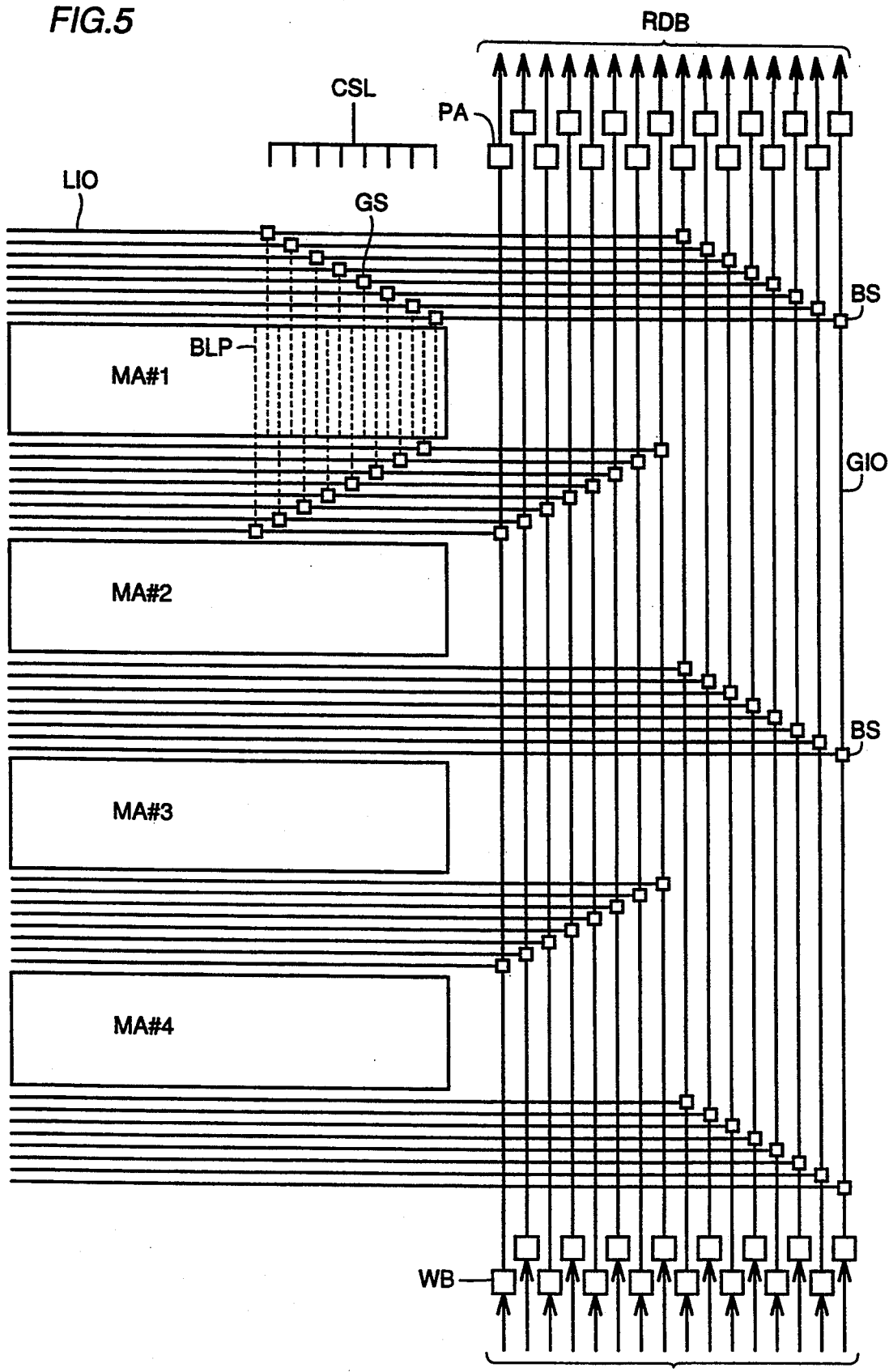
FIG. 5 is a diagram for showing problems caused when an SDRAM employs an array configuration of the standard DRAM.

In FIG. 5, there are also provided 16 local I/O line pairs LIO for one memory array, and there are also provided 16 global I/O line pairs GIO. The column selecting lines CSL simultaneously selects 16 bit line pairs BLP in one memory array and connect them to the local I/O line pairs LIO. Also in FIG. 5, the divided column selecting lines formed through division of the column selecting line CSL simultaneously select two bit line pairs and connect them to the local I/O line pairs LIO.

Similarly, the local I/O line pairs LIO are connected to the global I/O line pairs GIO through the block selecting switches BS.

As can be understood from the configuration in FIG. 5, if the numbers of the local I/O line pairs LIO and global I/O line pairs GIO are increased, an interconnection area significantly increases, resulting in remarkable increase of a chip area. Therefore, it is not a good countermeasure to use the 16-Mbit DRAM of the configuration shown in FIG. 3 for forming the SDRAM allowing successive access of 8 bits.

[Embodiment 1]

Figure 6:
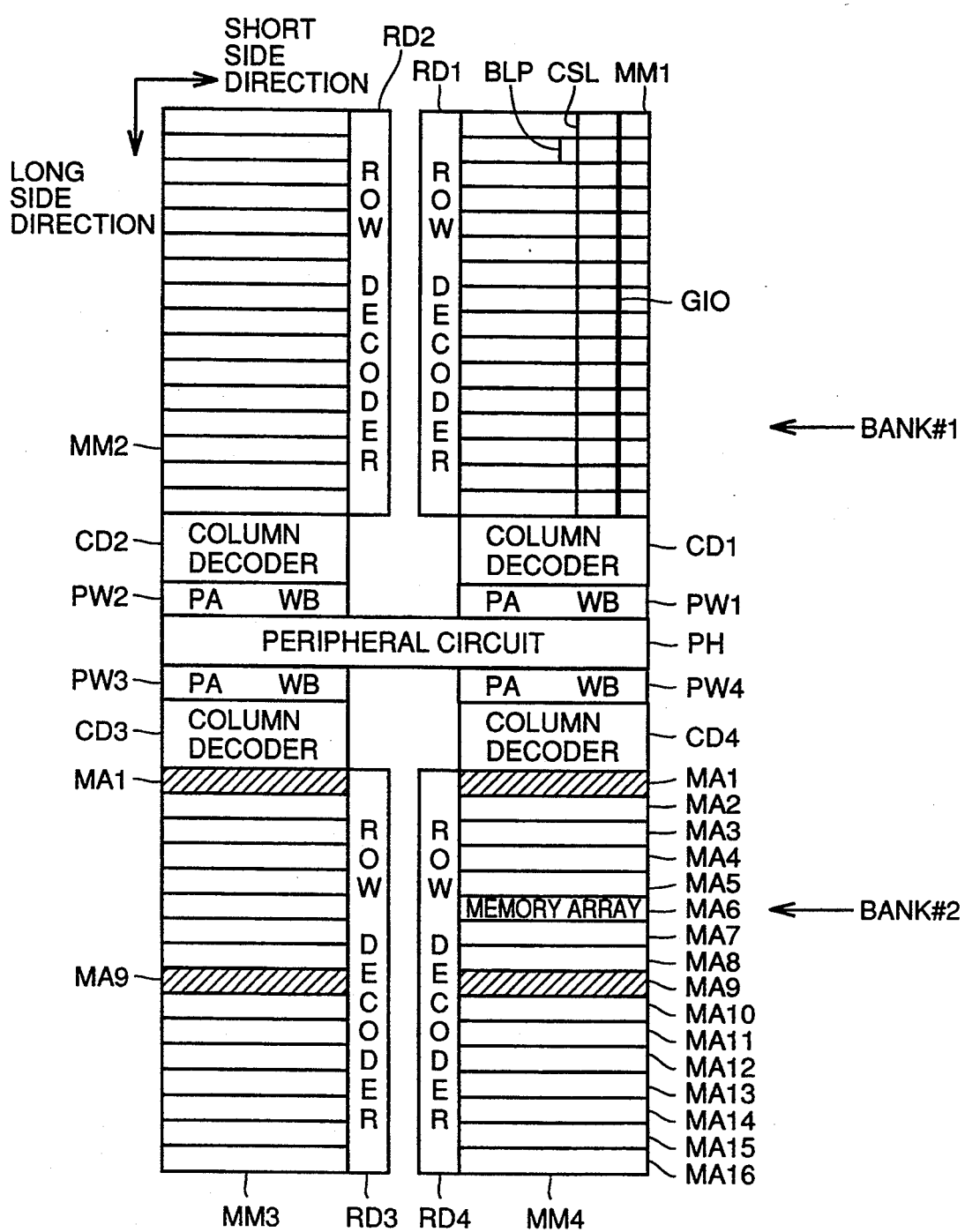
FIG. 6 shows an arrangement of memory arrays of an SDRAM according to the invention.

FIG. 6 shows a layout of a chip of an SDRAM which is a preferable embodiment of the invention. FIG. 6 shows, as an example, a 16-Mbit SDRAM of a 2 megawords×8 bits configuration. The SDRAM includes 4 memory mats MM1–MM4 each having a memory capacity of 4 Mbits. Each of the memory mats MM1–MM4 includes 16 memory arrays MA1–MA16 each having a memory capacity of 256 Kbits. Row decoders RD1–RD4 extending along the long side of the chip are disposed beside the long sides of the memory mats MM1-MM4, respectively. Column decoders CD1-CD4 disposed at the central area of the chip along short sides of the memory mats MM1-MM4, respectively. Column selecting lines CSL extend from the column decoders CD (reference characters "CD" are used to indicate generally the column decoders CD1-CD4) across the respective arrays in the corresponding memory mats MM ("MM" generally indicates the memory mat(s) MM1-MM4). Each column selecting line CSL is adapted to select simultaneously 8 bit line pairs, as will be describe later.

The global I/O line pairs GIO for transmitting internal data are arranged along the long sides of the memory mats MM and across the respective arrays.

For the memory mats MM1-MM4, there are provided I/O circuits PW1-PW4 at the central area of the chip, respectively. Each of the I/O circuits PW1-PW4 is formed of the preamplifiers PA for amplifying data of the selected memory cells and the write buffers WB for transmitting write data to the selected memory cells.

The peripheral circuit PH which includes circuits for generating the address signal and control signal is disposed at the central area of the chip.

The SDRAM shown in FIG. 6 includes two banks #1 and #2, each of which can perform precharging and activating operations independently from the other bank. The bank #1 includes the memory mats MM1 and MM2, and the bank #2 includes the memory mats MM3 and MM4. The number of banks can be changed.

Each of the memory mats MM1-MM4 includes two array blocks each having a memory capacity of 2 Mbits. One of the array blocks is formed of memory arrays MA1-MA8, and the other array block is formed of memory arrays MA9-MA16. In each array block, up to one memory array is selected. Four memory arrays are simultaneously activated, and FIG. 6 shows a situation in which the memory arrays MA1 and MA9 in the memory mat MM3 and the memory arrays MA1 and MA9 in the memory mat MM4 are active. Thus, in the selected bank, one memory array is selected in each array block of the memory mat.

The column selecting lines CSL which are simultaneously selected are eight in number. Each column selecting line CSL selects 8 bit line pairs. Thus, memory cells of 8×8=64 bits are simultaneously selected.

Each I/O circuit PW is commonly used by the respective memory cells in the corresponding memory mat MM. The numbers of the preamplifiers PA and the write buffers WB included in one I/O circuit PW each is 32, and the SDRAM includes 128 preamplifiers and 128 I/O circuits PW as a whole. These numbers are half the numbers of 256 of the preamplifiers PA and write buffers WB in the configuration shown in FIG. 5, which is formed by expanding the configuration in FIG. 3. Therefore, the chip occupying area is significantly reduced.

The preamplifiers PA and write buffers WB included in the I/O circuits PW are concentrated in the central area of the chip. These are driven by control circuit in the peripheral circuit PH. Therefore, lengths of signal lines for controlling operations of the preamplifiers PA and write buffers WB are short, so that loads the signal lines are reduced and a high-speed operation is allowed.

Owing to the arrangement of the peripheral circuit PH at the central area of the chip, input and output of data are performed through the central area of the chip. Therefore, in the packaged device, such an arrangement of pins is employed that a data I/O terminal is disposed at the central area of the chip, so that a distance between the peripheral circuit PH and data I/O terminal is reduced, and thus input and output of data can be performed at a high speed.

The SDRAM shown in FIG. 6 has the shared sense amplifier configuration of the alternate arrangement type, similarly to the 16-Mbit DRAM shown in FIG. 3. Thus, only the selected memory arrays are activated, and the unselected memory arrays are maintained in the precharged state. The number of the memory arrays which are activated simultaneously is four, and the current consumption is not larger than that of the DRAM configuration shown in FIG. 3.

Figure 7:
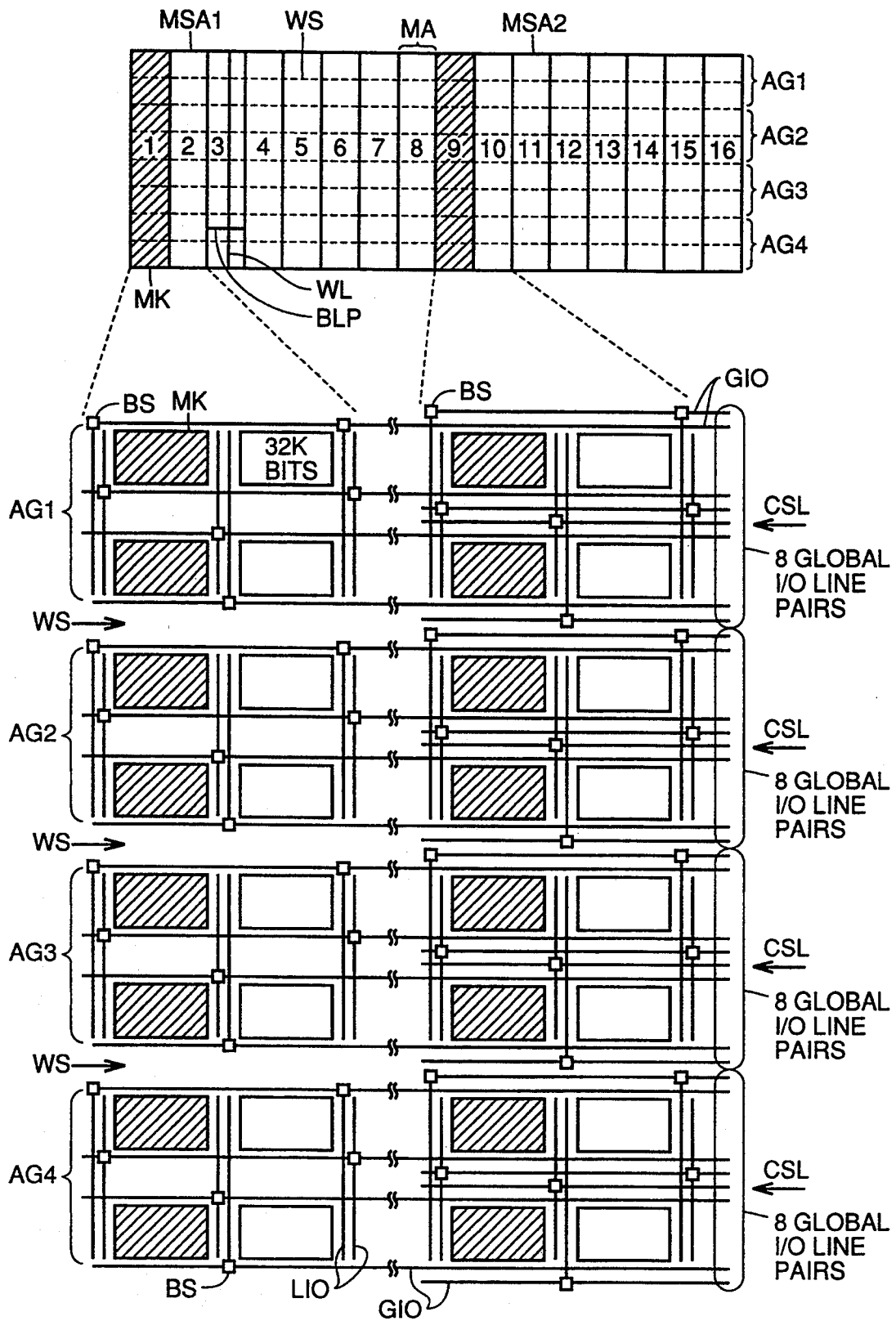
FIG. 7 shows an arrangement in one memory mat shown in FIG. 6.

FIG. 7 specifically shows an arrangement of the I/O line in the SDRAM shown in FIG. 6. In FIG. 7, there are shown two 2-Mbit memory arrays MSA1 and MSA2. The 2-Mbit memory array MSA1 is a 2-Mbit array block remote from the center of the chip, and the 2-Mbit memory array MSA2 is a 2-Mbit array block near the center of the chip.

Each of the 2-Mbit memory arrays MSA1 and MSA2 includes 64 32-Kbit memory arrays MK arranged in 8 rows and 8 columns. Each 2-Mbit memory array MSA ("MSA" generally indicates the memory arrays MSA1 and MSA2) is divided into four array groups AG1, AG2, AG3 and AG4 aligned in the direction of a word lines WL. A word line shunt region WS is interposed between the 32-Kbit memory arrays MK neighboring to each other in the direction of the word line WL. Generally in the DRAM, low resistance metal interconnections, e.g., of aluminum are disposed in parallel to the word lines made of polysilicon for reducing resistances of the word lines WL, and the polysilicon word lines and the low resistance metal interconnections are electrically connected together at positions spaced by predetermined distances. This word line shunt region WS will be described below.

Figure 8:
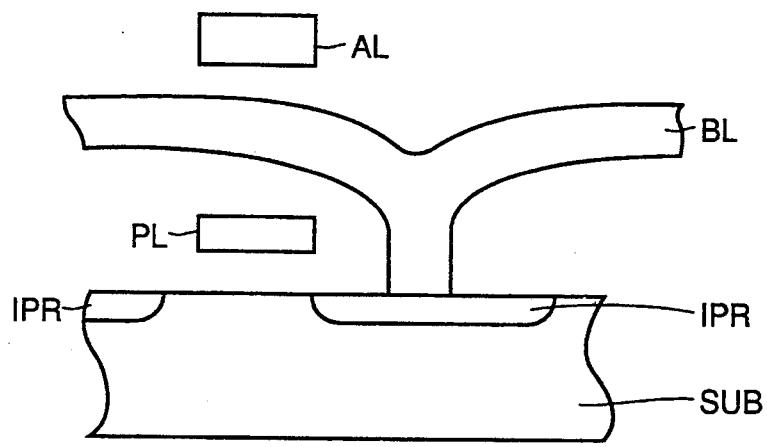
FIG. 8 shows a word line shunt region.

FIG. 8 schematically shows a sectional structure of a transistor forming the memory cell. The access transistor contained in the memory cell includes impurity regions IPR formed on a surface of a semiconductor substrate SUB, and also includes a gate electrode PL made of polysilicon and formed on the impurity region IPR with a gate insulating film therebetween. One of the impurity regions IPR is connected to a bit line BL formed of, e.g., a first layer aluminum interconnection. A low resistance conductive layer AL made of aluminum or the like is disposed on an upper layer above the bit line BL and is contacted with the word line.

Figure 9:
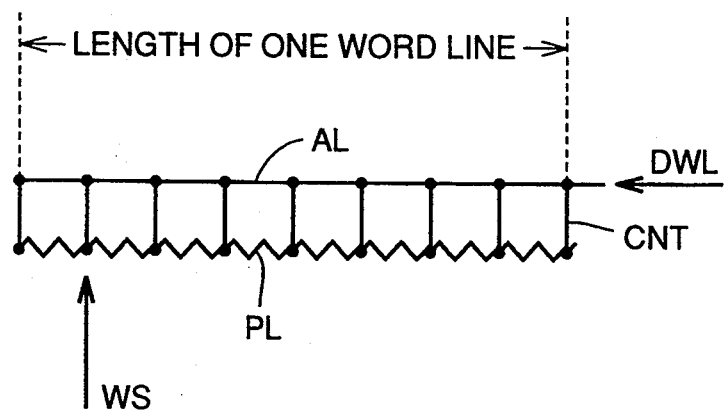
FIG. 9 shows the word line shunt arrangement.

As shown in FIG. 9, the low resistance conductive layer AL and the polysilicon gate electrode (word line) PL are electrically connected together by contacts CNT which are spaced from each other by predetermined distances. A region in which these electrical contacts CNT are disposed is referred to as the word line shunt region WS. A word line drive signal DWL is transmitted to the low resistance conductive layer AL. Therefore, the word line drive signal DWL is transmitted at a high speed up to an end of the word line, so that the potential of the word line can rise rapidly.

In order to form the electrical contacts CNT, it is necessary to connect the polysilicon gate electrode (word line) PL located in the layer under the bit line BL to the low resistance conductive layer AL located in the layer above the bit line BL. For this purpose, the electrical contacts CNT must be disposed in regions in which the bit lines BL do not exist, i.e., in regions in which memory cells do not exist. The regions not including the memory cells exist between the memory arrays MK neighboring in the direction of the word line WL in FIG. 7. In the word line shunt region WS, electrical connections are formed between the polysilicon gate electrode (word line) PL and the low resistance conductive layer AL.

Referring to FIG. 7 again, the global I/O line pairs GIO are disposed in the word line shunt regions WS. In each word line shunt region WS, four global I/O line pairs are disposed in the 2-Mbit memory array region MSA2 near the center of the chip. Among these four global I/O line pairs, two of them extend further through the 2-Mbit memory array region MSA1 remote from the center of the chip. Thus, the word line shunt region WS in the 2-Mbit memory array region MSA1 remote from the center of the chip is provided with the two global I/O line pairs GIO. The two global I/O line pairs are utilized by the 2-Mbit memory arrays MS.

For the transmission of data to and from the selected memory arrays, the local I/O line pairs LIO are provided corresponding to each of the array groups AG1, AG2, AG3 and AG4. For each 32-Kbit memory array MK, there are provided four local I/O line pairs. Specifically, two of the local I/O line pairs LIO are disposed at one side of the 32-Kbit memory array MK and the other two local I/O line pairs LIO are disposed at the other side. Each local I/O line pair LIO is commonly used by the 32-Kbit memory arrays MK which belong to the same array group and neighbor to each other in the direction of the word line WL, and is also used commonly by the 32-Kbit memory arrays MK neighboring to each other in the direction of the bit line BL. The memory arrays MK have the shared sense amplifier configuration of the alternate arrangement type, as will be detailed later. The sense amplifier is disposed in the region between the two 32-Kbit memory arrays MK neighboring to each other in the direction of the bit line BL. The block selecting switches BS are disposed for connecting the global I/O line pairs GIO and the local I/O line pairs LIO. The block selecting switches BS are disposed at the crossings between the word line shunt regions WS and the sense amplifier rows.

One of the column selecting lines CSL transmitting the column selecting signal from the column decoder is selected in each of the array groups AG1–AG4. The selected one column selecting line CSL selects four bit line pairs BLP in the region MSA1 remote from the center of the chip and connects them to the corresponding local I/O line pairs LIO. Also, the selected one column selecting line CSL selects four bit line pairs BLP in the 2-Mbit memory array region MSA2 near the center of the chip and connects them to the corresponding local I/O line pairs LIO. Thus, eight bit line pairs BLP are selected by the one column selecting line CSL, and are connected through the local I/O line pairs LIO to the eight global I/O line pairs GIO. Since two memory mats are selected, and 8×4=32 bit line pairs BLP are selected in one memory mat MM, the selected bit line pairs BLP are 64 in total number, so that the memory cells of 64 bits can be simultaneously accessed as a whole.

Figure 10:
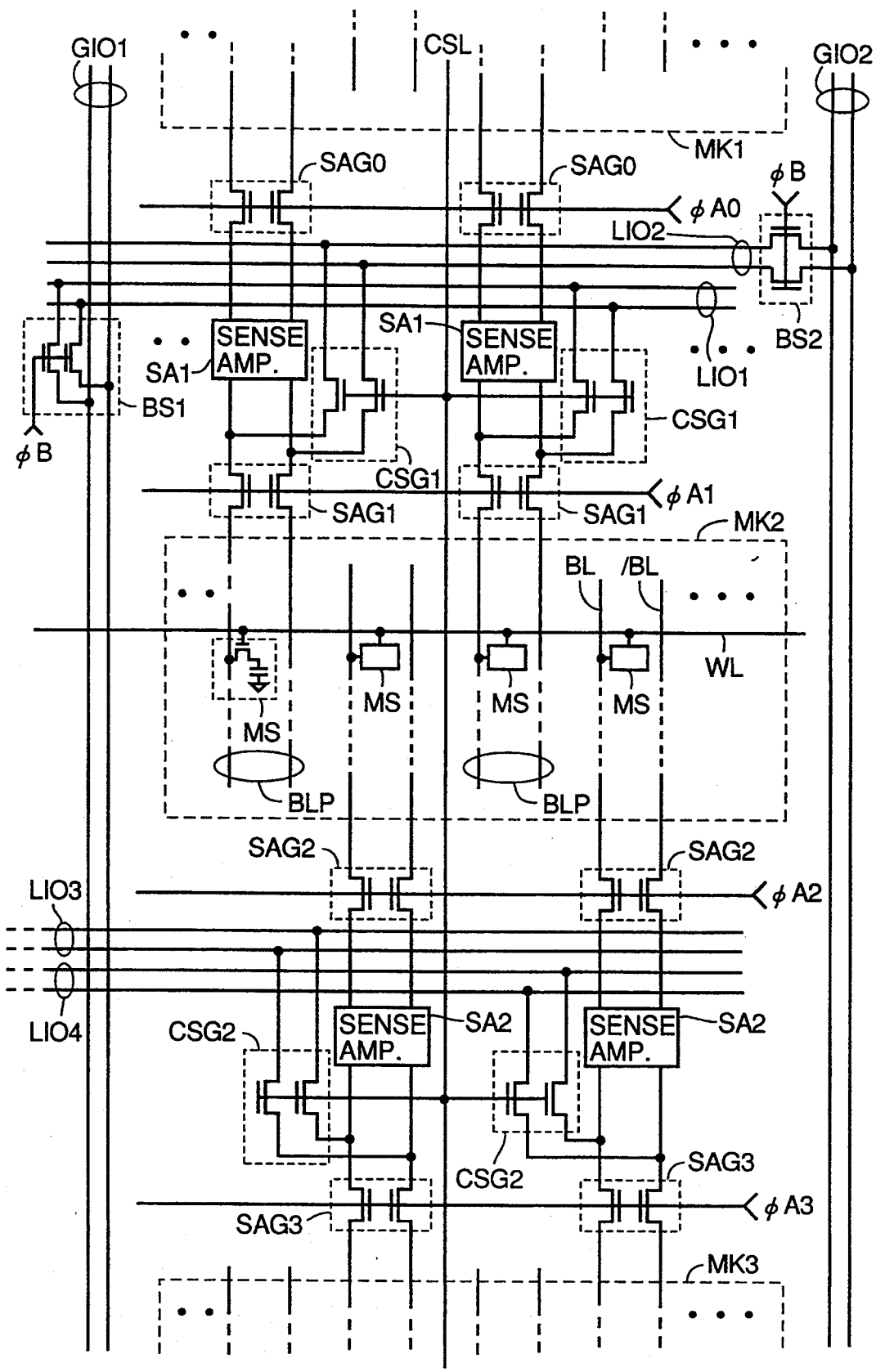
FIG. 10 shows a specific configuration of a memory cell array of the invention.

FIG. 10 shows a configuration of a portion related to one 32-Kbit memory array. In FIG. 10, the memory array MK2 of 32 Kbits includes the word lines WL transmitting the row selecting signal from the row decoder, the bit line pairs BLP crossing the word lines WL, and dynamic memory cells MS arranged corresponding to the crossings of the word lines WL and bit line pairs BLP. Each memory cell MS includes an access transistor and an information storing capacitor. The bit line pair includes bit lines BL and /BL transmitting signals which are complementary to each other. FIG. 10 shows a configuration in which the memory cells MS are provided correspondingly to the crossings of the bit lines BL and the word line WL.

Array selecting gates SAG1 and SAG2 are arranged at opposite sides of the memory array MK2. The array selecting gates SAG1 and SAG2 are disposed alternately to each other with respect to the bit line pairs BLP. The array selecting gate SAG1 becomes conductive in response to an array selecting signal $\phi$A1, and the array selecting gate SAG2 becomes conductive in response to an array selecting signal $\phi$A2.

The bit line pairs BLP are connected to the sense amplifiers SA1 or SA2 through the array selecting gates SAG1 or SAG2, respectively. The sense amplifiers SA1 are disposed at one side of the memory array MK2 and are aligned in parallel to the word line WL. The sense amplifiers SA2 are disposed at the other side of the memory array MK2 and are aligned in parallel to the word line WL. The sense amplifiers SA1 and SA2 are located at opposite sides of the memory array MK2 and are provided at alternate positions of the bit line pairs BLP. The sense amplifiers SA1 are commonly used by the memory arrays MK1 and MK2. The sense amplifiers SA2 are commonly used by the memory arrays MK2 and MK3.

The local I/O line pairs LIO1 and LIO2 are disposed along the row of the sense amplifiers SA1. The local I/O line pairs LIO3 and LIO4 are disposed along the row of the sense amplifiers SA2. FIG. 10 shows an arrangement in which two local I/O line pairs are disposed at one side of each row of the sense amplifiers SA. The local I/O line pairs may be disposed at opposite sides of each row of the sense amplifiers SA.

For the sense amplifiers SA1, there are provided column selecting gates CSG1 for transmitting data sensed and amplified by the sense amplifiers SA1 to the local I/O line pairs LIO1 and LIO2. Similarly, for the sense amplifiers SA2, there are provided column selecting gates CSG2 for transmitting data sensed and amplified by the sense amplifiers SA2 to the local I/O line pairs LIO3 and LIO4. The column selecting line CSL extending from the column decoder simultaneously make the two column selecting gates CSG1 and the two column selecting gates CSG2 conductive. Therefore, four bit line pairs BLP are simultaneously connected to the local I/O line pairs LIO1, LIO2, LIO3 and LIO4. Data sensed and amplified by the sense amplifiers SA1 are transmitted to the local I/O line pairs LIO1 and LIO2. Data sensed and amplified by the sense amplifiers SA2 are transmitted to the local I/O line pairs LIO3 and LIO4.

In order to connect the local I/O line pairs LIO to the global I/O line pairs GIO, there are provided the block selecting switches BS which become conductive in response to a block selecting signal $\phi$B. FIG. 10 shows the block selecting switch BS1 for connecting the local I/O line pair LIO1 to the global I/O line pair GIO1 and the block selecting switch BS2 for connecting the local I/O line pair LIO2 to the global I/O line pair GIO2.

The local I/O line pairs LIO3 and LIO4 are connected to the adjacent two global I/O line pairs GIO through the block selecting switches (shown in FIG. 7 but not shown in FIG. 10), respectively.

An operation will now be described briefly. If the selected word line WL is contained in the memory array MK2, array selecting signals φA1 and φA2 become active, and the bit line pairs BLP contained in the memory array MK2 are connected to the sense amplifiers SA1 and SA2. The array selecting gates SAG0 and SAG3 provided for the memory arrays MK1 and MK3 become nonconductive, and the memory arrays MK1 and MK3 maintain the precharged state.

After the memory cell data appears on each bit line pair BLP, the sense amplifiers SA1 and SA2 are activated to sense and amplify the memory cell data.

When the signal on the column selecting line CSL rises to the active state of "H", the column selecting gates CSG1 and CSG2 become conductive, and the data sensed and amplified by the sense amplifiers SA1 and SA2 is transmitted to the local I/O line pairs LIO1-LIO4.

Subsequently or simultaneously, the block selecting signal φB attains the active state of "H", so that the local I/O line pairs LIO1-LIO4 are connected to the global I/O line pairs GIO1-GIO4, respectively. In the data read operation, the data of the global I/O line pairs is amplified by the preamplifiers PA for output. In the data write operation, write data supplied from the write buffer WB is transmitted through the global I/O line pair GIO and local I/O line pair LIO to each bit line pair BLP, and is written into the memory cell.

The block selecting signal φB becomes active only for the memory array MK2 to which the selected word line WL belongs. The array selecting signals φA1 and φA2 act in a similar manner. The block selecting signal φB as well as the array selecting signals φA1 and φA2 can be produced using a predetermined number of bits (e.g., upper 4 bits) of the row address signal.

As described above, the global I/O line pairs GIO are disposed in the word line shunt regions WS, and the sense amplifiers are disposed to form the shared sense amplifier configuration of the alternate arrangement type. Thereby, interconnection regions for disposing signal lines do not increase even if the memory cells of 64 bits are to be selected simultaneously. The number of the 256K memory arrays to be activated simultaneously is four which is equal to that in the standard 16-Mbit DRAM, so that the current consumption does not increase.

[Embodiment 2]

Figure 11:
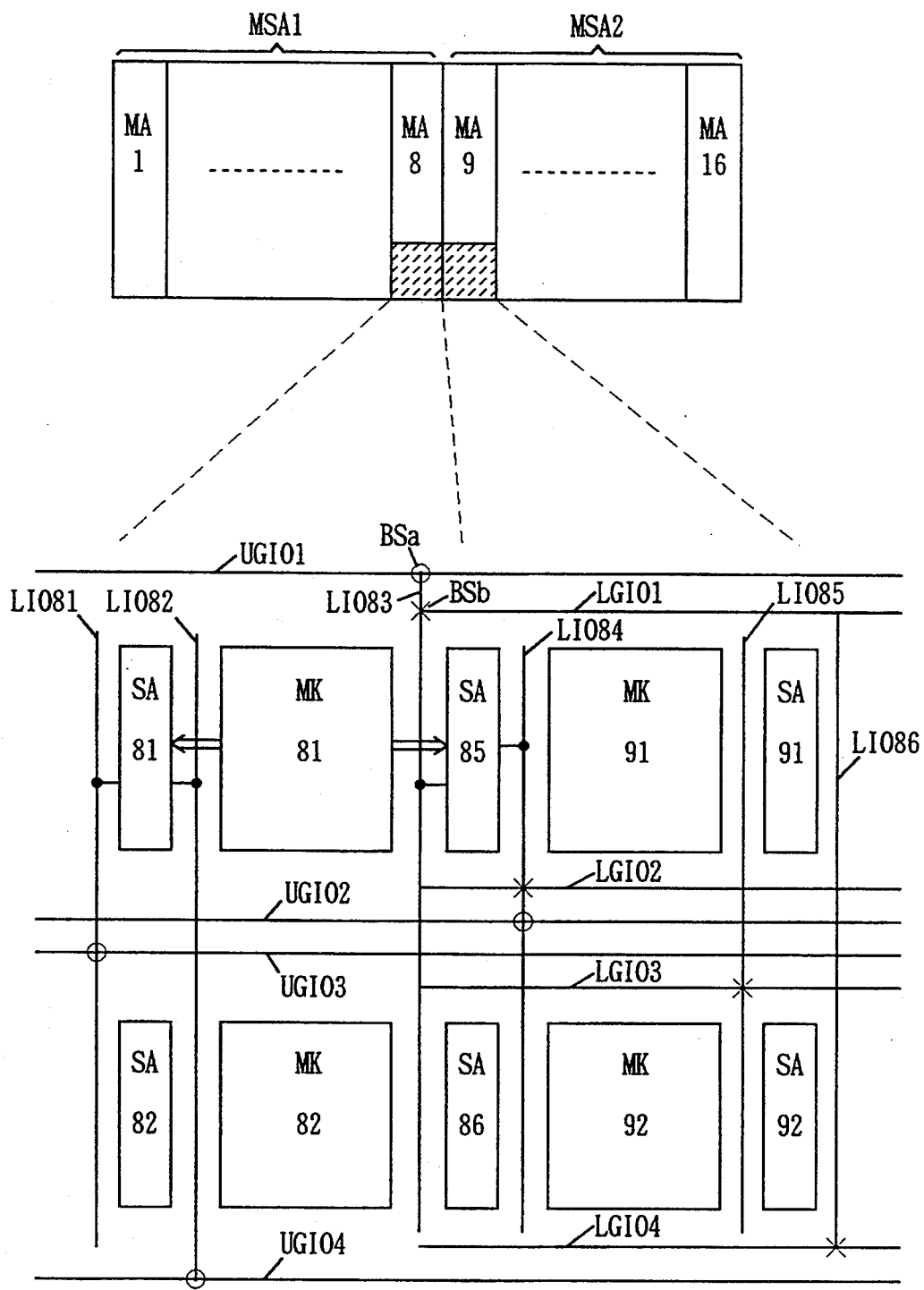
FIG. 11 shows a connection configuration between local I/O lines and global I/O lines in the SDRAM of the invention.

FIG. 11 shows, in an enlarged manner, a configuration of the array part in a boundary region between the memory arrays MSA1 and MSA2 in the 4-Mbit memory mats. FIG. 11 shows 32-Kbit memory arrays MK in the 256-Kbit memory arrays MA8 and MA9.

In FIG. 11, the 256-Kbit memory array MA8 includes 32-Kbit memory arrays MK81 and MK82 as well as sense amplifier groups SA81 and SA82 disposed at one side of the memory arrays MK81 and MK82. The 256-Kbit memory array MA9 includes 32-Kbit memory arrays MK91 and MK92 as well as sense amplifier groups SA91 and SA92 provided correspondingly to the memory arrays MK91 and MK92, respectively. A sense amplifier group SA85 is disposed between the memory arrays MK81 and MK91, and a sense amplifier group SA86 is disposed between the memory arrays MK82 and MK92.

For the memory arrays MK81 and MK82, there are provided global I/O line pairs UGIO1, UGIO2, UGIO3 and UGIO4. For the memory arrays MK91 and MK92, there are provided global I/O line pairs LGIO1, LGIO2, LGIO3 and LGIO4. For the memory arrays MK81 and MK82, there are provided local I/O line pairs LIO81 and LIO82 at one side thereof, and there are also provided local I/O line pairs LIO83 and LIO84 at the other side. Local I/O line pairs LIO85 and LIO86 are provided at the side of the memory arrays MK91 and MK92 opposite to the local I/O line pair LIO83 and LIO84. The local I/O line pairs LIO83 and LIO84 are commonly used by the memory arrays MK81, MK82, MK91 and MK92.

The global I/O line pairs UGIO1-UGIO4 transmit data of the memory cells contained in the memory array MSA1. The global I/O line pairs LGIO1-LGIO4 transmit data of memory cells in the memory array MSA2. In this divided array configuration, one of the 256-Kbit memory arrays is selected in the memory array MSA1, and one of the 256-Kbit memory arrays is selected in the memory array MSA2. In this operation, the 256-Kbit memory arrays MA ("MA" generally indicate MA1—MA16) at the same position in the memory arrays MSA1 and MSA2 are activated simultaneously. When the memory array MA8 is activated, the memory array MA9 is maintained in the precharged state, and the memory array MA16 is activated.

It is assumed that the column in the memory array MK81 is selected. In this case, the memory array MK81 is connected to the sense amplifier groups SA81 and SA85. The memory arrays MK91 and MK92 maintain the precharged state. The memory array MK82 is connected to the sense amplifier groups SA82 and SA86. When the column in the memory array MK81 is selected, the memory array MK81 is connected through the sense amplifier groups SA81 and SA85 to the local I/O line pairs LIO81, LIO82, LIO83 and LIO84. The memory array MK81 is a 32-Kbit memory array contained in the memory array MSA1. In this case, the local I/O line pairs LIO81, LIO82, LIO83 and LIO84 are connected through the block selecting switches BSa to the global I/O line pairs UGIO1-UGIO4, as indicated by circular marks in the figure.

In the case where the memory array MK91 is selected, the memory array MK91 is connected to the global I/O line pairs LGIO1-LGIO4. Thus, in FIG. 11, the local I/O line pairs LIO83, LIO84, LIO85 and LIO86 are connected to the global I/O line pairs LGIO1-LGIO4 through the block selecting switches BSb, as indicated by cross ("x") marks.

Thus, the local I/O line pairs LIO83 and LIO84 are connected to the global I/O line pairs UGIO1 and UGIO2, respectively, when the memory arrays MK81 and MK82 are selected. The local I/O line pairs LIO83 and LIO84 are connected to the global I/O line pairs LGIO1 and LGIO2 when the memory arrays MK91 and MK92 are selected (i.e., activated). Therefore, two block selecting switches are required for the local LIO line pairs LIO83 and LIO84 disposed in a boundary region between the memory arrays MSA1 and MSA2. When the memory array MA8 is selected, the block selecting switches BSa become conductive. When the memory array MA9 is selected, the block selecting switches BSb become conductive. Owing to the above configuration, array activation zones, which correspond to the memory arrays MSA and indicate unit regions during the operation, can correspond to the local I/O line pairs in a one-to-one relationship.

[Embodiment 3]

Figure 12:
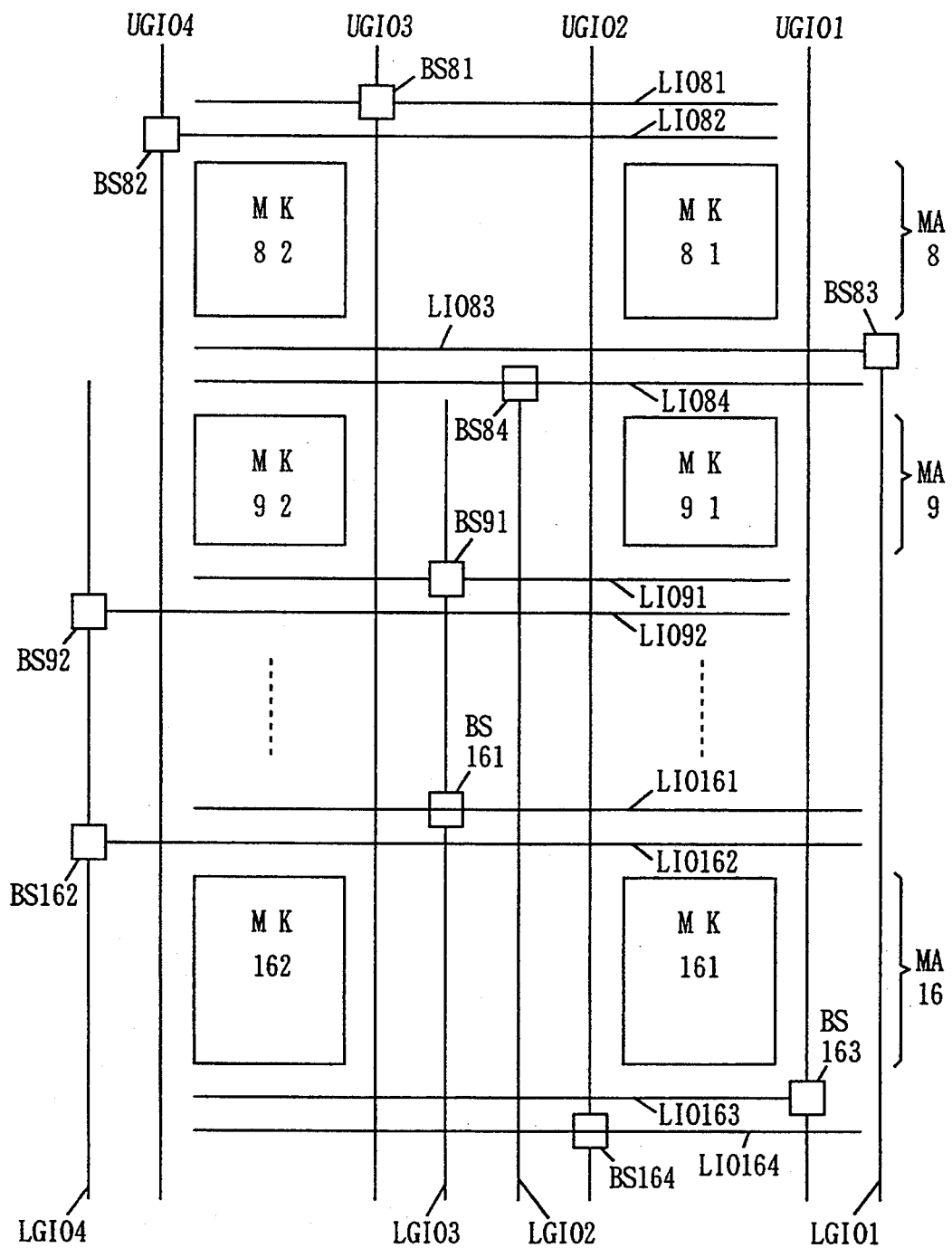
FIG. 12 shows a connection mode between the local I/O lines and global I/O lines in the SDRAM of the invention.

FIG. 12 shows another form of connection of the local I/O lines and global I/O lines shown in FIG. 11. In FIG. 12, parts and portions corresponding to those in FIG. 11 bear the same reference characteristics.

In FIG. 12, the local I/O line pairs LIO81, LIO82, LIO83 and LIO84 are provided for the 32-Kbit memory arrays MK81 and MK82 contained in the memory array MA8, similarly to the configuration in FIG. 11. The local I/O line pairs LIO83, LIO84, LIO91 and LIO92 are provided for the memory arrays MK91 and MK92. Memory arrays MK161 and MK162 are contained in the memory array MA16, and include local I/O line pairs LIO161, LIO162, LIO163 and LIO164.

The local I/O line pairs LIO81 and LIO82 are connected to the global I/O line pairs UGIO3 and UGIO4 through the block selecting switches BS81 and BS82, respectively. The local I/O line pairs LIO83 and LIO84 are connected to the global I/O line pairs LGIO1 and LGIO2 through the block selecting switches BS83 and BS84, respectively. The local I/O line pairs LIO91 and LIO92 are connected to the global I/O line pairs LGIO3 and LGIO4 through the block selecting switches BS91 and BS92. The local I/O line pairs LIO161 and LIO162 are connected to the global I/O line pairs LGIO3 and LGIO4 through the block selecting switches BS161 and BS162, respectively. The local I/O line pairs LIO163 and LIO164 are connected to the global I/O line pairs UGIO1 and UGIO2 through the block selecting switches BS163 and BS164, respectively.

In the operation, the memory array MA16 is selected when the memory array MA8 is selected. Both the memory arrays MA8 and MA9 are never selected simultaneously. When the memory array MK81 is selected, the memory array MK161 is also selected. The memory array MK81 is connected to the global I/O line pairs UGIO3 and UGIO4 through the local I/O line pairs LIO81 and LIO82 and block selecting switches BS81 and BS82, respectively, and is also connected to the global I/O line pairs LGIO1 and LGIO2 through the local I/O line pairs LIO83 and LIO84 and block selecting switches BS83 and BS84. In the operation for reading data from the memory array MK81, the data of selected memory cells of 4 bits in the memory array MK81 are transmitted to the global I/O line pairs LGIO1, LGIO2, UGIO3 and UGIO4.

In the memory array MK161, the local I/O line pairs LIO161 and LIO162 are connected to the global I/O line pairs LGIO3 and LGIO4 through block selecting switches BS161 and BS162, respectively. The local I/O line pairs LIO163 and LIO164 are connected to the global I/O line pairs UGIO1 and UGIO2 through block selecting switches BS163 and BS164, respectively. Thus, in the data read operation, the data of selected memory cells of 4 bits in the memory array MK161 are transmitted to the global I/O line pairs UGIO1, UGIO2, LGIO3 and LGIO4.

In the connection configuration shown in FIG. 12, correspondence between the array activation zones and the global I/O line pairs is not found in the memory arrays MA8 and MA16. In both the memory arrays MA8 and MA16, data are transmitted to the global I/O line pairs belonging to different groups. From the viewpoint of the activation zones, halves (in the case where the sense amplifiers are alternately arranged) of data in the memory arrays MA8 and MA16 are exchanged for each other. From the external viewpoint, it does not have substantial meaning to specify the memory cells to be activated. It is required only to write and read data into and from the memory cells of which addresses are designated.

In the connecting configuration shown in FIG. 12, every local I/O line pair is combined with only one block selecting switch. Therefore, the number of elements in the boundary region between the memory arrays (or activation zones) in the central portion of the memory mat can be reduced, and hence the interconnection area can be reduced. The other memory arrays MA1-MA7 each are connected to the global I/O line pairs UGIO1-UGIO4 when selected. The memory arrays MA9-MA15 each are connected to the global I/O line pairs LGIO1-LGIO4 when selected.

[Embodiment 4]

Figure 13:
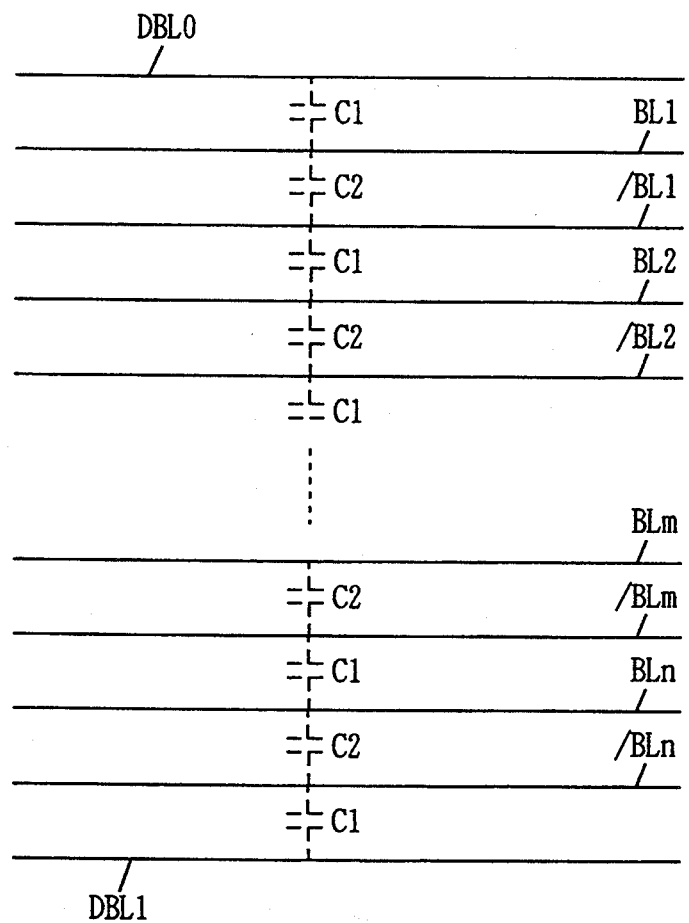
FIG. 13 shows a configuration including dummy bit lines.

FIG. 13 shows a bit line arrangement of a conventional DRAM array. In FIG. 13, there are shown bit line pairs BL1 and /BL1-BLn and /BLn. Each of the bit line pairs BL1 and /BL1-BLn and /BLn is connected to the memory cell, and, in the operation, transmits the data of the corresponding memory cell for sense and amplification by the sense amplifier. Parasitic capacities exist between the adjacent bit lines. Specifically, a parasitic capacity C2 exists between the bit lines of the same pair, and a parasitic capacitance C1 exists between the adjacent bit lines of the different pairs. In the operation, information signal (i.e., read voltage) read onto the bit line is determined by a ratio Cs/Cb1 between a capacity Cs of the memory cell and a capacitance Cb1 of the bit line. The sense amplifier amplifies a potential difference between a reference voltage (precharge voltage) and a read voltage appearing on the bit line during the operation. For accurate sensing operation, it is preferable for each bit line to have a uniform capacitance. If the bit lines had different capacitance, different read voltages would appear, so that accurate sensing operation cannot be performed.

The memory array is further provided with dummy bit lines DBL0 and DBL1 neighboring to the bit lines BL1 and BLn located at opposite ends of the array, respectively. The dummy bit lines DBL0 and DBL1 have the same configuration or capacitance (including the parasitic capacitances by the memory cells) as the bit lines BL1 and /BL1-BLn and /BLn. The dummy bit lines have dummy memory cells arranged in the same fashion as bit lines BL1, /BL1-BLn, /BLn, but are not externally accessed. Owing to the provision of the dummy bit lines DBL0 and DBL1, the parasitic capacitances of the bit lines BL1 and /BLn disposed at the ends of the memory array can be equal to those of the remaining bit lines, so that the read voltage level in the sensing operation can be constant. If the dummy bit line DBL0 were not provided, the parasitic capacitance of the bit line BL1 would be only the parasitic capacitance C2 caused by the adjacent bit line /BL1. Meanwhile, the parasitic capacitance of the bit line /BL1 would be equal to the sum of the capacitance C2 and the parasitic capacitance C1 by the adjacent bit line BL2. Therefore, the capacitance of the bit line BL1 and bit line/BL1 would be different from each other, and thus the level of the read voltage appearing on the bit line BL1 would be different from that appearing on the bit line /BL1 in the read operation, so that an accurate sensing operation would be impossible. The dummy bit lines DBL0 and DBL1 are provided for preventing the above disadvantage.

Figure 14:
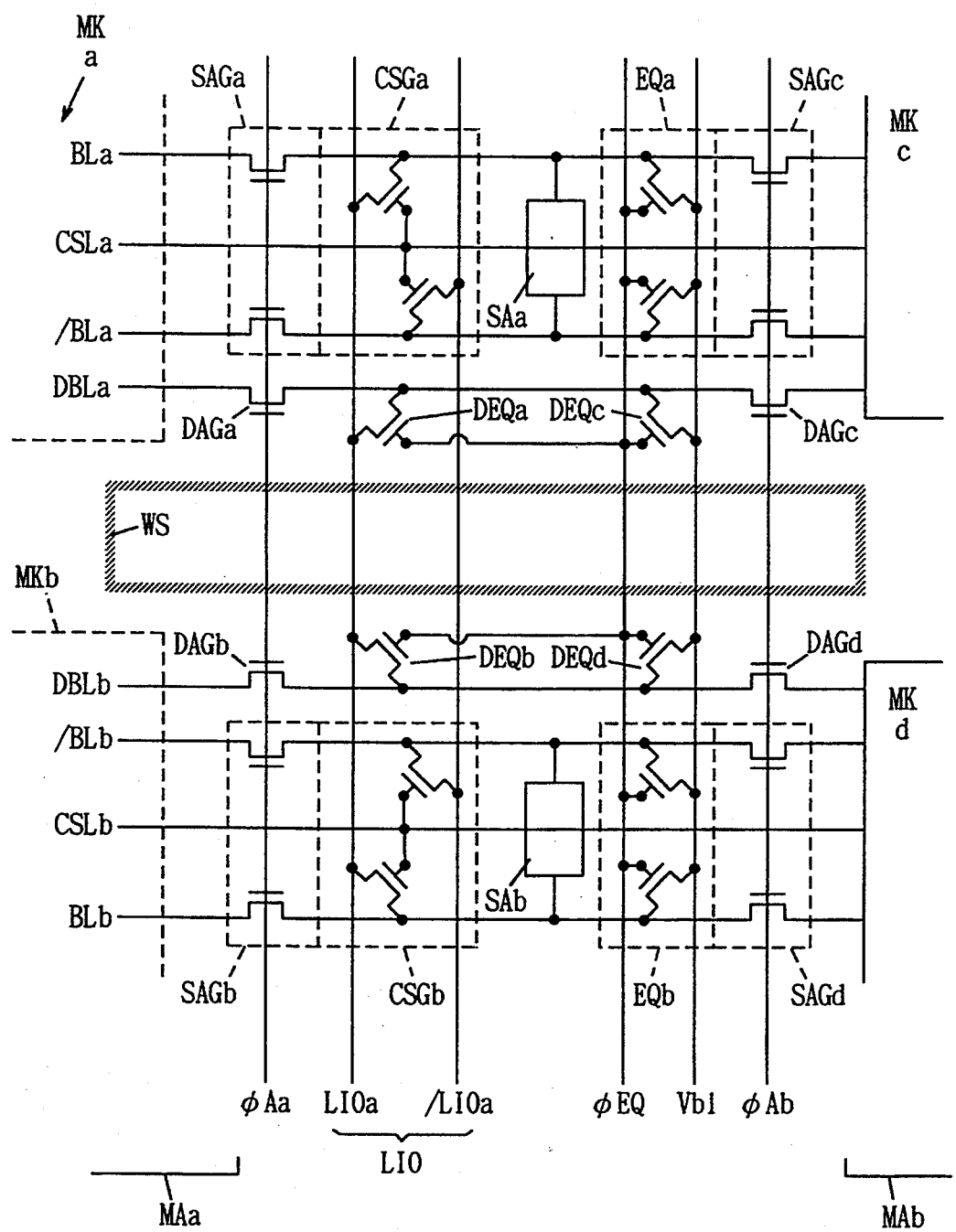
FIG. 14 shows a configuration for precharging the dummy bit lines and local I/O lines in the SDRAM of the invention.

FIG. 14 shows a configuration of an array arrangement of a semiconductor memory device of a fourth embodiment. Specifically, FIG. 14 shows a configuration around the word line shunt region related to 32-Kbit memory arrays MKa, MKb, MKc and Mkd.

The memory array MKa is shown to include a bit line pair BLa and /BLa as well as a dummy bit line DBLa. The memory array MKb is shown to have a bit line pair /BLb and BLb as well as a dummy bit line DBLb.

For the bit line pair BLa and /BLa, there is provided an array selecting gate SAGa which is responsive to an array selecting signal φAa to become conductive and connect the bit line pair BLa and /BLa to a corresponding sense amplifier SAa. Between the array selecting gate SAGa and the sense amplifier SAa, there is provided a column selecting gate CSGa, which is responsive to a signal on the column selecting line CSLa to connect latch nodes (corresponding to the bit lines BLa and /BLa) of the sense amplifier SAa to the local I/O lines LIOa and /LIOa. At the other side of the sense amplifier SAa, there is provided a precharge gate EQa, which is responsive to an equalize signal φEQ to precharge the latch nodes of the sense amplifier SAa to a predetermined potential Vb1 (generally, ½ of the supply voltage Vcc).

For the memory array MKc, there is provided an array selecting gate SAGc, which is responsive to an array selecting signal φAb to connect the corresponding bit line to the latch node of the sense amplifier SAa.

For the dummy bit line DBLa, there is provided an array selecting gates DAGa and DAGc, which are responsive to the array selecting signals φAa and φAb to become conductive, respectively. For the dummy bit line DBLa, there are further provided a precharge gate DEQc, which is responsive to an equalize/precharge signal φEQ to precharge the dummy bit line DBLa to a predetermined potential Vb1, as well as a precharge gate DEQa, which is responsive to the precharge/equalize signal φEQ to connect the dummy bit line DBLa to the local I/O line LIOa.

For the memory array MKb, there are similarly provided an array selecting gate SAGb which is responsive to the array selecting signal φAa to become conducive, a column selecting gate CSGb which is responsive to the signal on the column selecting line CSLb to become conductive and connect the bit lines BLb and /BLb to the local I/O lines LIOa and /LIOa, a sense amplifier SAb which senses and amplifies a potential on the bit lines BLb and /BLb, a precharge gate EQb which is responsive to the equalize/precharge signal φEQ to become conductive and precharge the bit lines BLb and /BLb to a predetermined potential Vb1, and an array selecting gate SAGd which is responsive to the array selecting signal φAb to become conductive.

For the dummy bit line DBLb, there are similarly provided an array selecting gate DAGb which is responsive to the array selecting signal φAa to become conductive, a precharge gate DEQd which is responsive to the precharge/equalize signal φEQ to precharge the dummy bit line DBLb to the predetermined potential Vb1, and a precharge gate DEQb which is responsive to the precharge/equalize signal φEQ to become conductive and connect the dummy bit line DBLb to the local I/O line LIOa.

In the precharged state, both the array selecting signals φAa and φAb are "H". All the array selecting gates SAGa–SAGd are conductive, and the bit line pairs contained in the memory arrays MKa–MKd are connected to the corresponding sense amplifiers SA. At this time, the equalize/precharge signal φEQ is also "H", and the precharge gates EQa and EQb are conductive and precharge all the bit line pairs to the predetermined potential Vb1. Both the precharge gates DEQc and DEQd become conductive in response to the equalize/precharge signal φEQ, so that the dummy bit lines DBLa and DBLb are precharged to the predetermined potential Vb1. Further, the precharge gates DEQa and DEQb become conductive, so that the precharge voltage Vb1 transmitted through the gates DEQc and DEQd is transmitted to the local I/O line LIOa.

In the operation, only the selected arrays are connected to the sense amplifiers and are activated. The unselected memory arrays maintain the precharged state and are isolated from the sense amplifiers if they are to be used commonly by the selected memory arrays.

In the conventional DRAM, the precharge gates DEQa and DEQb always maintain the OFF state. These gates DEQa and DEQb function only to provide the same capacitance as the bit lines (BLa, /BLa, BLb and /BLb) to the dummy bit line. These gates DEQa and DEQb are used for precharging the local I/O lines, whereby the area of the word line shunt region can be reduced. If transistors for precharging the local I/O lines and transistors for equalizing the local I/O lines were provided in the word line shunt region, the area of this region would increase. However, owing to the configuration in which the gates DEQa and DEQb provided for the dummy bit lines DBLa and DBLb are used for precharging the local I/O lines, it is not necessary to provide additional transistors in the row of the sense amplifiers and the word line shunt region, so that the area of the word line shunt region does not increase. Also, it is not necessary to provide signal lines for transmitting control signals used for precharging the local I/O lines, so that the area occupied by the row of sense amplifiers (i.e., a region between the adjacent memory arrays MAa and MAb) can be small.

[Embodiment 5]

Figure 15:
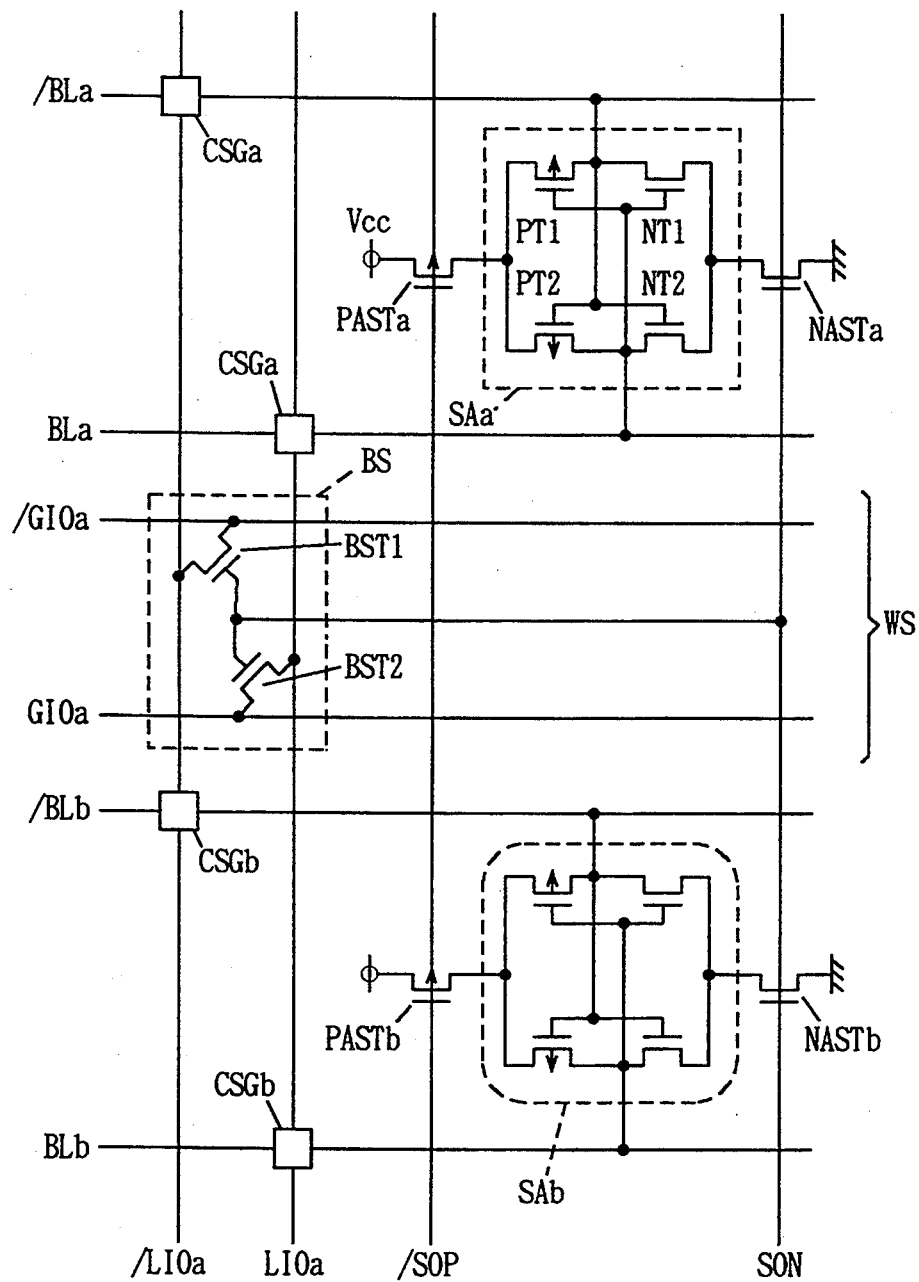
FIG. 15 shows a connection made between the local I/O lines and global I/O lines in the SRAM of the invention.

FIG. 15 shows a configuration of a main part of an array arrangement of a fifth embodiment of the invention. Specifically, FIG. 15 shows a form of connection between the local I/O lines and global I/O lines. In FIG. 15, the bit line pairs BLa and /BLa and the bit line pairs BLb and /BLb are connected to the sense amplifier SAa and SAb, respectively. In FIG. 15, the column selecting gates CSGa and CSGb, which become conductive in response to the column selecting signal, are arranged at the crossings between the bit line BLa, /BLa, BLb and /BLb and the local I/O lines LIOa and /LIOa. The column selecting lines are not shown in FIG. 15. The sense amplifiers SA (SAa and SAb) include p-channel MOS (insulated gate type field effect) transistors PT1 and PT2 having gates and drains cross-coupled and n-channel MOS transistors NT1 and NT2 having gates and drains cross-coupled. The transistors PT1 and NT1 are connected in series, and the transistors PT2 and NT2 are connected in series.

For the sense amplifier SA, there are further provided p-channel MOS transistors PAST (PASTa and PASTb) which are responsive to a sense amplifier activating signal /SOP to be turned on for transmitting the potential at the supply potential Vcc level to the sense amplifiers SA, as well as n-channel MOS transistors NAST (NASTa and NASTb) which are responsive to a sense amplifier activating signal SON to be turned on for transmit a ground potential to the sense amplifiers SA. When the transistor NAST is turned on, one having a lower potential of the corresponding bit lines BL and /BL is discharged to the ground potential level. When the transistor PAST is turned on, one, in the corresponding bit lines BL and /BL, having a higher potential is charged to the supply potential Vcc level. In this semiconductor memory device, the sense amplifier activating signals SON and /SOP are applied only to the selected memory array MA for activating the same. Unselected memory arrays MA do not receive the sense amplifier activating signal and maintain the precharged state. Therefore, the sense amplifier activating signals SON and /SOP can also be considered that they contain information for specifying the activated memory arrays.

The global I/O line pairs GIOa and /GIOa arranged in the word line shunt region WS are connected to the local I/O line pairs LIOa and /LIOa through the block selecting gate BS which becomes conductive in response to the sense amplifier activating signal SON. The block selecting gate BS includes a transistor BST2 connecting the local I/O line LIOa to the global I/O line GIOa and a transistor BST1 connecting the global I/O line/GIOa to the local I/O line/LIOa.

As described before, the sense amplifier drive signal SON is activated only for the selected memory array MA. By utilizing the sense amplifier drive signal as a connection control signal for the connection between the local I/O line and global I/O line, the local I/O line pair LIO related to the selected memory array MA can be connected to the global I/O line pair GIO. It is not necessary to provide a signal line dedicated to the control of connection between the local I/O line pair LIO and global I/O line pair GIO, so that an area occupied by the sense amplifier row can be small.

[Embodiment 6]

Figure 16:
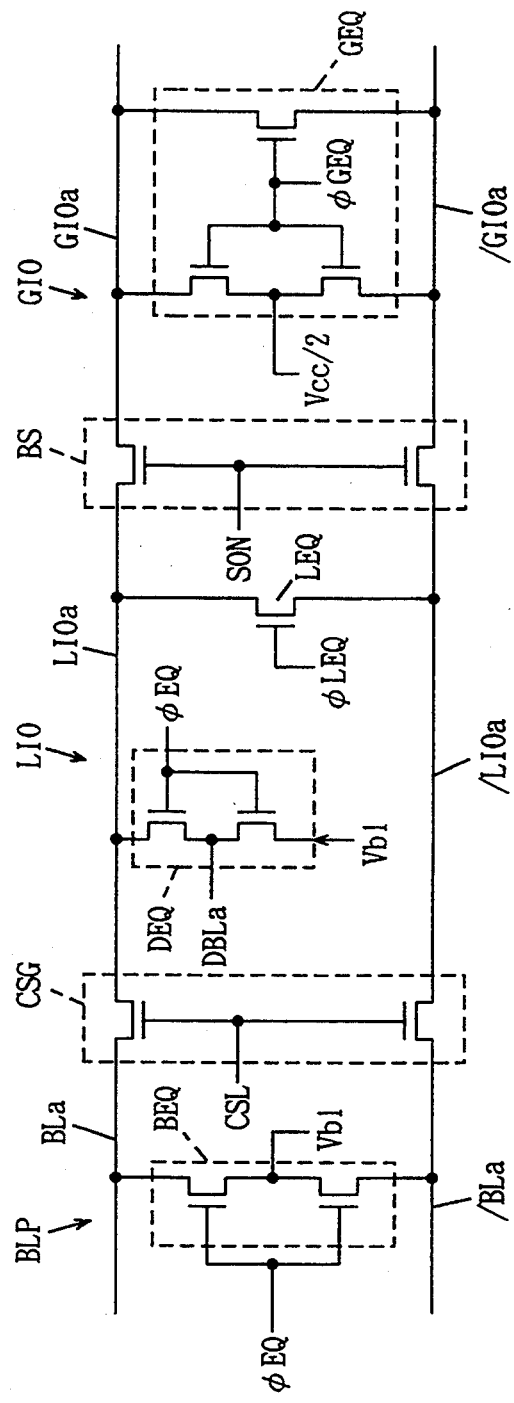
FIG. 16 shows configurations of a bit line pair, a local I/O line pair and a global I/O line pair.

FIG. 16 shows a configuration of connection between the bit lines, local I/O lines and global I/O lines. The configuration shown in FIG. 16 corresponds to combination of the configurations shown in FIGS. 14 and 15.

For the bit line pair BLa and /BLa in FIG. 16, there is provided a precharge circuit BEQ which is responsive to the bit line equalize/precharge signal φEQ to precharge the bit lines BLa and /BLa. The precharge circuit BEQ may include an equalize transistor which electrically connect the bit line BLa and the complementary bit line /BLa together in response to the equalize/precharge signal φEQ. A column selecting gate CSG which becomes conductive in response to the column selecting signal CSL is interposed between the bit lines BLa and /BLa and the local I/O lines LIOa and /LIOa. The local I/O line LIOa is provided with an equalize/precharge circuit DEQ, which is responsive to the bit line equalize/precharge signal φEQ to precharge the dummy bit line DBLa to the predetermined potential Vb1 and transmit the potential on the dummy bit line DBLa onto the local I/O line LIOa. Between the local I/O lines LIOa and /LIOa, there is provided an equalize transistor LEQ which is responsive to the local I/O line equalize signal φLEO to be turned on for electrically connecting the local I/O lines LIOa and /LIOa to each other.

The block selecting gate BS, which is responsive to the sense amplifier activating signal SON to become conductive, is disposed between the local I/O lines LIOa and /LIOa and the global I/O lines GIOa and /GIOa. The global I/O lines GIOa and /GIOa are provided with a global I/O line equalize/precharge circuit GEQ, which is responsive to a global I/O line equalize signal φGEQ to be turned on for precharging and equalizing the global I/O lines GIOa and /GIOa to have half the predetermined potential Vcc (i.e., Vcc/2). Then, an operation of the connection configuration shown in FIG. 16 will be described below with reference to a waveform diagram of FIG. 17.

In a standby state, the signals φEQ, φLEQ and φGEQ are at the "H" level, and the sense amplifier activating signal SON is at the "L" level. In this state, the equalize/precharge circuits BEQ, DEQ and GEO as well as the equalize transistor LEQ are active. All the bit lines BLa and /BLa, local I/O lines LIOa and /LIOa, and global I/O lines GIOa and /GIOa have been precharged to the predetermined potential Vb1 (=Vcc/2). At this time, the dummy bit line DBLa has been precharged by the equalize/precharge circuit DEQ to the predetermined potential Vb1.

In the operation, the signals φEQ, φLEQ and φGEQ first fall to "L", the precharge/equalize circuits BEQ, DEQ and GEQ are deactivated, and the equalize transistor LEQ is turned off. Thereby, the bit lines BLa and /BLa, local I/O lines LIOa and /LIOa, and global I/O lines GIOa and /GIOa are set at the precharge potential and maintain the floating state.

Figure 17:
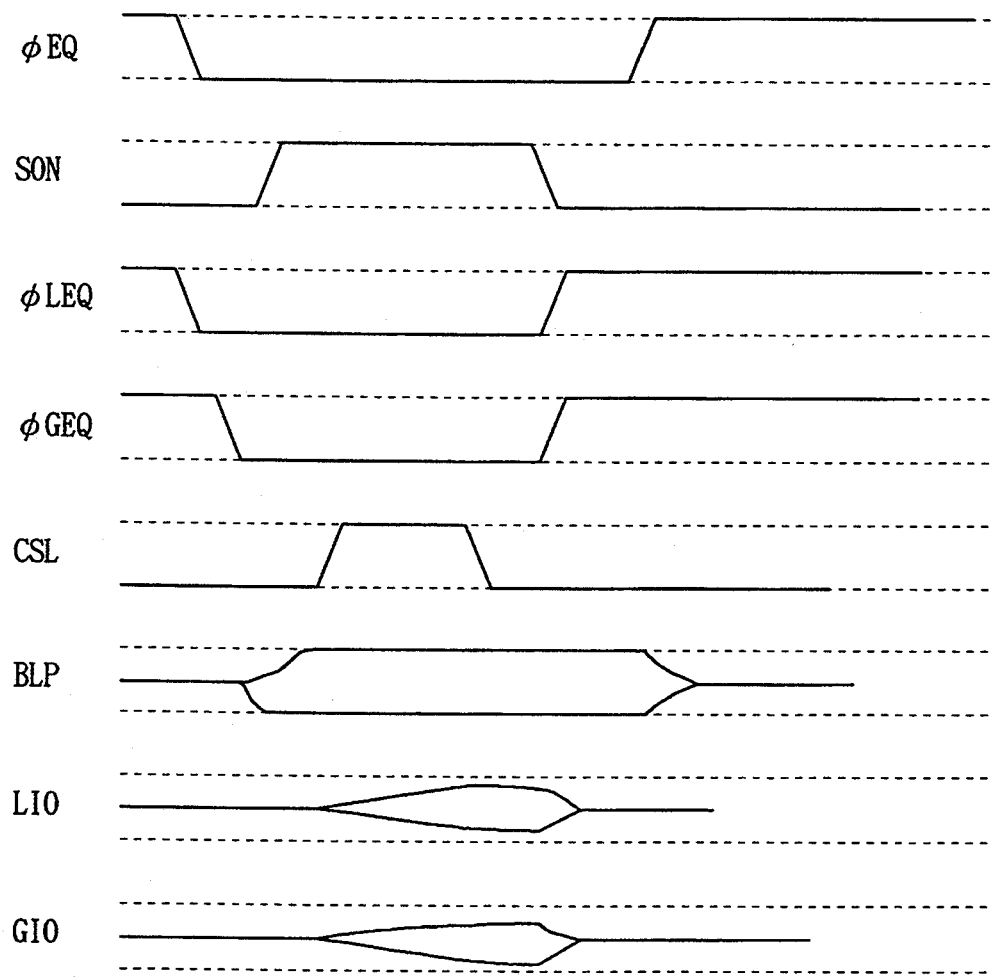
FIG. 17 shows changes in signals in the configurations shown in FIG. 16.

Then, the word line is selected, and the potential thereof increases. In accordance with the increase of the word line potential, the data in the memory cell is read through the corresponding bit line. FIG. 17 shows, as an example, change of the potential of the bit line pair BLP when data of "0" is read through the bit line pair BLP. When a potential difference on the bit line pair sufficiently increases, the sense amplifier drive activating signals SON and /SOP are generated. FIG. 17 shows only the sense amplifier drive activating signal SON. In response to the sense amplifier activating signal SON, the sensing operation is carried out in the selected memory array, and the potential difference on the bit lines further increases.

Also at this time, the block selecting gate BS becomes conductive in response to the sense amplifier activating signal SON, and connects the local I/O lines LIO to the global I/O line pair GIO.

Then, in accordance with the column selecting operation, the potential of the column selecting line CSL rises to "H", and the column line gate CSG becomes conductive. Thereby, the signal on the selected bit line pair BLP is transmitted onto the local I/O line pair LIO (LIOa and /LIOa). In FIG. 17, a potential amplitude of the local I/O line pair LIO is set smaller than that of the bit line pair BL, because it is necessary for the sense amplifier associated to the bit line pair to drive both the global I/O line pair GIO and local I/O line pair LIO, and the global I/O line pair is provided with a clamp transistor (not shown).

When the local I/O line pair LIO receives the signal potential, the block selecting gate BS is already conductive, so that the potential is immediately transmitted to the global I/O line pair GIO. In this state, data is read through a preamplifier (not shown), or write data supplied from the write buffer is transmitted through the global I/O line pair, local I/O line pair and bit line pair BL for writing the data.

In this manner, the local I/O line pair LIO is precharged utilizing the dummy bit lines, and the state of the block selecting gate is controlled utilizing the sense amplifier activating signal, whereby the number of signal lines for transmitting the control signals can be reduced, and the number of transistors for the precharging operation can be reduced. Consequently, the area for the sense amplifier row and/or word line shunt region does not increase, and the chip area can be small.

[Specific Configuration of a 32-Kbit Array]

Figure 18:
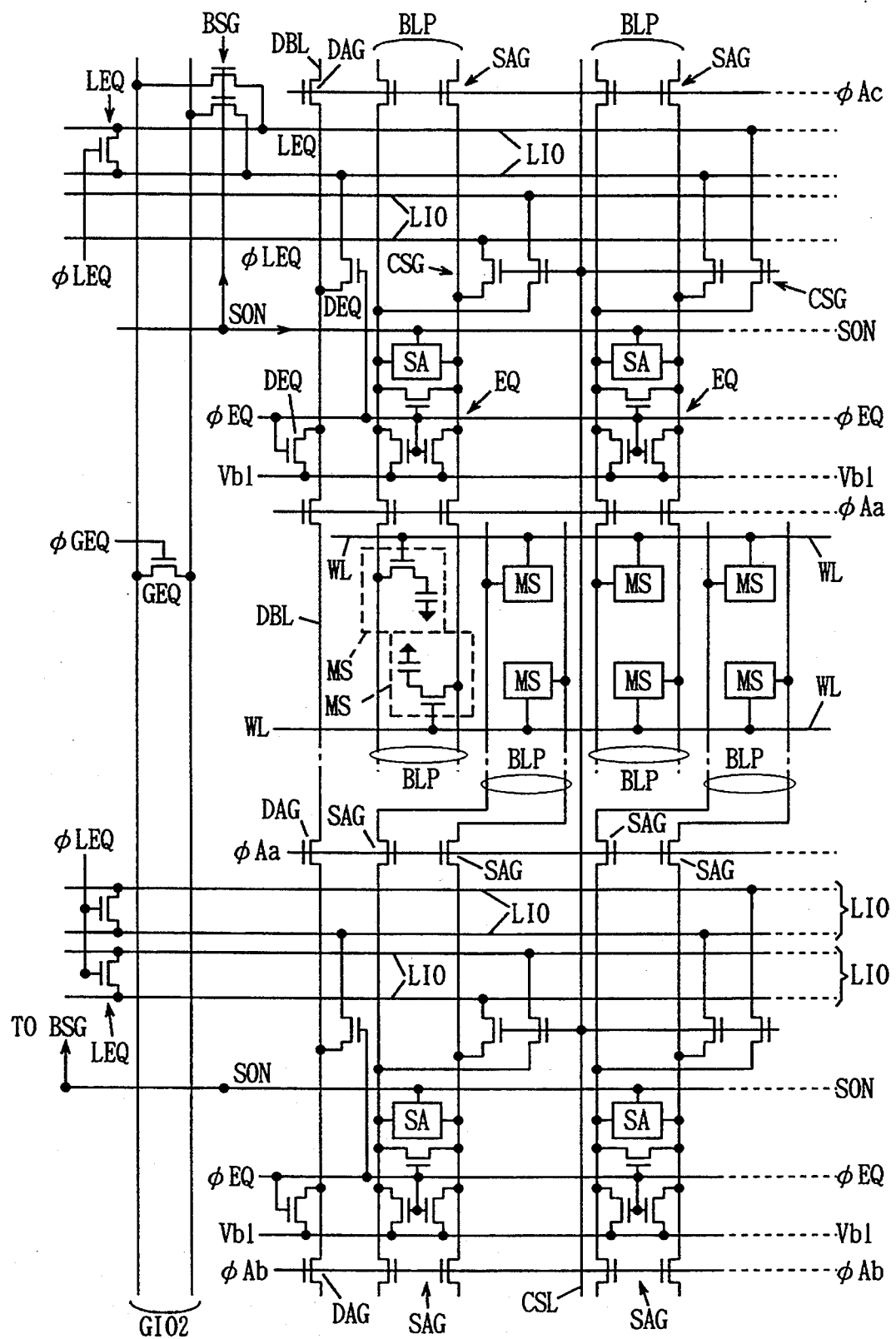
FIG. 18 shows a specific configuration of an array in the SDRAM of the invention.
Figure 19:
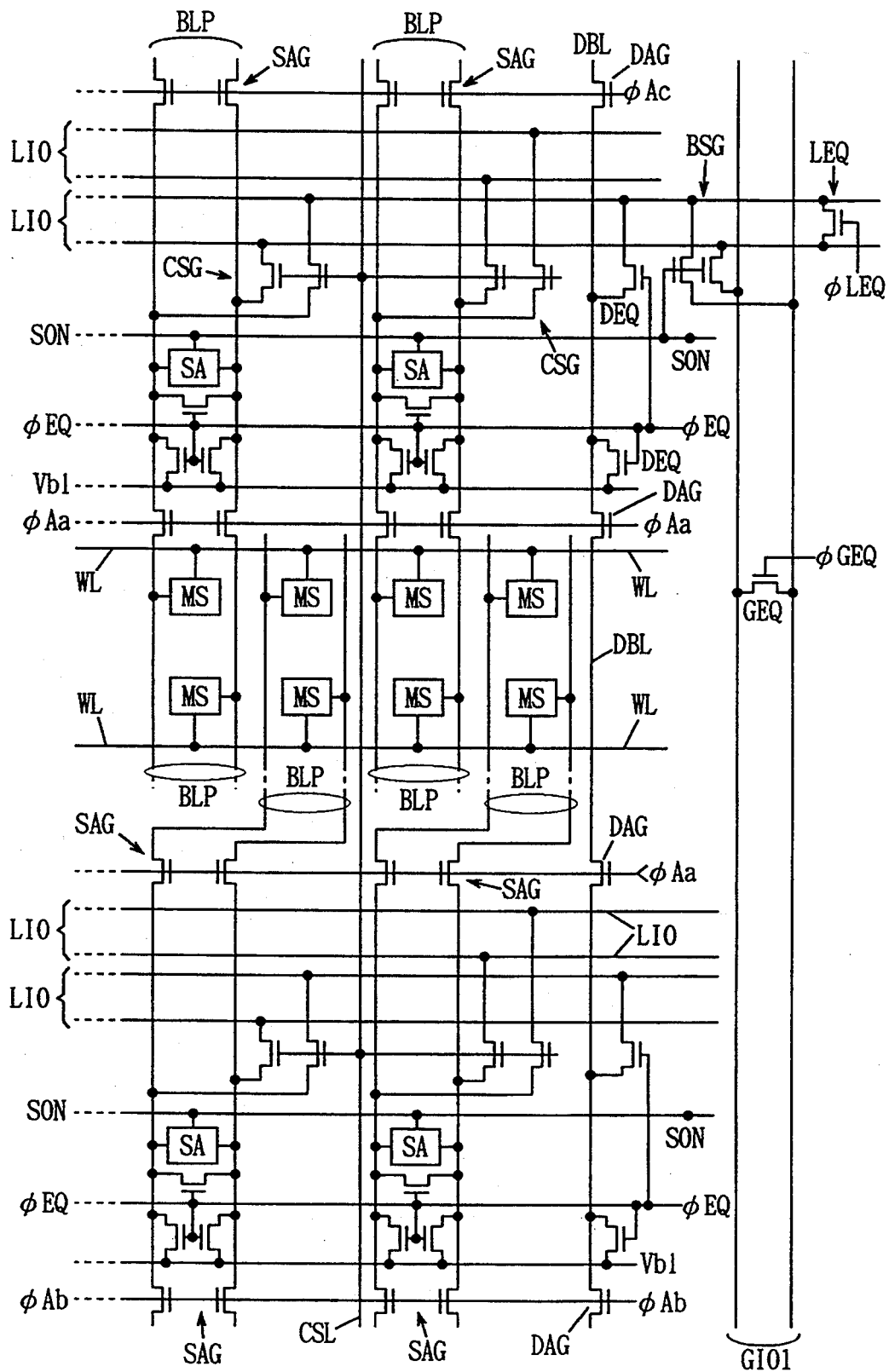
FIG. 19 shows a specific configuration of an array in the SDRAM of the invention.

FIGS. 18 and 19 show a specific configuration of a part corresponding to one 32-Kbit memory array. FIGS. 18 and 19 show two global I/O line pairs GIO1 and GIO2. The other two global I/O line pairs are not shown in FIGS. 18 and 19 because they are connected at positions of the adjacent memory arrays to the local I/O line pairs. In connection with elements for equalizing and precharging the global I/O line pairs, there are representatively shown only transistors for equalizing them. In the FIGS. 18 and 19, two local I/O line pairs shown at the upper portions are connected to the global I/O line pairs GIO1 and GIO2. The two local I/O line pairs LIO shown at the lower portions of the figures are connected at unillustrated portions to the global I/O line pairs (not shown).

The arrangement in FIGS. 18 and 19 differs in the following configurations from that shown in FIG. 10. The block selecting gate BSG for connecting the local I/O line pair and the global I/O line pair becomes conductive in response to the sense amplifier activating signal SON. The number of control signals used in this configuration is smaller than that in the configuration shown in FIG. 10. More specifically, the block selecting signal $\phi B$ (see FIG. 10) is replaced with the sense amplifier activating signal. The local I/O line pair LIO utilizes, as the precharge transistor for precharging the same to a predetermined potential, the transistor DEQ which is provided in the dummy bit line DBL. The areas of the word line shunt region and a region for arranging the sense amplifier row can be reduced.

In the operation, which is similar to the operation already described, when the memory array is selected, the array selecting signal $\phi Aa$ maintains "H" and the remaining array selecting signals $\phi Ab$ and $\phi Ac$ fall to "L". In the unselected memory arrays, the array selecting signals maintain "H" and thus they maintain the precharged state. Only the unselected memory arrays related to the selected memory arrays are isolated from the sense amplifiers. Thereafter, the upper and lower sense amplifiers SA perform the sensing operation, and the local I/O line pair and global I/O line pair are connected in response to the sense amplifier activating signal SON. This operation performed in the SDRAM is also performed similarly in the standard DRAM (only in connection with the array sensing and the sensing operation of the memory cells). Therefore, the standard DRAM can also employ the configuration of this embodiment for connecting the local I/O line pairs and the global I/O line pairs as well as connecting and precharging the bit line pairs and the local I/O line pairs.

[Correspondence between the Global I/O Lines and the Data I/O Terminals]

One column selecting line CSL selects eight bit line pairs BLP, and four column selecting lines CSL are selected in one memory mat. Since two memory mats are simultaneously activated, the memory cells of 64 bits, in total, can be accessed by one address designation.

Figure 20:
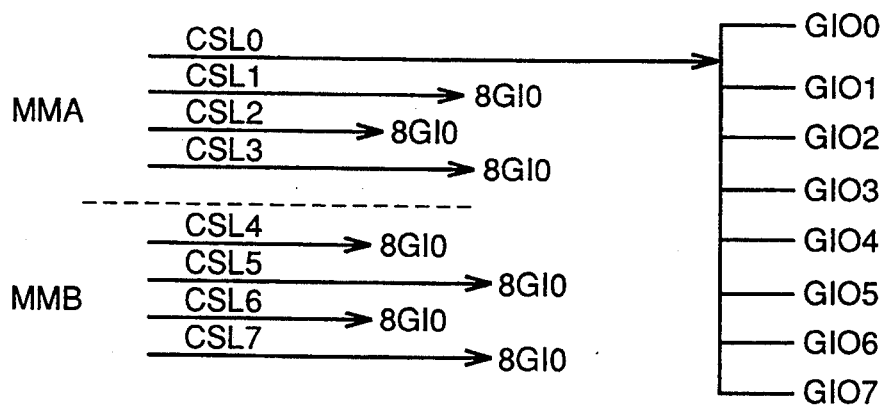
FIG. 20 shows correspondence between one column selecting line and global I/O line pairs in the SDRAM of the invention.

As shown in FIG. 20, one column selecting line CSL corresponds to eight global I/O line pairs. In one memory mat MM, one column selecting line CSL is selected in each array group AG. Eight pairs of global I/O lines GIO0-GIO7 are disposed for one array group AG (FIG. 7). Two memory mats MMA and MMB are simultaneously selected. Therefore, 64 global I/O line pairs GIO, in total, are in the accessible state. These 64 global I/O line pairs, i.e., memory cells of 64 bits may be correlated with the data I/O terminals DQ in various manner. The correlation between the data I/O terminals DQ and the memory cells of 64 bits will be briefly described below.

(1) Manner 1

The data I/O terminals DQ are eight in number and "DQ0"-"DQ7" are assigned thereto, respectively. In this manner 1, eight pairs of the global I/O lines GIO0-GIO7 corresponding to one column selecting line CSL are correlated with the eight data I/O terminals DQ0-DQ7. This correspondence is shown in FIG. 21.

Figure 21:
FIG. 21 shows correspondence between data I/O terminals and global I/O lines related to one column selecting line.

In the correlation shown in FIG. 21, one column selecting line CSL can simultaneously correlate the global I/O line pairs with the data I/O terminals DQ0-DQ7. According to this, the internal configuration can be easily changed even if the wrap length (i.e., the number of successively accessible data) changes. More specifically, if the wrap length is 8, eight column selecting lines CSL are simultaneously selected, whereby eight consecutive data can be successively and sequentially correlated with the column selecting lines. A case where the wrap length is 4 can be dealt with by simultaneously selecting four column selecting lines.

The configuration, in which the number of the column selecting lines to be selected is changed in accordance with the change of the wrap length, can be achieved by in such a manner that the number of unit decoder circuits to be simultaneously selected in the column decoder is changed using the wrap length determining information and one bit of the column address bits applied to the column decoder. More specifically, a column address of 1 bit may applied as an activating signal to the column decoder part provided corresponding to each memory mat or each array group in accordance with the wrap length determining information, whereby the number of column selecting lines to be selected simultaneously can be changed in accordance with the wrap length. Also in this case, the preamplifiers PA or write buffers WB may be sequentially switched for the respective array groups in synchronization with the clock signal, which enables successive data writing and reading.

(2) Manner 2

Figure 22:
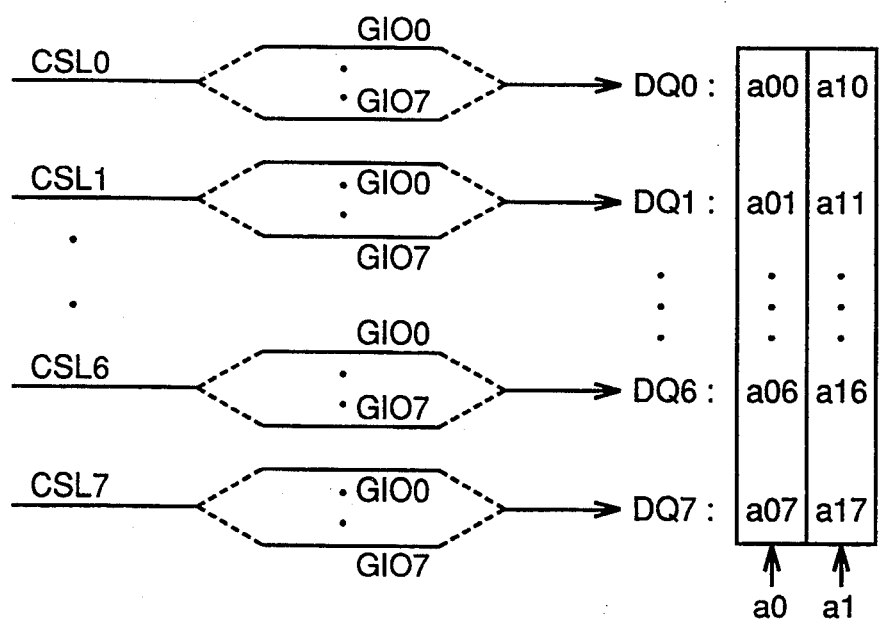
FIG. 22 shows another example of correspondence between global I/O line pairs and data I/O terminals.

In the manner 2, as shown in FIG. 22, one column selecting line CSL is correlated with one data I/O terminal DQ. More specifically, in the case of the wrap length of 8, the global I/O line pairs GIO0-GIO7 are correlated with the wrap data of 8 bits related to one data I/O terminal, respectively.

In this configuration, the preamplifiers PA or write buffers WB are sequentially activated in one array group.

As shown in FIG. 22, if one column selecting line is correlated with one data I/O terminal DQ, an operation such as a write-per-bit operation can be easily achieved. In the write-per-bit operation, data I/O terminals DQ0–DQ7 are individually and independently prohibited from data writing. In this case, such a method can be utilized that the column selecting line CSL corresponding to the data I/O terminal DQ of which data writing is prohibited is set in the unselected state.

[Bank Configuration]

In the SDRAM, the memory array is divided into a plurality of banks. It is required for the banks to independently execute the precharging operation and the activating operation (e.g., selection of a word line and activation of the sense amplifiers). In the arrangement shown in FIG. 6, the memory mats MM1–MM4 are grouped into two banks #1 and #2. The bank #1 is formed of the memory mats MM1 and MM2, and the bank #2 is formed of the memory mats MM3 and MM4.

In this configuration, the row decoders and column decoders are provided corresponding to the memory mats, and the internal data transmitting lines for the respective memory mats are independent from each other, so that conditions of the banks are satisfied.

Further in the configuration of FIG. 6, the I/O circuits PW including the preamplifiers PA and write buffers WB are provided corresponding to the respective memory mats. Therefore, an interleaving operation in which the banks #1 and #2 are alternately accessed can be achieved.

More specifically, while the bank #1 is being accessed, the bank #2 can be precharged. In this case, the bank #2 can be accessed without requiring an additional precharging time. By alternately accessing and precharging the banks #1 and #2, a time loss caused by the precharging operation, which is required prior to the access in the DRAM, can be eliminated, so that the high-speed access can be achieved.

In the standard DRAM, x8-configuration and x4-configuration are selected in the DRAMs formed of the same chips by utilizing the wire bonding in many cases. The internal circuitry is generally constructed to operate as the x8-configuration, and the internal configuration is changed into the x4-configuration by connecting a particular pad to the supply potential Vcc or ground potential Vss. In this case, such a configuration may be employed that only the data bus of 4 bits in the internal data transmitting bus of 8 bits is selectively connected to the data I/O terminal utilizing the potential setting carried out by the wire bonding of a particular pad. Generally, if the circuitry is changed into the x4-configuration, the manner of activating the memory arrays is changed to correspond to the x4-configuration.

[Functional Configuration of SDRAM]

FIG. 1 is a block diagram functionally showing a configuration of a main part of the SDRAM according to the invention. FIG. 1 shows a functional configuration related to an I/O buffer of 1 bit in the SDRAM of the x8-bit configuration.

The array part related to the data I/O terminal DQi includes a memory array 1a forming the bank #1 and a memory array 1b forming the bank #2.

For the memory array 1a of the bank #1, there are provided an X-decoder group 2a forming row decoders which decode address signals X0–Xj to select corresponding rows in the memory array 1a, a Y-decoder group 4a forming column decoders which decode address signals Y3–Yk to generate column selecting signals for selecting corresponding columns in the memory array 1a, and a sense amplifier group 6a which senses and amplifies data of the memory cells connected to the selected row in the memory array 1a.

The X-decoder group 2a includes X-decoders which are provided corresponding to the word lines in the memory array, respectively. In accordance with the address signals X0–Xj, the corresponding X-decoder is selected and thereby selects the corresponding word line. The Y-decoder group 4a includes Y-decoders provided corresponding to the column selecting lines. One column selecting line CSL selects eight pairs of bit lines. The X-decoder group 2a and Y-decoder group 4a simultaneously select the memory cells of 8 bits in the memory array 1a. The X-decoder group 2a and Y-decoder group 4a each are activated by the bank designating signal B1.

For the bank #1, there is further provided the bus GIO of the internal data transmitting lines (global I/O lines) which transmit the data sensed and amplified by the sense amplifier group 6a and transmit the write data to the selected memory cells in the memory array 1a. The global I/O line bus GIO includes eight pairs of global I/O lines.

For reading data, there are provided a preamplifier group 8a which is activated to amplify the data on the global I/O line bus GIO in response to a preamplifier activating signal $\phi$PA1, a read register 10a storing data amplified by the preamplifier group 8a, and an output buffer 12a sequentially outputting data stored in the read register 10a. The preamplifier group 8, read register 10a and output buffer 12a have configurations of 8-bit width corresponding to the global I/O line pairs of 8 bits. The read register 10a is responsive to a register activating signal $\phi$Rr1 to latch output data of the preamplifier group 8a and sequentially output the same. The output buffer 12a is responsive to an output enable signal $\phi$OE1 to transmit sequentially the data of 8 bits stored in the read register 10a to the data I/O terminal DQi. The data I/O terminal DQi commonly performs the input and output of data.

For writing data, there are provided an input buffer 18a of 1-bit width which is responsive to an input buffer activating signal $\phi$DB1 to be activated and produce write data from input data applied to the data I/O terminal DQi, a write register 16a which is responsive to a register activating signal $\phi$Rw 1 to be activated and sequentially store write data coming from the input buffer 18a, and a write buffer group 14a which is responsive to a write buffer activating signal $\phi$WB1 to be activated and amplify the data stored in the write register 16a for transmitting the same to the global I/O line pair GIO. The write buffer group 14a and write register 16a each have an 8-bit width.

Similarly, the bank #2 includes an X-decoder group 2b, a Y-decoder group 4b, a sense amplifier group 6b a which is activated in response to a sense amplifier activating signal $\phi$SA2, a preamplifier group 8b which is activated in response to a preamplifier activating signal $\phi$PA2, a read register 10b which is activated in response to a register activating signal $\phi$Rr2, an output buffer 12b which is activated in response to an output enable signal $\phi$OE2, a write buffer group 14b which is activated in response to a buffer activating signal $\phi$WB2, a write register 16b which is activated in response to a register activating signal $\phi$Rw2, and an input buffer 18b which is activated in response to a buffer activating signal $\phi$DB2.

The structures for the bank #2 are the same as those for the bank #1. The read registers 10a and 10b as well as write registers 16a and 16b serve as registers storing wrap data for the successive access.

Control signals for the banks #1 and #2 are generated in such a manner that control signals for only one of the banks are generated in response to the bank designating signal B1 or B2.

In a form corresponding to the chip arrangement in FIG. 6, the read registers 10a and 10b, write registers 16a and 16b, input buffers 18a and 18b and output buffers 12a and 12b are arranged in the peripheral circuit PH. The preamplifier groups 8a and 8b as well as the write buffer groups 14a and 14b are arranged in the I/O circuit PW.

A function block 200 thus constructed is provided for each data I/O terminal. In the case of x8-bit configuration, there are provided eight function blocks 200.

As described above, the banks #1 and bank #2 have similar configurations, and only one of them is activated by the bank designating signals B1 or B2. Therefore, the banks #1 and #2 can operate substantially independently from each other. Further, the registers 10a and 10b for reading data and the registers 16a and 16b for writing data, which are independent from each other, are provided for the banks #1 and #2, respectively, so that conflict of data can be prevented when switching the reading and writing operations and switching the banks. Therefore, read and write operations can be executed accurately.

A control system, which independently activates the memory arrays in the banks #1 and #2, includes a first control signal generating circuit 20 and a second control signal generating circuit 22. The first control signal generating circuit 20 takes in the externally applied control signals such as external row address strobe signal ext./RAS, external column address strobe signal ext./CAS, external output enable signal ext./OE, external write enable signal ext./WE and mask instructing signal WM in synchronization with the system clock, i.e., the external clock signal CLK, and generates internal control signals $\phi$xa, $\phi$ya, $\phi$W, $\phi$O, $\phi$R and $\phi$C. The second control signal generating circuit 22 is responsive to the bank designating signals B1 and B2, internal control signals $\phi$W, $\phi$O, $\phi$R and $\phi$C and clock signal CLK to generate control signals for independently driving the banks #1 and #2, i.e., sense amplifier activating signals $\phi$SA1 and $\phi$SA2, preamplifier activating signals $\phi$PA1 and $\phi$PA2, write buffer activating signals $\phi$WB1 and $\phi$WB2, input buffer activating signals $\phi$DB1 and $\phi$DB2 and output buffer activating signals $\phi$OE1 and $\phi$OE2.

The internal control signal $\phi$W is an internal write enable signal which is generated in synchronization with the external write enable signal ext./WE. The internal control signal $\phi$O is an internal read enable signal which is generated in synchronization with the external read enable signal ext./OE. The internal control signal $\phi$R is an internal row address strobe signal (internal RAS signal) which is generated in synchronization with the external row address strobe signal ext.-/RAS. The internal control signal $\phi$C is an internal column address strobe signal (internal CAS signal) which is generated in synchronization with the external column address strobe signal ext./CAS. The internal control signals $\phi$xa and $\phi$ya are internal address buffer activating signals which are generated in synchronization with the external control signals ext./RAS and ext./CAS, respectively.

The second control signal generating circuit 22 activates only the control signals corresponding to the designated bank in accordance with the bank designating signals B1 and B2. The clock signal CLK controls the timing at which the second control signal generating circuit 22 generates the control signals. For example, the read enable signal $\phi$OE1 or $\phi$OE2 is generated when six clock signals CLK are counted after the activation of the external row address strobe signal ext.-/RAS (or internal row address strobe signal $\phi$R). Also the write buffer activating signal $\phi$WB1 or $\phi$WB2 is generated in response to the clock signal after application of eight write data. Thus, write data are transmitted to the selected memory cells in the memory array when eight clocks CLK are counted after the activation of the external write enable signal ext./WE. This is based on the assumption that the wrap length is 8, and, in the normal operation mode, the SDRAM always operates based on the assumption that the wrap length is 8.

The SDRAM further includes, as its peripheral circuits, an X-address buffer 24 which is responsive to the internal control signal $\phi$xa to introduce external address signals ext.A0–ext.Ai and generate internal address signals X0–Xj and bank selecting signals B1 and B2, a Y-address buffer 26 which is responsive to an internal control signal $\phi$ya to be activated and generate column addresses Y3–YK for designating the column selecting line and wrap address bits Y0–Y2 for designating a first bit line pair (column) in the successive access operation, and a register control circuit 28 which is responsive to the clock signal CLK to decode the wrap address bits Y0–Y2 and generate wrap addresses WY0–WY7, register drive signals $\phi$Rr1 and $\phi$Rr2 for controlling the read registers 10a and 10b and control signal $\phi$Rw1 and $\phi$Rw2 for driving the write registers 16a and 16b. Such a configuration may be employed that the register control circuit 28 receives the bank designating signals B1 and B2 and the register drive signal is generated only for the selected bank. Then, a specific internal operation will be described below.

[Successive Write Mask Function]

In the SDRAM, data of 8 bits are successively written through one data I/O terminal in a normal operation mode. For example, if it is intended to rewrite byte data at even positions in a series of consecutive data, this can be achieved by masking the data at the odd positions. A configuration for masking desired byte data in this successive access operation will be described below.

Figure 23:
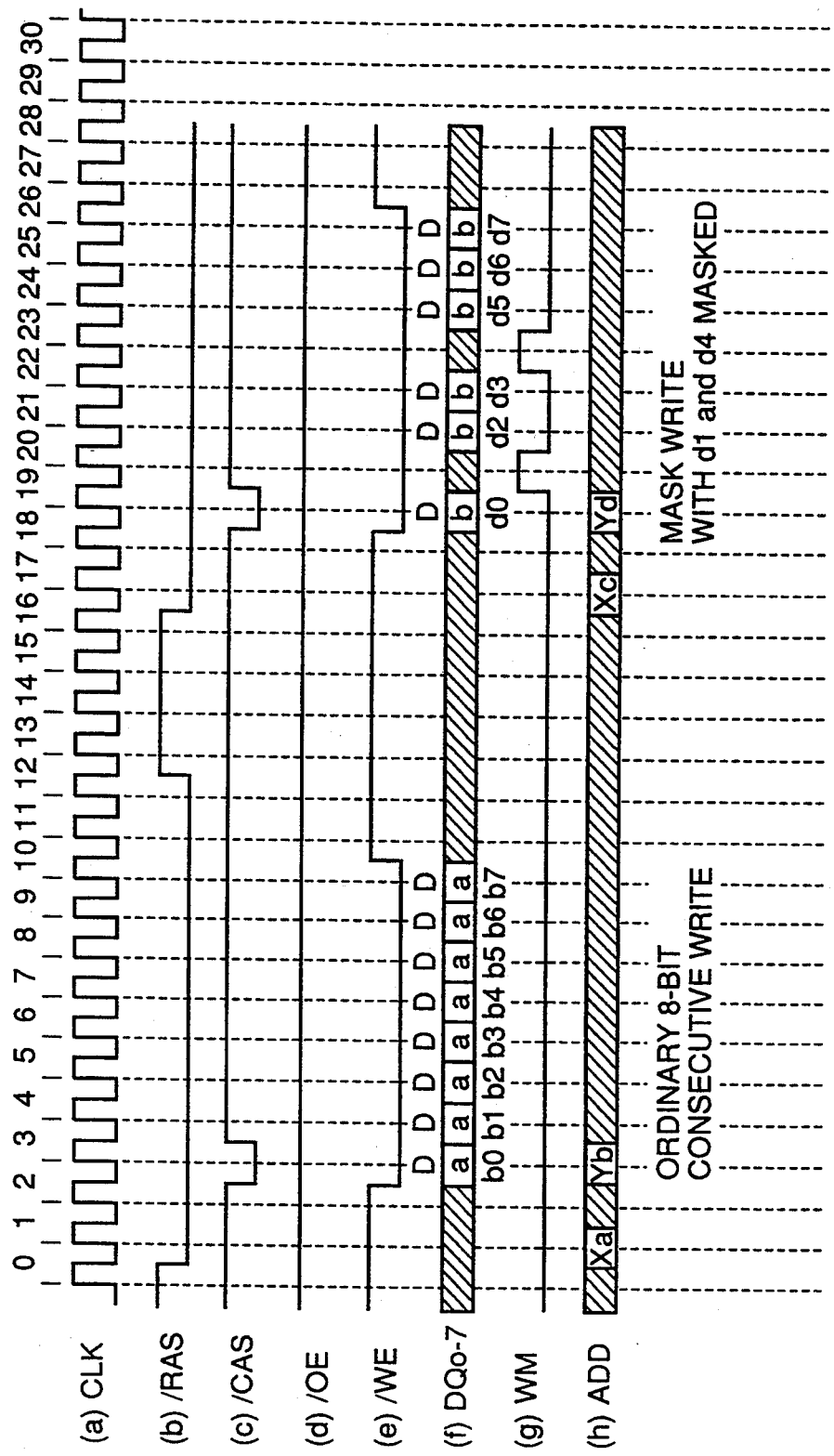
FIG. 23 is a timing chart showing a mask write operation of the SDRAM of the invention.

FIG. 23 is a timing chart showing a masking operation in the successive addressing. In FIG. 23, all the control signals are external control signals, and characters "ext." indicative of the fact that they are the external control signals are eliminated in this figure. In the data writing operation, the external row address strobe signal /RAS is fallen to "L". Thereby, the external address ADD is taken in as the row address signal Xa, and the internal row address signal is generated. In accordance with this, the bank is selected, and the memory arrays in the selected bank are activated (i.e., the word lines are selected and the sense amplifiers are driven).

Then, the external column address strobe signal /CAS and external write enable signal /WE are fallen to "L". Here, such a specification is employed that an RAS-CAS delay time tRCD, i.e., a time required between fall of the external row address strobe signal /RAS and subsequent fall of the external column address strobe signal /CAS, is 2 clock cycles.

In response to the fall of the write enable signal /WE to "L", the input buffer in the selected bank is activated, and the data is written into the write register. The data writing position in the write register is designated by least significant three bits Y0–Y2 in the internal column address signal Yb generated from the external address signal ADD which was taken in when the external column address strobe signal /CAS fell. Then, data are sequentially written in to the write registers through the input buffer at the rising edges of the clock signals. Thereby, data b0–b7 of bytes are successively written. After the write of byte data b0–b7, the data of 8 bytes are simultaneously written into the memory cells of 64 bits which have already been selected. Transmission of the write data to the selected memory cells is carried out in response to the rise of the clock signal CLK supplied after eight clocks of the clock signal CLK were counted subsequently to the fall of the write enable signal /WE to "L".

In the successive write operation, and particularly, in the masked write operation for masking the intended byte data, the mask instructing signal WM corresponding to the data to be masked is raised to "H". In FIG. 23, the second byte data d1 and fifth byte data d4 are to be masked. In this case, the memory cells of 64 bits are simultaneously selected, but the write data is not transmitted to the corresponding memory cells. In this case, only the rewriting is effected on the memory cells corresponding to the masked data. A configuration for performing the masking in the successive write operation will be described below.

Figure 24A:
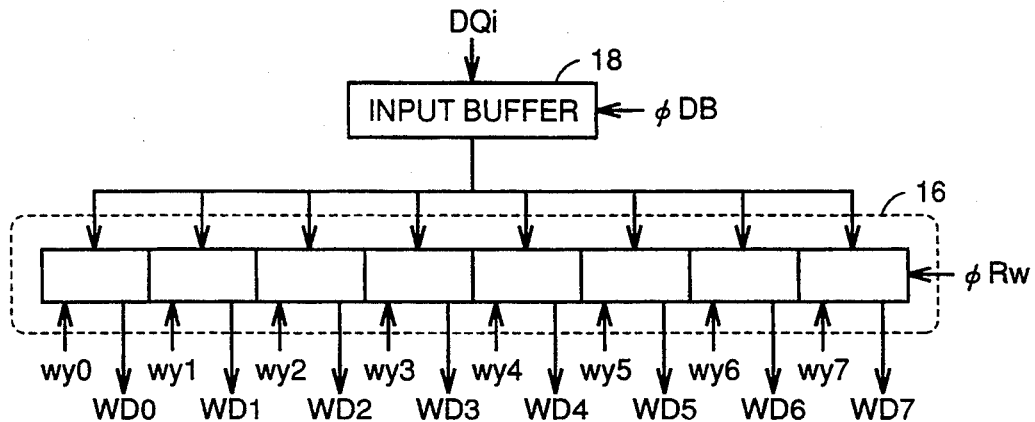
FIGS. 24A-24C shows configurations for achieving mask write shown in FIG. 23.
Figure 24B:
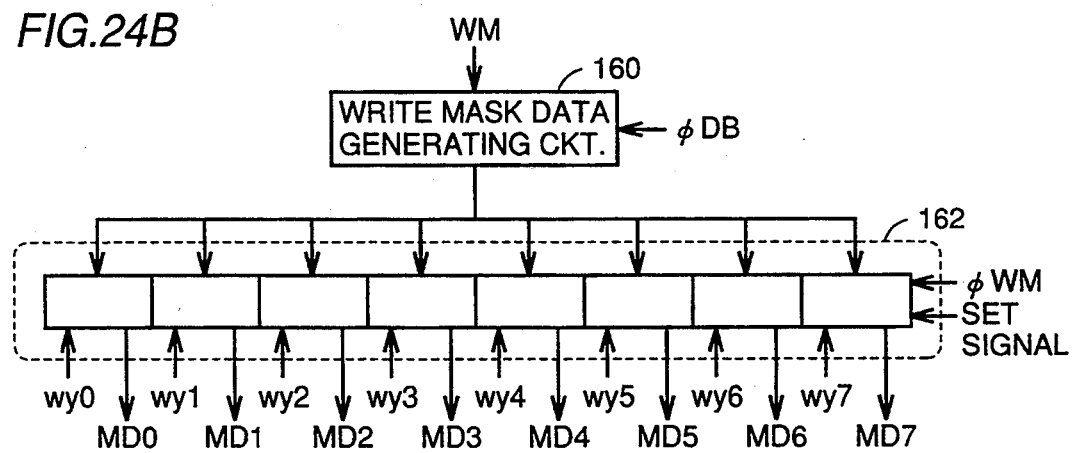
Figure 24C:
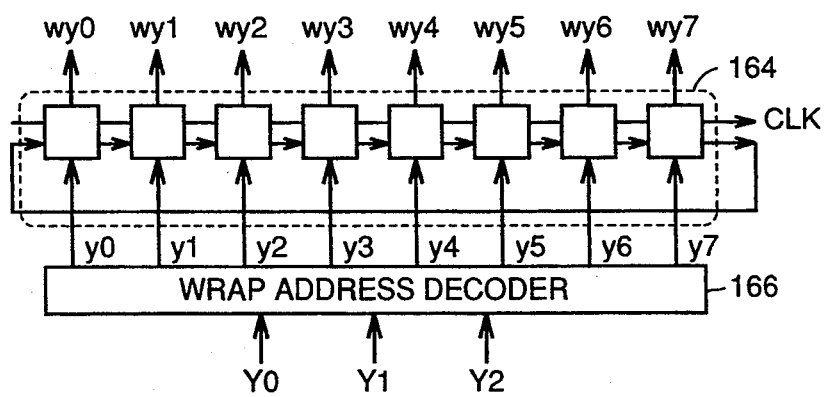

FIGS. 24A–24C shows a circuit configuration for achieving the masked write function in the successive write operation. FIG. 24A shows the write register 16 and the input buffer 18. The input buffer 18 takes in the input data applied to the data I/O terminal DQ1 and produces the write data. The input buffer 18 is activated in response to the input buffer activating signal $\phi$DB. The input buffer activating signal $\phi$DB is generated from the second control signal generating circuit 22 shown in FIG. 1 in response to the internal write signal $\phi$W. The output of the input buffer 18 is applied to the write register 16 having unit registers of 8 bits. The write register 16 latches the write data coming from the input buffer 18 into the unit register corresponding to the activated wrap address among the wrap addresses wy0–wy7. The write register 16 is activated in response to the write register activating signal $\phi$Rw and simultaneously generates the write data WD0–WD7. Only one of the wrap addresses wy0–wy7 is activated. The activated wrap address sequentially is shifted at every clock cycle.

FIG. 24B shows a configuration for producing the mask data. In FIG. 24B, a mask data generating system includes a write mask data generating circuit 160, which is activated in response to the input buffer activating signal $\phi$DB and takes in the write mask instructing signal WM for generating the write mask data, and a write mask register 162 which takes in the write mask data coming from the write mask data generating circuit 160. The write mask register 162 includes unit registers of 8 bits. In the write mask register 162, each unit register is maintained in the set state by a set signal before the write operation starts, and the held data set at "1". If the unit register holds the data of "1", the writing is inhibited. If the held data is "0", the writing is executed.

The write mask register 162 sequentially stores the write mask data coming from the write mask data generating circuit 160 in the unit registers in accordance with the wrap addresses wy0–wy7. The held data of the write mask register 162 is simultaneously output as the mask data MD0–MD7 in response to the write mask register activating signal $\phi$WM. The write mask register activating signal $\phi$WM is generated at the substantially same timing as the write activating signal $\phi$Rw. The mask data MD0–MD7 held by the write mask register 162 are transmitted to the write buffers for controlling the outputs of the corresponding write buffers, respectively, as will be described later.

FIG. 24C shows a configuration for generating the wrap addresses. In FIG. 24C, a wrap address generating system includes a wrap address decoder 166 decoding internal column addresses Y0–Y2 of 3 bits, and a wrap address register 164 which latches outputs of the wrap address decoder 166 and sequentially shifts the latched data in response to the clock signal CLK. The wrap address decoder 166 decodes the column address bits Y0–Y2, and selects only one of its outputs y0–y7.

Figure 25:
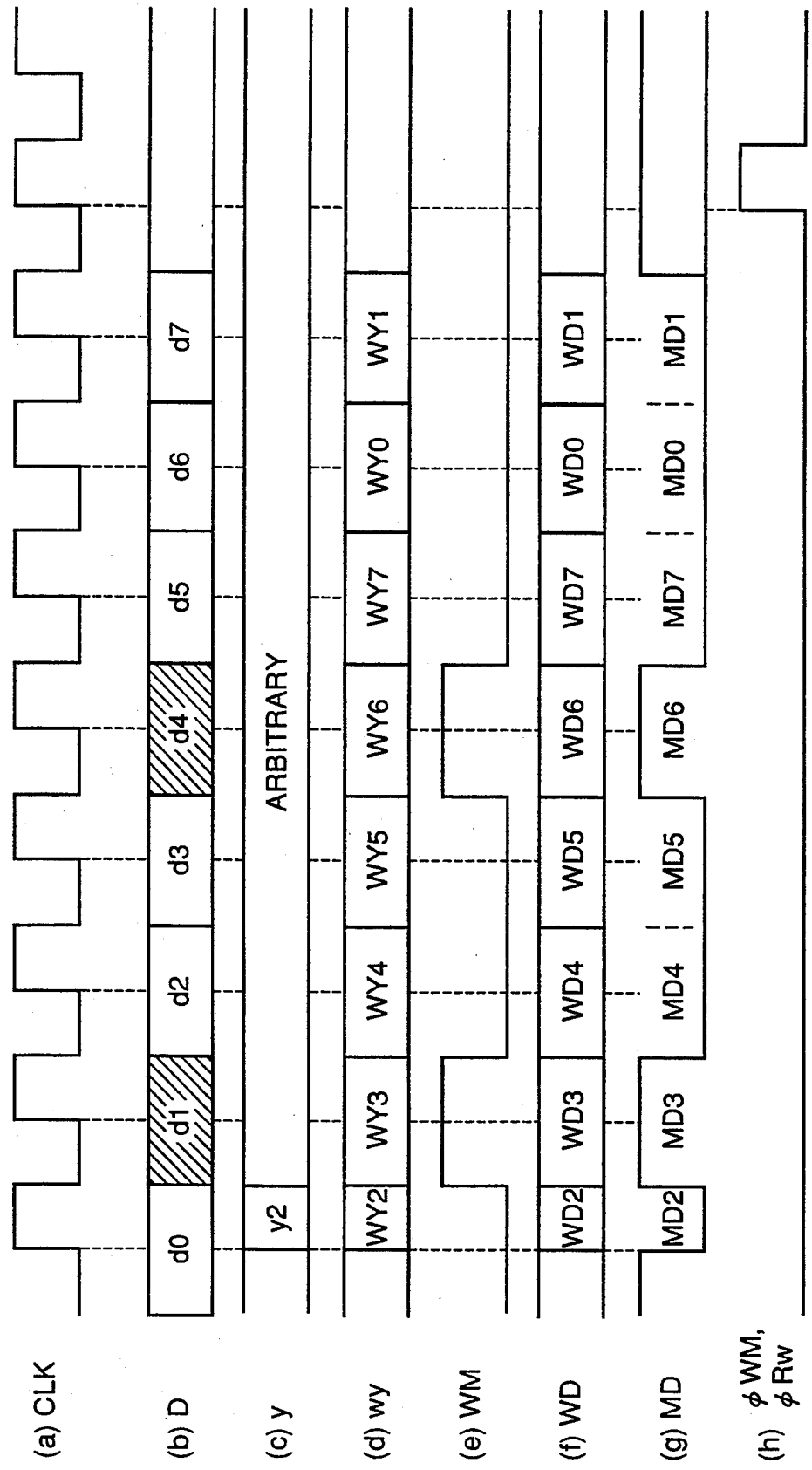
FIG. 25 is a signal waveform diagram showing an operation of circuitry shown in FIG. 24.

The wrap address register 164 includes shift register structures of eight stages. It latches the outputs y0–y7 of the wrap address decoder 166 into unit shift registers, and then sequentially shifts them in accordance with the clock signal CLK. The unit shift registers of the wrap address register 164 generate the wrap addresses wy0–wy7 indicating the memory cell positions at which the data is first written. In the configuration shown in FIG. 1, the wrap address register 164 is included in the register control circuit 28. In the configuration shown in FIG. 1, the write mask register 162 may be included in the first control signal generating circuit 20 or may be included in the second control signal generating circuit 22. Then, an operation of the circuit achieving the mask write function shown in FIG. 24 will be described below with reference to an operation timing chart of FIG. 25. For the purpose of this description, it will be assumed that the second input data d1 and fifth input data d4 are to be masked as shown in FIG. 23.

The wrap address decoder 166 decodes the internal column addresses Y0–Y2 to generate the wrap addresses y0–y7. If 3 bits Y0–Y2 of a column address have the relationship of (Y0, Y1, Y2)=(0, 1, 0), only the output y2 coming from the wrap address decoder 166 is first set at the selected state. The output signal y2 is taken into the wrap address register 164. The wrap address wy2 in the wrap address register 164 is set at the selected state. Thereafter, the wrap addresses sent from the wrap address register 164 are sequentially activated in the order of wy3-wy4-wy5-wy6-wy7-wy0-wy1 every time the clock signal CLK is toggled.

The externally applied mask bit instructing signal WM is generated corresponding to the input data d1 and d4. In the write mask register 162, the held data in each unit register is set at "1" in response to the write enable signal /WE. Each unit register of the write mask register 162 stores the write mask data WM coming from the write mask data generating circuit 160 in accordance with the wrap address wy. Therefore, in the write mask register 162, the mask data MD3 and MD6 attain the active state of "1" indicating the write disable state, and the remaining mask data MD2, MD4, MD5, MD7, MD0 and MD1 store the data of "0" indicating the write enable state.

The write register 16 stores the data coming from the input buffer 18 in accordance with the wrap addresses wy0-wy7. After the writing of data of 8 bits, the write register activating signal φRw and write mask register activating signal φWM are activated in response to the rise of the clock signal CLK, and the data stored in the respective registers are transmitted in parallel to the write buffers. The write buffers transmit the write data WD0-WD7 to the corresponding global I/O line pairs GIO in accordance with the mask data MD0-MD7, as will be described below.

Figure 26:
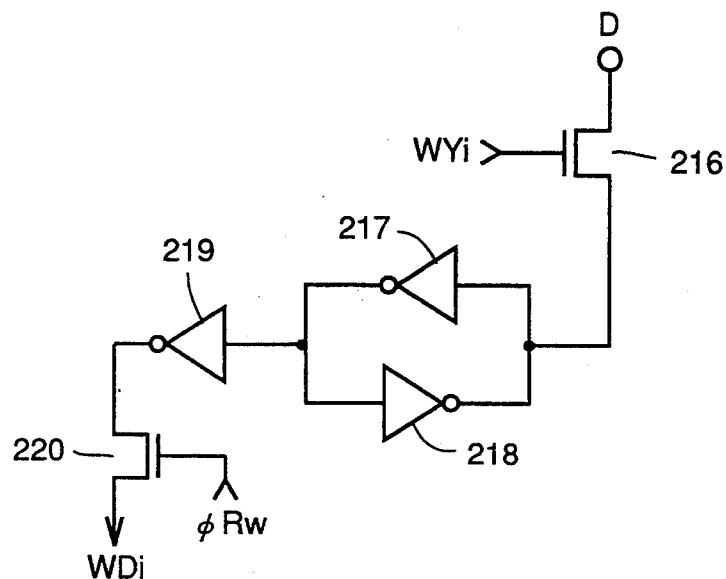
FIG. 26 shows a specific configuration of a write register shown in FIG. 24A.

FIG. 26 shows a configuration of the unit register of the write register 16 shown in FIG. 24. In FIG. 26, the unit write register includes an n-channel MOS transistor 216 which passes the write data D coming from the input buffer 18 in response to the wrap address wyi, inverter circuits 217 and 218 forming an inverter latch circuit latching the write data sent through the transistor 216, an inverter circuit 219 inverting the output of the inverter latch circuit (inverter circuits 217 and 218), and an n-channel MOS transistor 220 outputting the output of the inverter circuit 219 in response to the register activating signal φRw. The output of the inverter circuit 217 is combined with the input to the inverter circuit 218, and the output of the inverter circuit 218 is combined with the input to the inverter circuit 217.

In the operation, the unit register takes in the write data D coming from the input buffer 18 when the wrap address wyi attains the active state ("H"), and latches the same in the inverter latch circuit. When the activating signal φRw is activated, the transistor 220 is enabled to produce the internal write data WDi. In the configuration shown in FIG. 27, the transistor 220 may be disposed between the input of the inverter circuit 219 and the output of the inverter latch circuit (inverter circuits 217 and 218). The inverter latch circuit may have an input (i.e., input of the inverter circuit 217) which is normally precharged to a predetermined potential.

Figure 27:
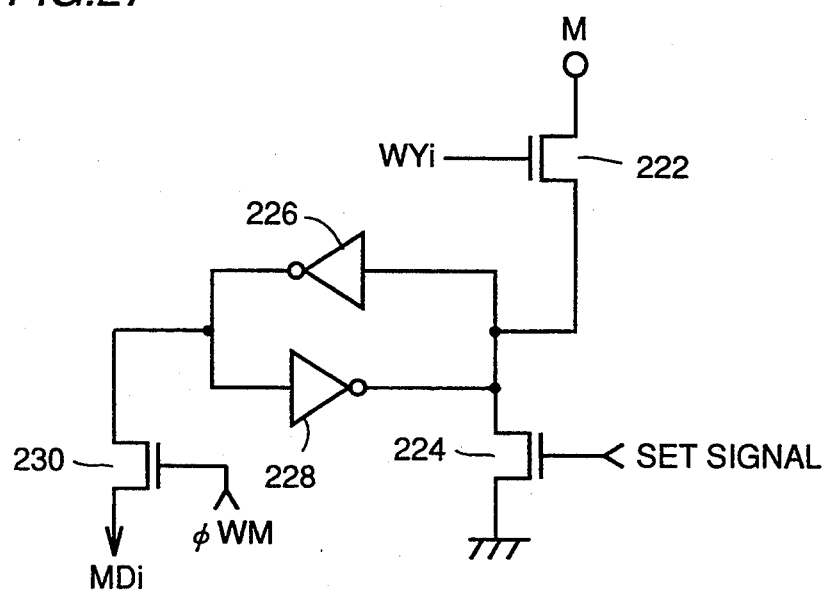
FIG. 27 shows a specific configuration of a mask data register shown in FIG. 24B.

FIG. 27 shows a configuration of the unit register of the write mask register shown in FIG. 24. In FIG. 27, the unit mask register includes an n-channel MOS transistor 222 which passes the mask data M generated from the write mask data generating circuit 160 in response to the wrap address wyi, inverter circuits 226 and 228 forming an inverter latch circuit which latches the mask data applied through the transistor 222, an n-channel MOS transistor 230 which passes the output of the inverter latch circuit (i.e., output of the inverter circuit 226) to produce the mask data MDi in response to the write mask register activating signal φWM, and an n-channel MOS transistor 224 which is responsive to the set signal to set the input of the inverter latch circuit (input of the inverter circuit 226) at the ground potential. The set signal may be generated in response to the row address strobe signal /RAS. It is required only to set the input of the inverter latch circuit at the ground potential by the set signal prior to generation of the write mask data M.

In the operation, the set signal first sets the potential of input of the inverter circuit 226 at the ground potential. Thereby, data of "1" is initially set in the unit write mask register. Then, the transistor 222 is enabled in accordance with the wrap address wyi, and the mask data M coming from the write mask data generating circuit 160 is applied to the input of the inverter circuit 226. The transistor 224 has already been turned off. Thereby, the mask data M is latched by the inverter circuits 226 and 228. Upon activation of the write mask register activating signal φWM, the transistor 230 is turned on and thereby passes the output of the inverter circuit 226 to generate the mask write instructing signal MDi.

Figure 28:
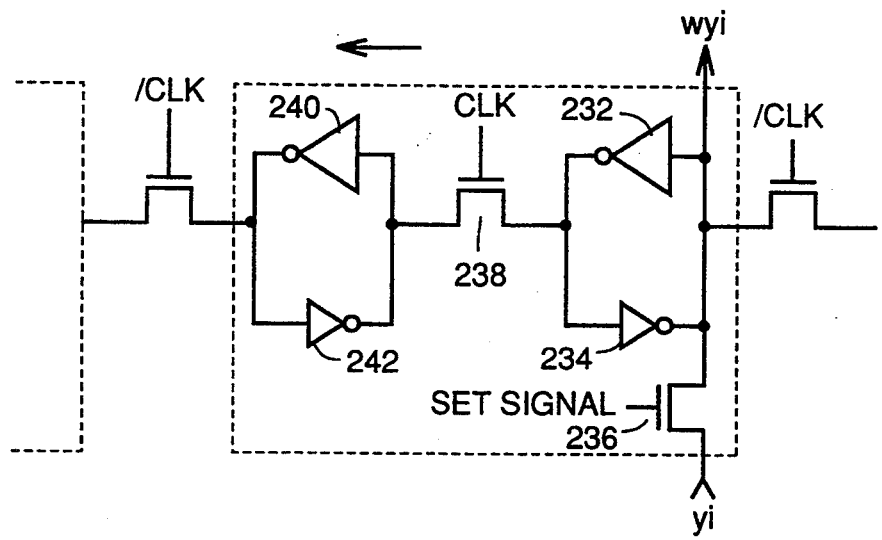
FIG. 28 shows a specific configuration of a wrap address generating circuit shown in FIG. 24C.

FIG. 28 shows a configuration of the unit register of the wrap address register 164 shown in FIG. 24. In FIG. 28, the unit wrap address register includes an inverter circuit 232 having a large driving capability, an inverter circuit 234 having a relatively small driving capability, an n-channel MOS transistor 238 which is responsive to the clock signal CLK to transmit the output of the inverter circuit 232, an inverter circuit 240 having a relatively large driving capability for inverting a signal sent through the transistor 238, and an inverter circuit 242 having a relatively small driving capability for inverting an output of the inverter circuit 240.

The output of the inverter circuit 232 is applied to the transistor 238 and is also applied to the input of the inverter circuit 234. The output of the inverter circuit 234 is applied to the input of the inverter circuit 232. The unit wrap address register further includes an n-channel MOS transistor 236 which is responsive to the set signal to take in a selecting signal yi generated from the wrap address decoder 166. The output of the transistor 236 is applied to the input of the inverter circuit 232 and the output of the inverter circuit 234. The wrap address wyi is generated from the output of the inverter circuit 234.

The set signal applied to the gate of the transistor 236 may be formed of a one-shot pulse signal which is generated for a predetermined period in response to the control signal for activating the wrap address decoder 166. It may be formed of a one-shot pulse which is generated at a rising edge of the clock signal CLK in response to the activation of the column address strobe signal /CAS. An operation will be described below.

Upon activation of the set signal, the transistor 236 is turned on to take in and latch the output yi of the wrap address decoder 166. The signal yi thus taken in is sent therefrom as the wrap address wyi. At the time of generation of the set signal, the clock signal CLK is "H", and the complementary clock signal /CLK is "L". The output of the inverter circuit 232 is applied through the transistor 238 to the inverter circuit 240, and is latched by the inverter circuits 240 and 242.

Then, the clock signal CLK falls to "L", and the complementary clock signal /CLK rises to "H", whereby the output of the inverter circuit is transmitted to the adjacent unit wrap address register, so that the adjacent wrap address attains the active state. The inverter circuit 240 has the relatively large driving capability, and thus corrects the latch state of the inverter latch circuit, which is provided in the input of the adjacent unit wrap address register, in accordance with its output state. Thereby, the wrap addresses are sequentially activated in accordance with the clock signal CLK.

In the wrap address generating system described above, the wrap address wy which is initially set is used as the initial address for sequentially selecting the adjacent columns, and the manner for generating the wrap addresses is unique. A configuration for programming the sequence of generating the wrap addresses may be employed.

[Write Buffer]

Figure 29:
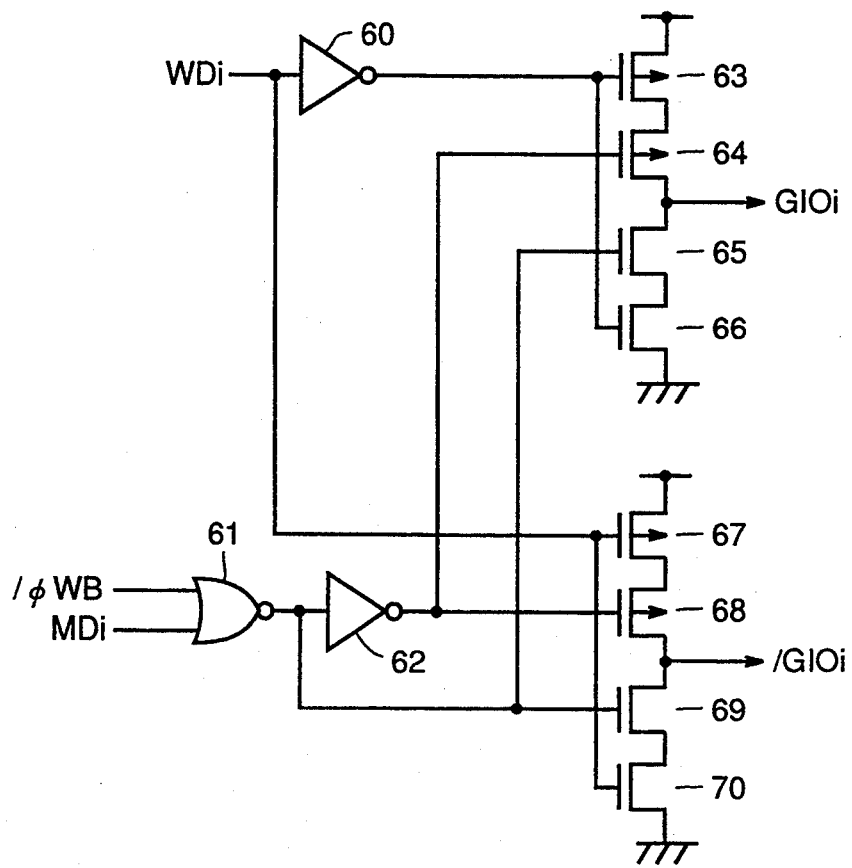
FIG. 29 shows an example of a specific configuration of a write buffer shown in FIG. 29.

FIG. 29 shows a configuration of the write buffer. The write buffer group 14 shown in FIG. 1 includes eight write buffers each having the configuration shown in FIG. 29. Referring to FIG. 29, the write buffer includes an inverter circuit receiving the write data WDi from the write register 16, a 2-input NOR circuit 61 receiving the write buffer activating signal /$\phi$WB as well as the mask data MDi coming from the write mask register 162, and an inverter circuit 62 receiving the output of the NOR circuit 61. The write buffer control signal /$\phi$WB is activated and instructs the data write when it attains "L".

The write buffer further includes p-channel MOS transistors 63 and 64 and n-channel MOS transistors 65 and 66 which are arranged in series between the supply potential Vcc and the ground potential Vss. Transistors 63 and 66 receives on their gates the output of the inverter circuit 60. The transistor 64 receives on its gate the output of the inverter circuit 62. The transistor 65 receives on its gate the output of the NOR circuit 61.

The write buffer further includes p-channel MOS transistors 67 and 68 as well as n-channel MOS transistors 69 and 70 which are connected in series between the supply potential Vcc and the ground potential Vss. The transistors 67 and 70 receive on their gates the write data WDi. The transistor 68 receives on its gate the output of the inverter circuit 62. The transistor 69 receives on its gate the output of the NOR circuit 61. A connecting point between the transistors 64 and 65 is connected to one of the paired global I/O lines GIO, i.e., global I/O line GIOi, and a connecting point between the transistors 68 and 69 is connected to the other global I/O line/GIOi. An operation will be described below.

(i) It will be assumed that the mask data MDi is "1" ("H") instructing the write data masking. In this case, the NOR circuit 61 generates the output of "L", and the inverter circuit 62 generates the output of "H". Thereby, the transistors 64, 65, 68 and 69 are turned off, and the global I/O lines GIOi and /GIOi are in the potential holding state, so that the write data is not transmitted.

(ii) It will be assumed that the mask data MDi is "0".

In this case, the data is written in accordance with the write data WDi. More specifically, the output of the NOR circuit 61 attains "H" in response to the fall of the write buffer activating signal /$\phi$WB, and the output of the inverter circuit 62 attains "L". Thereby, the transistors 64, 65, 68 and 69 are turned on. If the write data WDi is "1" and hence "H", the transistor 63 is turned on, and the transistor 66 is turned off. Simultaneously with this, the transistor 67 is turned off, and the transistor 70 is turned on. Thereby, the global I/O line pair GIOi is charged to the supply potential Vcc level through the transistors 63 and 64, and the global I/O line/GIOi is discharged to the ground potential Vss through the transistors 69 and 70.

When the write data WDi is at the "L" level indicating "0", the output of the inverter circuit 60 attains "H". In this case, the transistor 63 is turned off, the transistor 66 is turned on, the transistor 67 is turned on, and the transistor 70 is turned off. The global I/O line GIOi is discharged to attain the "L" level, i.e., ground potential Vss level through the transistors 65 and 66, and the global I/O line/GIOi is charged to "H" through the transistors 67 and 68.

Owing to the configuration described above, only the intended data can be masked in the successive write operation.

[Frequency/Latency]

In the SDRAM, the output timing of the read data is determined by the number of toggling of the clock signal clock CLK. A relationship between the number of toggling of the clock and the timing of output of the read data is referred to as a latency. For example, if the frequency of the clock signal CLK is 100 MHz, the valid data is output at sixth clock cycle after the cycle at which the external row address strobe signal /RAS fell.

However, in the case where the SDRAM is used in the system using the clock signal CLK of which frequency is 50 MHz, if the read data were output upon counting of 6 clocks after the fall of the external row address strobe signal /RAS, the access would be 120 nanoseconds, and the performance of the SDRAM, i.e., high speed operating ability would not be sufficiently exhibited. According to a configuration which will be described below, however, the high speed operating ability of the SDRAM can be sufficiently obtained even if the clock frequency changes.

Figures 30, 31:
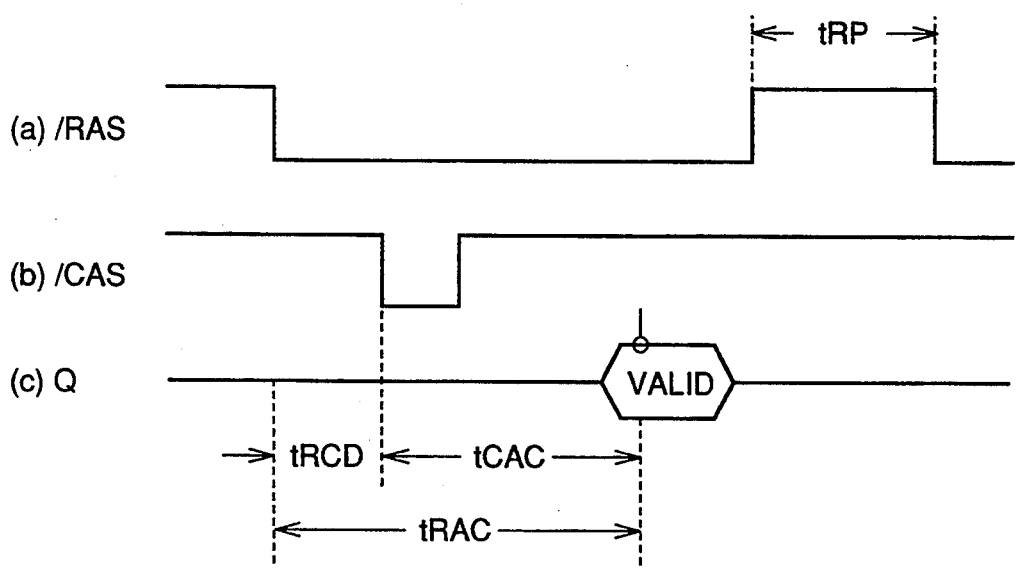
FIG. 30 is a list showing correlation between frequencies and latencies.
FIG. 31 is a diagram for explaining definition of respective access times in the SDRAM.

FIG. 30 shows a relationship between the frequencies and the latencies in the SDRAM according to the invention. The latency is determined by the combination of the address bits A4 and A5. The latency set cycle is executed under the conditions of the WCBR that all the signals /RAS, /CAS and /WE are set at "L" at the rising edge of the clock signal CLK. If the clock frequency is 100 MHz, an RAS access tRAC is set at 6 clock cycles, a CAS access time tCAC is set at 4 clock cycles, an RAS precharge cycle time is set at 4 clock cycles, and the RAS-CAS delay time tRCD is set at 2 clock cycles at the minimum. As the frequency of the clock signal CLK decreases, the clock cycles required for the access time and precharge time are reduced.

FIG. 31 shows the RAS access time, CAS access time, RAS precharge time and RAS-CAS delay time tRCD.

The RAS access time tRAC, which is represented by the number of the clock cycles in the SDRAM in any case, is a time period required after the fall of the external row address strobe signal /RAS to "L" and before the output of valid data.

The CAS access time tCAC is a time period required after the fall of the column address strobe signal /CAS to "L" and before the output of valid data. The RAS precharge time tRP is required for precharging the memory arrays, and is a time period for maintaining the signal /RAS at "H". The RAS-CAS delay time tRCD is a time period required for ensuring separation of the row address signal and column address signal, which are applied in a multiplexed form, from each other and setting them at the fixed state, and in other words, in a time period required after the fall of the external address strobe signal /RAS and before the fall of the column address strobe signal /CAS to "L". A configuration for changing the latency in accordance with the frequency will be described below with reference to FIG. 32.

Figures 32, 33:
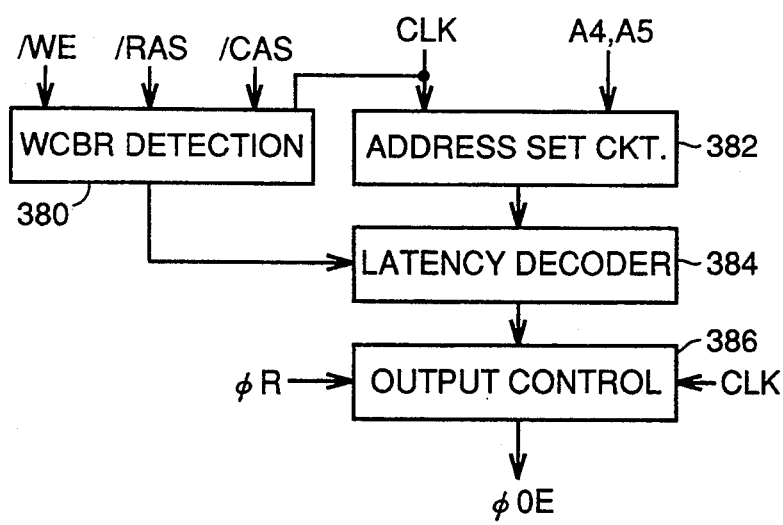
FIG. 32 shows a specific circuit configuration for achieving the correlation between the frequencies and latencies shown in FIG. 30.
FIG. 33 is a table for explaining wrap lengths.

In FIG. 32, a latency changing circuit includes a WCBR detecting circuit 380 detecting the condition of WCBR, an address set circuit 382 which is responsive to the clock signal CLK to take in the address signal bits A4 and A5, a latency decoder 384 which is activated in response to an output of the WCBR detecting circuit 380 and decodes the address bits latched in the address set circuit 382 for detecting the latency, and an output control circuit 386 for adjusting the output timing in response to a latency set signal coming from the latency decoder 384. The output control circuit 386 is responsive to the internal control signal $\phi R$ (or int.RAS) coming from the control signal generating circuit 20 shown in FIG. 1 to count the predetermined number of clocks of the clock signal CLK for generating the output buffer control signal $\phi OE$. The clock number counted by the output control circuit 386 is adjusted in accordance with the latency set signal coming from the latency decoder 384.

The address set circuit 382 may have a configuration in which the internal address bits A4 and A5 sent from the address buffer are latched in response to the WCBR detection signal coming from the WCBR detecting circuit 380. In this case, change of the latency requires only to adjust the data output timing in accordance with the count of the clocks. If the timing, e.g., of rise of the word line is to be executed in response to the internal control signal $\phi R$, it is not especially necessary to apply the output of the latency decoder 384 to the RAS control system and CAS control system. If the timings such as the sense amplifier activating timing and column selecting signal generating timing are set in accordance with the count of the clocks, each of the sense amplifier activating signal and column selecting signal generating timing is adjusted in accordance with the latency set signal coming from the latency decoder 384. Also in this case, only the change of the count of clocks is required.

As described above, the data output timing is adjusted in accordance with the frequency of the clock signal CLK, whereby the performance of the SDRAM can be sufficiently exhibited regardless of the frequency of the clock signal CLK.

[Change of Wrap Length]

In the above description, the wrap length is set at 8. However, the number of data which are successively written in one access cycle may be variable in some cases. For example, even in the standard DRAM, there are a nibble mode, a page mode, a static column mode and others. In these modes except for the nibble mode, the number of data to be successively written or read can be easily changed. Therefore, a configuration for changing the wrap length is provided in the SDRAM.

FIG. 33 shows a manner for programming the wrap length in a list form. The wrap length is determined by setting the address key under the conditions of WCBR. As the address key, the address signals A0, A1 and A2 of 3 bits are utilized as an example. As the unit of the wrap length, 4, 8, 16, 32 and full page (1 row) may be utilized.

Figure 34:
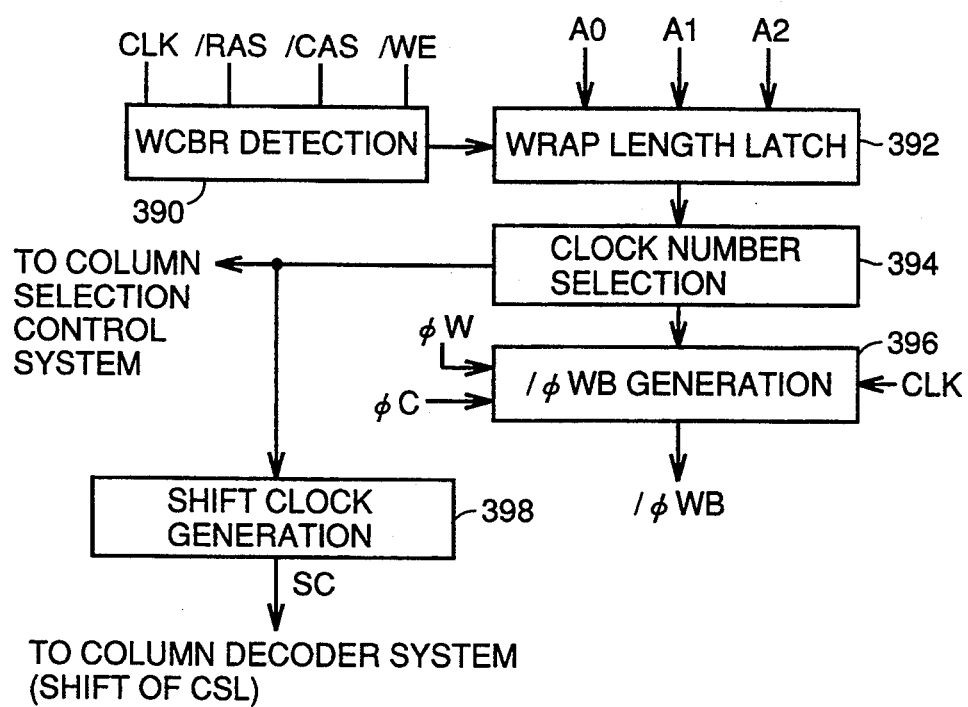
FIG. 34 shows a specific circuit configuration for achieving the wrap lengths shown in FIG. 33.

FIG. 34 shows the wrap length setting control system. In FIG. 34, the wrap length setting control system includes a WCBR detecting circuit 390 detecting the conditions of WCBR, a wrap length latch circuit 392 which is responsive to an output of the WCBR detecting circuit 390 to latch the internal address bits A0, A1 and A2 generated from the address buffer, a clock number selecting circuit 394 selecting the clock number indicative of the wrap length in accordance with the data latched by the wrap length latch circuit 392, and a $\phi WB$ generating circuit 396 which counts the clock signal CLK in accordance with the clock number information coming from the clock number selecting circuit 334 and generates the write buffer activating signal $/\phi WB$.

The $/\phi WB$ generating circuit 396 is activated in response to the internal CAS system control signal $\phi C$, which is generated in synchronization with the signal $/CAS$, and generates the write register activating signal $/\phi WB$ after counting the predetermined clock number. In FIG. 34, there is shown only the configuration for writing the data. In the reading operation, a circuit generating a read register activating signal err is similarly controlled by the output of the clock number selecting circuit 394. The $/\phi WB$ generating circuit 396 is responsive to the internal write enable signal $\phi W$ and the internal CAS control signal $\phi C$ to generate a write register activating signal $/\phi WB$. A $/\phi Rr$ generating circuit (not shown) is responsive to the internal RAS control signal $\phi R$ to generate a read register control signal.

The output buffer and input buffer may be maintained at the active state during the wrap cycle.

The wrap length control circuit further includes a shift clock generating circuit 398 which generates a shift clock in accordance with the clock number information coming from the clock number selecting circuit 394. The shift clock generating circuit 398 generates the shift clock by which the position of the column selecting line CSL selected by the column decoder is shifted one by one in accordance with the set clock number. Generally, the wrap length is set at 8, and the clock number selecting circuit 394 generates the shift clock in accordance with a difference between the wrap length of 8 and the programmed wrap length.

If the programmed wrap length is 8, an operation is carried out similarly to the ordinary case, and thus the shift clock is not generated. If the wrap length is 16, one shift clock is generated. If the wrap length is 32, three shift clocks are generated. In this case, the basic wrap length is 8, and the transference of data is carried out when the wrap data of 8 bits is stored (in the case of data writing). More specifically, if the wrap length is larger than the standard value of 8, the transference of data is carried out when the wrap data of consecutive 8 bits in the write data is stored in the write register. After the transference of data, the data of next consecutive 8 bits is stored in the register (i.e., write register). During this, the column selecting line from the column decoder is shifted by one in accordance with the shift clock coming from the shift clock generating circuit 398. This period is sufficiently long (it is required only to allow the rising of the next column selecting line before the writing of the next 8-bit data), and the data of the intended wrap length can be written in a sufficiently consecutive manner. A configuration for sequentially raising the column selecting lines will be described below.

Figure 35:
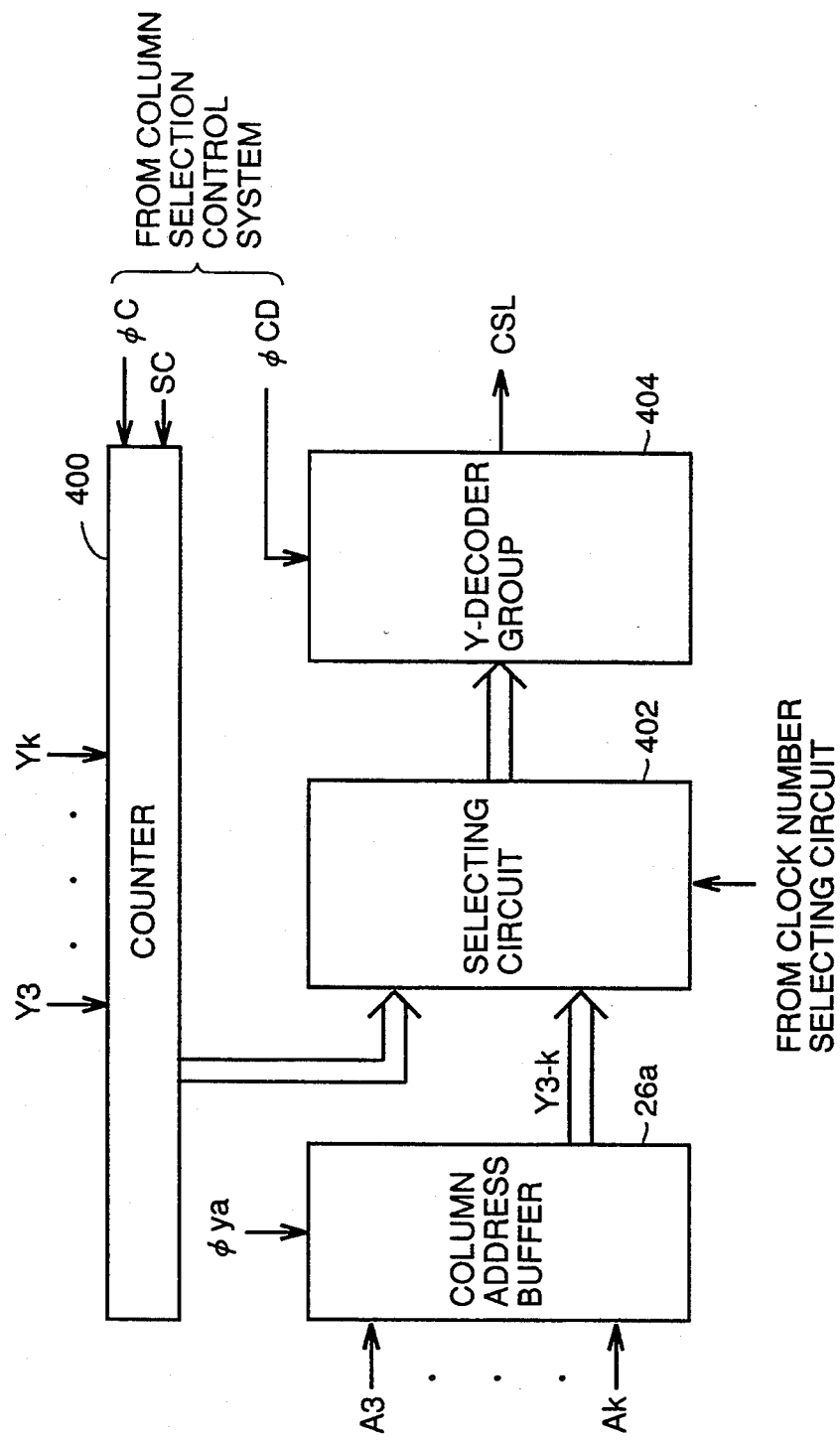
FIG. 35 shows a configuration of a circuit portion related to column selection in the SDRAM.

FIG. 35 shows a configuration for generating the column selecting signal at the time of wrap length programming. In FIG. 35, a column selecting signal generating system includes a column address buffer 26a which is responsive to the internal control signal $\phi ya$ to take in the externally applied address signals A3–Ak and generate internal column address signals Y3–Yk, a counter 400 which is activated in response to the internal control signal $\phi C$ generated in synchronization with the external column address strobe signal $/CAS$ and takes in, as an initial count value, the internal column address signals Y3–Yk generated from the column address buffer 26a, a selecting circuit 402 which is responsive to the wrap length information coming from the clock number selecting circuit 394 (see FIG. 45) to select one of the output of the counter 400 and the output of the wrap address buffer 26a, and a Y-decoder group 404 which decodes the column address signal coming from the selecting circuit 402 to activate the column selecting line CSL.

The count of the counter 400 is incremented or decremented by one in accordance with the shift clock signal SC. The counter 400 is responsive to the shift clock signal SC coming from the shift clock generating circuit 398 shown in FIG. 35 to increment its count by one.

The selecting circuit 402 selects the output of the counter 400 and applies the same to the Y-decoder group 404 if the clock number information coming from the clock number selecting circuit 394 indicates one or more, i.e., if it indicates the wrap length is 16 or more.

The Y-decoder group 404 is responsive to a decoder activating signal φCD to decode the signal applied from the selecting circuit 402 for selecting the column selecting line. If the wrap length is 8 or less, the selecting circuit 402 selects the output of the column address buffer 26a.

The structure may be employed in which decoder activating signal φCD applied to the Y-decoder group 404 temporarily attains the inactive state when a predetermined clock number elapses after the fall of the external column address strobe signal /CAS or write enable signal in accordance with the information coming from the clock number selecting circuit, and then will attain the active state again. In the configuration shown in FIG. 35, the counter 400 may be constructed so that its count is incremented by one in response to the fall of the Y-decoder activating signal φCD instead of the shift clock SC. In this case, the shift clock signal SC is applied to the Y-decoder control system, and activation and deactivation of the activating signal φCD are controlled at the timing of generation of the shift clock signal SC. With reference to a waveform diagram of FIG. 36, an operation of the SDRAM in which the normal wrap length is set at 8 will be described below in connection with the case where the wrap length of 16 is selected.

When the external row address strobe signal /RAS falls to "L", the address signal ADD is taken in at the next rising edge of the clock signal CLK, and the internal row address signal Xa is generated. In accordance with the internal row address signal Xa, the potential of the word line WL rises, and the potentials of the memory cells in this one row are transmitted to the respective bit line pairs BLP.

When the external column address strobe signal /CAS and write enable signal /WE fall to "L", the data currently applied to the data I/O terminal DQ is taken and latched into the write register at the rising edge of the clock signal CLK. In this latching operation into the write register, the data is stored at the register positions indicated by the wrap address as described before. At this time, the column address signal Yb has already been taken in.

The selecting circuit 402 selects the output of the counter 400 in accordance with the information applied from the clock number selecting circuit 394 (see FIG. 34) and indicating that the wrap length is 16. The counter 400 has latched the output of the column address buffer 26a as an initial count value in accordance with the internal control signal φC. Then, the Y-decoder group 404 responds to the decoder activating signal φCD by performing the column decoding operation for selecting one of the column selecting lines CS1. The write register sequentially stores the wrap data b0–b7 of 8 bits. The write buffer activating signal φWB is generated at the rising edge of the clock signal at which the wrap data at eighth bit is latched. At this time, the column selecting line CSL is already selected. Thereby, the eight wrap data b0–b7 of 8 bits is written into the respective selected memory cells. In parallel to the writing of the wrap data b0–b7 into the memory cells, the write register sequentially takes in and latches the subsequent wrap data b8–b15 of 8 bits at the rising edges of the clock signal.

Writing of data from the write register is carried out at the rising edge of the clock signal at which the wrap data b7 is taken in, and the next wrap data is introduced in accordance with the next rising of the clock signal, so that erroneous data is not written. In accordance with the selection of the column selecting line CSL1, the data is written into the memory cells, and thereafter the decoder activating signal φCD temporarily changes to the inactive state. In response to deactivation of the column decoder, the count of the counter 400 is incremented by one. In the memory array, only the column selecting system temporarily returns to the precharged state.

The word line WL maintains the selected state. Therefore, the potential of each bit line pair BLP maintains the state in which it is latched by the sense amplifier. Upon counting of a predetermined clock number, i.e., before writing of all the next wrap data b8–b15 into the write register, the Y-decoder group 404 is activated. The selecting circuit 402 applies the output of the counter 400 to the Y-decoder group 404. The count of the counter 400 is incremented by one. Therefore, the Y-decoder group 404 selects the adjacent column selecting line.

The wrap data b8–b15 of 8 bits latched in the write register is transferred to the memory cells related to the selected column selecting line CSL2 in response to the write register activating signal φWB, and is written into the selected memory cells through the global I/O line pair GIO.

By repeating the above operation, all the memory cells connected to one word line can be successively accessed.

In the timing of transferring data from the write register, if data is transferred at an intermediate point in the wrap length, the activating signal for the write register is generated and the data is written in response to the rise of the clock signal at the time of writing of the 8-bit wrap data. If the final wrap data is written, the data is transferred at the rising edge of the clock signal after the writing of the final wrap data, similarly to the ordinary data write timing. In this case, the writing of data may be executed at the rising edge of the clock signal at the time of writing of the final wrap data.

In the configuration shown in FIG. 35, the selecting circuit 402 always selects the output of the counter 400 in accordance with the wrap length data of the clock number selecting circuit. In this case, such a configuration may be employed that the output of the column address buffer 26a is selected in the first cycle, and the output of the counter 400 is selected in the next cycle.

Figure 36:
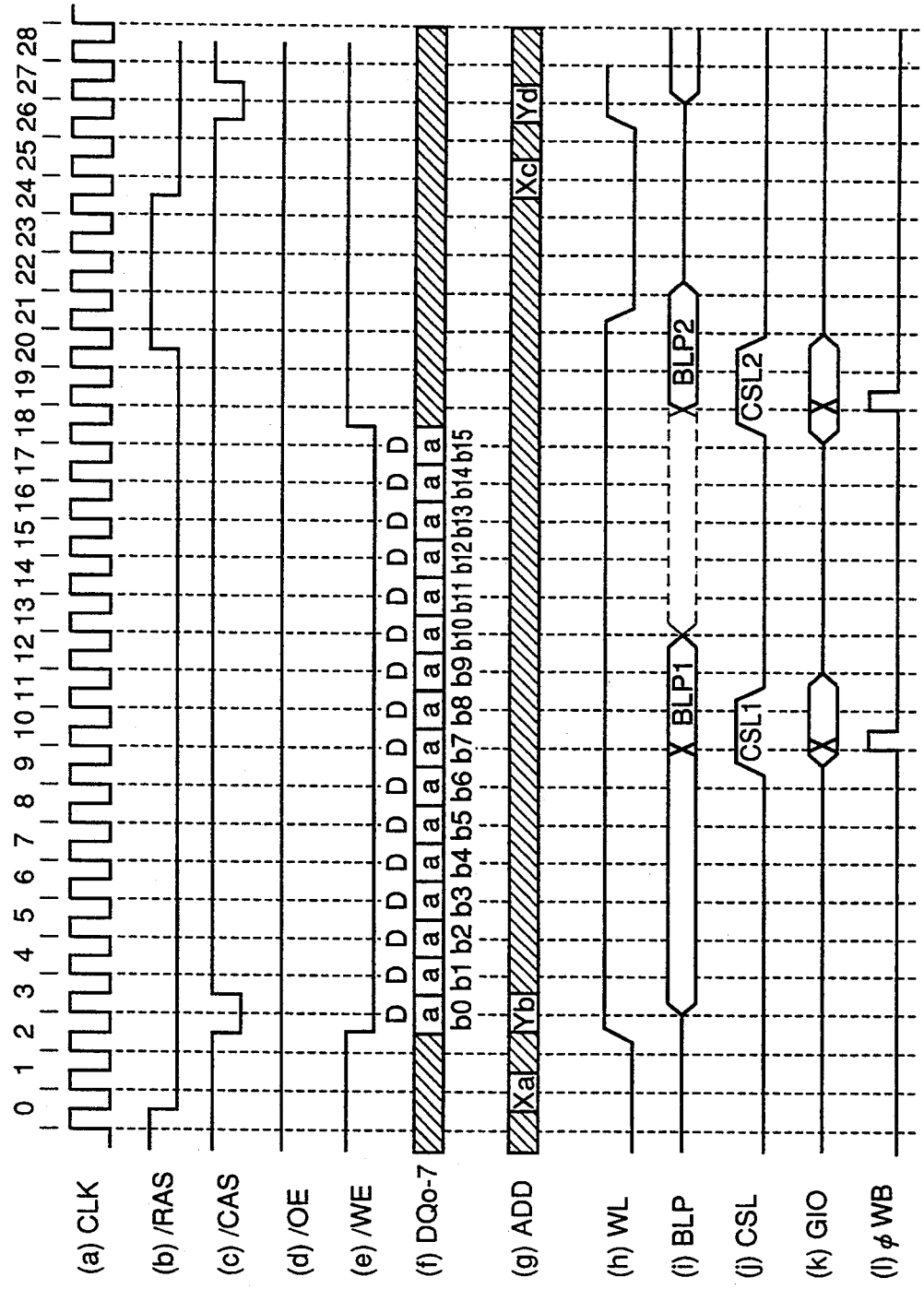
FIG. 36 is a timing chart showing internal operations with the wrap length of 16.

In the configuration shown in FIGS. 34–36, only a configuration of extension of the wrap length for the data writing is shown. In this case, however, the read register may be used instead of the write register, whereby the wrap length in the data reading operation can also be extended. Thus, in the successively reading cycles, the memory array operates similarly to the operation for successively writing data. A difference is only that the read register activating signal is used instead of the write register activating signal. In the successively reading cycles, when the wrap data of 8th bit is read through the output buffer, next 8-bit wrap data are stored in the read register. In parallel to the reading of data from the read register, the column selecting operation for the next wrap data is performed in the memory array.

In the SDRAM of which wrap length is 8 in accordance with the standard setting, if the wrap length is to be set at 4, such a configuration may be employed that the number of banks is increased or that mask data is used and only the writing of wrap data of 4 bits is performed while maintaining the bank number at 2. In the data read operation, the wrap address designates the top address of the wrap data of 4 bits, so that it is not particularly necessary to use mask data or the like, and the data reading is terminated when the data of 4th bit is read.

[Pin Arrangement]

Figure 37:
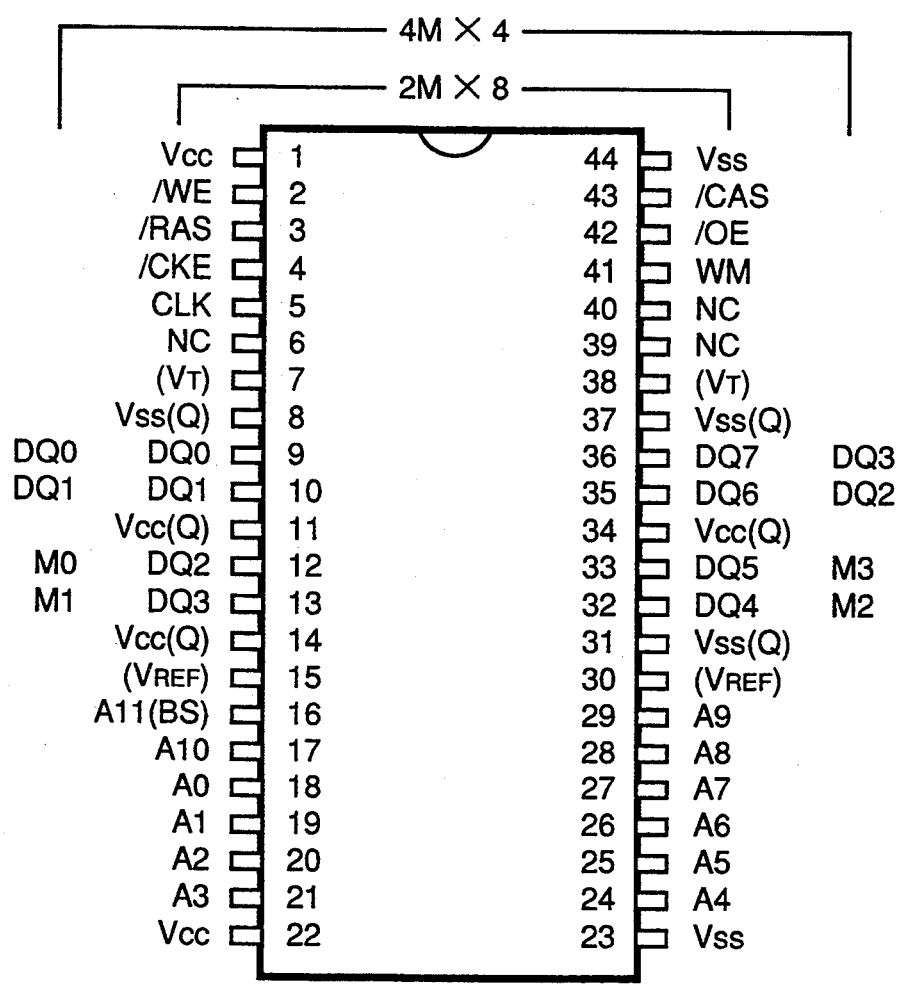
FIG. 37 shows an external appearance of a package accommodating an SDRAM of a first type of the invention and an arrangement of pins of the same.

FIG. 37 shows an appearance of a package accommodating the SDRAM according to the invention. The 16-Mbit SDRAM according to the invention is accommodated in the package of 44 pins, lead pitch of 0.8 mm, 400 mil and TSOP Type II. This package has the same sizes as those such as SOJ (Single Outline J leaded Package) accommodating a standard 16-Mbit DRAM, but has such an advantage that the lead pitch is small and the number of pins can be increased.

In FIG. 37, the SDRAM accommodated in this package can alternatively have the x4-configuration and x8-configuration which are selected by switching bonding wires.

The supply potential Vcc is applied to pins of Nos. 1 and 22. Data I/O terminals are disposed in a central portion of the package, and pin terminals of pin Nos. 9, 10, 12, 13, 32, 33, 35 and 36 are used as the data I/O terminals DQ0–DQ7 (in the case of x8-configuration).

At opposite sides of the data I/O terminals DQ0 and DQ1 and data I/O terminals DQ7 and DQ6, there are arranged pin terminals of Nos. 11 and 34 for receiving the supply potential Vcc (Q) to be used by the I/O buffer as well as pin terminals of Nos. 8 and 37 for receiving the ground potential Vss (Q). In connection with input and output of data, the supply potentials Vcc (Q) and Vss (Q) used only by the I/O buffers are utilized, whereby it is possible to effectively reduce noise, which may be due to charge and discharge of the data I/O terminals carried out for inputting and outputting data at a high speed, and thus stable internal operations can be ensured.

The pin terminals of pin Nos. 1 and 22 located at opposite ends of the package receive the supply potential Vcc, and the pin terminals of pin Nos. 23 and 44 receive the ground potential Vss. The pin terminal of pin No. 2 receives the write enable signal /WE, and the pin terminal of pin No. 3 receives the external row address strobe signal /RAS. The terminal of pin No. 4 receives the clock enable signal /CKE. The pin terminal of pin No. 5 receives the clock signal CLK. The address signal bits A0–A11 are applied to the pins of Nos. 18–21, 24–29, 17 and 16, respectively. An address signal bit A11 applied to the pin of No. 16 is utilized as the bank selecting signal BS. Thus, 2-bank configuration is utilized in this case. The address signals applied to the address pin terminals 16–29 include the row address signals and column address signals which are applied in a time manner. In the x8-configuration, the address signal bits A0–A8 or A0–A9 are used as the column address signal. The refresh unit in the internal refresh cycle determines which of them are to be actually used.

The pin terminal of pin No. 41 receives the write mask instructing signal WM, and the pin terminal of pin No. 42 receives the output enable signal /OE. The pin terminal of pin No. 43 receives the column address strobe signal /CAS. A voltage VT applied to the pin terminals of pin Nos. 7 and 38 and a voltage Vref applied to the pin terminals of pin Nos. 15 and 30 are reference potentials which are required if the SDRAM is used together with a GTL interface. According to the GTL level, a comparison reference potential between the "H" and "L" is 0.8 V, and the signal has a logical amplitude of 0.8 V. In recent years, this has been proposed in connection with microprocessors operating in a high speed.

The pin terminals of pin Nos. 6, 39 and 40 are unused, and their specification is not defined.

In the x4-configuration, the pin terminals (data I/O terminals) of pin Nos. 12, 13, 32 and 33 are used as the I/O terminals for mask data. These mask data M0–M3 apply the mask to the data writing which is performed through particular data I/O pin terminals. The configuration performing the write-per-bit operation described above can be easily achieved. Such a configuration may be utilized that the mask data is simultaneously applied to the data I/O terminals for deactivating their input buffers. Alternatively, such a configuration may be utilized that the mask data is taken in and latched by the internal register circuit under particular conditions such as WCBR conditions, and, during the successive access, data applied through particular data I/O terminals is invalidated in accordance with the mask data held in their registers or the input buffers are maintained in the inactive state.

[SDRAM of a Second Type]

In the synchronous semiconductor memory device already described, the control signals, address signals, input data and others are internally taken into the device in synchronization with the externally applied clock signal. The synchronous semiconductor memory device is provided with a plurality of banks. By alternately accessing the banks, the interleave method can be internally achieved in the SDRAM. The memory cycle is determined by the activation period (period of "L") of the control signal /RAS. In order to switch the banks, it is necessary to temporarily raise the control signal /RAS to the inactive state of "H". This is required for setting the bank address. Successive and alternative access of the banks #1 and #2 can be performed in two methods.

In the first method, the control signals /RAS for the banks #1 and #2 are provided independently from each other. In the second method, all the external control signals are formed of one-shot pulses. The operation modes are designated by combination of the external control signals. Only when the operation mode is to be designated, the control signals are combined in a predetermined form. The SDRAM internally performs necessary operations in accordance with the operation thus set. By using the control signals in the pulse form, one of the banks can be precharged while the other is being accessed, even when the address signal is introduced in accordance with the control signal /RAS. According to the scheme in which all the control signals have the pulse form, the control signals have the same signal form as the address signals, which results in an advantage that the control signals can be produced very easily. This is owing to the fact that all the required signals are produced in the same signal form, and it is not necessary to apply an extra burden against externally provided processing devices. A configuration forming the control signals in the pulse form will be described below.

[Definition of Signal]

All the signals have the pulse form, and operations to be executed are determined by combination of the control signals. First, correlation between the states of respective control signals and operation modes executed thereby will be described below.

Figure 38:
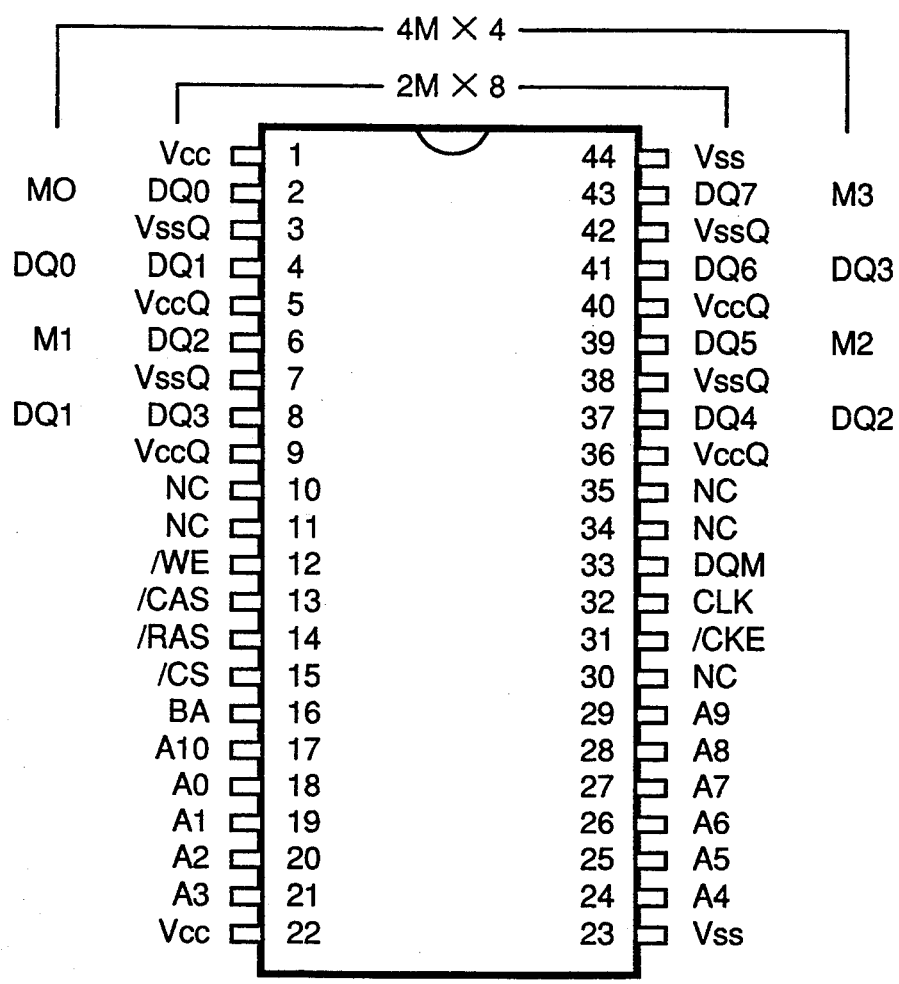
FIG. 38 shows an external appearance of a package accommodating an SDRAM of a second type of the invention and an arrangement of pins of the same.

FIG. 38 shows a pin arrangement of the pulse-utilizing synchronous semiconductor memory device. The synchronous semiconductor memory device shown in FIG. 38 has a configuration in which one word is formed of 4 bits and a configuration in which one word is formed of 8 bits, similarly to the first synchronous semiconductor device. The word configuration is determined in accordance with bonding of pads.

The operation supply voltage Vcc is supplied to the pin terminals of pin Nos. 1, 5, 22, 36 and 40. The operation supply voltage Vcc (which is indicated by vccQ in FIG. 38) supplied to the pin terminals of pin Nos. 5, 9, 36 and 40 is utilized in the I/O circuits (particularly in the I/O buffers). The ground potential Vss is supplied to the pin terminals of pin Nos. 3, 7, 23, 38 and 42. The ground potential Vss (which is indicated by VssQ in FIG. 38) supplied to the pin terminals of pin Nos. 3, 7, 38 and 42 is utilized in the I/O circuits. The supply voltage is divided into two, which are used for the I/O circuits and remaining circuits, in order to prevent generation of noise in the power supply line and ground line. Particularly, the I/O circuits are provided with the four pin terminals for the operation supply voltage vccQ and the four pin terminals for the ground potential VssQ for the purpose of surely preventing generation of noise which may be caused by ground bounce. By dispersing the power supply lines and ground lines, parasitic inductance components of the interconnections are reduced, and generation of ringing is prevented. Even if spike noise generates, the influence by the spike noise can be suppressed to an extremely small extent.

The pin terminals of pin Nos. 2, 4, 6, 8, 37, 39, 41 and 43 are used only for the input and output of data (in the case where one word is formed of 8 bits). If one word is formed of 4 bits, the pin terminals of pin Nos 2, 6, 39 and 43 are utilized for the input of mask data M0–M3.

The pin terminals of pin Nos. 17–21 and 24–29 are used as address signal input terminals. The pin terminal of pin No. 16 receives a bank address BA designating the bank. The pin terminal of pin No. 12 receives the write enable signal /WE. The pin terminal of pin No. 13 receives the column address strobe signal /CAS. The pin terminal of pin No. 14 receives the row address strobe signal /RAS. The pin terminal of pin No. 33 receives the data I/O and mask signal DQM. The signal DQM corresponds to combination of the output enable signal /OE and write mask signal WM in the former embodiment. The pin terminal of pin No. 32 receives the clock signal CLK. The pin terminal of pin No. 31 receives a clock buffer enable signal /CKE for controlling activation and deactivation of the clock buffer which takes in the clock signal CLK and generates the internal clock signal. The pin terminal of pin No. 15 receives the chip select signal /CS indicative of the fact that the semiconductor memory device is in the selected state.

These control signals are applied only in the cycle in which the operation mode is designated by the signal in the pulse form. All the control signals, address signals and data are internally taken in at the rising edges of the clock signal CLK. The operation mode designated in the device is determined in accordance with combination of states of the control signals /WE, /CAS, /RAS, /CS and DQM at the rising edge of the clock signal CLK. The correlation between these control signals and designated operation modes will be described below.

FIG. 39 shows correlation between the control signals and the operation modes designated thereby. The correlation between the control signals and the operation modes will be described below with reference to FIG. 39.

(a) /CS=/RAS="L" and /CAS=/WE="H"

In this state, taking-in of the row address is instructed and activation of the array is instructed. Thus, the row address as well as the bank address are taken in, and operations relating to the row selection are executed in the selected bank.

(b) /CS=/CAS="L" and /RAS=/WE="H"

In this state, taking-in of the column address is instructed, and the data read operation mode is designated. In this operation mode, the read data register is selected, and the operation for transferring data to the read data register of the selected memory cells is executed.

(c) /CS=/CAS=/WE="L" and /RAS="H"

In this state, taking-in of the column address and data write operation are instructed. In this operation mode, the write register is activated, and the applied data are written into the data write register and selected memory cells.

(d) /CS=/RAS=/WE="L" and /CAS="H"

The array attains the precharged state, and termination of the self-refresh cycle is instructed.

(e) /CS=/RAS=/CAS="L" and /WE="H"

In this state, the refresh is instructed, and the self-refreshing operation starts. In this operation mode, the refresh address is internally produced, and the memory cells in the selected row are refreshed using the internally provided address counter and timer.

(f) /CS=/RAS=/CAS=/WE="L"

In this operation mode, data is set in the mode register. Although not specifically described, this mode register is provided for designating the operation mode peculiar to the synchronous semiconductor memory device. An intended operation is carried out in accordance with the data set in the mode register. Such a mode register may be used for setting the wrap length required in the former embodiment and setting the wrap length sequence.

(g) DQM="L"

In this operation mode, data is written or read in accordance with the operation mode which was previously determined by the signals /CAS and /WE. Thus, externally applied write data is written into the write register, or data stored in the read data register is read.

(h) DOM="H"

In this operation mode, reading of data is deactivated, and write mask operation (i.e., masking operation in the consecutive bit data (wrap data)) is designated. An operation for masking the write data is effected on the data which is applied at the rising edge of the clock signal CLK subsequent to the change of the signal DQM to "H". The write data is masked with a delay of 1 clock, so that the timing of control signal can be easily set.

(i) /CS="L" and /RAS=/CAS=/WE="H"

In this state, operations do not change. No operation mode is designated. The semiconductor memory device is in the selected state and merely executes the operation which was previously designated.

(j) /CS="H"

In this state, the SDRAM is in the unselected state, and the signals /RAS, /CAS and /WE are ignored.

In FIG. 39, the state of signals indicated by a character "-" is "don't-care" state, and "X" indicates an "arbitrary" state. A specific operation will be described below.

[Specific Operation Sequence]

1. Data reading

Figure 40:
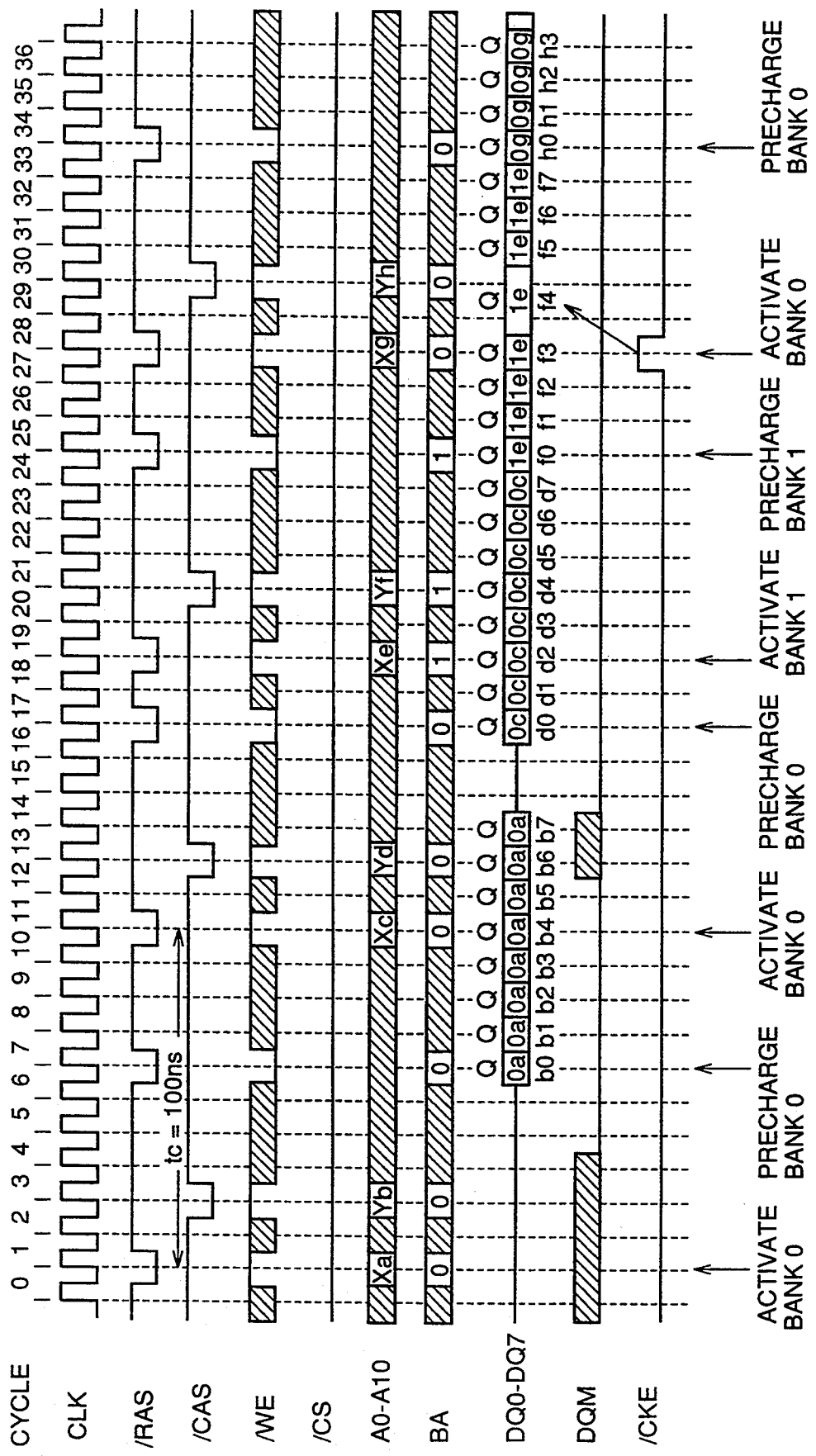
FIG. 40 is a timing chart exemplifying operations of the SDRAM of the second type.

FIG. 40 is a timing chart showing states of external signals indicative of operations during the data reading in the SDRAM of the second type. The data read operation will be described below.

In a cycle 1, the signal /RAS is set at "L" and both the signals /CAS and /WE are set at "H" at the rising edge of the clock signal CLK. At this time, the row address signal bits A0–A10 are taken in as the row address signal Xa to produce the internal address. Simultaneously, the bank address signal BA is also taken in. The bank address signal BA is "0". In this case, the bank corresponding to the bank address BA is selected. For the purpose of this description, it will be assumed that the SDRAM have the bank 0 and bank 1 corresponding to the bank addresses. In the bank 0, the row decoding operation and the activation of the arrays are executed.

In a cycle 3 after one clock, the signals /RAS and /WE are set at "H" and the signal /CAS is set at "L" at the rising edge of the clock signal CLK. This state shows the reading of data, and the address signal bits A0–A10 are taken in as the column address signal Yb at the rising edge of the clock signal CLK in the cycle 3. Thereby, operations for selecting the row and column are internally executed in accordance with the row address signal Xa and column address signal Yb, and the data in the selected memory cell is stored in the read data register. In a cycle 7 after 6 clock cycles, the data is read. In this case, the signal DQM has already been set at "L". Thereby, the reading of data is allowed.

In the cycle 7, eight data stored in the read register are sequentially read in synchronization with the rising edges of the clock signal CLK. The data of consecutive 8 bits are indicated by b0–b7, respectively.

In parallel to the reading of data, the signals /RAS and /WE are set at "L" and the signal /CAS is set at "H" at the rising edge of the clock signal CLK in the cycle 7. At this time, the bank address BA is set at "0". Thereby, the precharging of the bank 0 is instructed, and the arrays in the bank 0 are precharged.

Here, the signal DQM controls activation and deactivation of the read register with delay of two cycles in the data reading operation. This control is intended to facilitate setting of timing of the control signals for reading data. Such a configuration may be employed that the control of shift of the output buffer and read register is activated when 2 clocks elapse after the signal DQM attained "L". This configuration can be achieved by utilizing a delay circuit which delays the signal DQM by two clocks.

The bank 0 set in the precharged state can be activated again after elapse of a predetermined RAS precharge period (2 or 3 clock cycles).

In a cycle 11, the signal /RAS attains "L", and both the signals /CAS and /WE attain "H" at the rising edge of the clock signal CLK. The bank address signal BA goes to "0". The bank 0 is activated again. Simultaneously, the row address signal Xc is taken in.

In a cycle 13, the signal /CAS is set at "L" and both the signals /RAS and /WE are set at "H" at the rising edge of the clock signal CLK. The column address signal Yd is taken in, and the data read operation is instructed. In the bank 0, the selecting operation is executed in accordance with the row address Xc and column address Yd. The data of the selected memory cells is transferred to the read data register again. The output of data is executed after 6 clocks are counted since the start of the memory cycle in which the signal /RAS attained "L". In this state, the signal DQM is "L" indicating the output enable state.

In a cycle 17, eight data d0–d 7, which are selected by the addresses Xc and Yd at the rising edges of the clock signal CLK, start to be sequentially read in response to the rises of the clock signal CLK. In the cycle 17, the signals /RAS and /WE are simultaneously set at "L" and the bank address signal BA is set at "L". Thereby, the bank 0 returns to the precharged state.

In a cycle 19, the signal /RAS is set at "L", the signals /CAS and /WE are set at "H", and the bank address BA is set at "1". In this state, the bank 1 is selected, and the currently applied address signal bits A0–A10 are taken in as the row address Xe. Thereby, the row selecting operation is executed in accordance with the row address Xe in the bank 1.

The signals /RAS and /WE are set at "H" and the signal /CAS is set at "L" at the rising edge of the clock signal CLK in the cycle 21. Thereby, the data read operation for the bank 1 is designated. Simultaneously with this, a column address Yf is taken in. The signal DQM is in the state of "L" indicative of the output enable state. After the reading of data d7 from the bank 0, data f1 is read from the bank 1 at the rising edge of the clock signal CLK in a next clock cycle 25. At this time, the signal /RAS is set at "L", the signal /WE is set at "L" and the signal /CAS is set at "H". Also the bank address signal BA is "1", and thus the precharging of the bank 1 is instructed. Subsequently, the data of bank 1 is read from the data register. In the bank 1, the precharging is executed.

In a cycle 28, the signal /RAS is set at "L" again, the signals /CAS and /WE are set at "H", and the bank address signal BA is set at "0", so that the bank 0 is activated again.

At the time of rising of the clock signal CLK in the cycle 28, the clock buffer enable signal /CKE is set at "H". The signal /CKE functions to enable and disable the clock buffer. If the signal /CKE attains "H", generation of the shift clock of the register in the read register will be inhibited in the next clock cycle. Thus, data f4 read in a cycle 29 is successively read also in a next cycle 30. Thereby, in a device which performs processing of data in the exterior of the SDRAM, if the data processing speed cannot follow the data reading, or required data is not completed, the clock buffer enable signal /CKE may be set at "H", whereby the same data can be continuously output for a predetermined period. This operation is referred to as a "suspended output".

In a cycle 30, taking-in of a column address Yh in the bank 0 is carried out, and the bank 0 is precharged in a cycle 34.

As described above, owing to the application of the signal /RAS in the pulse form, the control signals /RAS, /CAS and /WE can be combined to form a predetermined state only for an initial period in the operation cycle so as to designate the operation mode. Therefore, the banks can be easily switched. When the bank 0 is activated, the bank 1 can be precharged. Therefore, it is not necessary to take the RAS precharging time into consideration, and the data can be successively read alternately from the banks 0 and 1, and thus the data can be read at a high speed.

Owing to provision of the "suspended output" operation mode, the taking-in of data can be carried out in accordance with the operation speed of the processing device even during the successive data reading, so that the timing design of the system can be facilitated. From the external viewpoint, it is shown as if the second clock signal is erased after the signal /CKE attained "H". From the internal viewpoint, the shift of the registers is executed at the rising edge of the next clock signal, so that the clock in the cycle subsequent to the cycle in which the signal /CKE attained "H" is erased.

2. Data Writing

Figure 41:
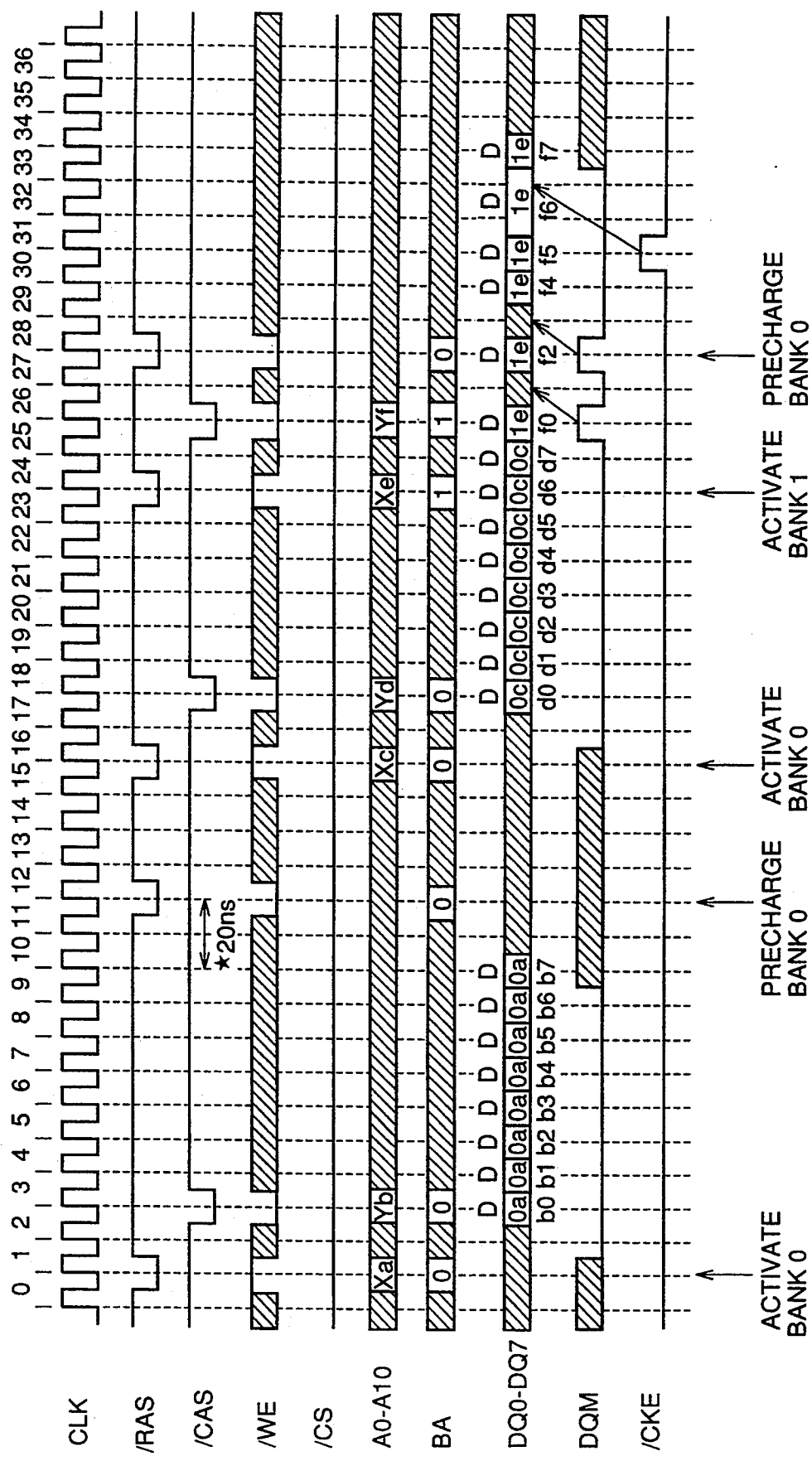
FIG. 41 is a timing chart exemplifying another operation form of the SDRAM of the second type.

FIG. 41 shows a data write operation of the SDRAM of the second type. The write operation is designated by setting the signal /WE at "L" simultaneously with the fall of the signal /CAS. In FIG. 41, the operation for writing data into the bank 0 is first designated. In this state, the data is written into the register, i.e., the external data is taken in simultaneously with the setting of the signals /CAS and /WE at "L".

In the writing operation, the signal DQM internally enables and disables the taking-in or introduction of data with delay of one clock.

In the data writing operation, it is required only to introduce the data into the input buffer simultaneously with the write instruction. At this time, the state of the write register may not be reset completely. It is necessary only to ensure the reset state of the register before the next clock cycle so as to allow the write of data b0. Therefore, the signal DQM controls enable/disable of the data writing with a delay of one clock from the data writing, which is different from the manner in the reading operation. In the data read operation, the reading operation is performed when six clocks of the clock signal CLK are counted after the start of the memory cycle. Before this time, it is necessary to set the output buffer at the enable state, and the data applied from the register must be introduced and read into the output buffer. Therefore, the signal DQM is enabled at a point of time earlier than that in the write mode.

When the signal DQM is set at "H", the write data to be applied in the next cycle is masked. The reason of masking the data applied with a delay of one clock cycle is to facilitate the timing setting. The configuration for masking the data delayed by on clock may be provided utilizing the configuration shown in FIG. 24, and particularly the configuration in which the write mask data WM is applied to the write mask data generating circuit with a delay of one clock. Owing to the configuration for masking the data delayed by one clock, the timing from the wrap address decoder to the wrap address can be easily designed.

Also in this data write mode, when the signal /CKE is set at "H", data f6 to be applied in the next clock cycle will be continuously input also in the clock cycle subsequent to the above next cycle. The shift operation of the register in the write register is inhibited. Thereby, the data can be written when the necessary data is completed in the data writing operation. This operation is referred to as a "suspended input".

Each instruction and each address signal is taken in at the rising edge of the external clock signal CLK. It is impossible to estimate in advance the time when the instructions and address signals are to be applied. Therefore, it is necessary to take in the external control signals at the rising edge of the external clock signal CLK for generating the internal control signals so as to stabilize the state. A configuration of the input part provided for this purpose will be described below.

[Control Signal Buffer]

Figure 42:
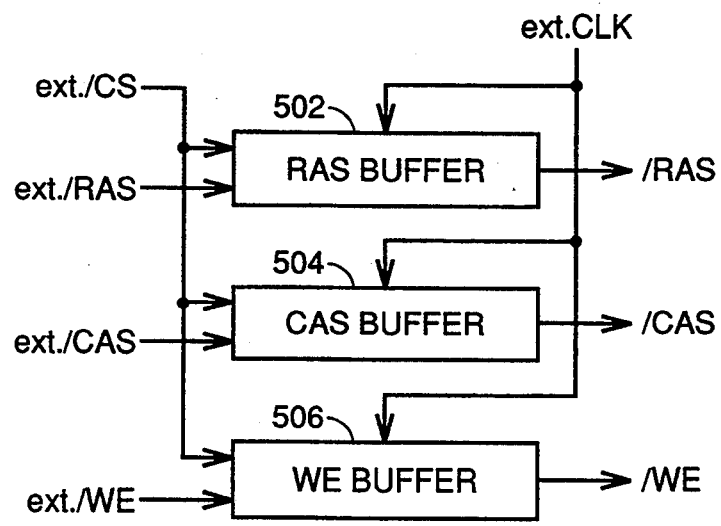
FIG. 42 shows a configuration of an external signal input part of the SDRAM of the second type.

FIG. 42 shows a configuration of the buffer circuit which takes in the signals /RAS, /CAS and /WE in synchronization with the external clock signal CLK. In FIG. 42, characters "ext." are affixed to the reference characters indicative of the external signals so as to distinguish the internal signals and the external signals from each other.

In FIG. 42, the RAS buffer is activated when an external control signal ext./CS is at "L", and takes in the external control signal ext./RAS for generating the internal control signal /RAS in synchronization with the external clock signal ext.CLK. A CAS buffer 504 is activated in response to "L" of the external control signal ext./CS, and takes in the external control signal ext./CS at the rising edge of the clock signal ext.CLK for generating the internal control signal /CAS. A WE buffer 506 is activated in response to "L" of the external control signal ext./CS, and takes in the signal ext./WE at the rising edge of the external clock signal ext.CLK for generating the internal signal /WE.

Figure 43:
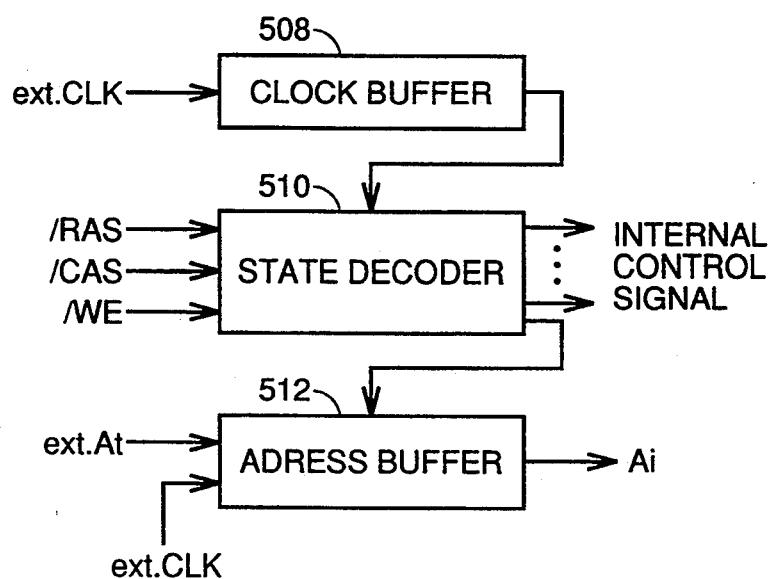
FIG. 43 shows a configuration of an address buffer part of the SDRAM of the second type.

FIG. 43 shows a circuit configuration for generating the internal address signal. In FIG. 43, a clock buffer 508 effects the buffer processing on the external clock signal ext.CLK to produce the internal clock signal CLK. A state decoder 510 takes in the internal control signals /RAS, /CS and /WE at the rising edge of the internal clock signal CLK coming from the clock buffer 508, and determines the state of the signal for producing required internal control signals. The state decoder 510 activates an address buffer 512 if the signals /RAS, /CAS and /WE instruct the taking-in of the address signal. The address buffer 512 takes in the external address ext.Ai at the rising edge of the external clock signal ext.CLK in accordance with a decode result signal coming from the state decoder 510, and produces the internal address Ai (including the bank address BA).

[Internal Control Signal Generating System]

Figure 44:
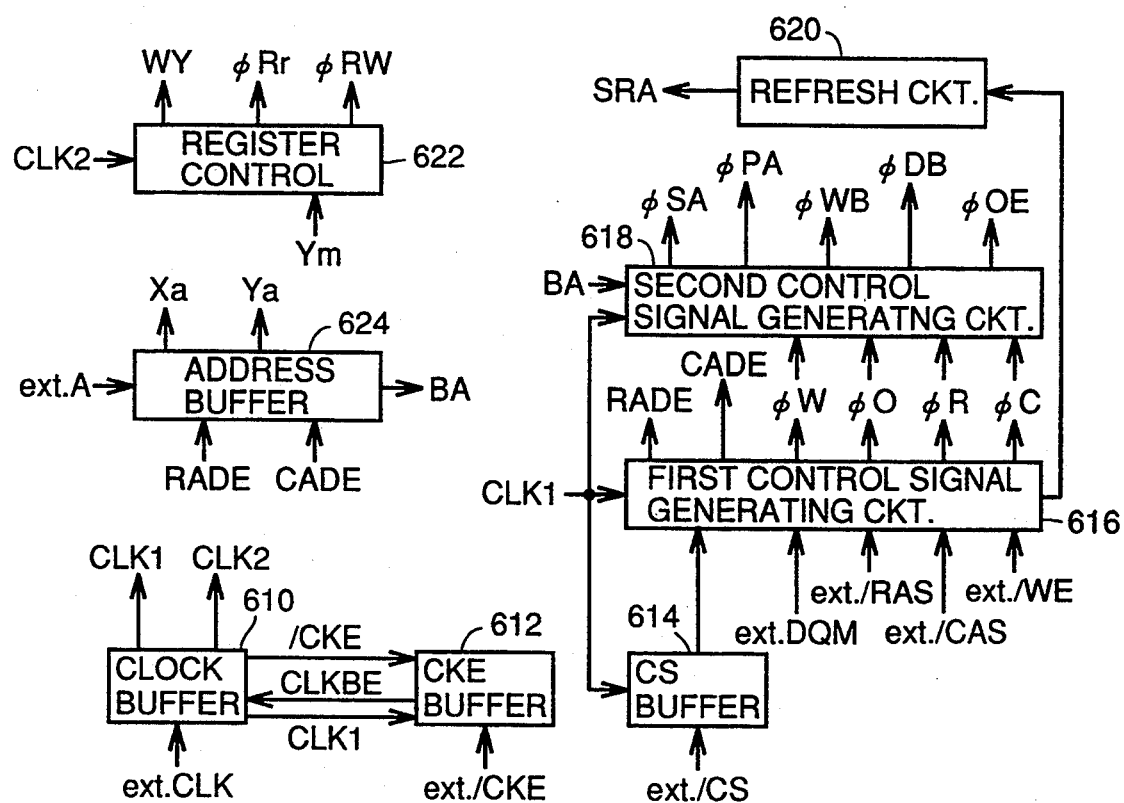
FIG. 44 is a block diagram showing an overall configuration of the SDRAM of the second type.

FIG. 44 is a block diagram schematically showing a configuration of an internal control signal generating system of the SDRAM of the second type. In FIG. 44, the memory array includes two banks, i.e., a first bank (bank 0) 600a and a second bank (bank 1) 600b. The banks 600a and 600b include the circuit portion 200 shown in FIG. 1. In FIG. 44, the internal control signals are shown to be generated commonly to the banks 600a and 600b for the sake of clarity of drawing. Only one of the banks is activated in accordance with the bank address signal BA, and the control signals are applied only to the activated bank. The banks 600a and 600b have internal configurations similar to those of the former embodiment.

In FIG. 44, the internal control system includes a CS buffer 614 which performs the buffer processing on the external control signal ext./CS to generate the internal control signal /CS, a CKE buffer 612 which is responsive to an externally applied clock buffer enable signal ext./CKE to generate control signals CLKBE and /CKE, and a clock buffer 610 which is activated in response to the control signals CLKBE and /CKE and performs the buffer processing on the externally applied clock signal ext.CLK to generate internal clock signals CLK1 and CLK2.

The CKE buffer 612 interrupts generation of the clock signals CLK1 and CLK2 from the clock buffer 610 when the external control signal ext./CKE is inactive (i.e., at "H" level). The CKE buffer 612 takes in the external control signal ext./CKE in synchronization with the first internal clock signal CLK1 coming from the clock buffer 610 and generates the internal control signal /CKE. The control signal /CKE is also applied to the clock buffer 610. The clock buffer 610 is responsive to the internal control signal /CKE to generate the second internal clock signal CLK2 synchronized with the external clock signal ext.CLK. When a special mode is set, the CKE buffer 612 takes in the external control signal ext./CKE asynchronously with the clock signal CLK1 (i.e., external clock signal ext.CLK), generates the control signal CLKBE, and inhibits generation of the clock signals CLK1 and CLK2.

More specifically, the clock buffer 610 receives the control signals CLKBE and /CKE in parallel from the CKE buffer 612, and thereby is controlled to be activated and deactivated. If one of the control signals CLKBE and /CKE is active, the clock buffer 610 generates the internal clock signal. Only when a special mode is designated, generation of the internal clock signal by the clock buffer 610 is interrupted. Here, the clock buffer 610 generates two clock signals, i.e., the first and second internal clock signals CLK1 and CLK2 for the purpose of inhibiting operations of unnecessary buffer circuits in the self-refreshing operation and standby operation. More specifically, the first internal clock signal CLK1 is used to take in the control signals such as the external control signals ext./RAS, ext./CAS and ext./WE. The second internal clock signal CLK2 is utilized for controlling the input and output of data. The second clock signal CLK2 is applied only to the data I/O control system, whereby the suspended input operation and suspended output operation described before can be achieved.

The SDRAM further includes a first control signal generating circuit 616 which is activated in response to the internal control signal /CS coming from the CS buffer 614 and takes in the external control signals ext.-/RAS, ext./CAS, ext./WE and ext. DQM for generating the internal control signals, a second control signal generating circuit 618 which generates the control signals for driving the selected array in response to the control signals coming from the first control signal generating circuit 616, and a refresh circuit 620 which performs the refresh operation in response to a refresh instruction coming from the first control signal generating circuit 616.

The first control signal generating circuit 616 is responsive to the first internal clock signals CLK1 to take in the external control signals ext./RAS, ext./CAS, and ext./WE, and determines the operation mode which is designated by the combination of the current signal states. In accordance with the result of determination, the first control signal generating circuit 616 generates the write control signal $\phi W$, read control signal $\phi O$, row selection control signal $\phi R$, column selection control signal $\phi C$, row address buffer activating signal RADE and column address buffer activating signal CADE. The first control signal generating circuit 616 also takes in the external control signal ext.DQM at the rising edge of the first internal clock signal CLK1 and sets the I/O buffer in the enable state.

The second control signal generating circuit 618 receives the first internal clock signal CLK1 and bank address signal BA, and generates the sense amplifier activating signal $\phi SA$, preamplifier activating signal $\phi PA$, write register activating signal $\phi WB$, input buffer activating signal $\phi DB$ and output buffer enable signal $\phi OE$ in accordance with the control signal coming from the first control signal generating circuit 616. The control signals $\phi WB$, $\phi DB$ and $\phi OE$ generated from the second control signal generating circuit 618 are determined by the first internal clock signal CLK1. More specifically, these control signals $\phi WB$, $\phi DB$ and $\phi OE$ are generated in accordance with the predetermined count value of the internal clock signal CLK1.

The refresh circuit 620 generates the refresh address SRA in accordance with the refresh instruction coming from the first control signal generating circuit 616, and applies the refresh address SRA to the banks 600a and 600b (if the banks 600a and 600b are to be refreshed simultaneously) instead of the internal row address Xa coming from the address buffer. The refresh circuit 620 includes an address counter for generating the refresh address and a multiplexer for switching the refresh address and the ordinary internal row address. A refresh period is defined by a timer included in the first control signal generating circuit 616. The refresh address SRA coming from the refresh circuit 620 may be applied to an address buffer 624, which will be described later, and the multiplexer for switching the refresh address SRA and the ordinary external address ext.A may be provided at a front stage of the address buffer 624. In this case, the first control signal generating circuit 616 generates the row address buffer activating signal RADE and row selection control signal $\phi R$ when it receives the refresh instruction.

The SDRAM also includes the address buffer 624 which is activated in response to the row address buffer activating signal RADE and column address buffer activating signal CADE coming from the first control signal generating circuit 616, and thereby takes in the external address signal ext.A as the row address signal and column address signal for generating the internal row address signal Xa and internal column address signal Ya as well as bank address signal BA. The SDRAM further includes a register control circuit 622 which operates in response to the second internal clock signal CLK2, and receives predetermined bits of the internal column address signal Ym of coming from the address buffer 624 for generating signals which controls the read register and write register shown in FIG. 1, i.e., the wrap address WY, read register drive signal err and write register drive signal $\phi$Rw. The register control circuit 622 is operated in synchronization with the second internal clock signal CLK2, whereby the suspended input operation and suspended output operation described before can be achieved if generation of the second internal clock signal CLK2 is interrupted. The reason for the above is that the control signal $\phi$Rr or $\phi$Rw is not generated because the second internal clock signal CLK2 is not applied, so that the shift operation in the register is not performed.

As shown in FIG. 44, there is provided a control signal ext./CKE which controls the activation and deactivation of the clock buffer and forms an input to the first control signal generating circuit 616, and the buffer operation of the clock buffer is controlled by this control signal. The clock buffer 610 produces the internal clock signals CLK1 and CLK2 synchronized with the external clock signal ext.CLK. The first control signal generating circuit 616, which takes in the external control signal ext./RAS and others, takes in the external control signals in synchronization with the first internal clock signal CLK1 (i.e., in synchronization with the external clock signal ext.CLK). The CS buffer 614 takes in the external control signal ext./CS at the rising edge of the first internal clock signal CLK1.

The first control signal generating circuit 616 takes in the external control signals only when the internal control signal /CS is active. If the internal clock signal CLK1 is not generated, the first control signal generating circuit 616 and CS buffer 614 do not take in the external control signal. Thereby, it is not necessary to always operate the buffer circuit taking in the external control signal, so that power consumption can be reduced. Even in the case where the clock signal CLK1 has been generated, the taking-in of the internal control signal ext./RAS and others is not performed if the internal control signal /CS is inactive, so that the power consumption can be reduced similarly.

The address buffer 624 takes in the external address signal ext.A only when the internal control signals RADE and CADE are generated. Therefore, the address buffer 624 takes in and latches the address only when the address is designated, so that it does not operate at every cycle of the external clock signal ext.CLK, resulting in reduction of the power consumption.

The clock buffer 610 is activated only when the activation is required in accordance with the control signals CLKBE and /CKE coming from the CKE buffer 612. Thereby, the clock buffer 610 can inhibit the taking-in of the external clock signal ext.CLK, for example, in the standby state in which the SDRAM is not accessed. Therefore, the internal clock signals CLK1 and CLK2 are generated only when required, so that it is not necessary to always take in the external clock signal ext.CLK, and thus the power consumption can be reduced similarly.

[Data Read Circuitry]

Figure 45:
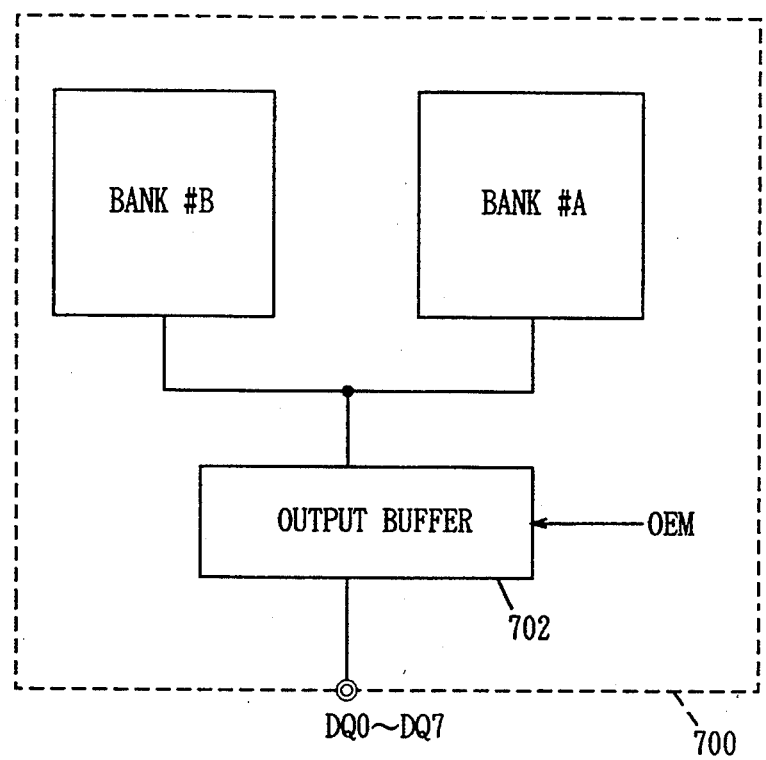
FIG. 45 schematically shows a configuration of an output part of the SDRAM of the invention.
Figure 46:
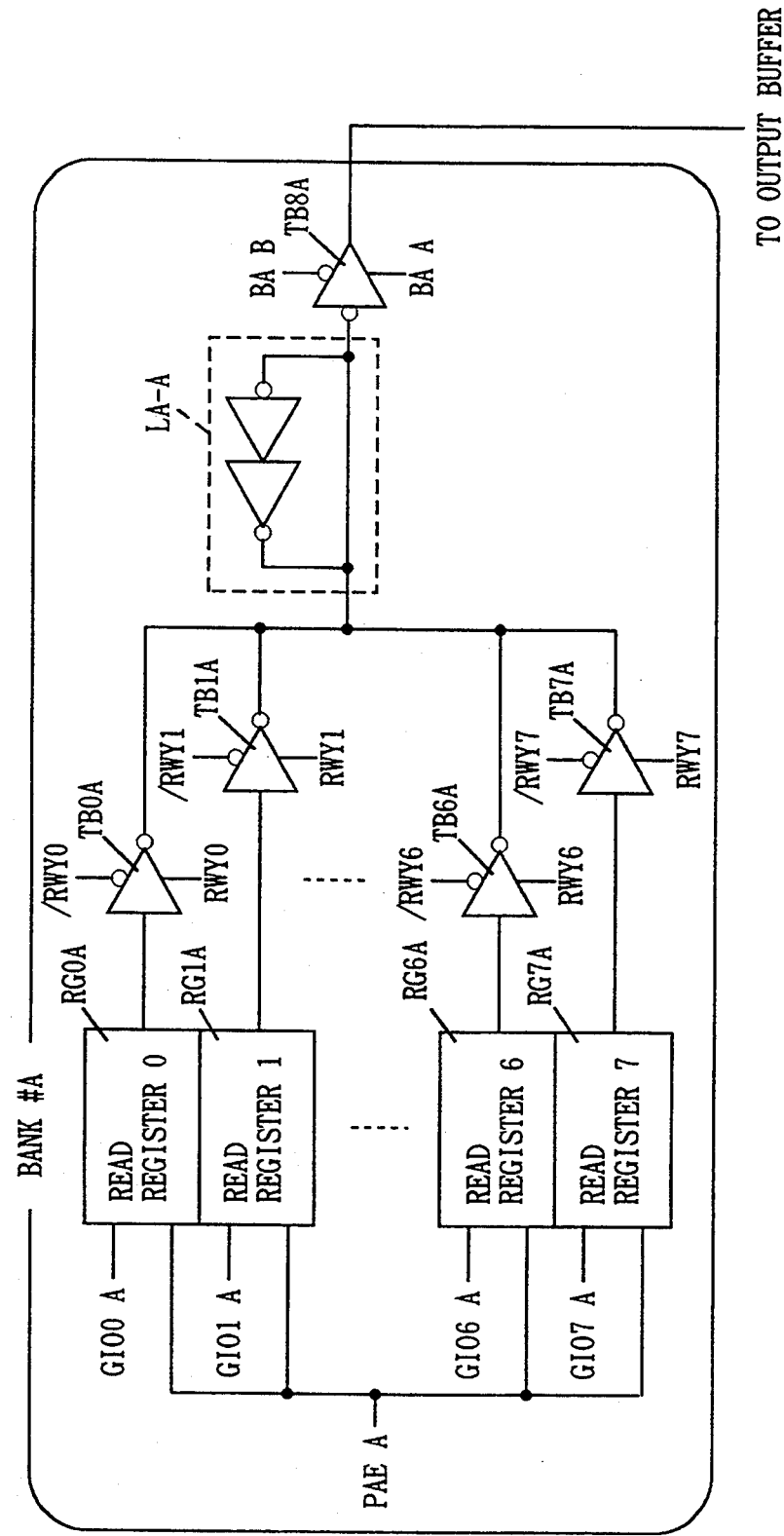
FIG. 46 shows a configuration of a data output part of a bank #A shown in FIG. 45.
Figure 47:
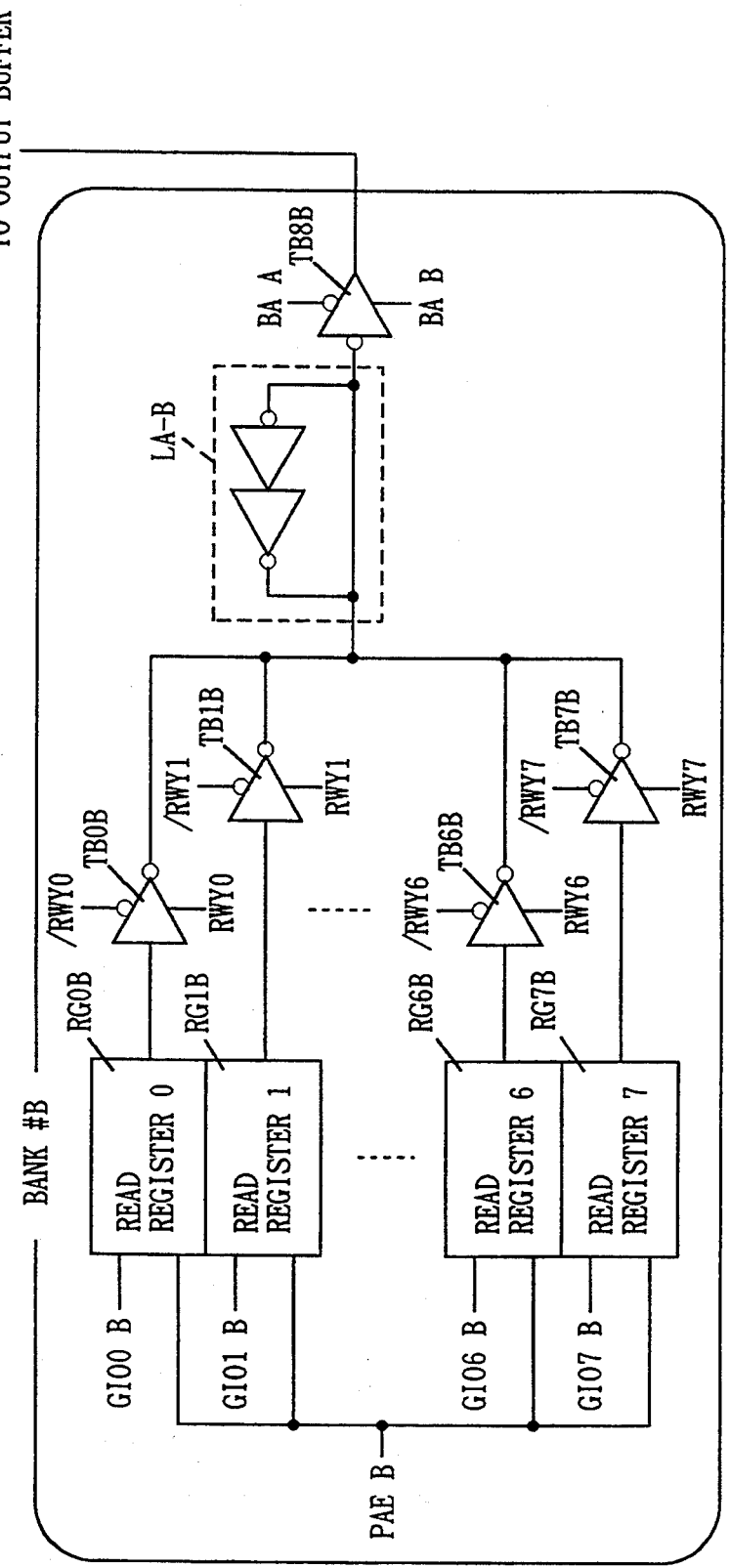
FIG. 47 shows a configuration of a data output part of a bank #B shown in FIG. 45.

FIGS. 46-47 show specific configurations of the data read circuitry of the SDRAM shown in FIGS. 1 and 45. As shown in FIG. 45, an SDRAM 700 includes two banks #A and #B as well as an output buffer 702 provided commonly to the banks #A and #B. In FIG. 45, there are shown the data I/O terminals DQ0-DQ7, and thus there is shown, as an example, a configuration performing input and output of data in units of 8 bits. The output buffer 702 is activated in response to the read control signal OEM, and receives the data coming from the selected bank for producing the read data and transmitting the same to the data I/O terminals DQ0-DQ7.

FIG. 46 shows a configuration of a data reading portion of the bank #A. Particularly, FIG. 46 shows a configuration of a portion related to one data I/O terminal DQ.

In FIG. 46, the bank #A includes read registers RG0A-RG7A which are provided corresponding to eight global I/O line pairs GIO0A-GIO7A, respectively, and are responsive to the preamplifier enable signal PAEA to amplify and latch the data on the corresponding global I/O line pairs, tri-state inverter buffers TB0A-TB7A which are provided correspondingly to the read registers RG0A-RG7A, respectively, and are responsive to wrap addresses RWY0 and /RWY0-RWY7 and /RWY7 to invert and amplify data held by the corresponding read registers, a latch circuit LA-A latching data coming from the inverter buffers TB0A-TB7A, and a tri-state inverter buffer TB8A inverting and amplifying data, which is transmitted from the inverter buffers TB0A-TB7A and is latched in the latch circuit RA-A, for transmitting the same to the output buffer. The inverter buffer TB8A is activated in response to the bank designating signals BAA and BAB which are generated in accordance with the bank address BA.

FIG. 47 shows a configuration of a data read system of the bank #B shown in FIG. 45. The bank #B has a configuration similar to that of the bank #A. More specifically, the bank #B includes read registers RG0B-RG7B which are activated in response to a preamplifier enable signal PAEB and amplifying and latching data on corresponding global I/O lines GIO0B-GIO7B, tri-state inverter buffers TB0B-TB7B which are activated in response to the wrap address to invert and amplify the outputs on the corresponding read register RG0B-RG7B, respectively, a latch circuit LA-B latching outputs of the inverter buffers TB0B-TB7B, and tri-state inverter buffer TB8B inverting and amplifying the latched data of the latch circuit LA-B. The inverter buffer TB8B is activated in response to the bank designating signals BAA and BAB, and transmits the inverted and amplified data to the output buffer. Then, data reading operations of the SDRAM shown in FIGS. 45-47 will be described below with reference to a waveform diagram of FIG. 48.

Figure 48:
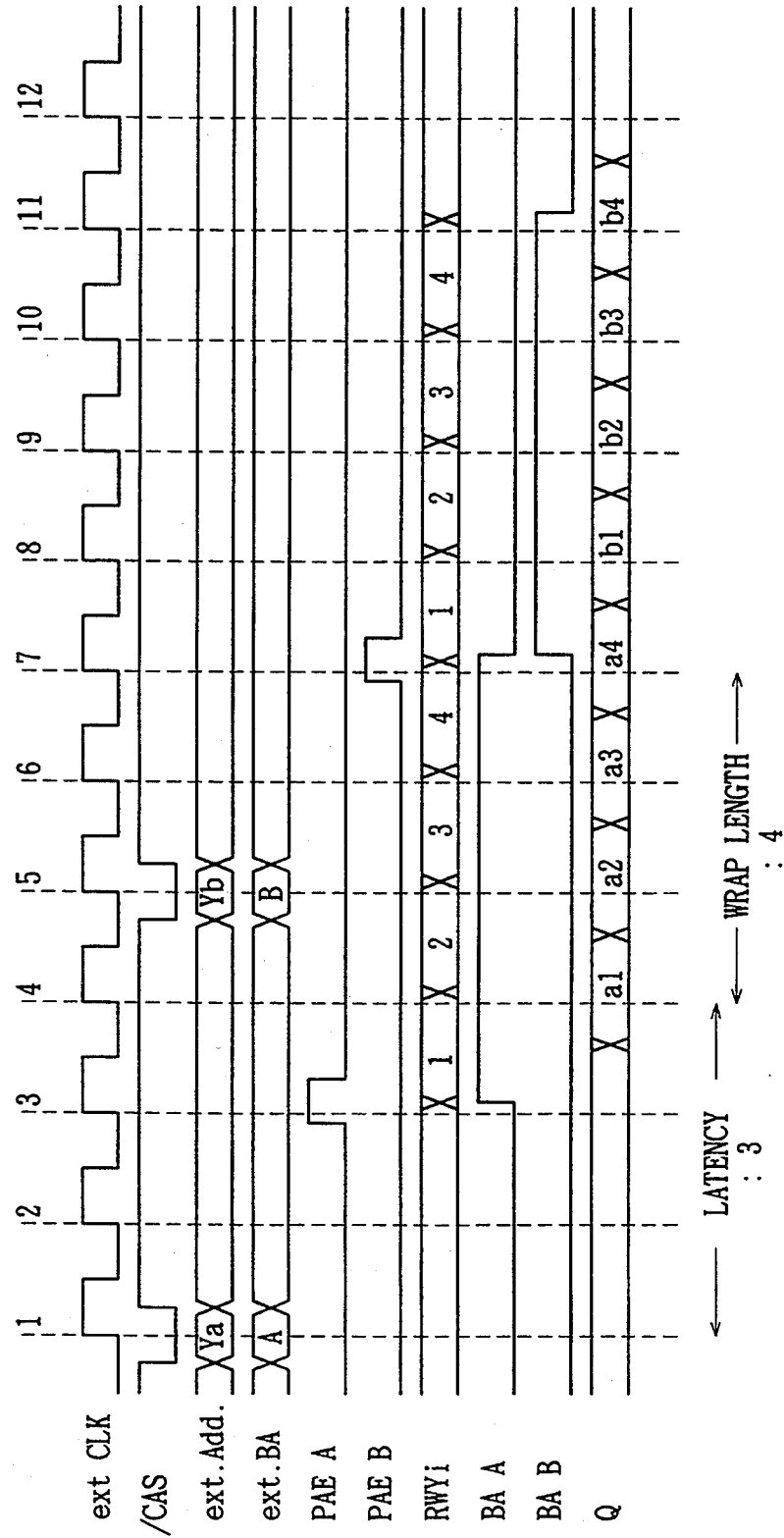
FIG. 48 is a timing chart showing an operation for reading data from the bank shown in FIG. 47.

FIG. 48 shows waveforms in a data reading operation with the latency of 3 and the wrap length of 4. Here, the latency is the number of clock cycles required from the start of the column access to the appearing of valid data on the data I/O terminal DQ (indicated by a reference "Q" in FIG. 48). The start of the column access is instructed by setting the signal /CAS at "L" at the rising edge of the clock signal CLK. The same column access cycle is performed in both the configurations shown in FIGS. 1 and 44. Therefore, the signal /RAS is not shown in FIG. 48. The signal /RAS is set before the designation of the column access in accordance with respective operation manners.

In a first cycle (clock No. 1), the signal /CAS falls to "L". The write enable signal /WE is "H" and designates the data read. The bank #A is designated in accordance with the address signal Ya and bank address BA which are simultaneously applied at this time. The row access has already been executed by the signal /RAS. The column selecting operation is executed in the bank #A in accordance with the column access instruction (column selecting operation instruction), and data of the selected memory cells is transmitted to the global I/O line pairs GIO0–GIO7.

When the data on the global I/O line pairs GIO0–GIO7 is fixed, the preamplifier enable signal PAEA rises to "H". The timing of generation of the preamplifier enable signal PAEA is set in accordance with the latency, and it is generated in synchronization with the rise of the clock of a third cycle (clock No. 3). Thereby, the read registers RG0A–RG7A latch the data on the corresponding global I/O line pairs.

Then, the wrap addresses RWYi are sequentially generated from the wrap address generating circuit in accordance with the predetermined sequence during the clock cycles starting from the third clock cycle and corresponding to the wrap length. In this third clock cycle, the bank designating signal BAA similarly rises to "H" in accordance with the bank address BA, and the inverter buffer TB8A is activated. The inverter buffers TB0A–TB7A activated by the wrap addresses transmit the data to the output buffer 702. The output buffer 702 receives the signal OEM (not shown in FIG. 48) in a timing similar to that of the bank designating signal BAA. Thereby, the valid data is sequentially output from the fourth clock cycle.

In a fifth clock cycle, the signal /CAS falls to "L", and the column selecting operation is effected on the bank #B, in which the row access has already been performed in accordance with the currently applied address signal ADD and bank address BA. In a seventh cycle, the preamplifier enable signal PAEB for the bank #B rises to "H", and, in the bank #B, the data is transferred from the global I/O line pairs GIO0B–GIO7B to the read registers RG0B–RG7B, respectively and is latched. The wrap addresses are sequentially generated from the seventh clock cycle, and the data of the read register in the selected bank #B is transmitted to the output buffer. Thereby, the data b1–b4 read from the bank #B are sequentially output from the eighth clock cycle. As described above, the banks #A and #B are alternately accessed, whereby the data can be read from both the banks #A and #B at a high speed. The successive access to the banks #A and #B can be easily achieved in the SDRAM using the pulse scheme shown in FIG. 44. Such a configuration may be employed that the banks #A and #B utilize independent signals /RAS.

The preamplifier enable signal PAEA (or PAEB) and wrap address RWYi may be generated in synchronization with the clock signal CLK, whereby the data can be read from the memory array in a pipelined manner, so that the data can be read at a high speed.

[Bank Designating Signal Generating System]

Figure 49:
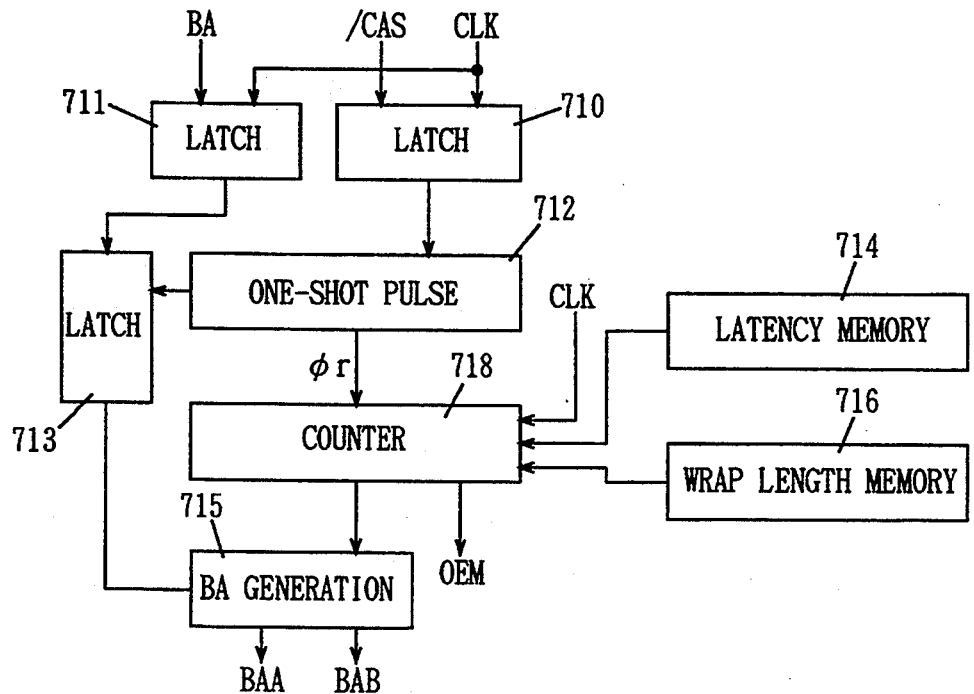
FIG. 49 shows a circuit configuration for generating a data output control signal.

FIG. 49 shows a configuration of a circuitry generating the bank designating signals BAA and BAB. Referring to FIG. 49, the bank designating signal generating system includes a latch circuit 710 which latches the signal /CAS at the rising edge of the clock signal CLK, a latch circuit 711 which takes in the bank address BA at the rising edge of the clock signal CLK, a one-shot pulse generating circuit 712 which is responsive to the output signal (column selecting operation instruction) coming from the latch circuit 710 to generate a one-shot pulse $\phi r$ having a predetermined width, and a latch circuit 713 which is responsive to the one-shot pulse $\phi r$ coming from the one-shot pulse generating circuit 712 to latch the data latched in the latch circuit 711. The latch circuits 710 and 711 renew their latched data in accordance with the rising edges of the clock signal CLK. The latch circuit 713 renews its latched data in accordance with the one-shot pulse $\phi r$ coming from the one-shot pulse generating circuit 712.

The bank designating signal generating system further includes a latency memory circuit 714 storing latency information, a wrap length memory circuit 716 storing the wrap length data, a counter circuit 718 which is activated in response to the one-shot pulse $\phi r$ coming from the one-shot pulse generating circuit 712 and performs the count operation in accordance with the latency data and wrap length data which are held by the latency memory circuit 714 and wrap length memory circuit 716, respectively, and a BA generating circuit 715 which selects the output signals coming from the counter circuit 718 in accordance with the latched data of the latch circuit 713 and generates the bank designating signal BAA or BAB.

The counter circuit 718 is activated in response to the one-shot pulse signal $\phi r$, and counts the clock number (latency 1) indicated by the latency data contained in the latency memory circuit 714 for generating a signal, which will become active later. After generating the activation signal, the counter circuit 718 maintains the active state for a clock cycle period indicated by the wrap length data held by the wrap length memory circuit 716. A specific configuration of the counter circuit 718 will be described later. The output enable signal OEM is generated from the counter circuit 718. Generation of the output enable signal OEM is triggered by the signal which is applied from the counter circuit 718 to the BA generating circuit 715. Then, an operation of the bank designating signal generating system shown in FIG. 49 will be described below with reference to an operation waveform diagram of FIG. 50.

In the first clock cycle (indicated by the number "1" in FIG. 50), the signal /CAS falls to "L" at the rising edge of the clock signal CLK. This state corresponds to the column access instruction, and the SDRAM starts the column selecting operation from this cycle. The latch circuit 710 latches the signal /CAS at the rising edge of the clock signal CLK. The latch circuit 711 latches the bank address BA at the rising edge of the clock signal CLK. The one-shot pulse generating circuit 712 is responsive to the signal of "L" coming from the latch circuit 710 to generate the one-shot pulse signal $\phi r$. In accordance with the one-shot pulse signal $\phi r$, the latch circuit 713 latches the bank address BA, which is applied from the latch circuit 711.

Figure 50:
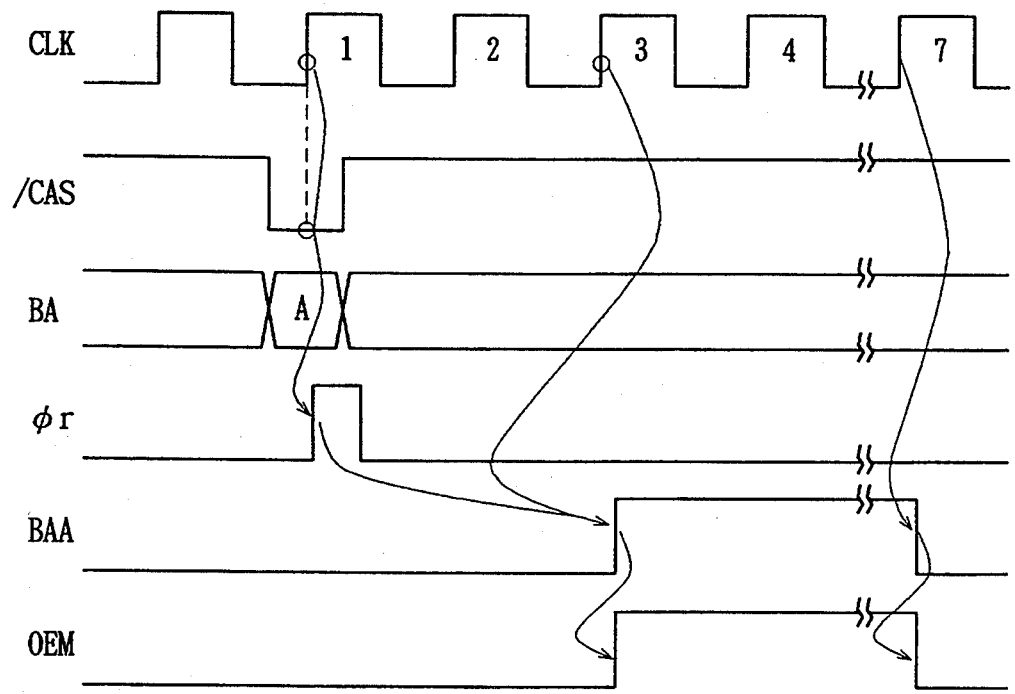
FIG. 50 is a signal waveform diagram showing an operation of a circuit shown in FIG. 49.

The counter circuit 718 starts to count the clock signal in response to the one-shot pulse signal φr. When the count value coincides with the clock cycle number (latency 1) indicated by the latency information stored in the latency memory circuit 714, the counter circuit 718 generates the signal rising to "H". In this time, the counter 718 may have such a configuration that the one-shot pulse signal φr is counted as one clock. The counter circuit 718 may have such a configuration that, after the application of the one-shot pulse signal φr, it detects the rise of the clock signal CLK, of which clock number is smaller by two than the clock cycle number indicated by the latency number data stored in the latency memory circuit 714. In FIG. 50, three states of the latency are shown, and also the case where the bank #A is designated is shown. The BA generating circuit 715 generates the bank designating signal BAA in accordance with the activating signal coming from the counter circuit 718. In this time, the counter circuit 718 also generates the output enable signal OEM using the bank designating signal BAA as a trigger. The active state of the output signal of the counter circuit 718 is maintained for clock cycles indicated by the wrap length stored in the wrap length memory circuit 716. FIG. 50 shows the case where the wrap length is 4, and also shows the state in which the bank designating signal BAA and output enable signal OEM change to "L" at the seventh cycle, i.e., when four clock cycles elapse after the third clock cycle.

[Read Register]

Figure 51:
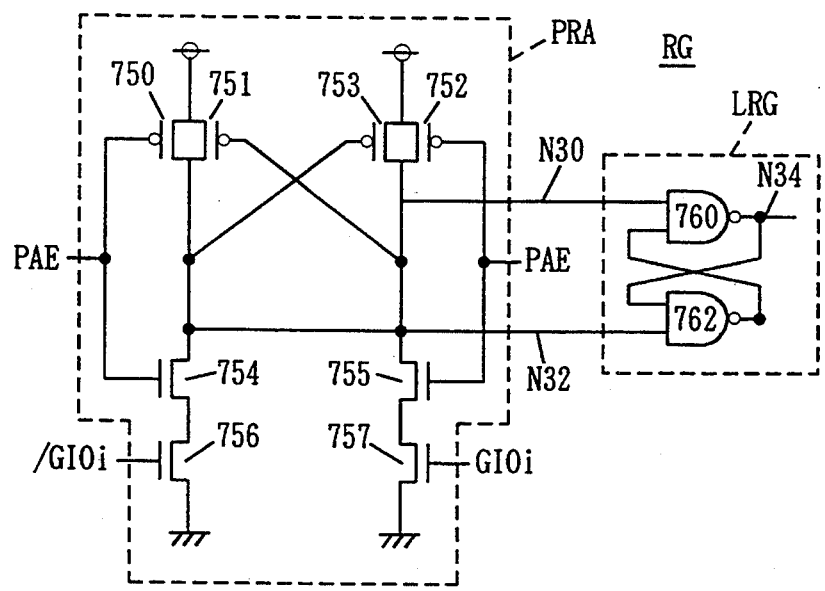
FIG. 51 shows an example of a specific configuration of a read register shown in FIGS. 46 and 47.

FIG. 51 shows a specific configuration of the read register shown in FIGS. 46 and 47. The read registers RG0A–RG7A and RG0B–RG7B in FIGS. 46 and 47 have the same configurations, and one of them is shown in FIG. 51 and is indicated by the reference characters "RG".

Referring to FIG. 51, the read register RG includes a preamplifier PRA amplifying the signal potentials on the global I/O lines GIOi and /GIOi in response to the preamplifier enable signal PAE (PAEA or PAEB), and a latch circuit LRG latching the data amplified by the preamplifier PRA. The preamplifier PRA includes a p-channel MOS transistor 750 and an n-channel MOS transistor 754 which are complementarily coupled and receive on their gates the preamplifier enable signal PAE (PAEA or PAEB), an n-channel MOS transistor 756 which is arranged between the transistor 754 and the ground potential and is connected at its gate to the global I/O line/GIOi, a p-channel MOS transistor 752 and an n-channel MOS transistor 755 which receive on their gates the preamplifier enable signal PAE and are complementarily coupled together, and an n-channel MOS transistor 757 which is arranged between the transistor 755 and the ground potential and is connected at its gate to the global I/O line GIOi.

The preamplifier PRA further includes a p-channel MOS transistor 751 arranged in parallel to the transistor 750, and a p-channel MOS transistor 753 arranged in parallel to the transistor 752. The gates and drains of the transistors 751 and 753 are cross-coupled.

Figure 52:
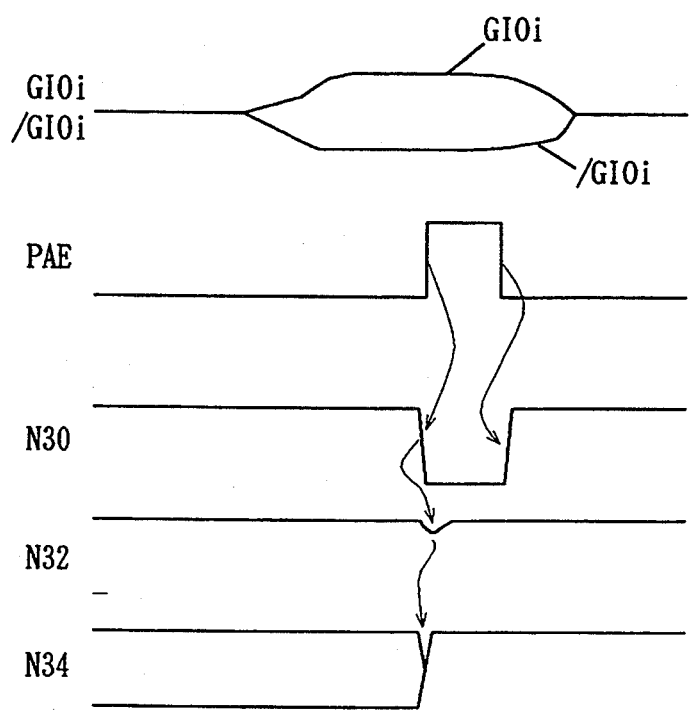
FIG. 52 is a signal waveform diagram showing an operation of the read register shown in FIG. 51.

The latch circuit LRG includes two 2-input NAND circuits 760 and 762. The NAND circuit 760 is coupled at its one input to a node N30 (one of output nodes of the preamplifier PRA), and is coupled at the other input to an output of the NAND circuit 762. The NAND circuit 762 is coupled at its one input to a node N32 (other output node of the preamplifier PRA), and is coupled at the other input to an output node N34 of the NAND circuit 760. The stored data of the read register RG is output through the output node N34 of the NAND circuit 760. An operation of the read register shown in FIG. 51 will be described below with reference to an operation waveform diagram of FIG. 52.

When the column selecting instruction is applied (i.e., when signal /CAS falls to "L"), data of the selected memory cell in the selected bank is transmitted to the global I/O lines GIOi and /GIOi, and signals on the global I/O line pair GIOi and /GIOi change to have potentials corresponding to the read data. In the situation shown in FIG. 52, data "1" (corresponding to the potential "H") is read onto the global I/O line GIOi, and data of "0" (corresponding to the potential "L") is read onto the global I/O line/GIOi.

When the potentials on the global I/O lines GIOi and /GIOi are fixed, the preamplifier enable signal PAE is generated using the clock signal CLK as a trigger.

While the signal PAE maintains "L", the p-channel MOS transistors 751 and 752 in the preamplifier PRA are in the ON state, and the n-channel MOS transistors 754 and 755 are in the OFF state. Therefore, the nodes N30 and N32 have been precharged to the potential of "H". In this state, the latched data of the latch circuit LRG does not change, and it holds the signal which was read in the former access cycle. When the preamplifier enable signal PAE rises to "H", the transistors 750 and 752 are turned off, and the transistors 754 and 755 are turned on. The transistors 756 and 757 receive on their gates the signal potentials of the global I/O lines/GIOi and GIOi which are already in the stable state. It is assumed that the signal potential on the global I/O line GIOi is "1". Therefore, the conductance of the transistor 757 is higher than that of transistor 756, and the node N30 is discharged by the transistors 755 and 757 at a speed higher than the node N32. When the potential of the node N30 decreases, the transistor 751 changes to the ON state and thereby charges the node N32. As the potential of the node N32 increases, the transistor 753 turns to the OFF state. Thereby, the potentials of the node N30 and N32 change to the potentials corresponding to the global I/O lines GIOi and /GIOi at a high speed. Thus, the potential of the node N30 changes to "L", and the potential of the node N32 changes to "H". Correspondingly, the output of the NAND circuit 760 changes to "H", and the data read from the selected memory cell is latched in the node N34.

If the signal potential on the global I/O line GIOi is "L" and the signal potential on the global I/O line /GIOi is "H", the potential of the node N30 attains "H", and the potential of the node N32 attains "L", so that both the inputs of the NAND circuit 760 attain "H", and thus the signal potential of "L" is latched in the node 34.

[Preamplifier Enable Signal Generating System]

Figure 53:
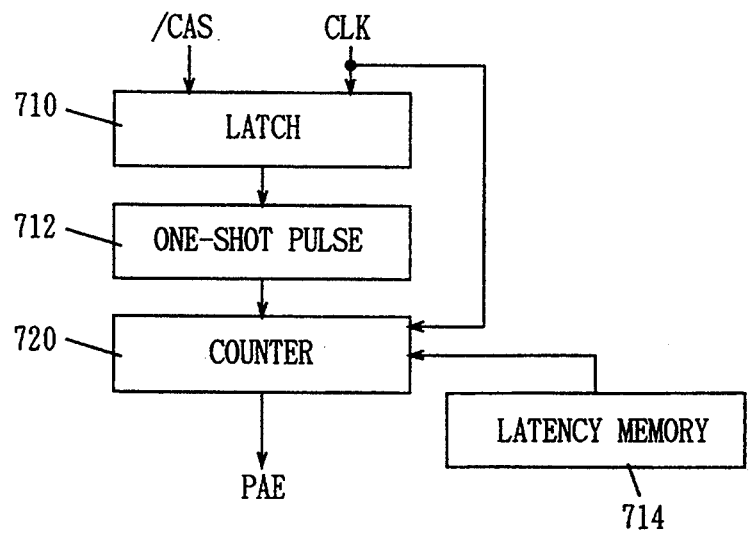
FIG. 53 shows a circuit configuration for generating a preamplifier enable signal shown in FIG. 51.

FIG. 53 shows a circuit configuration for generating the preamplifier enable signal PAE. In FIG. 53, the PAE signal generating system includes a latch circuit 710 which latches the signal /CAS at the rising edge of the clock signal CLK, a one-shot pulse generating circuit 712 which generates a pulse of one-shot in response to the output signal of the latch circuit 710, and a counter circuit 720 which is responsive to the one-shot pulse coming from the one-shot pulse generating circuit 712 to count the clock signal CLK in accordance with the memory information of the latency memory circuit 714 and generates the preamplifier enable signal PAE when the count reaches a predetermined value. Then, an operation of the preamplifier enable signal generating system shown in FIG. 53 will be described below with reference to an operation waveform diagram of FIG. 54.

Figure 54:
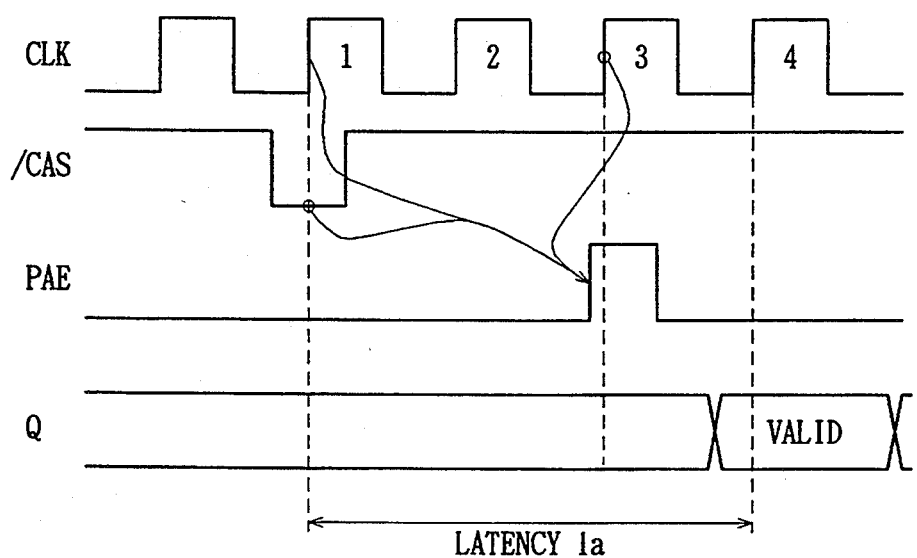
FIG. 54 is a signal waveform diagram showing an operation of a circuitry shown in FIG. 53.

When the signal /CAS is set at "L" at the rising edge of the clock signal CLK, the column selecting operation (column access) starts. At this time, the output of the latch circuit 710 falls to "L", and the one-shot pulse generating circuit 712 generates the pulse of one-shot. The one-shot pulse generated by the one-shot pulse generating circuit 712 indicates that the column selecting operation starts. The counter circuit 720 counts the clock signal CLK in accordance with the one-shot pulses from the one-shot pulse generating circuit 712. When the count reaches a value which is smaller by one than the latency stored in the latency memory circuit 714, the counter circuit 720 generates the one-shot pulse signal using the currently applied clock signal CLK as a trigger. The one-shot pulse signal generated from the counter circuit 720 forms the preamplifier enable signal PAE. The preamplifier enable signal PAE supplied from the counter circuit 720 is generated only for the read register provided for the selected bank owing to the configuration similar to the BA generating circuit 715 shown in FIG. 49. Such a configuration may be employed that counter circuits 720 are provided for the respective banks #A and #B, and only the counter circuit corresponding to the selected bank is activated in accordance with the bank address BA. FIG. 54 shows, as an example, the case where the latency 1a is 3. Therefore, the preamplifier enable signal PAE is generated using, as a trigger, the second clock signal (clock No. 3) generated after the start of the column selecting operation.

Figure 55:
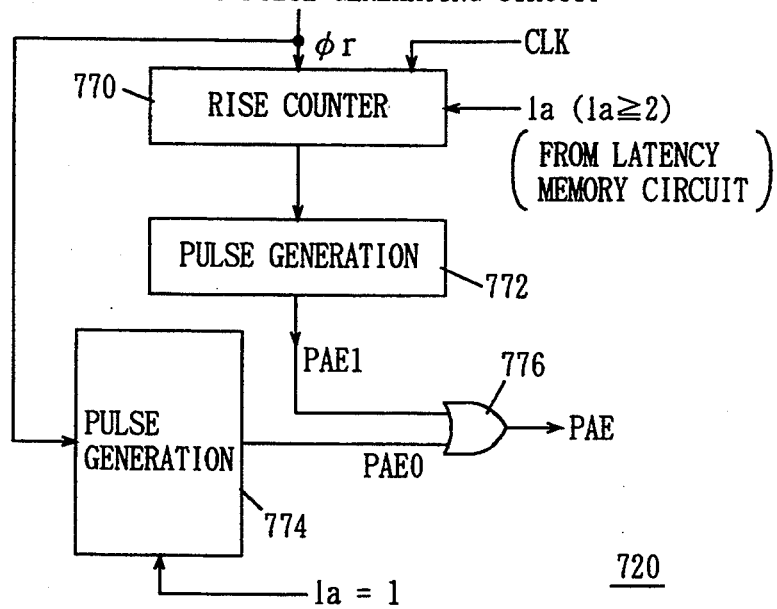
FIG. 55 shows an example of a specific configuration of a counter circuit shown in FIG. 53.
Figure 56:
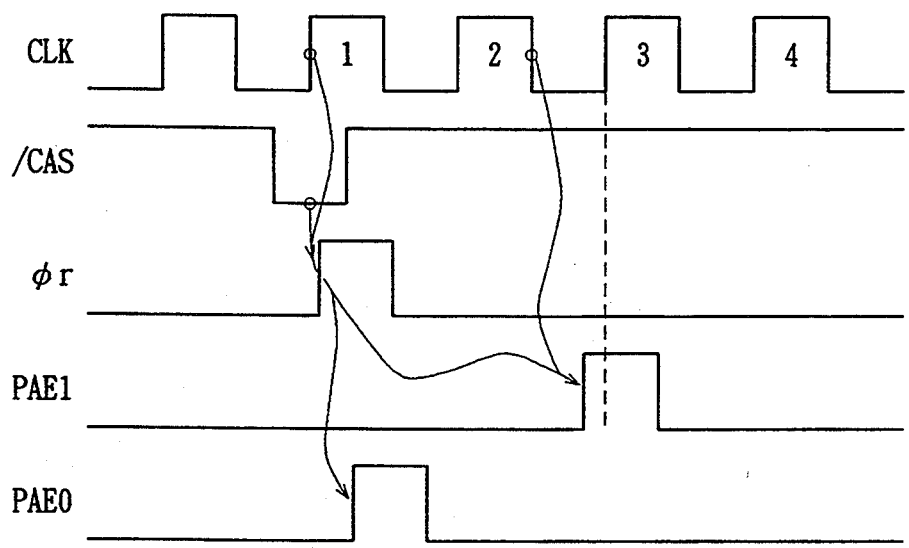
FIG. 56 is a signal waveform diagram showing an operation of a counter circuit shown in FIG. 55.

FIG. 55 shows a specific configuration of a counter circuit 720 shown in FIG. 53. In FIG. 55, the counter circuit 720 includes a fall counter 770 which is activated in response to the one-shot pulse $\phi r$ applied from the one-shot pulse generating circuit and counts the fall of the clock signal CLK, a pulse generating circuit 772 which generates a pulse signal PA1, which has a predetermined pulse width, in response to a count-up signal coming from the fall counter 770, a pulse generating circuit 774 which is activated when the latency data coming from the latency memory circuit shows "1" and is responsive to the one-shot pulse $\phi r$ to generate the pulse signal PAE0 having a predetermined pulse width, and an OR circuit 776 carrying out the OR operation between the pulse signals PAE1 and PAE0 coming from the pulse generating circuits 772 and 774. The OR circuit 776 generates the preamplifier enable signal PAE. The fall counter 770 performs the count operation if the latency 1a stored in the latency memory circuit is 2 or more. The pulse generating circuit 774 is activated if the latency 1a stored by the latency memory circuit is 1. Then, an operation of the counter circuit 720 shown in FIG. 55 will be described below with reference to an operation waveform diagram of FIG. 56.

If the signal /CAS is "L" at the rising edge of the clock signal CLK, the one-shot pulse signal $\phi r$ having the predetermined pulse width is generated. If the latency is 2 or more, the fall counter 770 is activated. The fall counter 770 is activated in response to the rise of the one-shot pulse signal $\phi r$ and counts the fall of the clock signal CLK. If the latency is 3, the pulse generating circuit 772 generates the pulse signal PA1 having a predetermined pulse width after elapse of a predetermined time by virtue of the count-up signal which was generated from the counter 770 in response to the second fall of the clock signal CLK. Meanwhile, the pulse generating circuit 774 is activated if the latency is 1, and generates the pulse signal PAE0 having a predetermined pulse width after elapse of a predetermined time in response to rise of the one-shot pulse signal $\phi r$. The OR circuit 776 generates the preamplifier enable signal PAE in accordance with either the pulse signal PAE1 or PAE0. The pulse width required by the pulse signals PAE0 and PAE1 may be equal to the pulse width of the clock signal CLK.

Figure 57:
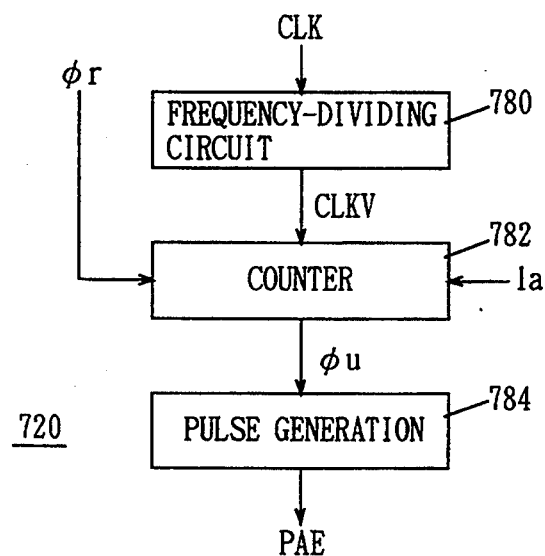
FIG. 57 shows another example of a configuration of the counter circuit shown in FIG. 54.

FIG. 57 shows another configuration of the counter circuit shown in FIG. 53. In FIG. 57, the counter circuit 720 includes a frequency dividing circuit 780 dividing the clock signal CLK, a counter 782 counting a clock signal CLKV coming from the frequency dividing circuit 780, and a pulse generating circuit 784 which generates a pulse signal PAE having a predetermined pulse width in accordance with a count-up signal $\phi u$ coming from the counter 782. The counter 782 is activated in response to the one-shot pulse signal $\phi r$ and counts the clock signal CLKV and generates the count-up signal when its count reaches a value designated by the latency data. Then, an operation of the counter circuit 720 shown in FIG. 57 will be described below with reference to a waveform diagram of FIG. 58.

Figure 58:
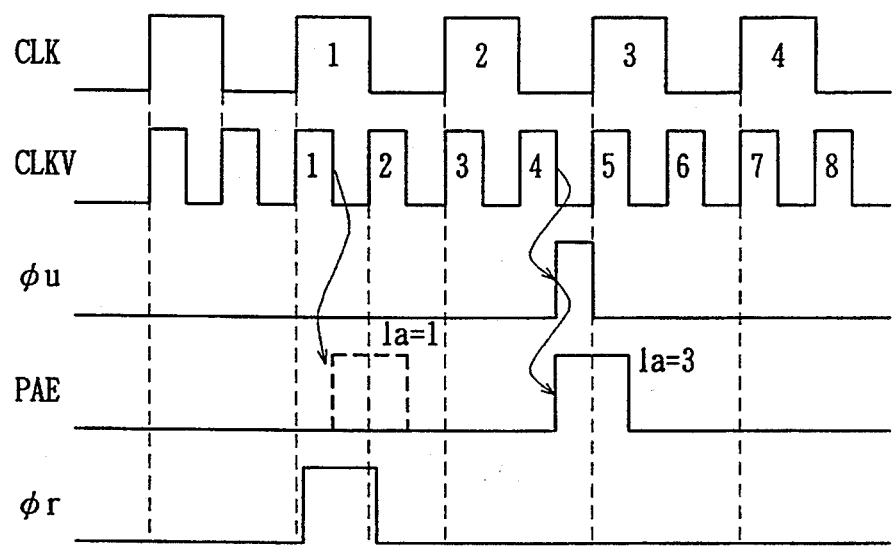
FIG. 58 is a signal waveform diagram showing an operation of a circuit shown in FIG. 57.

In an example shown in FIG. 58, the frequency dividing circuit 780 performs $\frac{1}{2}$-frequency-division of the clock signal CLK to double its frequency. As to the latency data 1a the counter circuit 782 operates, and counts 2(1a-1) times the fall of the clock signal CLKV after the pulse signal $\phi r$ of one-shot is applied. When the count reaches 2(1a-1), the count-up signal $\phi u$ is generated. The pulse generating circuit 784 generates the pulse signal of one-shot in response to the count-up signal $\phi u$. The pulse signal PAE shown in FIG. 58 has a pulse width equal to the pulse width of the clock signal CLK. The counter circuit 782 generates the count-up signal in response to the first fall of the frequency-divided clock signal CLKV if the latency 1a is set at 1. In this case, therefore, it can be understood that the pulse generating circuit 784 generates the preamplifier enable signal PAE in response to the first rise of the clock signal CLK in the column access cycle of the clock signal CLK.

In connection with the wrap address RWYi, the wrap address is set in response to the (latency 1a-1)-th rise of the clock signal CLK after the start of the column selecting operation, and then, the wrap addresses are sequentially generated in response to the clock signal during the clock cycles indicated by the wrap length. The setting timing of the output of the decoder in the wrap address generating circuit shown in FIG. 24C (i.e., reset signal in FIG. 28) is generated in accordance with the latency data 1a, and then the clock signal CLK is sequentially supplied to the wrap address generating circuit during the clock cycles defined by the wrap length data from the clock cycle designated by the latency data 1a.

[Wrap Address Generating System]

Figure 59:
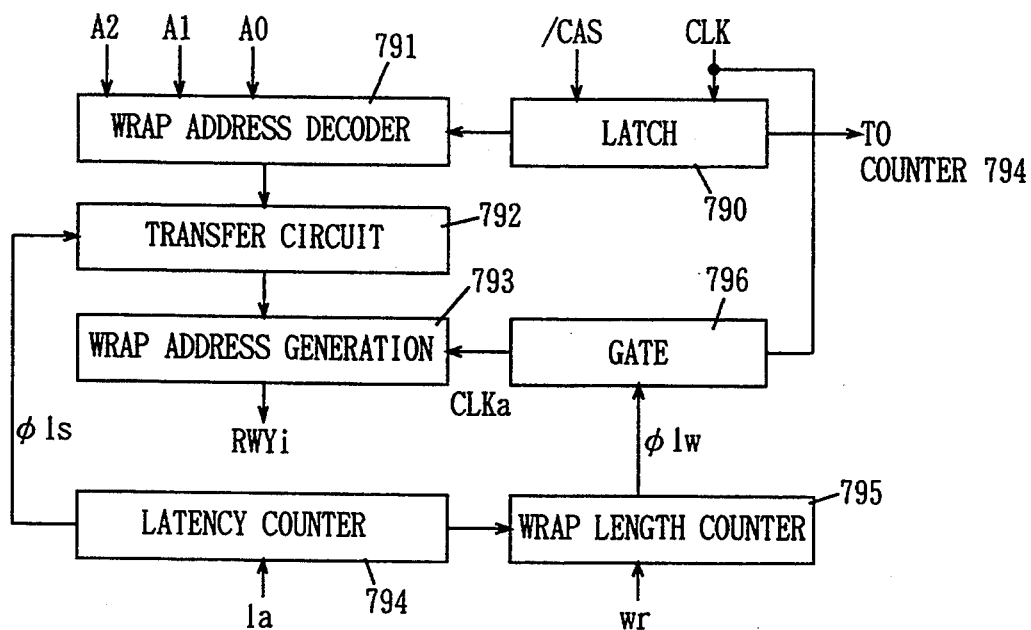
FIG. 59 shows a circuit configuration for generating a wrap address.

FIG. 59 shows an example of a configuration of the wrap address generating system. In FIG. 59, the wrap address generating system includes a latch circuit 790 which latches the signal /CAS at the rising edge of the clock signal CLK, a wrap address decoder 791 which decodes 3 bits A0, A1 and A2 of the address in response to the column selection start instruction coming from the latch circuit 790 and latches a result of the decoding, a latency counter 794 which is activated in response to the column selecting operation instruction coming from the latch circuit 790 and counts the clock signal CLK in accordance with the latency data la, a transfer circuit 792 which transfers the decoder, which is latched by the wrap address decoder 91, in accordance with a count-up signal $\phi$ls coming from the latency counter 794 to a wrap address generating circuit 793, a wrap length counter 795 which is activated in response to the count-up signal coming from the latency counter 794 and counts the fall of the clock signal CLK in accordance with the wrap length data wr, and a gate circuit 796 which selectively passes the clock signal CLK in accordance with an output $\phi$lw of the wrap length counter 795 and applies the same to the wrap address generating circuit 793.

The wrap address decoder 791 has a configuration corresponding to that shown in FIG. 24C. The wrap address generating circuit 793 sequentially shifts the wrap address applied through the transfer circuit 792 in accordance with the clock signal CLKa from the gate circuit 796 (see FIG. 28). The transfer circuit 792 corresponds to the transistor 236 in FIG. 28 which receives the reset signal. The gate circuit 796 is formed of, e.g., an AND circuit, and passes the clock signal CLK only when the output $\phi$lw of the wrap length counter 795 is "H". Then, an operation of the wrap address generating system shown in FIG. 59 will be described below with reference to an operation waveform diagram of FIG. 60.

The signal /CAS is set at "L" at the rising edge of the clock signal CLK to instruct the column selecting operation. This state is latched by the latch circuit 790, and the wrap address decoder 791 and latency counter 794 are activated. The wrap address decoder 791 decodes 3 bits A0, A1 and A2 of the address in accordance with the column selecting operation instruction from the latch circuit 790, and latches the decode result. Thereby, a decode signal which makes one of the eight wrap addresses RWY0-RWY7 active is produced. The latency counter 794 is activated in accordance with the column selecting operation instruction coming from the latch circuit 790, and produces the count-up signal $\phi$ls at the rising edge of the clock signal (third clock cycle) of which clock number is smaller by one than the latency la.

Figure 60:
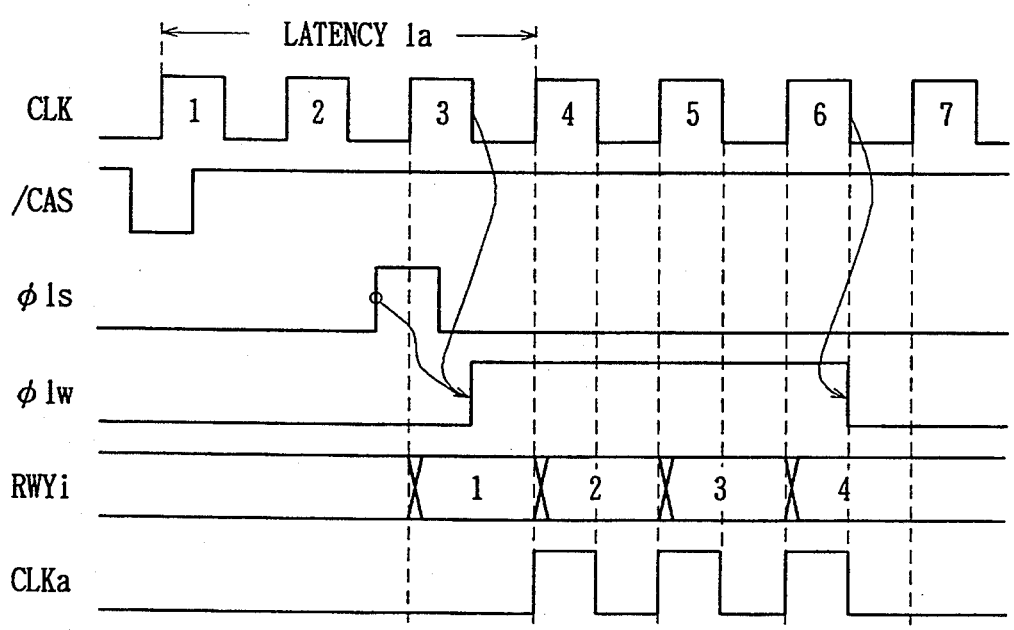
FIG. 60 is a signal waveform diagram showing an operation of a wrap address generating circuit shown in FIG. 60.

The latency counter 794 may be constructed to count the fall of the clock signal CLK in accordance with the column selecting operation instruction from the latch circuit 790. In FIG. 60, since the latency la is set at 3, the latency counter 794 produces a signal which attains "H" at the time of rise of the clock signal of which clock number is smaller by one than the latency la, i.e., the clock signal of clock No. 3 (the first clock signal is not counted). Thereby, the transfer circuit 792 becomes conductive, and the information which has been decoded and latched by the wrap address decoder 791 is transmitted to the wrap address generating circuit 793. The wrap address generating circuit 793 includes a shift register configuration as exemplified in FIG. 28. In each of the shift registers of 8 bits, the wrap address is set, and the wrap address of 1 bit among the wrap addresses RWY0-RWY7 of 8 bits is set at the selected state of "H".

The wrap length counter 795 is activated in synchronization with the count-up signal $\phi$ls coming from the latency counter 794, and counts the clock cycle number designated by the wrap length data wr from the next falling edge of the clock signal CLK. Until the clock cycles designated by the wrap length data wr elapses, the wrap length counter 795 maintains the signal $\phi$lw at "H". Thereby, the clock signal CLK is applied to the wrap address generating circuit 793 from the fourth clock cycle. The wrap address generating circuit 793 changes its wrap address RWYi in accordance with the clock signal CLKa applied through the gate circuit 796. The output $\phi$lw of the wrap length counter 795 falls to "L" (in response to the fall of the clock signal CLK) after the wrap length counter 795 counts the fall of the clocks designated by the wrap length data w1. Thereby, the gate 796 is turned off, so that the change of the wrap address RWYi in the wrap address generating circuit 793 is inhibited.

In the configuration described above, in which the wrap address generating circuit 793 sequentially shifts its held data in accordance with the clock signal CLK, the timing of transferring the initial wrap address is set in accordance with the clock signal, and the wrap address is sequentially changed in accordance with the clock signal CLK, whereby the data reading can be performed accurately.

The wrap address generating circuit 793 may have a configuration different from that of the shift register.

As shown in FIG. 61, the wrap address decoder and wrap address generating circuit may employ a configuration in which the sequence of generation of the wrap addresses is set in accordance with the address bit A6 under the WCBR conditions, and then the wrap addresses are generated in accordance with the sequence which are sequentially set in accordance with the addresses A0, A1 and A2 of 3 bits when the column selecting operation instruction is applied. In this configuration, the timings of generation and change of the wrap addresses which are sequentially generated are set in accordance with the clock signal. The configuration can be achieved using an ordinary sequence setting circuit.

[Output Buffer]

Figure 62:
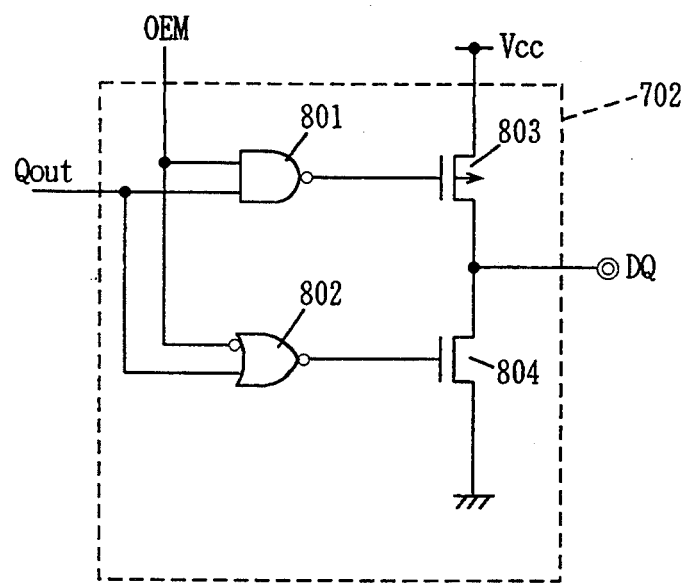
FIG. 62 shows an example of a specific configuration of an output buffer shown in FIG. 45.

FIG. 62 shows an example of a specific configuration of the output buffer. Referring to FIG. 62, the output buffer 702 includes an 2-input NAND circuit 801 which receives data Qout transmitted from the inverter buffer TB8 and also receives the output enable signal OEM, a 2-input gate circuit 802 receiving the read Qout and output enable signal OEM, a p-channel MOS transistor 803 which is turned on in response to the output of the NAND circuit 801 and charges the data I/O terminal DQ to the supply potential Vcc level, and an n-channel MOS transistor 804 which is turned on in response to the output of the gate circuit 802 and discharges the data I/O terminal DQ to the ground potential level. The gate circuit 802 receives at its false input the output enable signal OEM, and receives at its true input the read data Qout. An operation will be briefly described below.

If the output enable signal OEM is at "L", the output of the NAND gate 801 is at "H", and the output of the gate circuit 802 is at "L". Thereby, both the transistors 803 and 804 are turned off, and the output buffer 702 attains the output high impedance state.

If the output enable signal OEM rises to "H", the NAND circuit 801 functions as an inverter, and the gate circuit 802 also functions as an inverter. For example, if the data Qout is "1" (corresponding to the potential "H"), the outputs of both the gates 801 and 802 are "0" (corresponding to the potential "L"), so that the transistor 803 is turned on, and the transistor 804 is turned off. Thereby, the data "1" is read to the data I/O terminal DQ.

[Second Embodiment of Data Reading System]

Figure 63:
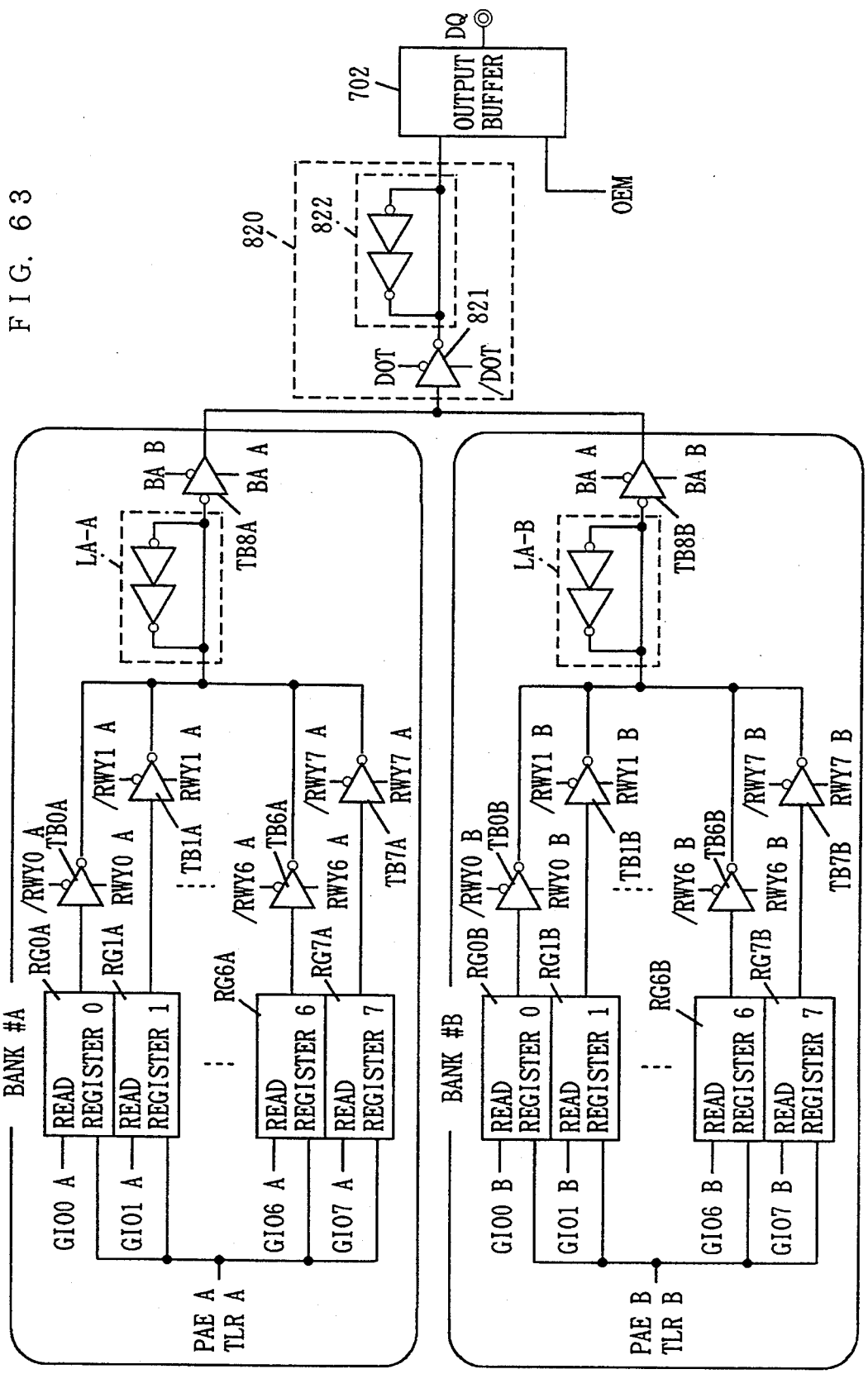
FIG. 63 shows another example of a configuration of a data output part of the SDRAM.

FIG. 63 shows an example of a configuration of the data reading system in the SDRAM of the invention. In FIG. 63, the SDRAM includes two banks #A and #B.

The bank #A includes the read registers RG0A-RG7A which amplify and latch the data on the corresponding global I/O line pairs GIO0A-GIO7A in accordance with the preamplifier enable signals PAEA and transfer instructing signal TLRA, the tri-state inverter buffers TB0A-TB7A which transfer data of the corresponding read registers in accordance with wrap addresses RWYiA and /RWYiA (i=0, 1, ..., 7), a latch circuit LA-A which latches the output of the selected (i.e., activated) one of the inverter buffers TB0A-TB7A, and the tri-state inverter buffer TB8A which inverts and amplifies the latched data of the latch circuit LA-A in accordance with the bank designating signals BAA and BAB.

Similarly to the bank #A, the bank #B includes read registers RG0B-RG7B which amplify and latch the data on the corresponding global I/O line pairs GIO0B-GIO7B in accordance with the preamplifier enable signal PAEB and transfer instructing signal TLRB, respectively, tri-state inverter buffers TB0B-TB7B which invert and amplify the latched data of the corresponding read registers in accordance with the wrap addresses RWY0B and /RWY0B-RWY7B and /RWY7B, a latch circuit LA-B which latches the output of the activated tri-state inverter buffer among the tri-state inverter buffers, and a tri-state inverter buffer TB8B which inverts and amplifies the latched data of the latch circuit LA-B.

According to the configurations of the banks #A and bank #B shown in FIG. 63, the read registers RG0A-RG7A and RG0B-RG7B are different from the read registers described before in that their operations for latching and transferring data are controlled in accordance with the transfer instructing signals TLRA and TLRB in addition to the preamplifier enable signals PAEA and PAEB.

In FIG. 63, the SDRAM further includes a latch circuit 820 which latches the outputs from the banks #A and bank #B (i.e., outputs of the tri-state buffers TB8A and TB8B), and the output buffer 702 which transmits the output of the latch circuit 820 to the data I/O terminal DQ in accordance with the output enable signal OEM. The output buffer 702 has a configuration similar to that shown in FIG. 62.

The latch circuit 820 includes a tri-state inverter buffer 821 which is activated in response to the control signals DOT and /DOT, and a latch circuit 822 which latches the output of the tri-state inverter buffer 821.

[Read Register]

Figure 64:
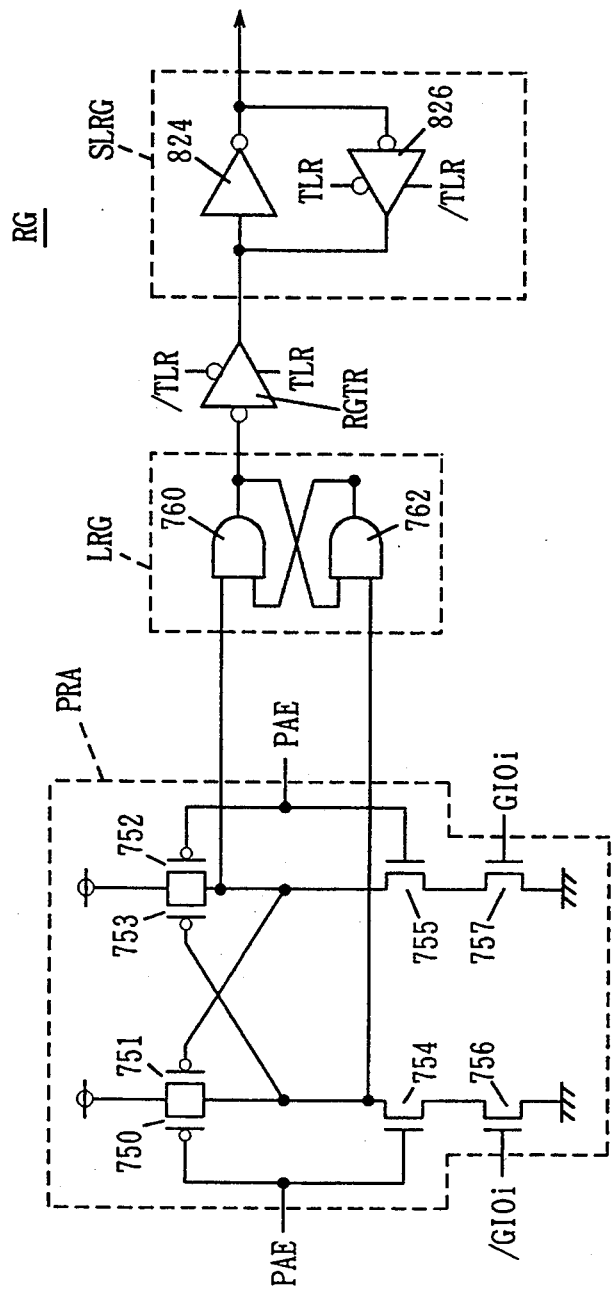
FIG. 64 shows a specific configuration of a read register shown in FIG. 63.

FIG. 64 shows a specific configuration of the read register shown in FIG. 63. Similar to the read register shown in FIG. 51, the read register RG shown in FIG. 64 includes the preamplifier PRA which is activated in response to the preamplifier enable signal PAE and amplifies the data on the corresponding global I/O lines GIOi and /GIOi, and the latch circuit LRG which latches the data amplified by the preamplifier PRA. The read register RG shown in FIG. 64 also includes a read register transfer gate RGTR which transfers the latched data of the latch circuit LRG in response to the transfer instructing signals TLR and /TLR, and a latch circuit SLRG which latches the output signal of the transfer gate RGTR. The latch circuit SLRG includes an inverter 824 which inverts the output of the transfer gate RGTR, and a tri-state inverter buffer 826 which is activated in response to the transfer instructing signals TR and /TR and inverts the output of the inverter 824 for transmitting the same to the input of the inverter 824. The transfer gate RGTR is formed of a tri-state inverter buffer. The transfer gate RGTR and the tri-state inverter buffer 826 are complementarily attain the output high-impedance state and operative state.

Figure 65:
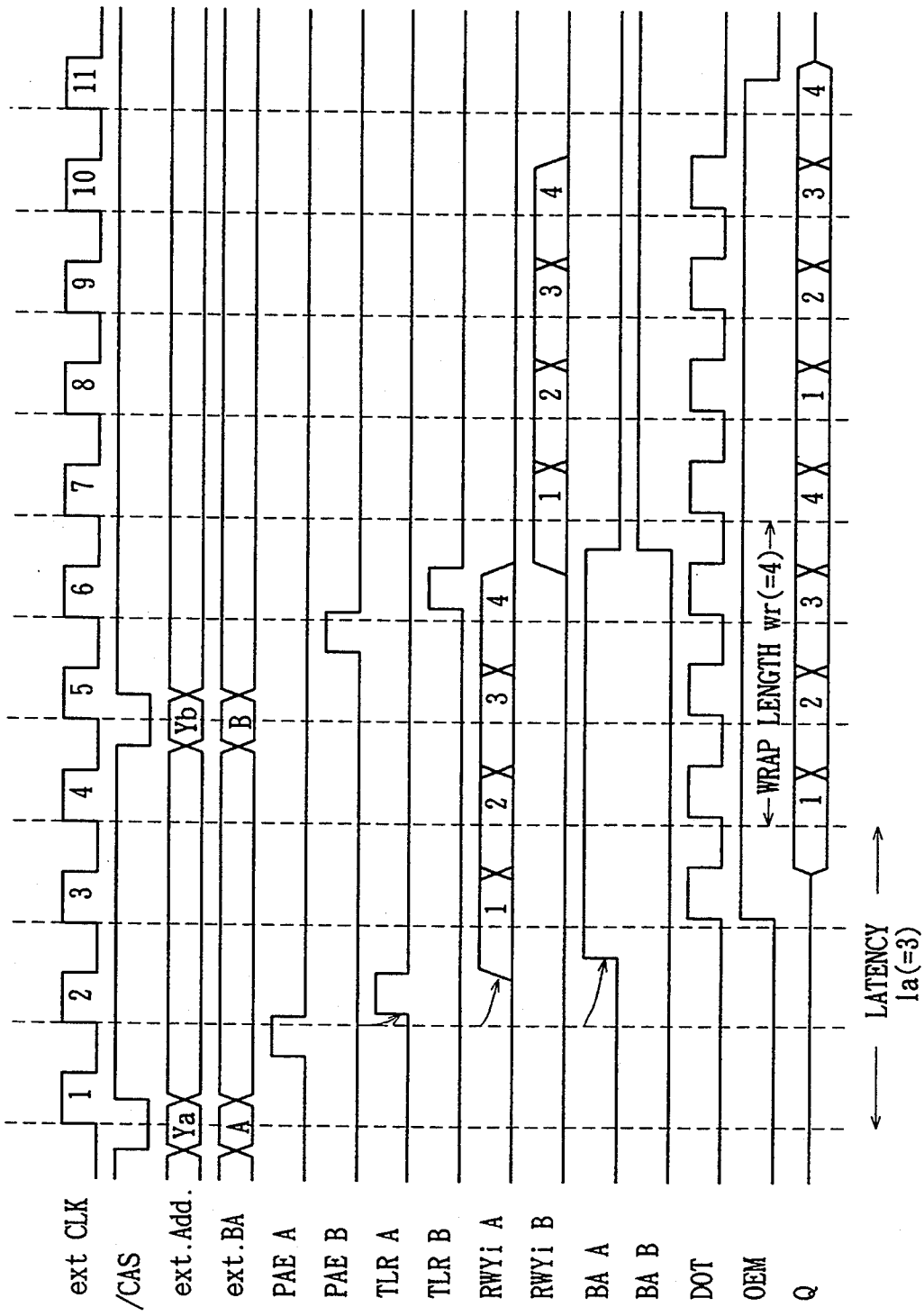
FIG. 65 is a timing chart showing a data read operation of a data output part shown in FIG. 63.

The data reading operation of the SDRAM shown in FIGS. 63 and 64 has a distinctive feature that data is read to a front stage of the advance-reading latch circuit 820 at a point of time preceding by 1 clock cycle the latency cycle, which in turn is the clock cycle number required from the start of the column selecting operation to the appearing of valid data on the output terminal DQ. Thus, in the internal operation, all the data transferring operations are carried out at the timings preceding by 1 clock to those of the former embodiments. Thereby, the speed of data reading operation can be increased. The data reading operation of the SDRAM shown in FIGS. 63 and 64 will be described below with reference to an operation waveform diagram of FIG. 65. FIG. 65 shows, as an example, the data reading operation in the case where the latency is 3 and the wrap length is 4.

In the first clock cycle, the signal /CAS is set at "L" at the rising edge of the clock signal CLK and thereby the column selecting operation is instructed to start (column access is designated). The column selecting operation is executed using the currently applied address Ya as the column address. At the same time, the bank address A is set and the bank #A is selected. The row selecting operation is performed in accordance with the previously applied signal /RAS and the currently applied bank address. The bank address A, therefore, has a function of designating the bank in the circuitry of the data reading system, i.e., the circuitry related to the signal CAS.

In the second clock cycle, the preamplifier enable signal PAEA is set at "H" when the clock signal CLK rises. Thus, the preamplifier enable signal PAEA is activated in the (latency−2) clock cycles. At the timing preceding by 2 clocks the appearance of the valid data on the data I/O terminal DQ, the read register RG performs the amplification and latch (by the latch circuit LRG) of data.

In this second clock cycle, the transfer instructing signal TLRA is raised to "H", which is triggered by the rise of the clock signal CLK. Thereby, the transfer gate RGTR shown in FIG. 64 changes from the output high-impedance state to the active state, and the data latched in the latch circuit LRG (i.e., memory cell data read in the current access cycle) is transferred to the latch circuit SLRG at the next stage. The data transferred by the transfer gate RGTR is latched by the latch circuit SLRG (i.e., the tri-state inverter buffer 826 is activated) when the signal TLR falls to "L".

In this second clock cycle, the wrap address generating circuit generates the wrap address using the rise of the clock signal CLK as a trigger. Thereby, one of the tri-state inverter buffers TB0A–TB7A is activated, and the data latched by the latch circuit SLRG is latched by the latch circuit LA-A at the front stage in the tri-state inverter buffer TB8A provided in the output part. In parallel to the generation of the wrap address RWYiA, the bank designating signal BAA attains "H", which is triggered by the rise of the clock signal CLK in the second clock cycle. Thereby, the data latched by the latch circuit LA-A is transmitted through the tri-state inverter buffer TB8A to the front stage of the advance-reading latch circuit 820 provided in the output part.

In the subsequent third clock cycle (which precedes by 1 clock cycle the clock cycle in which the valid data is output), the control signal DOT is maintained at "H" for a predetermined period, which is triggered by the rise of the clock signal CLK. Thereby, the advance-reading latch circuit 820 takes in and latches the data already transmitted thereto. In synchronization with the generation of the control signal DOT, the output enable signal OEM rises to "H". Thereby, the output buffer 702 is activated and transmits the data, which is transmitted from the advance-reading latch circuit 820, to the data I/O terminal DQ.

In this third clock cycle, the wrap address is changed, which is triggered by the rise of the clock signal CLK.

In the fourth clock cycle, the output data of the output buffer 702 is decided valid.

Thereafter, the wrap address RWYiA changes at every clock cycle, and the control signal DOT is generated, so that the output buffer 702 sequentially outputs the data of 4 bytes.

In the fifth clock cycle, the column selection of the bank #B is designated. Also in this case, the preamplifier enable signal PAEB is set at "H" in the sixth clock cycle, and the data of the selected memory cells is amplified and latched in the bank #B (the row selection is already executed in the bank #B in accordance with the signal /RAS). Thus, the banks #A and bank #B can be activated in parallel to each other in a pipelined form. In this bank #B, when the preamplifier enable signal PAEB is generated, the transference signal TLRB is generated in the sixth clock cycle, and the memory cell data read in the current access cycle is latched in the latch circuit SLRG. Subsequently, the wrap addresses RWYiB are sequentially generated, and the data is transmitted to the input of the advance-reading latch circuit 820 in accordance with the wrap addresses. In the subsequent clock cycles, the data is sequentially read in accordance with the control signals DOT and OEM.

The control signal DOT attains "L" when the clock signal is counted by the number indicated by the wrap length (i.e., 4 in the configuration shown in FIG. 65) after the valid data was output.

If the latency is 1, the advance-reading cannot be performed. If the latency is set at 1, the change of the wrap address RWYi is triggered by the clock signal at the clock cycle in which the column access (start of the column selecting operation) is designated. Also the output control signal DOT is set at "H" at the clock cycle of the start of the column access, if the latency is 1. Thus, in the configuration shown in FIGS. 63 and 64, the transference of data and reading of data into the front stage of the output buffer are execute at the clock cycle preceding by 1 clock cycle the data reading operation described before.

Figure 66:
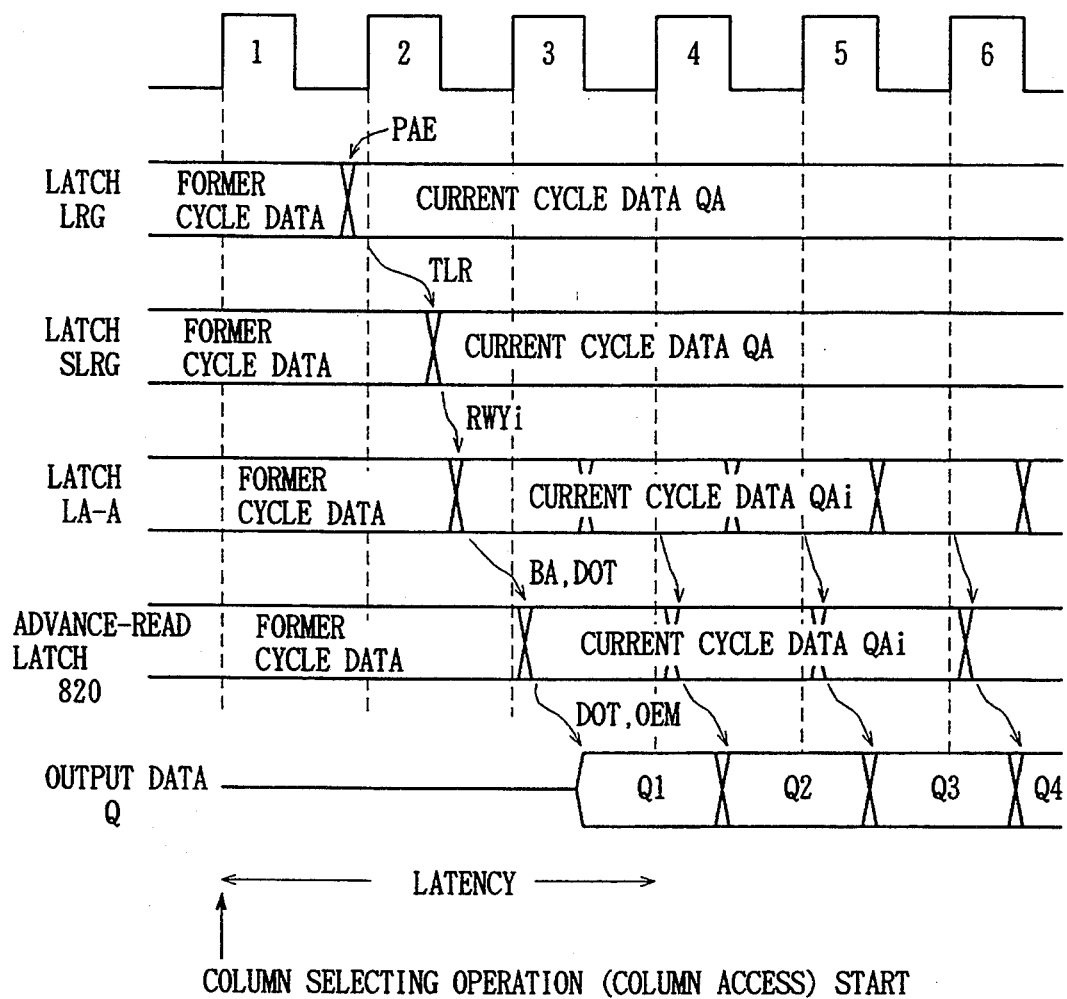
FIG. 66 shows a flow of data in the data output part shown in FIG. 63.

FIG. 66 shows a flow of data in the data reading system shown in FIGS. 63 and 64. In the first clock cycle, the latch LRG (latch at a first stage in the read register) has still latched the data in the former access cycle, as shown in FIG. 66. The same is true with respect to the remaining latches. The output buffer is in the output high-impedance state. In the first clock cycle, the signal PAE is generated, and the latched data in the latch LRG changes to the memory cell data QA in the current access cycle in response to the signal PAE. At this time, the latched data in the latch SLRG is the data in the former access cycle.

In the second clock cycle, the signal TLR is generated, and the data of the latch SLRG is replaced with the data latched in the latch LRG.

Then, the wrap address RWYi is generated, and the selected tri-state buffer among the data latched by the latch SLRG becomes active, and the latch LA-A provided in the output part changes into the initial data in the current access cycle. At this time, the bank designating signal BA is in the decided state, and the first data is transmitted up to the input of the advance-reading latch circuit 820.

In the third clock cycle, the control signal DOT is generated, and the latched data in the advance-reading latch circuit 820 changes into the current cycle data QAi.

Then, the output data of the output buffer 702 changes in accordance with the signals DOT and OEM. The data is sequentially output from the fourth clock cycle after elapse of the latency.

In the read register, the data transference is performed by the transference signal TLR for the purpose of preventing destruction of contents of the read register, which may be caused by the read data of the memory cells in the current access cycle, before all the data in the former access cycle is read in the case where the same bank is successively accessed. A specific circuit configuration will be described in due order.

[Wrap Address Generating System]

Figure 67:
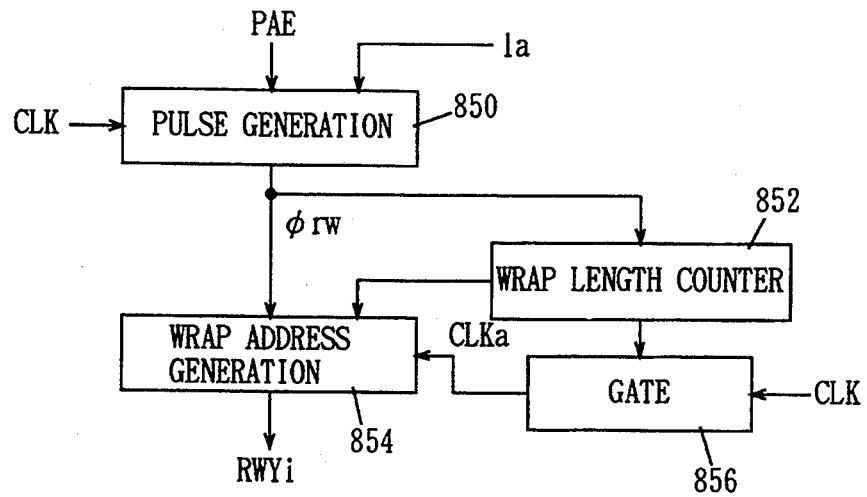
FIG. 67 shows a configuration of a wrap address generating circuit.

FIG. 67 shows a functional configuration of the wrap address generating system. In FIG. 67, the wrap address generating system includes a pulse generating circuit 850 which generates the pulse signal φrw of one-shot in response to the preamplifier enable signal PAE and clock signal CLK, a wrap length counter 852 which counts the subsequent fall of the clock signal CLK in response to the one-shot pulse signal φrw coming from the pulse generating circuit 850, a gate circuit 856 which selectively passes the clock signal CLK in response to the output of the wrap length counter 852, a wrap address generating circuit 854 which generates the initial wrap address in response to the one-shot pulse signal φrw and then sequentially changes the wrap address in response to the clock signal CLKa applied from the gate circuit 856.

In the case where the latency data 1a exhibits the latency of 2 or more, the pulse generating circuit 850 generates the pulse signal φrw of one-shot in response to the rise of the clock signal CLK while the preamplifier enable signal PAE is being generated. If the latency data 1a exhibits the latency of 1, the pulse generating circuit 850 generates the one-shot pulse signal φrw in response to the preamplifier enable signal PAE.

The wrap address generating circuit 854 includes the wrap address decoder and wrap address generating circuits 791 and 793 shown in FIG. 59. The decoding operation is performed in response to the column selecting instruction, and the result of decoding is transferred in response to the one-shot pulse signal for generating the first wrap address.

The wrap length counter 852 counts the fall of the clock signal CLK in response to the one-shot pulse signal φrw for a period (wr2+2) indicated by the wrap length data. Alternatively, the wrap length counter 852 may utilize a configuration which counts (wrap length+1) times the subsequent rise of the clock signal CLK after the one-shot pulse signal φrw is generated. The wrap length counter 852 maintains the gate circuit 856 in the conductive state until it counts up a predetermined number. When the gate circuit 856 is activated, it transmits the clock signal CLK. Thereby, the wrap address generating circuit 854 sequentially changes the wrap address in accordance with the clock signal CLKa.

Figure 68:
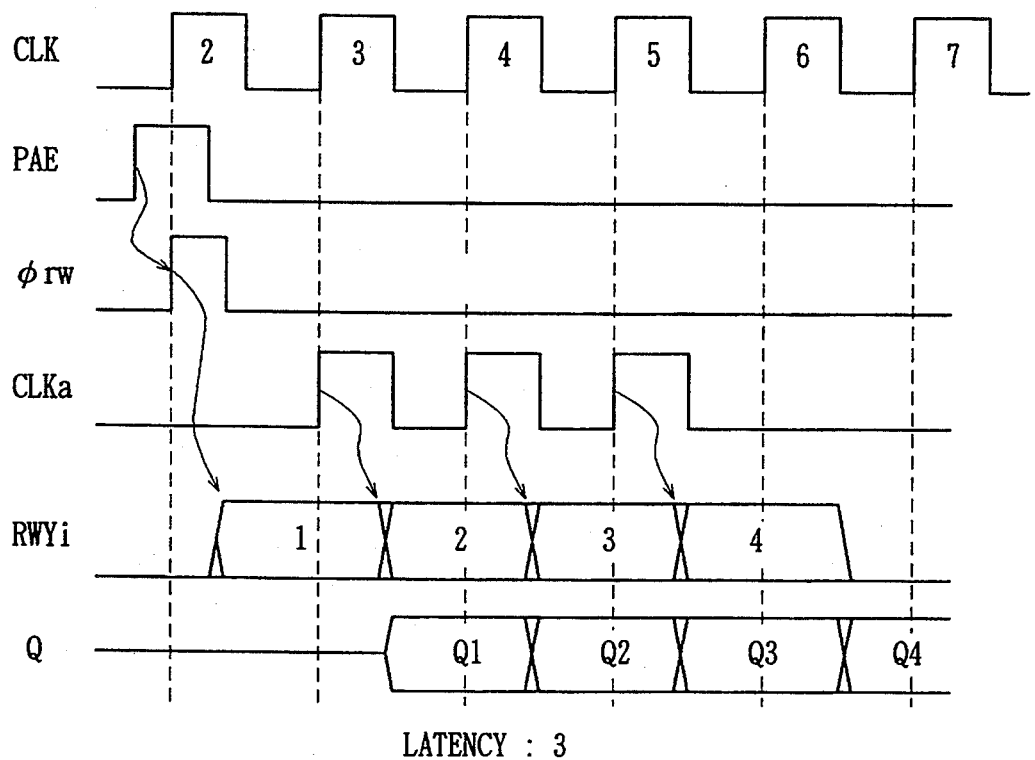
FIG. 68 is a signal waveform diagram showing an operation of the circuitry shown in FIG. 67.

FIG. 68 shows an operation waveform of the wrap address generating circuit shown in FIG. 67. FIG. 68 shows an operation in the case where the latency is 3 and the wrap length is 4. In the second clock cycle, the preamplifier enable signal PAE is generated, and the pulse generating circuit 850 generates the pulse signal φrw of one-shot in response to the rise of the clock signal CLK. In accordance with this pulse signal φrw of one-shot, the wrap address generating circuit 854 generates the first wrap address. The wrap length counter 852 is activated in response to this one-shot pulse signal φrw. The gate circuit 856 passes the clock signal CLK during the counting operation of the wrap length counter 852. The wrap address generating circuit 854 sequentially change the wrap address in accordance with the clock signal CLKa coming from the gate circuit 856. Thereby, the wrap address can be generated in the second clock cycle in the case if the latency is 3. The wrap length counter 852 sets the output of the wrap address generating circuit 854 at "L" after it completes the counting operation. The wrap address generating circuit 854 is operated only when required, whereby the current consumption can be reduced. Such a configuration may be employed that the output state of the wrap address generating circuit 854 is maintained.

Instead of the configuration shown in FIG. 67, the wrap address generating circuit 854 may include such a configuration that it sequentially generate the wrap addresses starting from the initial wrap address in accordance with the clock signal CLKa instead of the pulse signal φrw of one-shot. In this case, the one-shot pulse signal is not applied to the wrap address generating circuit 854. The wrap length counter 852 passes the clock signal CLK in accordance with the one-shot pulse signal φrw. The wrap address generating circuit 854 sequentially generates the first and subsequent wrap addresses in accordance with the clock signal CLKa. In this case as shown in the waveform diagram of FIG. 68, the clock signal CLKa is generated in the second clock cycle, and the wrap address is generated in accordance with the clock signal CLKa in the second clock cycle.

In the operation waveform diagram of FIG. 68, the wrap address RWYi is triggered to change by the rising edge of the clock signal CLK. Such a configuration may be utilized that the change of the wrap address is triggered by the falling edge of the clock signal CLK.

Figure 69:
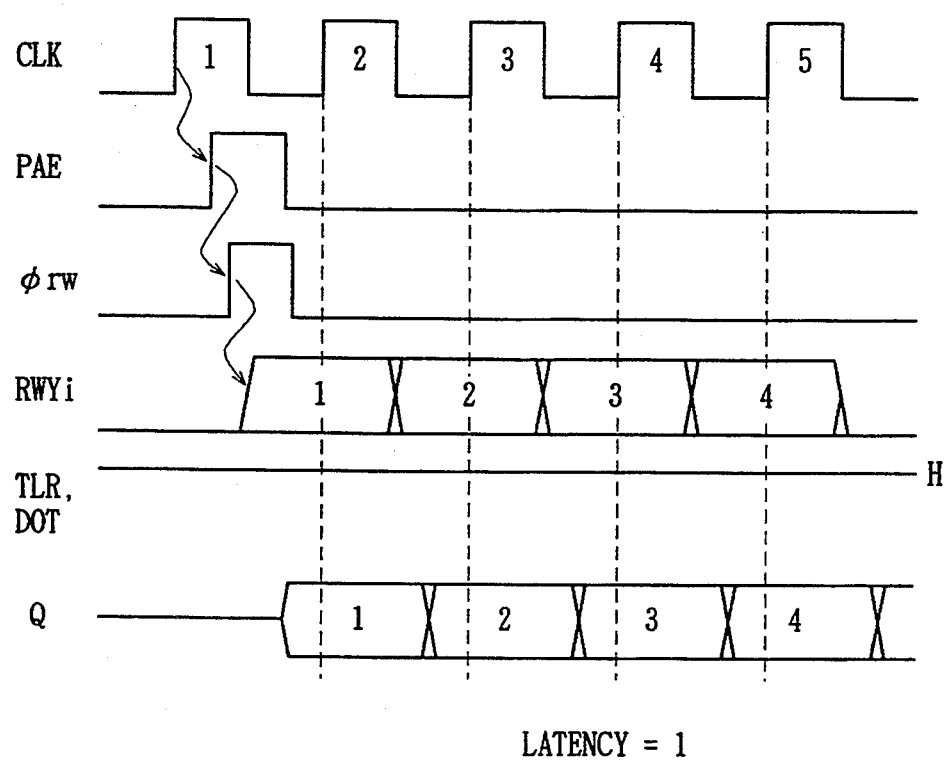
FIG. 69 shows an operation of the circuitry shown in FIG. 67.

FIG. 69 shows a form of generation of the wrap address in the case of the latency of 1. In the case of the latency of 1, when the column access (column selecting operation) starts, the preamplifier enable signal PAE is generated in response to the rise of the clock signal CLK as shown in FIG. 69. The one-shot pulse signal φrw is generated in response to the preamplifier enable signal PAE. The first wrap address RWYi is generated in accordance with the one-shot pulse signal φrw. At this time, the transfer control signal TLR and output control signal DOT are fixed at "H" because the latency is 1. Therefore, the data which is read in accordance with the preamplifier enable signal PAE is transmitted up to the output buffer 702 when the wrap address RWYi is generated. In the output buffer 702, the valid data is sequentially output in accordance with the clock signal at the second and subsequent clock cycles in accordance with the output enable signal OEM.

In the operation waveform diagram of FIG. 69, such a configuration may be employed that, if the latency is 1, the wrap address RWYi changes at the falling edge of the clock signal CLK in response to the one-shot pulse signal φrw.

[Data Read Control System]

Figure 70:
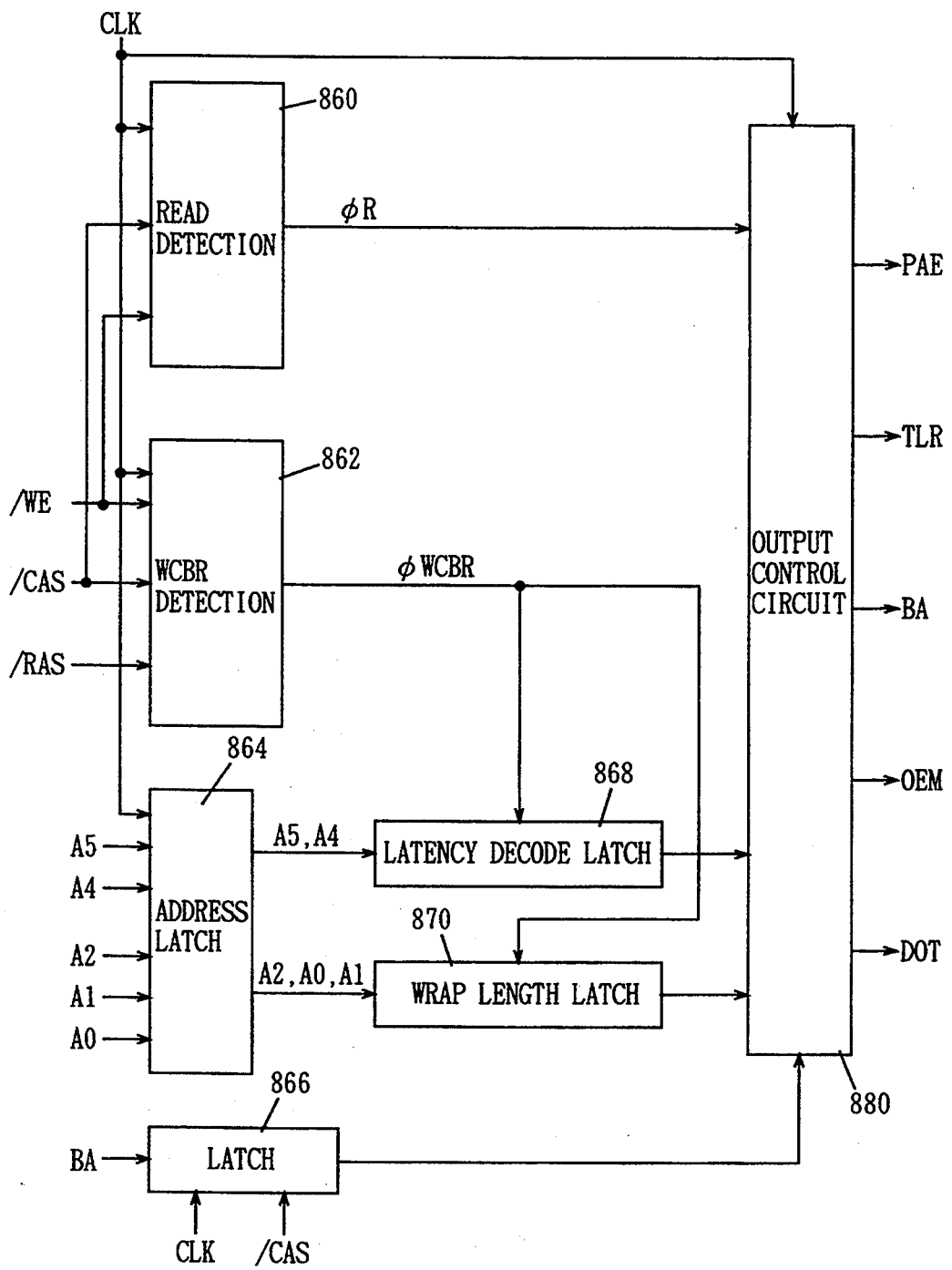
FIG. 70 shows a configuration of an output control part for controlling an operation of the data output part shown in FIG. 63.

FIG. 70 shows a configuration of the control signal generating system related to the data read. In FIG. 70, the data read control signal generating system includes a read detecting circuit 860 which latches the signals /WE and /CAS at the rising edge of the clock signal CLK and determines whether the data read operation is designated or not, a WCBR detecting circuit 862 which detects states of the signals /WE,/CAS and /RAS at the rising edge of the clock signal CLK and determines whether the WCBR mode is designated or not, an address latch 864 which latches the address bits A0, A1, A2, A4 and A5 at the rising edge of the clock signal CLK, a latency decode latch 868 which is responsive to the WCBR detection by the WCBR detecting circuit 862 to produce and latch the latency data in response to the address bits A5 and A4 latched in the address latch 864, a wrap length decode latch 870 which is responsive to the WCBR detection by the WCBR detecting circuit 862 to decode the address bits A1-A2 coming from the address latch 864 for holding the wrap length data, a latch circuit 866 which latches the bank address BA in accordance with the clock signal CLK and signal /CAS, and an output control circuits 880 generating various control signals PAE, TLR, BA, OEM and DOT.

The output control circuit 880 generates necessary control signals only to the bank designated by the bank address latched in the latch circuit 866. In FIG. 70, the control signals are shown being generated commonly to the banks #A and #B from the output control circuit 880.

Also, the control signal generating system shown in FIG. 70 can be applied to both the SDRAMs shown in FIGS. 1 and 44. Respective applied signals can be regarded as internal signals on which the buffer processing is effected.

Figure 71:
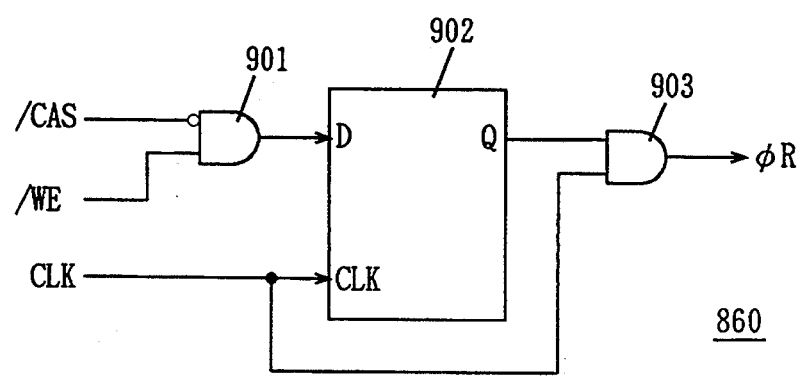
FIG. 71 shows a configuration of a read detecting circuit shown in FIG. 70.
Figure 72:
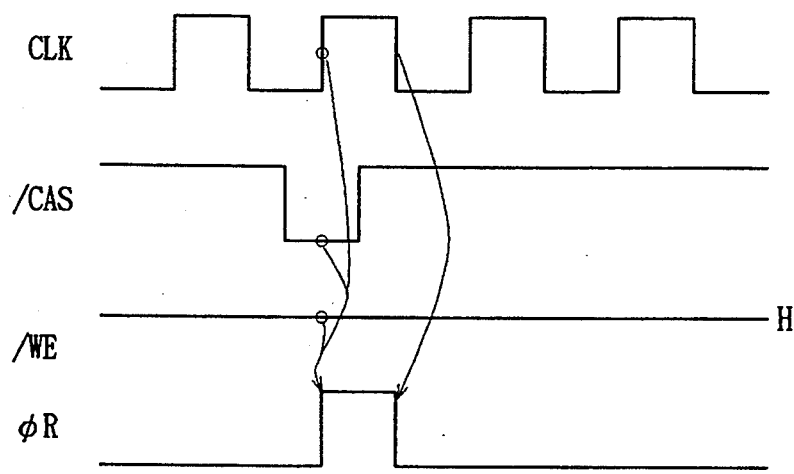
FIG. 72 is a signal waveform diagram showing an operation of the read detecting circuit shown in FIG. 71.

FIG. 71 shows an example of the read detecting circuit shown in FIG. 70. In FIG. 71, the read detecting circuit 860 includes a gate circuit 901 which receives at its false input the signal /CAS and receives at its true input the signal /WE, a D-type flip-flop 902 which latches an output of the gate circuit 901 at the rising edge of the clock signal CLK, and an AND circuit 903 which receives an output Q of the D-type flip-flop 902 and the clock signal CLK. The gate circuit 901 outputs the signal of "H" only when the signal /CAS is "L" and the signal /WE is "H". Then, an operation of the read detecting circuit 860 will be described below with reference to an operation waveform diagram of FIG. 72.

In the read operation, the signal /CAS is set at "L" and the signal /WE is set at "H" at the rising edge of the clock signal CLK. Thereby, the output Q of the D-type flip-flop 902 rises to "H". The AND circuit 903 outputs a signal of "H" when both of its inputs receive signals of "H". Thereby, the signal φr is formed of the pulse signal of one-shot having the substantially same width as the clock signal CLK when the read mode is designated.

Figure 73:
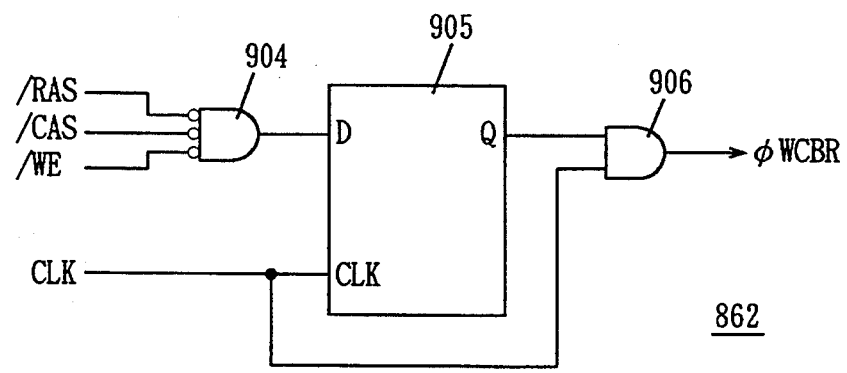
FIG. 73 shows a configuration of a WCBR detecting circuit shown in FIG. 70.
Figure 74:
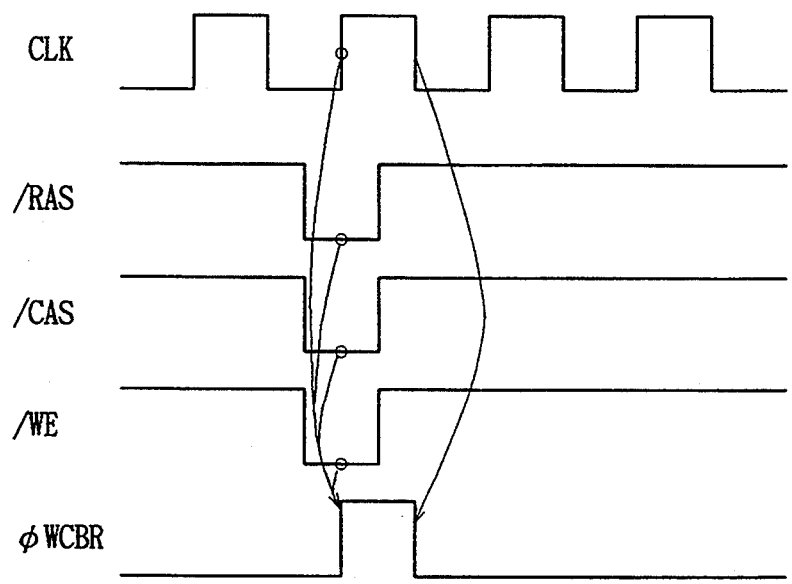
FIG. 74 is a signal waveform diagram showing an operation of a circuit shown in FIG. 73.

FIG. 73 shows an example of a configuration of the WCBR detecting circuit. In FIG. 73, the WCBR detecting circuit 862 includes a NOR circuit 904 receiving the signals /RAS, /CAS and /WE, a D-type flip-flop 905 latching an output of the NOR circuit 904 at the rising edge of the clock signal CLK, and an AND circuit 906 receiving an output Q of the D-type flip-flop 905 and the clock signal CLK. The NOR circuit 904 outputs a signal of "H" only when all of its three inputs attain "L". Then, an operation of the WCBR detecting circuit shown in FIG. 73 will be described below with reference to an operation waveform diagram of FIG. 74.

At the rising edge of the clock signal CLK, the signals /RAS, /CAS and /WE are set at "L". Thereby, the WCBR mode is designated. The output of the D-type flip-flop 905 rises to "H" at the rising edge of the clock signal CLK, and correspondingly, the signal φWCBR supplied from the AND circuit 906 rises to "H". Thereafter, the signal φWCBR falls to "L" when the clock signal CLK falls to "L". In the next clock cycle, the output of the NOR circuit 904 is "L" at the rising edge of the clock signal CLK, and the signal φWCBR maintains "L". Owing to this configuration, the signal WCBR is generated only when the WCBR mode is designated.

Figure 75:
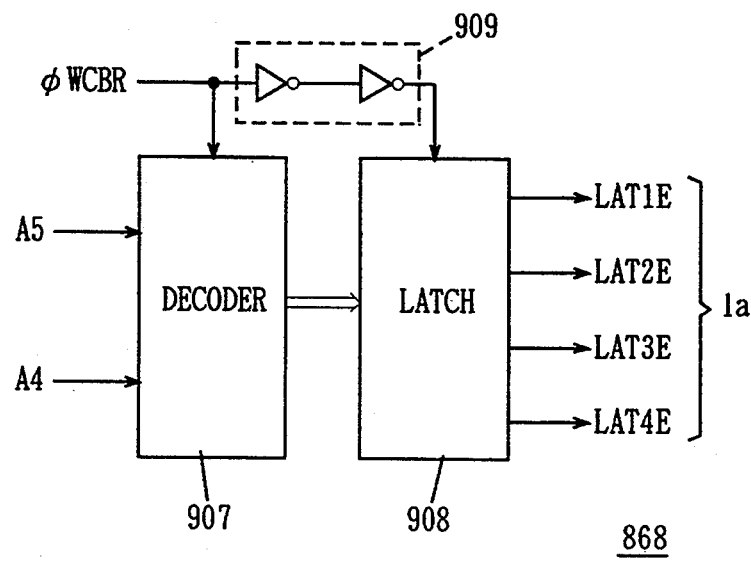
FIG. 75 shows a configuration of a latency decode latch shown in FIG. 70.

FIG. 75 shows a configuration of the latency decode latch shown in FIG. 70. In FIG. 75, the latency decode latch 868 includes a decoder 907 which is activated in response to the WCBR detection signal φWCBR to decode the applied address bits A4 and A5, a delay circuit 909 which delays the WCBR detection signal φWCBR by a predetermined time, and a latch circuit 908 which latches an output of the decoder 907 in response to an output of the delay circuit 909. In FIG. 75, there are prepared four kinds of latencies 1, 2, 3 and 44. The decoder 907 decodes 2 bits A4 and A5 of an address to activate one of these four 4 latencies. The latch 908 latches the output of the decoder 907 in response to the output of the delay circuit 909. Thereby, one of outputs LAT1E-LAT4E of the latch 908 is activated, and the latency data 1a is set.

Figure 76:
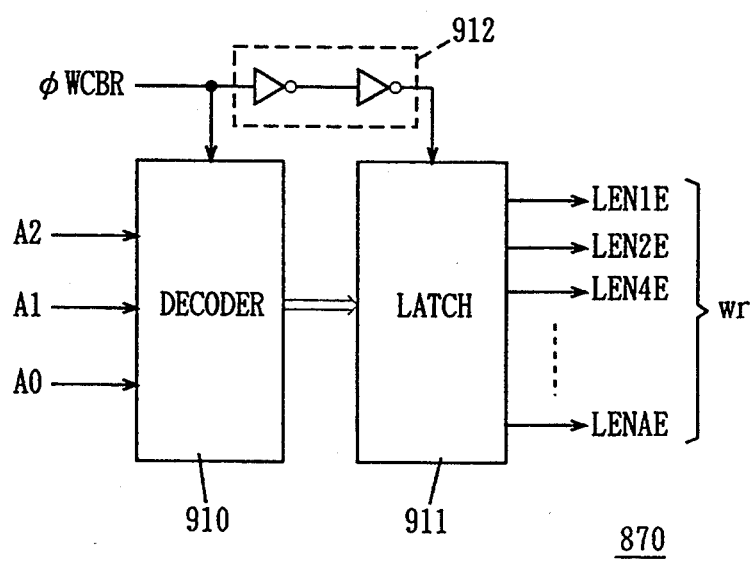
FIG. 76 shows a configuration of a wrap length decode latch shown in FIG. 70.

FIG. 76 shows a configuration of the wrap length decode latch shown in FIG. 70. In FIG. 76, the wrap length decode latch 870 includes a decoder 910 which decodes 3 bits A0-A2 of an address in response to the WCBR detection signal φWCBR, a delay circuit 912 which delays the WCBR detection signal φWCBR by a predetermined time, and a latch circuit 911 which latches an output of the decoder 910 in response to the output of the delay circuit 912. The decoder 910 decodes the address applied thereto and selects one of the eight types of wrap lengths. The latch circuit 911 latches the output of the decoder 910. Thereby, one of the outputs LEN1E, LEN2E, LEN4E, ..., LENAE of the latch circuit 911 is selected. Thereby, the wrap length data wr is set.

In FIG. 76, the decoder 910 included in the wrap length decode latch 870 is shown performing the decoding operation in response to the WCBR detection signal φWCBR. This decoder 910 may be used also as the decoder for generating the wrap address in accordance with the column selection start instruction (column access start instruction).

The delay circuits 909 and 912 in FIGS. 75 and 76 are provided for the purpose of surely latching the outputs of decoders 907 and 910.

[PAE Signal Generating System]

Figure 77:
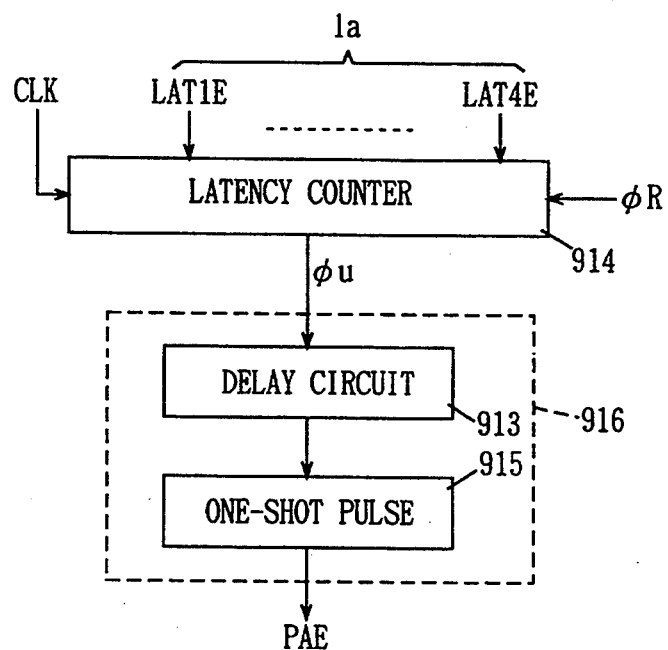
FIG. 77 shows a circuit configuration for generating a preamplifier enable signal.
Figure 78:
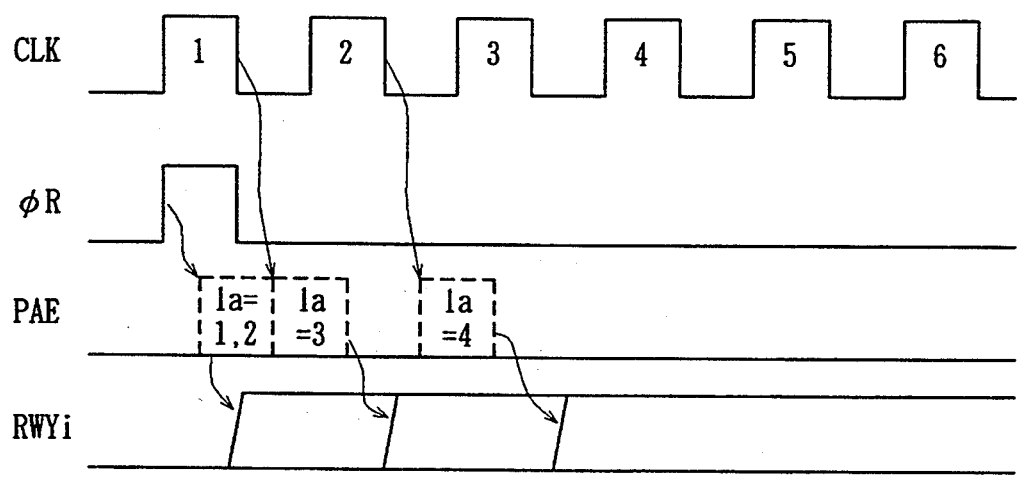
FIG. 78 is a signal waveform diagram showing an operation of a circuit shown in FIG. 77.

FIG. 77 shows a configuration of a preamplifier enable signal generating system. In FIG. 77, the preamplifier enable signal generating system includes a latency counter 914 which counts the clock number corresponding to the predetermined latency in response to the read detection signal φR, and a PAE generating circuit 916 which generates a preamplifier enable signal PAE having a predetermined pulse width in accordance with the count-up signal φu coming from the latency counter 914. The PAE generating circuit 916 includes a delay circuit 913 which delays the count-up signal φu coming from the latency counter 914 by a predetermined time, and a one-shot pulse generating circuit 915 which generates a pulse of one-shot having a predetermined pulse width in response to an output of the delay circuit 913. An operation of the circuitry shown in FIG. 77 will be described below with reference to an operation waveform diagram of FIG. 78.

The latency counter 914 counts the clock signal CLK in response to the read detection signal φR. The latency counter 914 performs the counting operation in accordance with the latency data la (latency set signal LAT-1E-LAT4E) and generates a count-up signal φu when its count reaches a value corresponding to the latency data 1a. In the PAE generating circuit 916, the delay circuit 913 delays the count-up signal φu by a predetermined time. The one-shot pulse generating circuit 915 is responsive to this delay output to generate a pulse signal having a predetermined pulse width (e.g., pulse width substantially equal to that of the clock signal CLK). If the latency is 1 or 2, the PAE generating circuit 916 is triggered by the first rise of the clock signal CLK (rise of the signal φR rise) to generate the preamplifier enable signal PAE. If the latency is 3 or more, the preamplifier enable signal PAE is generated, which is triggered by the fall of the clock signal in the clock cycle (1a-2) preceding by 2 cycles the latency. After the generation of the preamplifier enable signal PAE, the wrap address RWYi is generated. The delay circuit 913 and one-shot pulse generating circuit 915 may be constructed so that the delay time and pulse width are adjusted in accordance with the latency data, respectively.

Figure 79:
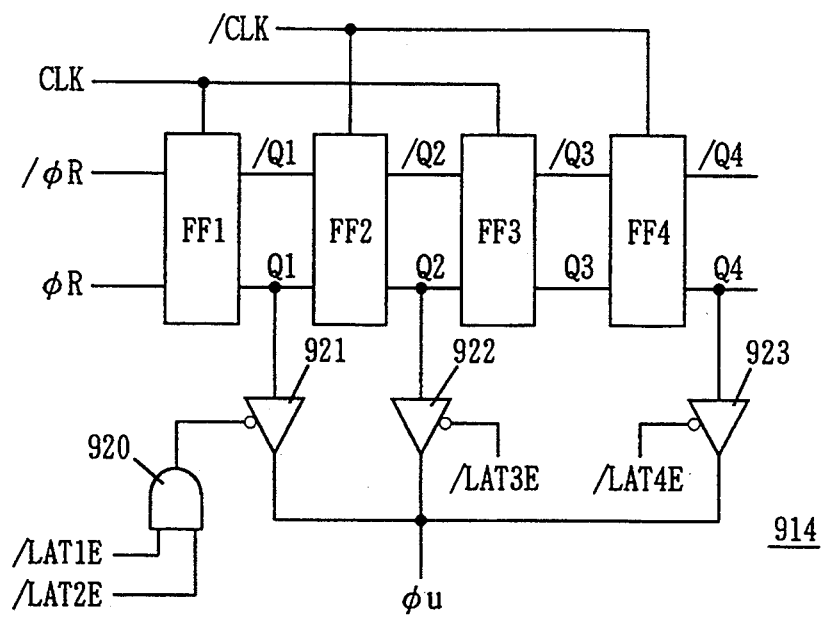
FIG. 79 shows an example of a configuration of a latency counter shown in FIG. 77.

FIG. 79 shows an example of the specific configuration of the latency counter 914 shown in FIG. 77. In FIG. 79, the latency counter 914 includes four flip-flops FF1–FF4 connected in series, a tri-state buffer 921 receiving an output Q1 of the flip-flop FF1, a tri-state buffer 922 receiving an output Q2 of the flip-flop FF2, a tri-state buffer 923 receiving an output Q3 of the flip-flop FF3, and a tri-state buffer 924 receiving an output Q4 of the flip-flop FF4. The flip-flop FF1 at the first stage receives at its inputs the read detection signal φR and complementary read detection signal /φR. The flip-flops FF1 and FF3 take in signals applied to its inputs and supply a signal therefrom in response to the clock signal CLK. The flip-flops FF2 and FF4 take in and latch signals applied to their inputs in response to the rise of the complementary clock signal /CLK.

The tri-state buffer 921 becomes active when the AND circuit 920 supplies an output of "L". The AND circuit 920 receives the latency set signals /LAT1E and /LAT2E which indicate the latencies 1 and 2, respectively. The tri-state buffer 922 receives at its input the latency set signal /LAT3E indicative of the latency of 3. The tri-state buffer 923 receives on its input the latency set signal /LAT4E indicative of the latency of 4. If the latency is 1 or 2, the tri-state buffer 921 is activated. If the latency is 3, the tri-state buffer 922 is activated. If the latency is 4, the tri-state buffer 923 is activated.

Figure 80:
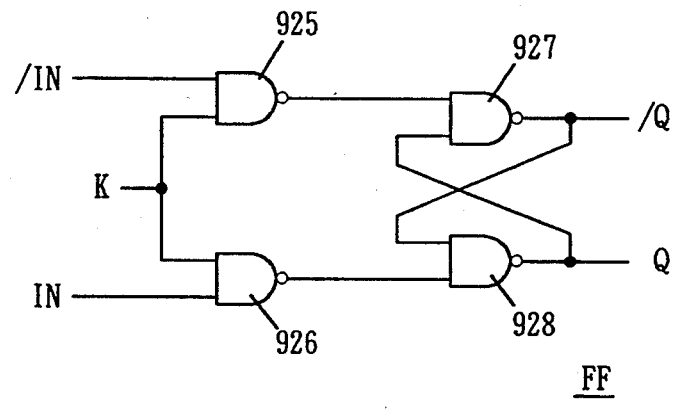
FIG. 80 shows an example of a configuration of a flip-flop shown in FIG. 79.

FIG. 80 shows a specific configuration of the flip-flop shown in FIG. 79. Referring to FIG. 80, the flip-flop FF ("FF" represents "FF1"–"FF4") includes a 2-input NAND circuit 926 receiving an input IN and the clock signal K (CLK or/CLK), a 2-input NAND circuit 925 receiving a complementary input /IN and the clock signal K, a NAND circuit 928 receiving at its one input an output of the NAND circuit 926, and a 2-input NAND circuit 927 receiving at its one input an output of the NAND circuit 925. The NAND circuits 927 and 928 have outputs, each of which is cross-coupled to the other input of the other circuit 928 or 927. The output of the NAND circuit 928 is connected to the output Q, and the output of the NAND circuit 927 is connected to the output /Q.

In the configuration of flip-flops shown in FIG. 80, signals which are applied to the inputs IN and /IN when the clock signal K is "H" are applied to the outputs Q1 and /Q, respectively. If the clock signal K is "L", the outputs do not change whichever the states the inputs IN and /IN may be in. Thus, the flip-flop shown in FIG. 80 attains a through-state and takes in the inputs IN and /IN in response to the rise of the clock signal K, and then attains the latch state in response to the fall of the clock signal K. Then, an operation of the latency counter shown in FIGS. 73 and 80 will be described below with reference to an operation waveform diagram of FIG. 81.

The read detection signal φR is generated in response to the rise of the clock signal CLK in the first cycle. In response to the rise of the signal φR to "H", the output Q of the flip-flop FF1 rises to "H" (in the initial state, all the outputs Q1–Q4 have been reset at "L"). The output Q1 of the flip-flop FF1 is introduced into the flip-flop FF2 at the fall of the clock signal CLK. The output Q2 of the flip-flop FF2 is introduced into the flip-flop FF3 in response to the rise of the clock signal CLK in the second cycle. The output Q3 of the flip-flop FF3 is introduced into the flip-flop FF4 in response to the fall of the clock signal CLK in the second cycle.

Figure 81:
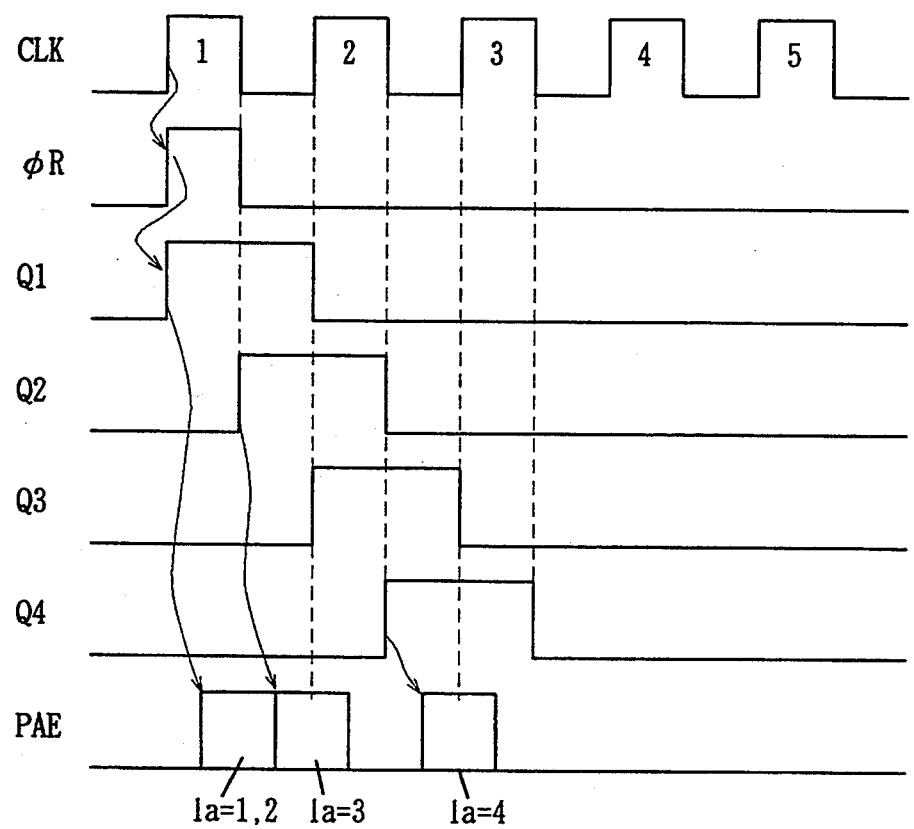
FIG. 81 is a signal waveform diagram showing an operation of a circuit shown in FIG. 79.

Thus, as shown in FIG. 81, each of the outputs Q1–Q4 of the flip-flops FF1–FF4 has a pulse width which is twice as large as that of the clock signal CLK, and forms a signal having a phase shifted by a half cycle from that of the clock signal CLK. If the latency is 1 or 2, the preamplifier enable signal PAE is generated in response to the output Q1 of the flip-flop FF1. If the latency is 3, the preamplifier enable signal PAE is generated in response to the output Q2 of the flip-flop FF2. If the latency is 4, the preamplifier enable signal PAE is generated in response to the output Q4 of the flip-flop FF4.

[TLR Signal Generating System]

Figure 82:
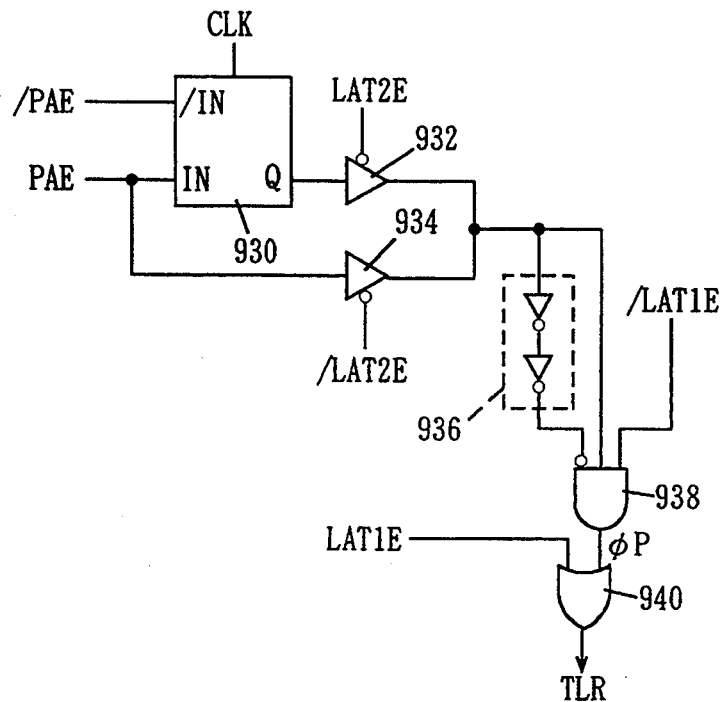
FIG. 82 shows a circuit configuration for generating a read register transfer instructing signal.

FIG. 82 shows a circuit configuration for generating a transfer control signal TLR. In FIG. 82, the TLR generating circuit includes a flip-flop 930 which takes in the preamplifier enable signals PAE and /PAE in accordance with the clock signal CLK, a tri-state buffer 932 receiving an output Q of the flip-flop 930, a tri-state buffer 934 receiving a preamplifier enable signal PAE, a delay circuit 936 delaying an output of the tri-state buffer 932 or 934 by a predetermined time, a gate circuit 938 receiving an output of the tri-state buffer 932 or 934 as well as an output of the delay circuit 936 and the latency set signal /LAT1E, and an OR circuit 940 receiving an output of the gate circuit 938 and the latency set signal LAT1E.

The flip-flop 930 has a configuration similar to that shown in FIG. 80. It takes in the signals PAE and /PAE applied to its inputs at the rising edge of the clock signal CLK and latches them at the falling edge of the clock signal CLK. The tri-state buffer 932 is activated when the latency set signal LAT2E is "L". The tri-state buffer 934 is activated when the latency set signal /LAT2E is "L". If the latency is set at 2, the set signal LAT2E attains "H". If not, the latency set signal LAT2E attains "L". The gate circuit 938 outputs a signal of "H" only when the output of the delay circuit 936 is "L", the output of the buffer 932 or 934 is "H" and the signal /LAT1E is "H". If the latency is 1, the signal /LAT1E attains "L", and if not, the signal /LAT1E attains "H".

The OR circuit 940 receives a signal φp (output of the gate circuit 938) and the set signal LAT1E. If the latency is 1, the signal LAT1E is "H". In this case, the transfer control signal TLR is fixed at "H". If the latency is 2, the transfer control signal TLR changes in accordance with the output φp of the gate circuit 938. The output φp of the gate circuit 938 fixedly attains "L" when the signal /LAT1E is "L". The gate circuit 938 is activated only when the latency is 2 or more. The activated gate circuit 938 generates a pulse signal of one-shot which is maintained at "H" for a delay time applied by the delay circuit 936 starting from the rising edge of the output of the buffer 932 or 934. Then, an operation of the TLR generating circuit shown in FIG. 82 will be described below with reference to an operation waveform diagram of FIG. 83.

If the latency is 1 or 2, the preamplifier enable signal PAE is generated utilizing the rise of the first clock cycle CLK as a trigger. If the latency is 1, the signal LAT1E attains "H", and the transference signal TLR is fixed at "H". If the latency is 2, the buffer 934 is activated, and the gate circuit 938 generates the pulse signal φp having a predetermined pulse width in response to the rise of the preamplifier enable signal PAE.

Figure 83:
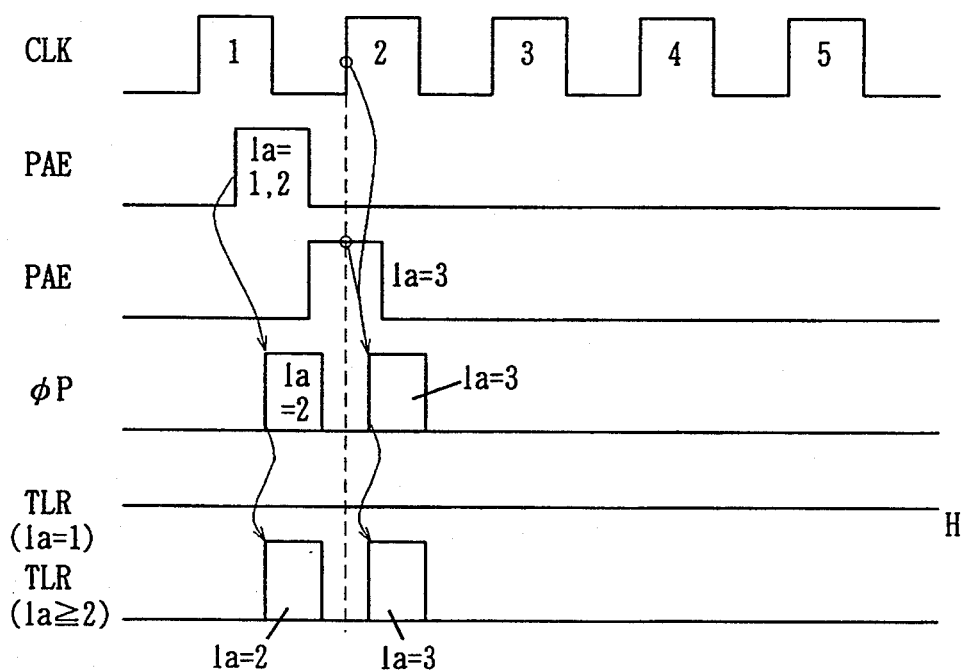
FIG. 83 is a signal waveform diagram showing an operation of a circuit shown in FIG. 80.

If the latency is 3 or more, the one-shot pulse signal φp is generated in accordance with the output of the buffer 932. In this case, the flip-flop 930 takes in the signals PAE and /PAE at the rising edge of the clock signal CLK. The output Q of the flip-flop 930 rises to "H" in synchronization with the rise of the clock signal CLK. Therefore, if the latency is 3 or more, the pulse signal φp from the gate circuit 938 maintains "H" for a predetermined "H", which is triggered by the rise of the clock signal CLK. FIG. 83 shows, as an example, a form of generation of the preamplifier enable signal PAE in the case where the latency is 3.

If the latency is 3, the one-shot pulse signal φp is generated utilizing the rise of the clock signal CLK in the second clock cycle (clock No. 2) as a trigger. Thereby, the preamplifier enable signal PAE is generated, data on the global I/O line pair is amplified and is latched by the latch at the first stage in the read register, and thereafter the established data is transferred to the latch (SLRG) at the next stage. As described above, the transfer control signal TLR is generated after the activation of the preamplifier enable signal PAE, and the data is transferred between the latches in the read register. Owing to this configuration, destruction of data held in the read register is prevented when the same bank is successively accessed for reading data.

[OEM/DOT Signal Generating System]

Figure 84:
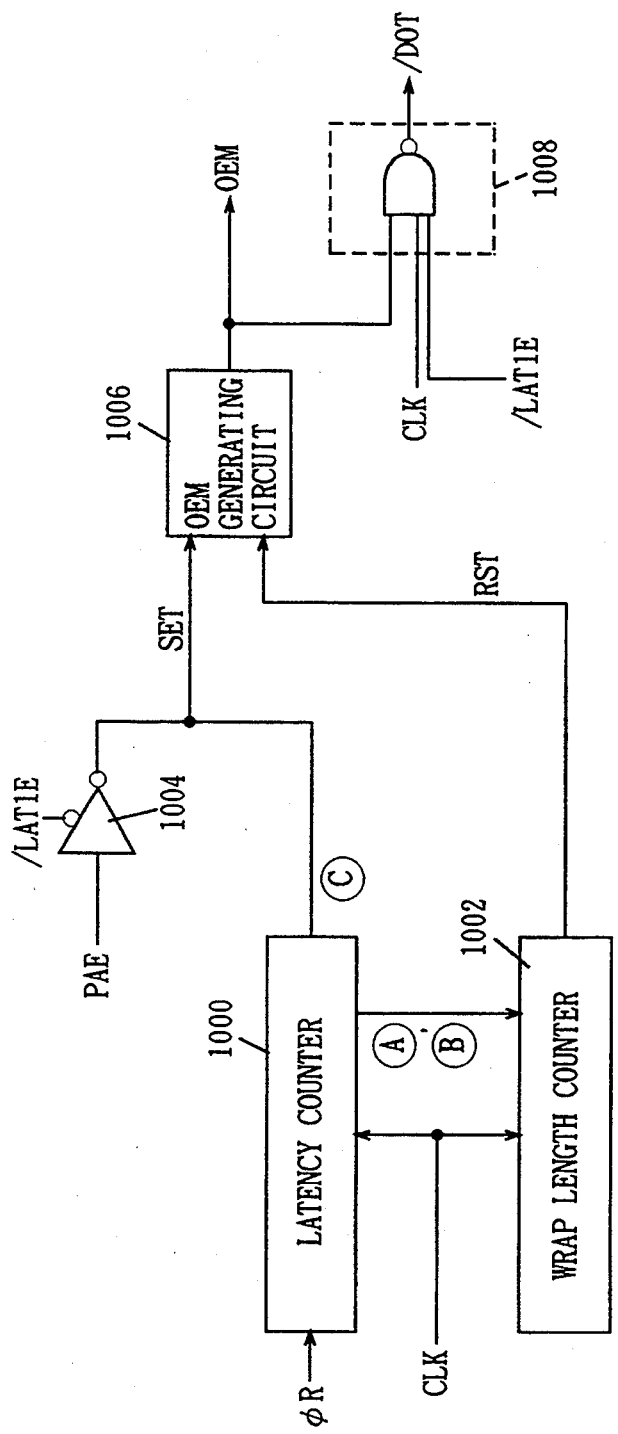
FIG. 84 shows a circuit configuration for generating an operation control signal for an output buffer.

FIG. 84 shows a circuit configuration for generating the data output control signals OEM and /DOT. Referring to FIG. 84, the data output control signal generating system includes a latency counter 1000 which counts the clock signal CLK in accordance with the set latency data in response to the read detection signal φR, a wrap length counter 1002 which is activated in response to a count-up signal coming from the latency counter 1000 and counts the clock signal CLK in accordance with the set wrap length, a tri-state inverter buffer 1004 which is activated in response to the latency set signal /LAT1E to pass the preamplifier enable signal PAE, and an OEM generating circuit 1006 which is set in accordance with the count-up signal coming from the latency counter 1000 or the signal coming from the inverter buffer 1004 and is reset in accordance with the count-up signal coming from the wrap length counter 1002. The latency counter 1000 counts the clock number equal to the set latency (if the latency is 2 or more). The wrap length counter 1002 generates a count-up signal when the clock number equal to the set wrap length is counted. The OEM generating circuit 1006 generates the output enable signal OEM. Further, there is provided a gate circuit 1008 which generates the output control signal /DOT in response to the output enable signal OEM, clock signal CLK and signal /LAT1E. The gate circuit 1008 includes a 3-input NAND circuit, and sets the signal /DOT at "L" when all the output enable signal OEM, latency set signal /LAT1E and clock signal CLK are "H".

Figure 85:
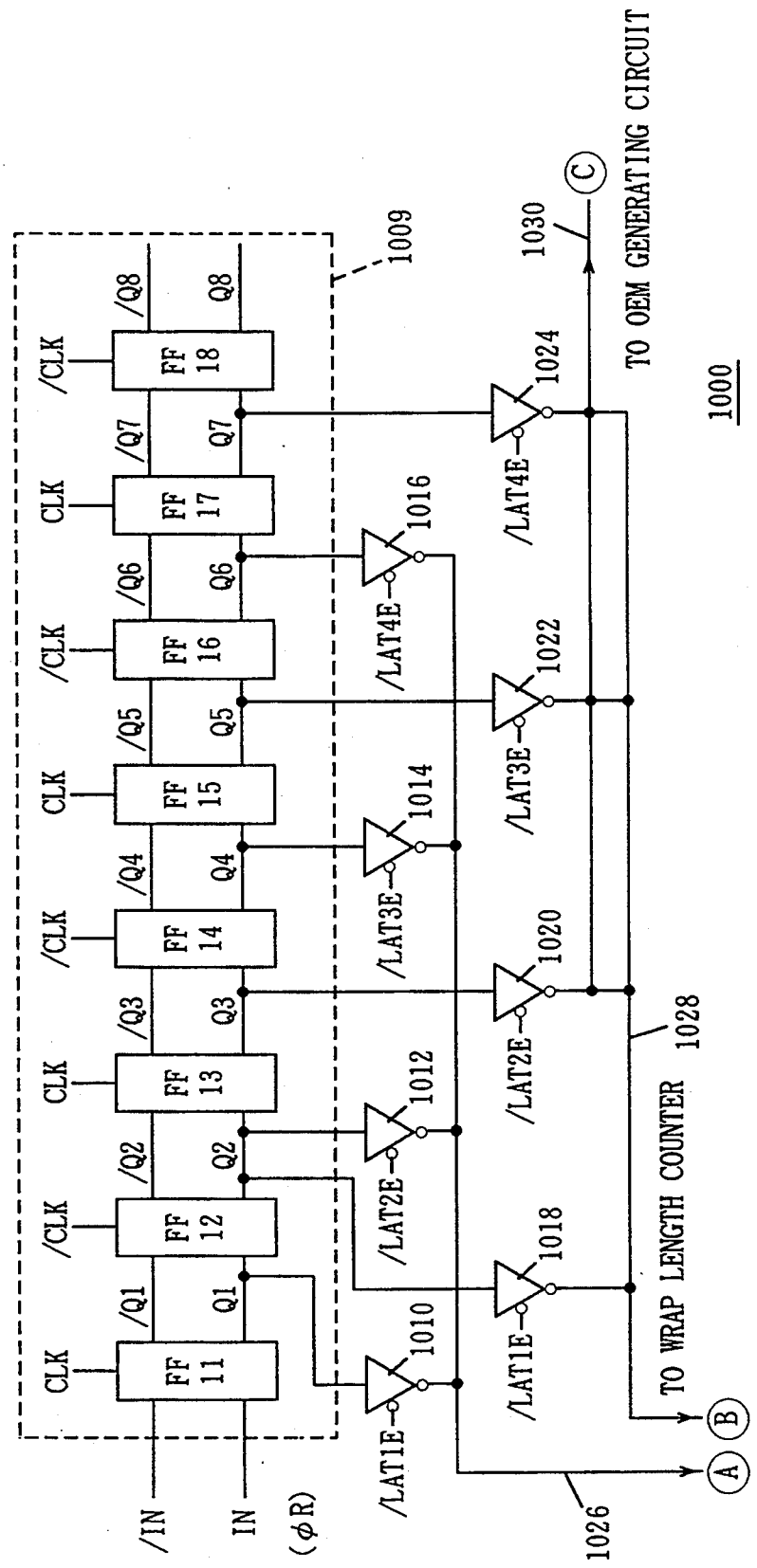
FIG. 85 shows a specific configuration of a latency counter shown in FIG. 84.

FIG. 85 shows a specific configuration of the latency counter 1000 shown in FIG. 84. In FIG. 85, the latency counter 1000 includes a shift counter 1009 which counts the clock signal CLK in response to the read detection signal φR, tri-state inverter buffers 1010, 1012, 1014 and 1014 which selectively pass an output of the shift counter 1009 in accordance with the latency set signals /LAT1E–LAT4E, and tri-state inverter buffers 1018, 1020, 1022 and 1024 which activate the wrap length counter and reset the OEM generating circuit.

The shift counter 1009 includes eight flip-flops FF11–FF18 connected in series. The flip-flops FF11–FF18 have configurations similar to that of the flip-flop shown in FIG. 80, and take in their inputs at the rising edge of the applied clock signal CLK or/CLK. The tri-state inverter buffer 1010 is activated in accordance with the latency set signal /LAT1E, and inverts an output Q1 of the flip-flop FF11 for transmitting the same onto a signal line 1026. The tri-state inverter buffer 1012 is activated in response to the latency set signal /LAT2E and inverts an output Q2 of the flip-flop FF12 for transmitting the same onto the signal line 1026. The inverter buffer 1014 is activated in response to the latency set signal /LAT3E and inverts an output Q4 of the flip-flop FF14 for transmitting the same onto the signal line 1026. The tri-state inverter buffer 1016 is activated in response to the latency set signal /LAT4E and inverts an output Q6 of the flip-flop FF16 for transmitting the same onto the signal line 1026. The signals transmitted from the inverter buffers 1010–1016 to the signal line 1026 are used for resetting the wrap length counter 1002.

The inverter buffer 1018 is activated in response to the latency set signal /LAT1E and transmits the output Q2 of the flip-flop FF12 onto the signal line 1028. The inverter buffer 1020 is activated in response to the latency set signal /LAT2E and inverts the output Q3 of the flip-flop FF13 for transmitting the same onto the signal lines 1030 and 1028. The inverter buffer 1022 is activated in response to the latency set signal /LAT3E and inverts the output Q5 of the flip-flop FF15 for transmitting the same onto the signal lines 1030 and 1028. The inverter buffer 1024 is activated in response to the latency set signal /LAT4E and inverts the output Q7 of the flip-flop FF17 for transmitting the same onto the signal line 1028. The signal on the signal line 1030 is used for resetting the OEM generating circuit. The signal on the signal line 1028 is used for driving the wrap length counter 1002. Then, an operation of the latency counter 1000 shown in FIG. 85 will be described below with reference to an operation waveform diagram of FIG. 86.

The inverter buffers 1010–1024 are selectively activated in accordance with the latency data which has been set in advance. For example, if the latency is 1, the inverter buffers 1010 and 1018 are activated. Before application of the read detection signal φR, the potentials of the signal lines 1030 and 1028 as well as signal line 1026 are "L". The read detection signal φR is generated in response to the rise of the clock signal CLK in the first cycle. In response to this, the output Q1 of the flip-flop FF11 rises to "H". Thereafter, the flip-flops FF12–FF18 take in signals applied to their inputs at the rising edge of the clock signal. Therefore, the flip-flops FF11–FF18 supply through their outputs the signals of which phases are shifted by a half cycle of the clock signal CLK. In accordance with the set latency, one of the outputs of the flip-flops FF11–FF17 is selected. Therefore, the signal on the signal line 1030 changes in accordance with the rising edge of the clock signal CLK (inverters 1020–1024 are connected to the flip-flops which take in the applied signals in accordance with the clock signal CLK). Meanwhile, the signal on the signal line 1026 changes in accordance with the rise of the inverted signal /CLK of the clock signal CLK unless the latency is 1. If the latency is 1, the signal on the signal line 1026 changes in response to the rise of the clock signal CLK. Thus, the signal potential on the signal line 1028 changes with a delay of a half cycle with respect to the signal potential on the signal line 1026.

Figure 86:
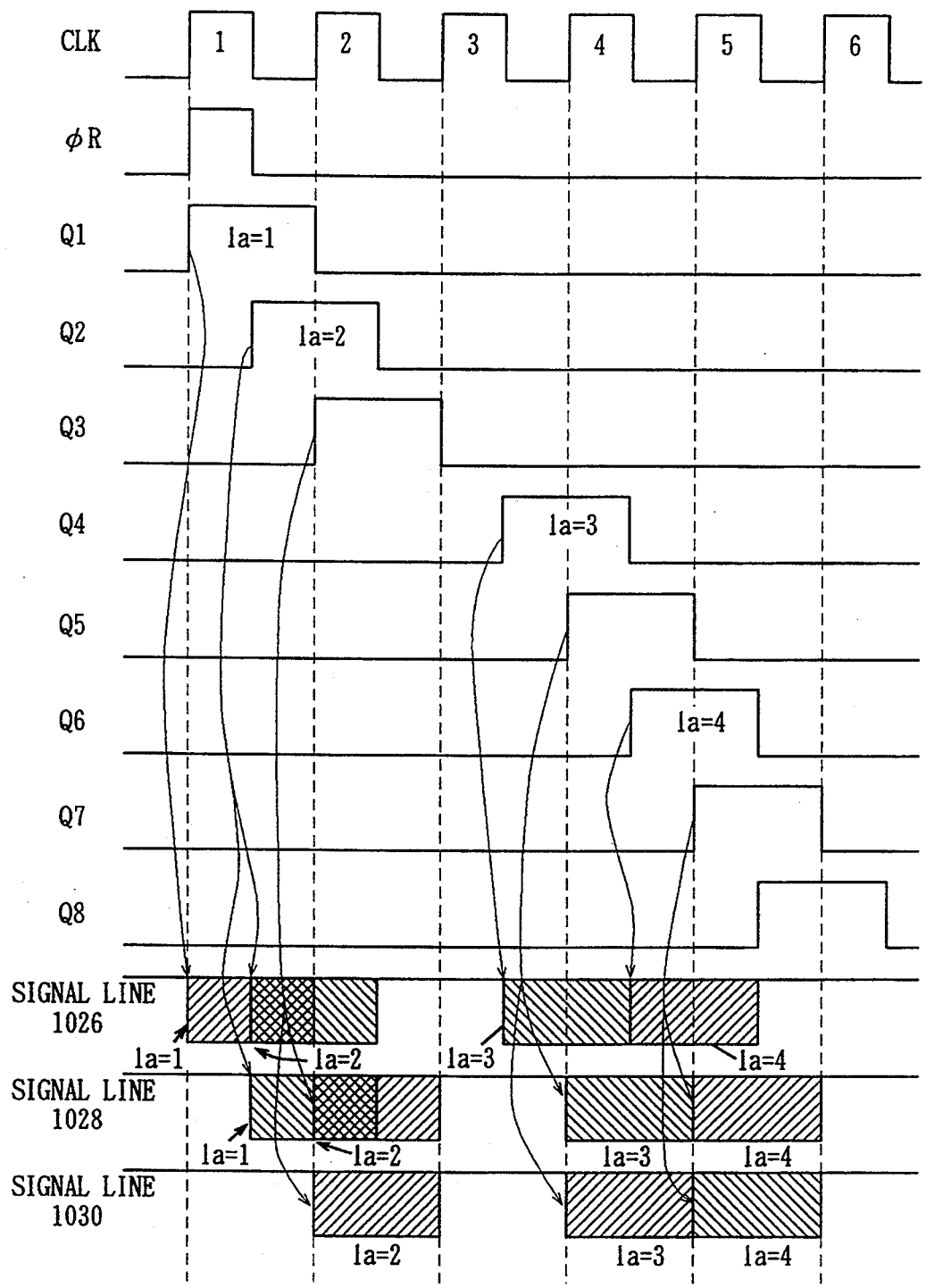
FIG. 86 is a signal waveform diagram showing an operation of the latency counter shown in FIG. 85.

In FIG. 86, only one pulse signal having a pulse width which is twice as large as that of the clock signal CLK appears on each of the signal lines 1026, 1028 and 1030. The signal on the signal line 1030 is activated at the time preceding by 1 clock cycle the clock cycle designated by the latency. The OEM generating circuit, therefore, is set in accordance with the signal on the signal line 1030 and generates the signal OEM (if the latency is 1). If the latency is 1, the inverted signal of the preamplifier enable signal PAE is applied from the tri-state inverter buffer 1004, as shown in FIG. 84, and the OEM generating circuit 1006 attains the set state in accordance with an output of the tri-state inverter buffer 1004, because the advance reading cannot be performs in the case of the latency of 1. If the latency is 1, the gate circuit 1008 sets its output/DOT at the inactive state of "H".

Figure 87:
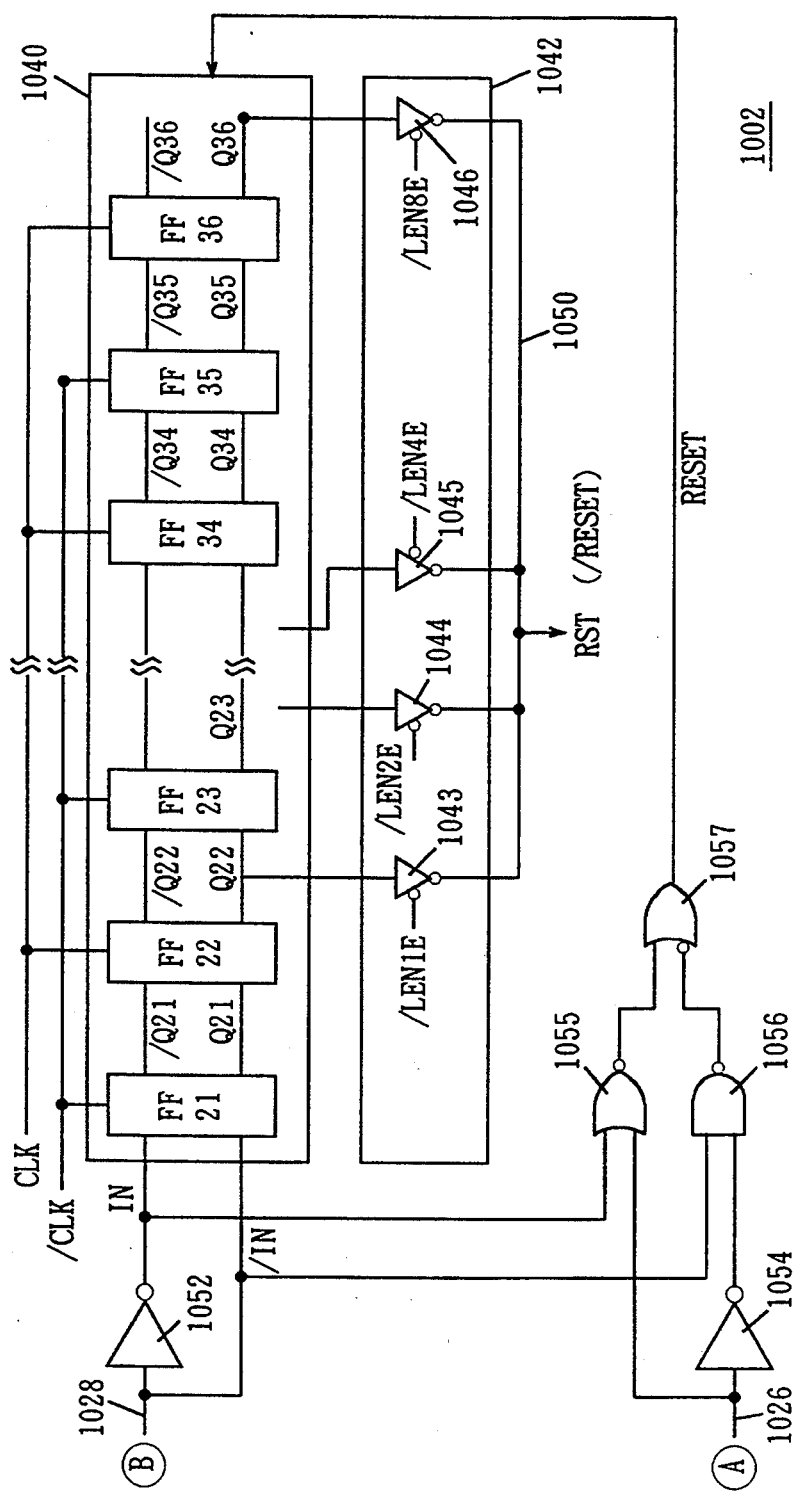
FIG. 87 shows a specific configuration of a wrap length counter shown in FIG. 84.

FIG. 87 shows, as an example, a specific configuration of the wrap length counter 1002 shown in FIG. 84. Referring to FIG. 87, the wrap length counter 1002 includes a shift counter 1040 which is activated in response to the signal on the signal line 1028 and performs the counting operation in response to the clock signals CLK and /CLK, and a selecting circuit 1042 which selects an output of this shift counter in accordance with the wrap length data /LEN1E, /LEN2E, /LEN4E and /LEN8E and generates an OEM generating circuit reset signal RST onto a signal line 1050.

The shift counter 1040 includes 16 flip-flops FF21–FF36 connected in series. Each of the flip-flops FF21–FF36 has a configuration similar to that of the flip-flop shown in FIG. 80. The flip-flops FF21–FF36 receive alternately the clock signals /CLK and CLK.

The selecting circuit 1042 selects the output of the shift counter 1040 so that it counts the clock number in accordance with the wrap length data after attaining the driven state and generates the reset signal upon elapse of a period equal to the clock cycle number designated by the wrap length data. The selecting circuit 1042 includes a tri-state inverter buffer 1043 which is responsive to the wrap length data /LEN1E to invert an output of the flip-flop FF22 and transmit the same onto the signal line 1050, a tri-state inverter buffer 1044 which inverts and amplifies an output of the flip-flop FF24 (not shown), a tri-state inverter buffer 1045 which is activated in response to the wrap length data /LEN4E to invert and amplify an output of the flip-flop FF28 (not shown) for transmitting the same onto the signal line 1050, and a tri-state inverter buffer 1046 selecting an output of the flip-flop FF36. The inverter buffer 1046 is activated in response to the wrap length data /LEN8E to invert and amplify the output of the flip-flop FF36 for transmitting the same onto the signal line 1050.

The output states of the flip-flops FF selected by the tri-state inverter buffers 1043–1046 change in accordance with the clock signal CLK. The OEM generating circuit is reset upon elapse of the clock cycle number of (wrap length+1) designated by the wrap length data after the latency counter generated the count-up signal.

The wrap length counter 1002 further includes an inverter 1052 inverting the signal on the signal line 1028, a 2-input NOR circuit 1055 receiving an output of the inverter 1052 and the signal on the signal line 1026, an inverter 1054 inverting the signal on the signal line 1026, a 2-input NAND circuit 1056 receiving the signal on the signal line 1028 and the output of the inverter 1054, and a gate circuit 1057 receiving an output of the NOR circuit 1055 and an output of the NAND circuit 1056. The gate circuit 1057 generates the reset signal RESET when an output of the NOR circuit 1055 is "H" or an output of the NAND circuit 1056 is "L". In response to the reset signal RESET, all the output states of the shift counter 1040 are reset at "L". This resetting configuration may be achieved in the flip-flop shown in FIG. 80 by providing one transistor, which couples the output Q to the ground potential in response to the reset signal RESET, for the output Q. Then, an operation of the wrap length counter shown in FIG. 87 will be described below with reference to an operation waveform diagram of FIG. 88.

Figure 88:
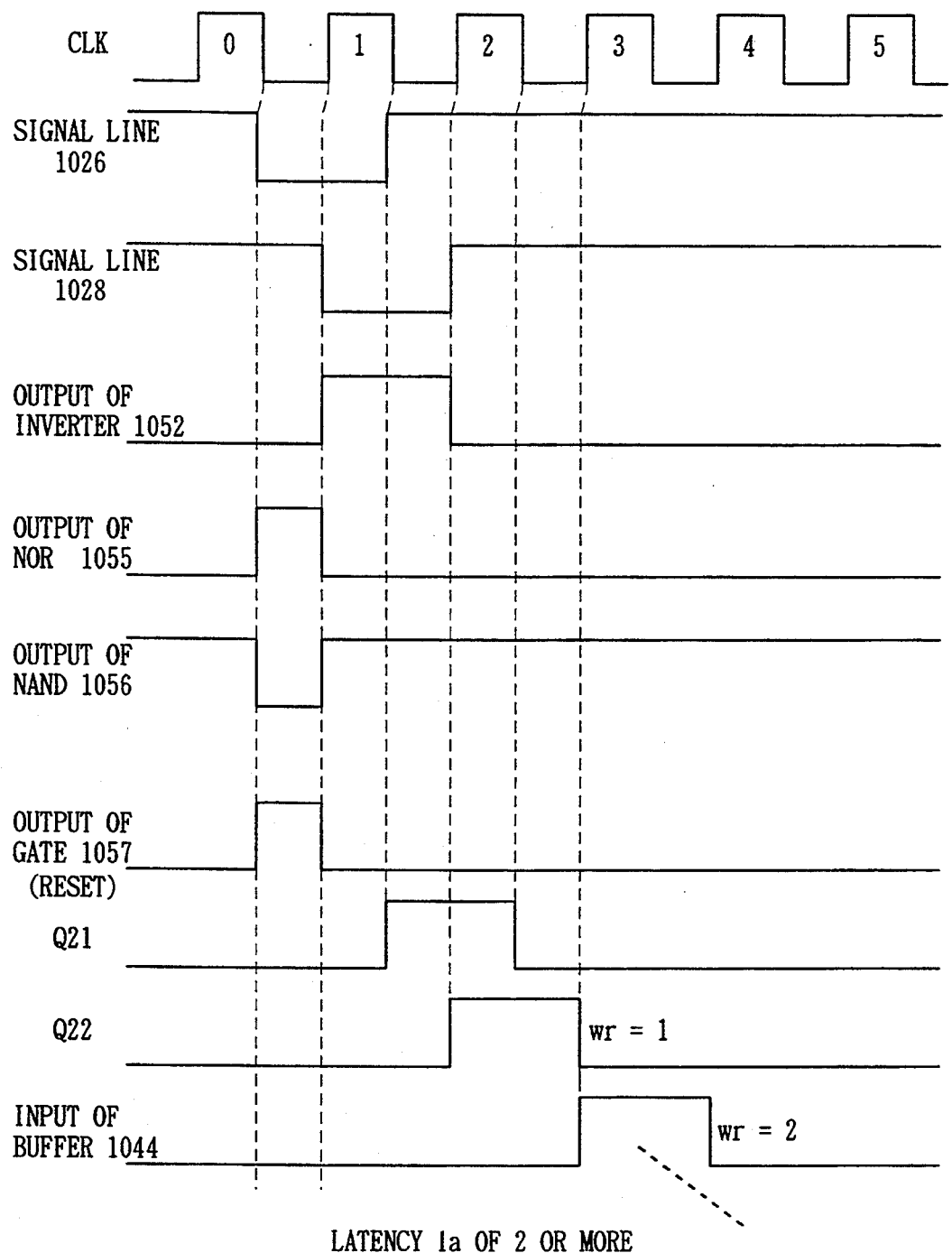
FIG. 88 is a signal waveform diagram showing a wrap length counter shown in FIG. 87.

FIG. 88 shows an operation waveform in the case where the latency is 2 or more. At the falling edge of the clock signal CLK, the potential of the signal line 1026 falls to "L", and then the signal potential of the signal line 1028 falls to "L" at the next rise of the clock signal CLK. In response to this, the output of the inverter 1052 rises to "H".

Meanwhile, the NOR circuit 1055 receives the output of the inverter 1052 and the signal on the signal line 1026. Therefore, the NOR circuit 1055 maintains its output at "H" for a period from the falling edge of the clock signal CLK of the clock No. 0 to the rising edge of the clock signal CLK of the clock No. 1. Similarly, the NAND circuit 1056 maintains its output at "L". The output of the gate circuit 1057 attains "H" in accordance with the outputs of the NOR circuit 1055 and gate circuit 1056, and the reset signal RESET is generated so that the output of the shift counter 1040 is reset. After this reset, the output of the inverter 1052 is introduced into the flip-flop FF21 at the falling edge of the clock signal CLK, and the output Q21 attains "H".

In response to the next fall of the clock signal CLK, the output Q22 of the flip-flop FF22 rises to "H". Thereafter, the alternate flip-flops supply the signals which are shifted in phase by 1 clock cycle from each other. The output Q22 of the flip-flop FF22 shows the fact that the wrap length data wr indicates the wrap length of 1. The input of the buffer 1044 indicates that the wrap length is 2. Therefore, the selecting circuit 1042 generates the reset signal RST upon elapse of clock cycles equal to the wrap length data after the latency counter indicated the count-up, and the output of the OEM generating circuit is reset.

Figure 89:
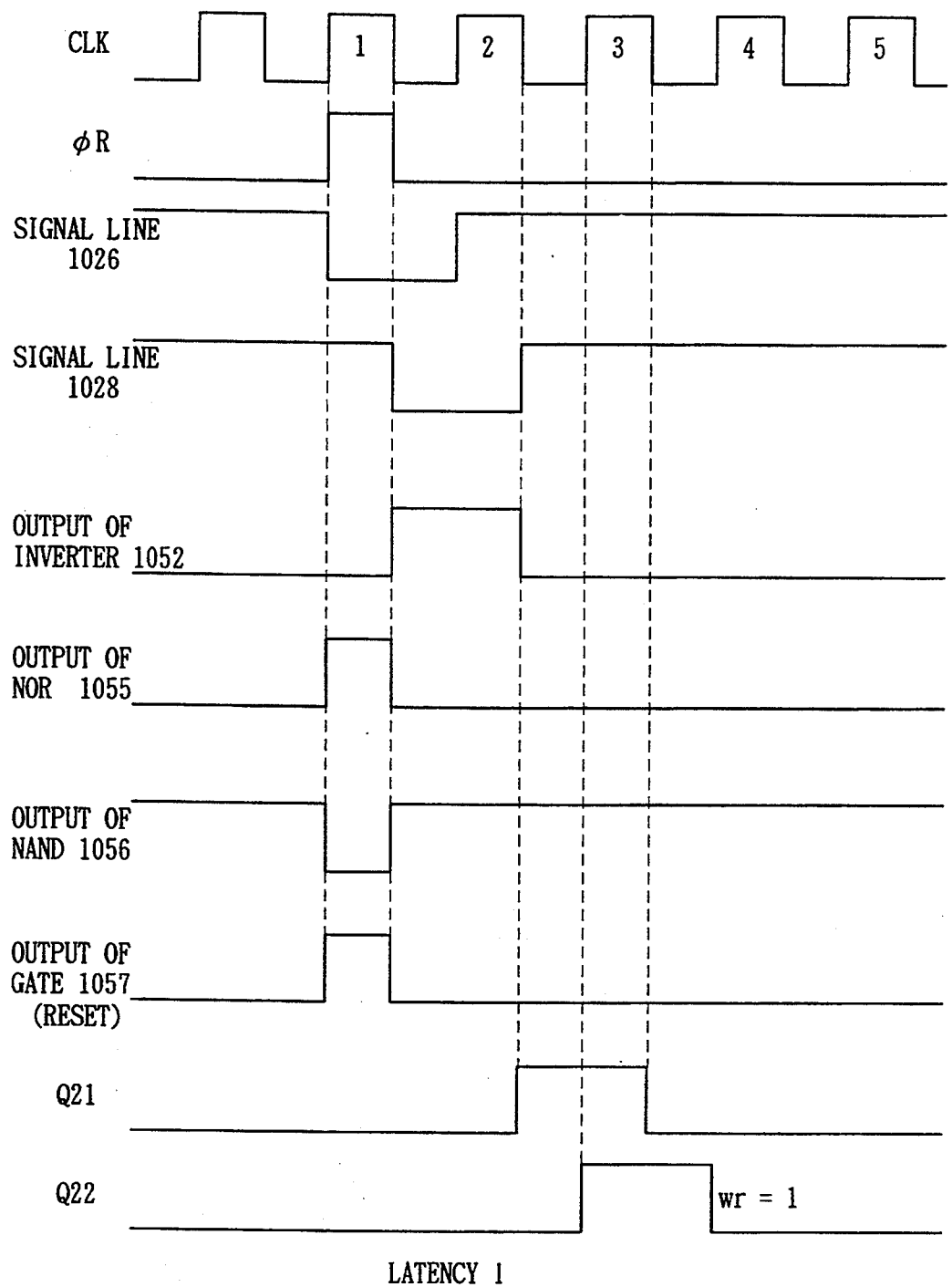
FIG. 89 shows another operation of the wrap length counter shown in FIG. 87.

FIG. 89 shows an operation of the wrap length counter in the case where the latency is 1. In FIG. 89, if the latency is 1, the read detection signal φR is generated in response to the rise of the clock signal CLK in the first clock cycle, and the potential of the signal line 1026 falls to "L". Subsequently, the potential of the signal line 1028 falls to "L" in response to the fall of the clock signal. In this first clock cycle, the outputs of the NOR circuit 1055 and NAND circuit 1056 attain "H" and "L" in accordance with the read detection signal φR, respectively. Thereby, the output of the gate circuit 1057 attains "H", and the shift counter 1040 is reset. The flip-flop FF21 takes in the signals applied to its inputs IN and /IN at the falling edge of the clock signal CLK in the first clock cycle. At this time, the output of the inverter 1052 has not yet attained "H", so that the output Q21 of the flip-flop FF21 maintains "L".

When the clock signal CLK falls to "L" in the second clock cycle, the flip-flop FF21 takes in the output of the inverter 1052 and outputs the signal of "H". The flip-flop FF22 takes in the output Q21 of the flip-flop FF21 at the next rising edge of the clock signal CLK, and produces a signal which attains "H" at the rising edge of the clock signal CLK in the third clock cycle. Thereafter, a signal, which disables the outputs upon elapse of the clock cycles indicated by the required wrap length, is generated at the rising edge of the clock signal CLK.

In this manner, the signal resetting the OEM generating circuit is generated upon elapse of the wrap length cycles after elapse of the latency.

Figure 90:
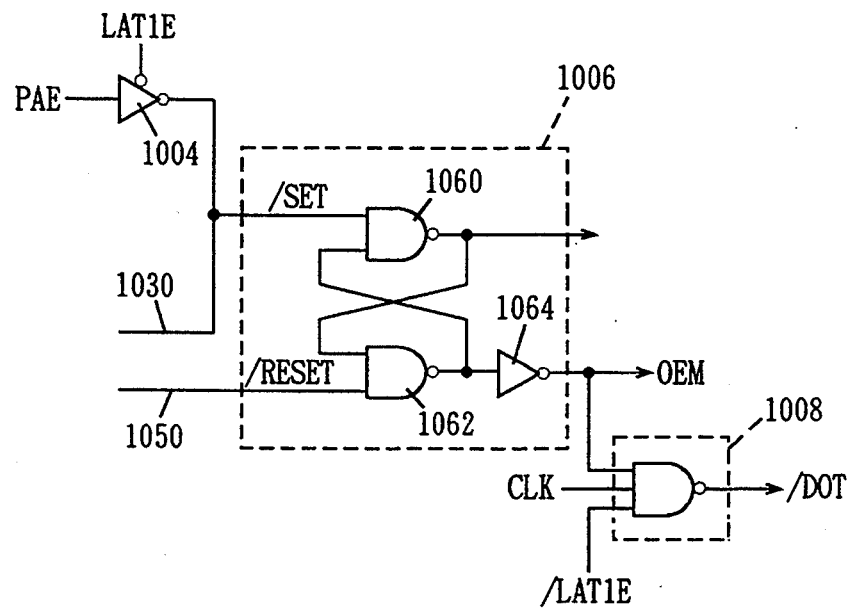
FIG. 90 shows a configuration of an OEM generating circuit shown in FIG. 84.

FIG. 90 shows an example of the OEM generating circuit shown in FIG. 84. In FIG. 90, the OEM generating circuit includes two 2-input NAND circuits 1060 and 1062, each of which has an output coupled to one of inputs of the other. The other input of the NAND circuit 1060 is coupled to the output of the tri-state inverter buffer 1004 and the signal line 1030. The other input of the NAND circuit 1062 is coupled to the signal line 1050. The NAND circuit 1062 is provided at its output with an inverter circuit 1064. The inverter circuit 1064 generates the output enable signal OEM. An operation of the OEM generating circuit shown in FIG. 90 will be described below with reference to an operation waveform diagram of FIG. 91.

In response to the rise of the clock signal CLK in the second clock cycle, the potential of the signal line 1030 falls to "L" (termination of the latency count). This operation is performed only if the latency is 2 or more. In the OEM generating circuit 1006, the output of the NAND circuit 1060 changes to "H" in response to the above fall. Since the signal potential on the signal line 1050 is "H", the output of the NAND circuit 1062 attains "L" and the output enable signal OEM generated from the inverter circuit 1064 rises to "H". In response to the output enable signal OEM, the gate circuit 1008 regenerates the output control signal /DOT synchronized with the clock signal CLK.

When the predetermined wrap length cycles have passed the signal potential on the signal line 1050 falls to "L" (in response to the rise of the clock signal CLK in the n-th cycle). Thereby, the output of the NAND circuit 1062 attains "H". The output enable signal OEM falls to "L" through the inverter circuit 1064, and is set in the output disable state.

Figure 91:
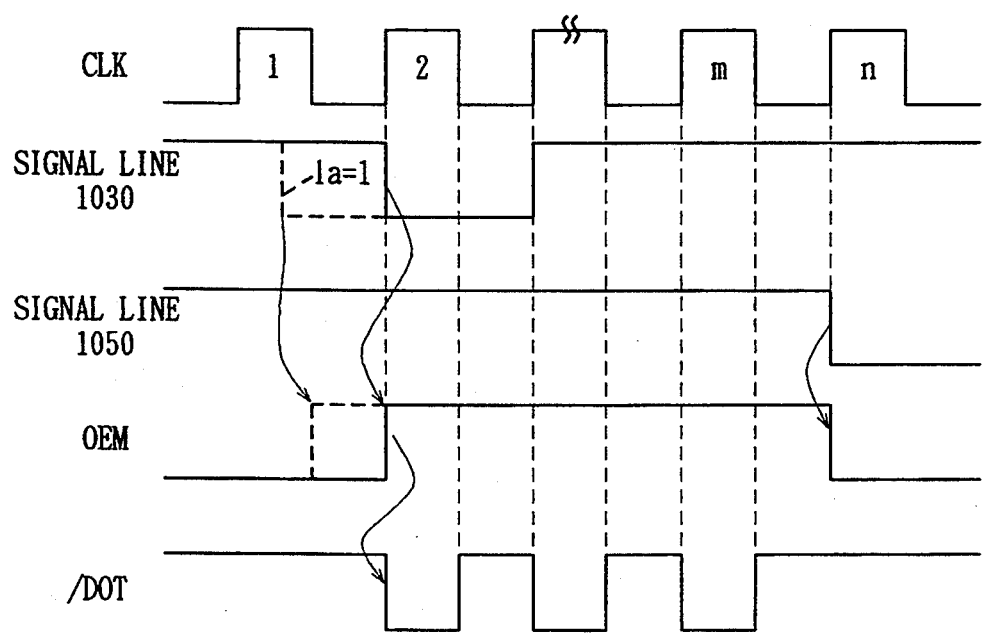
FIG. 91 is a signal waveform diagram showing an operation of the OEM generating circuit shown in FIG. 90.

If the latency is 1, a signal waveform represented by dotted line in FIG. 91 appears. In this case, the inverter buffer 1004 generates the output enable signal OEM in accordance with the preamplifier enable signal PAE. The output enable signal OEM falls at the same timing as that in the case of the latency of 2 or more. At this time, the signal /LAT1E is "L" and thus the gate circuit 1008 fixedly maintains the output control signal /DOT at "H" because the latency is 1. The reason for this is that, if the latency is 1, the output control signals DOT and /DOT for the advance-reading are not necessary.

[BA Signal Generating System]

Figure 92:
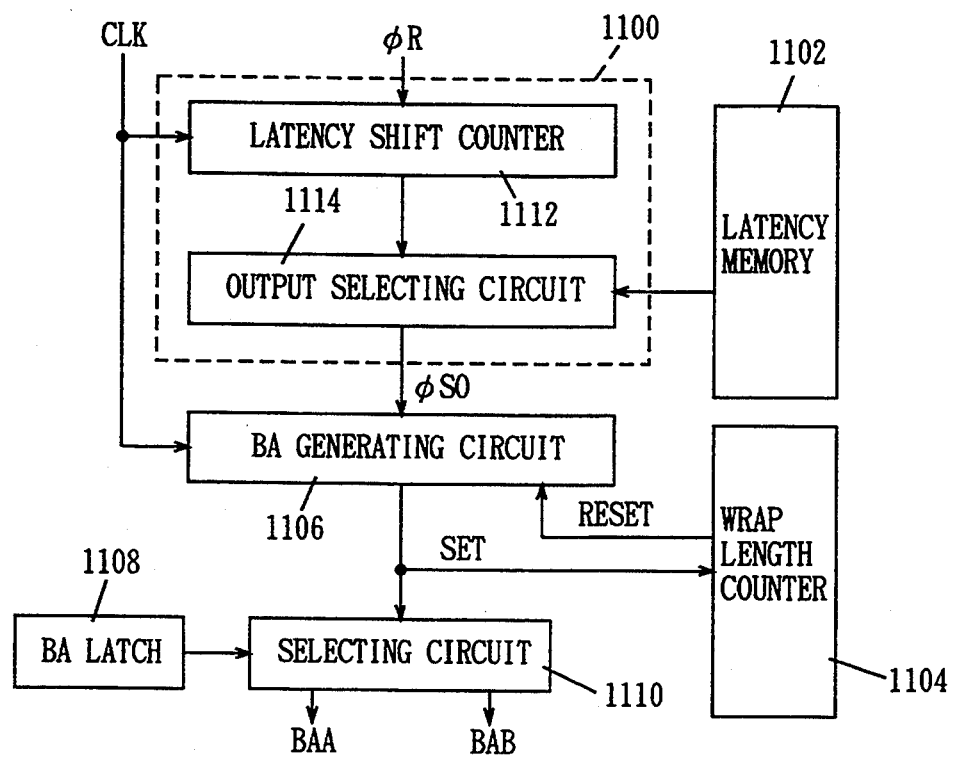
FIG. 92 shows a circuit configuration for generating a bank address designating signal.

FIG. 92 shows a configuration of a BA signal generating system. In FIG. 92, the BA signal generating system includes a counter circuit 1100 which counts the clocks in response to the read detection signal $\phi R$ and generates the count-up signal when the count reaches a predetermined value, a BA generating circuit 1106 which generates a control signal in response to an output of the counter circuit 1100, a wrap length counter 1104 which receives a signal from the BA generating circuit 1106 as a set signal SET and counts a predetermined wrap length, a BA latch 1108 which latches the bank address which is applied in the column accessing operation, and a selecting circuit 1110 which generates an output of the BA generating circuit 1106 as the bank designating signal BAA or BAB in accordance with an output of the BA latch 1108. The wrap length counter 1104 has a configuration similar to that shown in FIG. 87. The latency memory circuit 1102 has a configuration similar to that shown in FIG. 75.

The counter circuit 1100 includes a latency shift counter 1112 which counts the clock signal CLK by sequentially shifting the clock signal in response to the signal $\phi R$, and an output selecting circuit 1114 which selects an output of the latency shift counter 1112 in accordance with the latency information stored in the latency memory circuit 1102. The latency shift counter 1112 has a configuration similar to that of the shift counter shown in FIG. 85. Similarly, the output selecting circuit 1114 includes the tri-state inverter buffers as shown in FIG. 85, and selects the output of the latency shift counter 1112 so as to generate the count-up signal at the timing preceding by 2 clock cycles the set latency.

If the designated latency is 1, the read detection signal $\phi R$ is selected by the output selecting circuit 1114 and is applied to a BA generating circuit 1106. The BA generating circuit 1106 has a configuration similar to that of the OEM generating circuit shown in FIG. 90, and receives an output of the output selecting circuit 1114 as a set signal for generating an active control signal. The wrap length counter 1104 receives the signal from the BA generating circuit as a set signal and counts a predetermined wrap length. When the count reaches a value designated by the predetermined wrap length, the BA generating circuit 1106 is disabled. The BA generating circuit 1106 generates an activating signal in response to the fall of the clock signal CLK. The selecting circuit 1110 selects one of its outputs BAA and BAB in accordance with the bank address BA latched in the BA latch 1108. In this manner, the bank designating signal BAA (or BAB) is generated only for the selected bank.

The configuration of the bank designating signal generating system shown in FIG. 92 differs from those shown in FIGS. 85, 87 and 90 only in that the output selecting circuit 114 selects a different output position of the latency shift counter 1112, so that the configuration can be easily achieved utilizing the configurations shown in FIGS. 85, 87 and 90.

Figure 93:
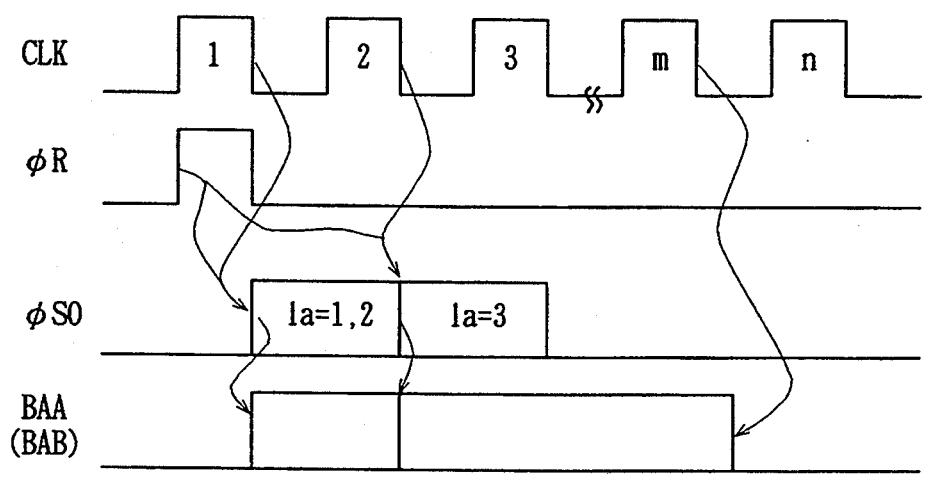
FIG. 93 is a signal waveform diagram showing an operation of a bank address generating circuit shown in FIG. 92.

FIG. 93 is an operation waveform diagram for generating the bank designating signal BAA (or BAB). FIG. 93 shows a situation in which the output selecting circuit 1114 generates the signal $\phi SO$ at the same timing in the cases of the latencies of 1 and 2. Such a configuration may be employed that, if the latency is 2, the activating signal $\phi SO$ is generated in response to the fall of the clock signal CLK, and if the latency is 1, the output selecting circuit 1114 generates the activation signal $\phi SO$ in response to the read detection signal $\phi R$ at a timing preceding the timing shown in FIG. 93. This can be achieved by utilizing the configuration, in which, if the latency is 1, the signal $\phi SO$ is generated in direct response to the signal $\phi R$, and, if the latency is 2, the signal $\phi R$ is introduced in response to the fall of the clock signal CLK for generating the signal $\phi SO$ as described with reference to FIG. 85.

[Data Write Circuitry]

Figure 94:
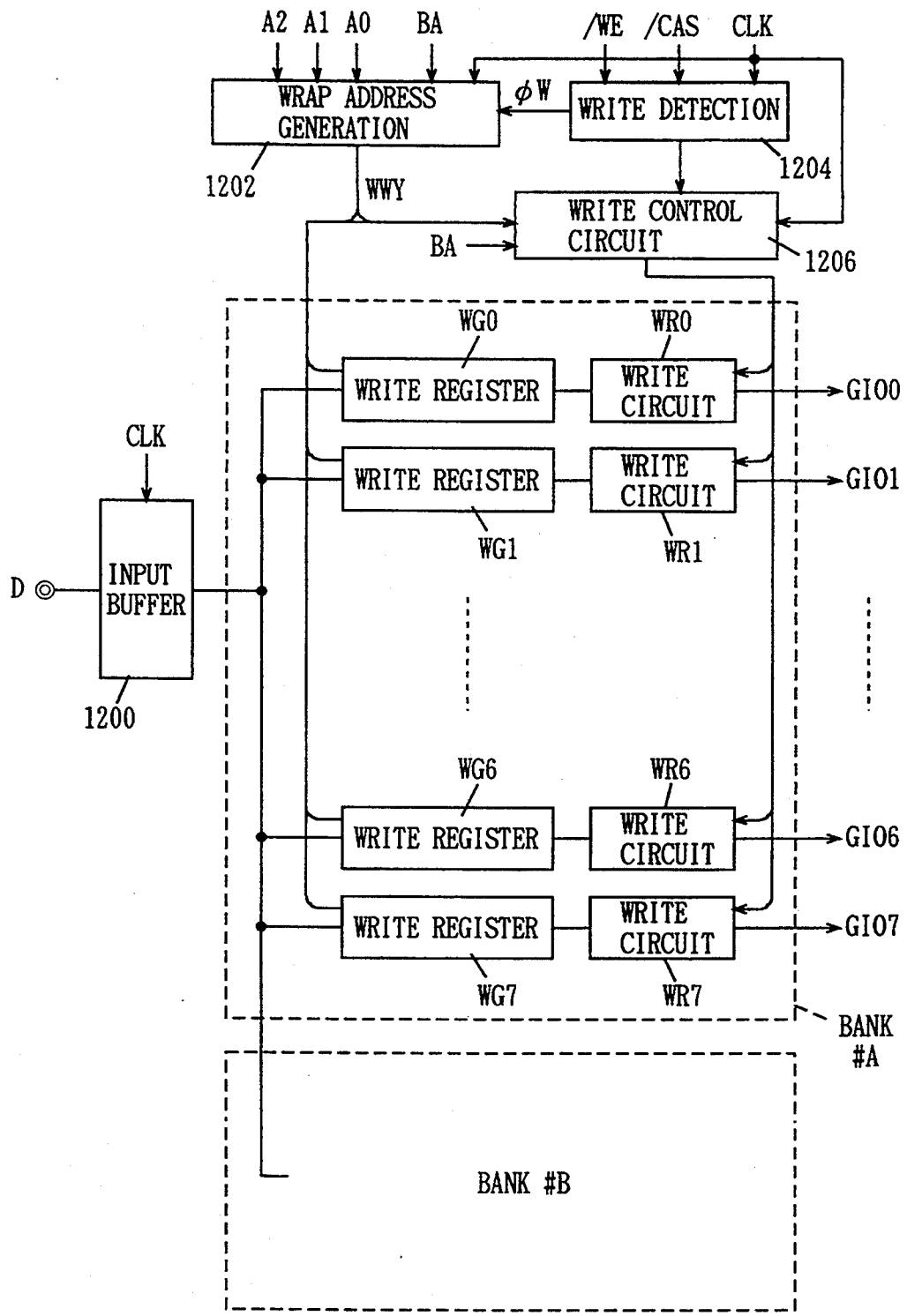
FIG. 94 shows a configuration of a data write part in the SDRAM.

FIG. 94 shows another configuration of the data write circuitry in the SDRAM of the invention. The data write circuitry shown in FIG. 94 can be applied to both the SDRAMS shown in FIGS. 1 and 44, similarly to the data read circuitry described before. Therefore, the signal /RAS will not be expressed. The signal /RAS is set in accordance with an operation manner of the SDRAM to which the circuitry is applied.

Referring to FIG. 94, the data write circuitry is divided into two portions for the banks #A and #B. The banks #A and #B have the data write circuitries of the same configurations. In FIG. 94, there is shown a data write circuit which is provided for one data input terminal D in the bank #A. The data write circuitry for the banks #A and #B are coupled commonly to an input buffer 1200. The input buffer 1200 takes in data applied to the data input terminal D in accordance with the clock signal CLK and produces write data.

The bank #A includes write registers WG0–WG7 and write circuits WR0–WR7 which are provided for the eight global I/O line pairs GIO0–GIO7 related to the data input terminal D, respectively.

In order to control the operation of the data write circuitry, there are provided a write detecting circuit 1204 which detects designation of the data write mode in response to the signals /CAS and /WE as well as the clock signal CLK, a wrap address generating circuit 1202 which is activated in response to a write detection signal $\phi w$ from the write detecting circuit 1204 and generates a write wrap address WWY in synchronization with the clock signal CLK, a write control circuit 1206 which is activated in response to the write detection signal $\phi w$ from the write detecting circuit 1204 and controls the data writing from the write circuits WR0–WR7 to the corresponding global I/O line pairs GIO0–GIO7 in accordance with the clock signal CLK coming from the write detecting circuit 1204 and the wrap address WWY coming from the wrap address generating circuit 1202.

The wrap address generating circuit 1202 and write control circuit 1206 are shown to produce the wrap address and write control signal only for the designated bank in accordance with the bank address BA, respectively. Such a configuration may be employed that the wrap address generating circuit 1202 and write control circuit 1206 are provided for each of the banks #A and B, and the wrap address generating circuit and write control circuit corresponding to the selected bank are activated in accordance with the bank address BA.

The wrap address generating circuit 1202 may be commonly used as the circuit which generates the read wrap address for selecting the read register.

The wrap address generating circuit 1202 decodes the bank address BA and 3 bits an address A0–A2, and sequentially generates a wrap address WWY for selecting the write registers. The wrap address sequentially changes in synchronization with the clock signal CLK. The write registers WG0–WG7 store the write data applied from the input buffer 1200 in accordance with the wrap address applied from the wrap address generating circuit 1202.

The write control circuit 1206 activates each predetermined number of write circuits WR0–WR7 in accordance with the wrap address WWY. Thus, the write control circuit 1206 does not simultaneously activates all the write circuits WR0–WR7 when data are written into all the write registers WG0–WG7 (in the case of the wrap length of 8). The write control circuit 1206 activates the corresponding write circuits when valid data of, e.g., 2 bits are written, and transmits the write data onto the corresponding global I/O line pairs. The data writing operation performed in units of a predetermined number of bits has a following advantage.

The number of data designated by the wrap length may not be applied in some cases. For example, only four valid data may be applied in spite of the wrap length of 8. In this case, if the operation is performed in accordance with the wrap length of 8, necessary data are written into the memory cells only after elapse of the predetermined clock cycles since the necessary data were written. Therefore, the write operation cannot be stopped until the elapse of the predetermined number of clock cycles, because if the data write is interrupted during the data writing operation (i.e., in the case of wrap stop), the write data are written only into the write registers, and the data are not written into the memory cells. However, by writing data from the write registers into the memory cells in units of multiple bits, the data have been written into the memory cells in units of a predetermined number of bits even if the wrap stop occurs, so that the wrap stop can be executed at intervals of a predetermined number of clock cycles, and thus a high speed access is allowed.

Figure 95:
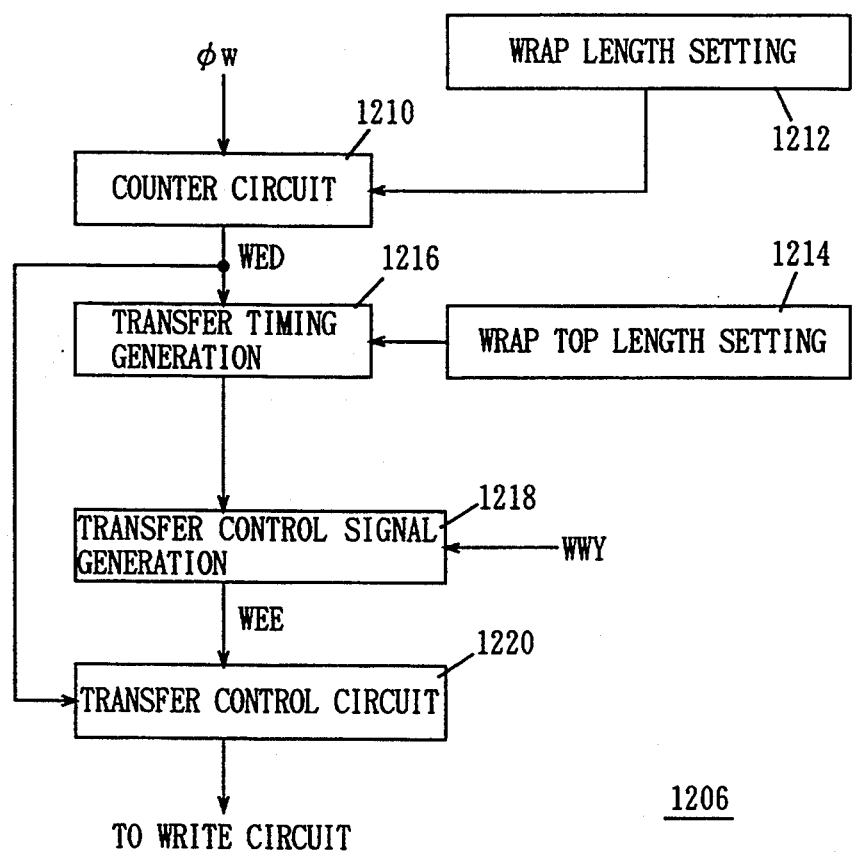
FIG. 95 shows a configuration of a write control circuit shown in FIG. 94.

FIG. 95 shows a functional configuration of a write control circuit shown in FIG. 94. In FIG. 95, the write control circuit 1206 includes a wrap length setting circuit 1212 storing the wrap length data, a wrap stop length setting circuit 1214 storing wrap stop data, and a counter circuit 1210 which is activated in response to the write detection signal $\phi w$ and counts the clocks by the number which is larger by one than the wrap length designated by the wrap length setting circuit 1212. The counter circuit 1210 has an output WDE, which is activated in response to the write detection signal $\phi w$ and is deactivated in the clock cycle of the number which is larger by one than the wrap length designated by the wrap length setting circuit 1212.

The write control circuit 1206 further includes a transfer timing generating circuit 1216 which generates a transfer timing signal enabling the transference in response to the output WDE coming from the counter circuit 1210 and wrap length data coming from a wrap stop length setting circuit 1214, a transfer control signal generating circuit 1218 which generates a transfer control signal WEE enabling the transference to the write register (write circuit) designated by the wrap address WWY in response to the wrap address WWY and an output of the transfer timing generating circuit 1216, a transfer control circuit 1220 which controls the data transference by the write circuits WR0–WR7 in response to the transfer control signal WEE coming from the transfer control signal generating circuit 1218 and the output WDE of the counter circuit 1210.

The transfer timing generating circuit 1216 generates a transfer timing signal, which is deactivated at every wrap stop length cycles designated by the wrap stop length setting circuit 1214, when the signal WDE is active. Thus, the wrap stop length data defines one data transfer cycle. The transfer control signal generating circuit 1218 generates a write enable signal WEE, which enables the data transference from the write circuit to the global I/O line pair GIO when the transfer timing generating circuit 1216 generates the active output for the corresponding write register (write circuit) designated by the wrap address WWY. The transfer control circuit 1220 performs the data transference in response to the transfer control signal (write enable signal) WEE coming from the transfer control signal generating circuit 1218 when the counter circuit 1210 generates the active output WEE.

[Write Register and Write Circuit]

Figure 96:
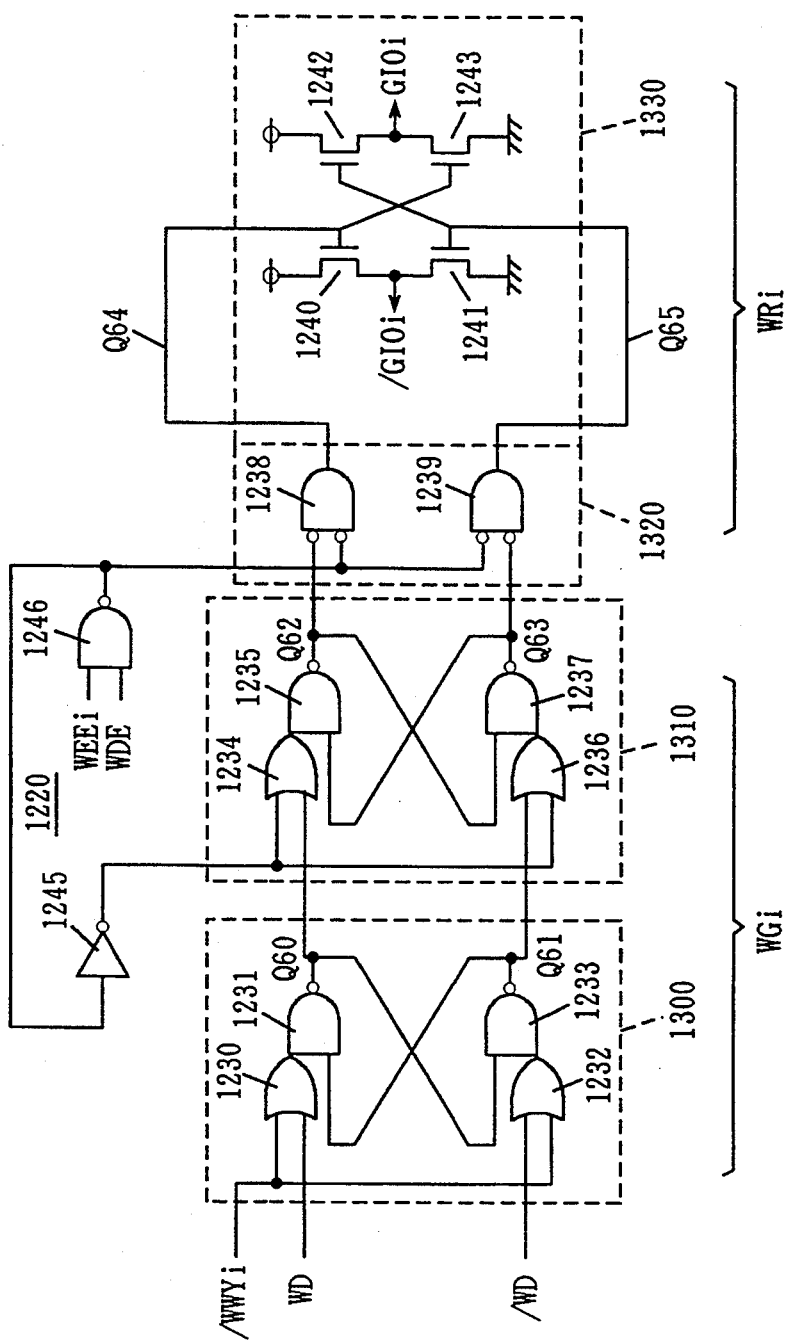
FIG. 96 shows specific configurations of a write register and a write circuit shown in FIG. 94.

FIG. 96 shows a specific configuration of the write register and write circuit shown in FIG. 94. FIG. 96 also shows the transfer control circuit 1220 shown in FIG. 95. FIG. 96 representatively shows a 1-bit data register WGi and a write circuit WRi. The write registers WG0–WG7 and write circuits WR0–WR7 have the same configurations as those shown in FIG. 96.

In FIG. 96, the transfer control circuit 1220 includes a 2-input NAND circuit 1246 receiving signals WEEi and WDE, and an inverter circuit 1245 receiving an output of the NAND circuit 1246.

When both the signals WEEi and WDE attain "H", the output of the NAND circuit 1246 attains "L", so that data transference to the global I/O lines GIOi and /GIOi is allowed.

The write register WGi includes a first latch circuit 1300 which takes in the write data WD and /WD applied from the input buffer (see FIG. 94) in response to the wrap address/WWYi, and a second latch circuit 1310 which takes in the latch data of the first latch circuit 1300 in response to the output of the inverter circuit 1245. The first latch circuit 1300 includes a 2-input OR circuit 1230 receiving the wrap address/WWYi and write data WD, a 2-input OR circuit 1232 receiving the wrap address/WWYi and write data/WD, and 2-input NAND circuits 1231 and 1233 each receiving on its one input an output of the OR circuit 1230 or 1232. The other inputs of the NAND circuits 1231 and 1233 are cross coupled to their outputs.

The second latch circuit 1310 includes a 2-input OR circuit 1234 receiving outputs of the inverter circuit 1245 and NAND circuit 1231, a 2-input OR circuit 1236 receiving outputs of the inverter circuit 1245 and NAND circuit 1233, and 2-input NAND circuits 1235 and 1237 each having inputs, one of which receives an output of the OR circuit 1234 or 1236. The other inputs of the NAND circuits 1235 and 1237 are cross-coupled with their outputs.

The first latch circuit 1300 introduces the write data WD and /WD thereinto when the wrap address /WWYi is "L", and attains the latch state of the introduced signal when the wrap address /WWYi attains "H". The second latch circuit 1310 introduces the output of the first latch circuit 1300 thereinto when the output of the inverter circuit 1245 is "L", and attains the data latch state when the output of the inverter circuit 1245 attains "H".

The write circuit WRi includes a transfer circuit 1320 which transfers the latched data in the second latch circuit 1310 in response to the output of the NAND circuit 1246, and a preamplifier 1330 which amplifies an output of the transfer circuit 1320 for transmitting the same onto the global I/O lines GIOi and /GIOi. The transfer circuit 1320 includes a 2-input NOR circuit 1238 which receives the output of the NAND circuit 1235 in the first latch circuit and the output of the NAND circuit 1246 in the transfer control circuit 1220, and a 2-input NOR circuit 1239 receiving the outputs of the NAND circuits 1237 and 1246. The transfer circuit 1320 functions as an inverter when the output of the NAND circuit 1246 attains "L", and transmits the latched data in the second latch circuit 1310. When the output of the NAND circuit 1246 is "H", the output of the NAND circuits 1238 and 1239 attain "L".

The preamplifier 1330 includes n-channel MOS transistors 1240 and 1241 connected in series between the power supply node and ground potential node, and n-channel MOS transistors 1242 and 1243 connected in series between the power supply node and ground potential node. The transistors 1240 and 1243 receive on their gates the output of the NOR circuit 1238 in the transfer circuit 1320. The transistors 1241 and 1242 receive on their gates the output of the NOR circuit 1239 in the transfer circuit 1320. In the preamplifier 1330, all the transistors 1240–1243 are turned off when both potentials of nodes Q64 and Q65 are "L", so that the preamplifier 1330 attains an output high-impedance state. Then, an operation of the circuit shown in FIG. 96 will be described below with reference to an operation waveform diagram of FIG. 97.

When the write operation is designated, the signal WDE rises to "H". A period in which the signal WDE is "H" is longer by one clock cycle than the clock cycle number designated by the wrap length data wr. During this period, the write data WD rises to "H" (if the data "1" is to be written). Thereafter, the wrap address /WWYi is selected and falls to "L". In response to the fall of the wrap address /WWYi, the latch node Q60 of the first latch circuit 1300 latches data of a value obtained by inverting the write data WD. Before this, it maintained the data written and latched in the former access cycle.

Then, the signal WEEi is selected in accordance with the wrap address WWYi and rises to "H". Thereby, the second latch circuit 1310 latches the data latched by the first latch circuit 1300, and the potential of the node Q62 attains "H". In parallel to this, the transfer circuit 1320 is turned on, and the potential of the node Q64 is fixed at "L". Before the signal WEEi attains "H" in the above operation, both the outputs of the transfer circuit 1320 were reset at "L". Thereby, the transistors 1240 and 1243 are turned off, and the transistors 1242 and 1241 are turned on, so that the potential on the global I/O line GIOi rises, and the data "1" is written.

Figure 97:
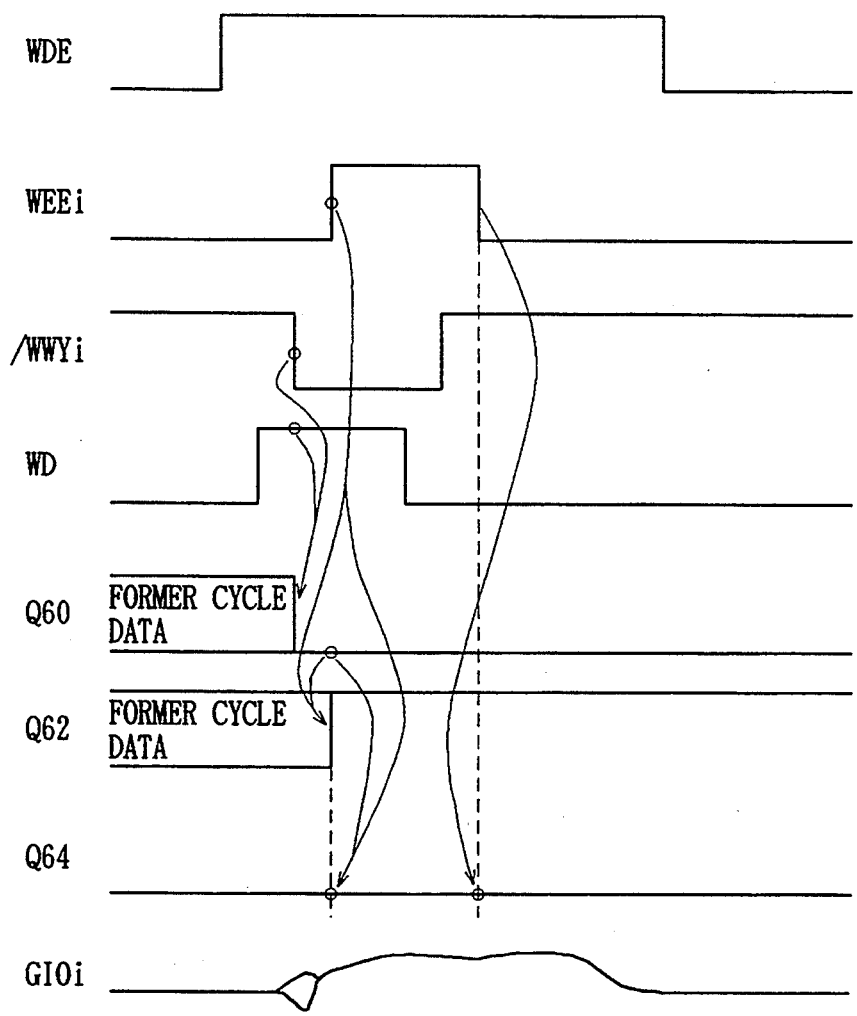
FIG. 97 is a signal waveform diagram showing operations of the write register and write circuit shown in FIG. 96.

FIG. 97 shows a situation, in which the potential of the global I/O line GIOi changes from the precharge potential in accordance with the read data of the memory cells, and then changes in accordance with the write data. The preamplifier 1330 may be activated while the global I/O lines GIOi and /GIOi are in the floating state maintaining the precharge potential and are not yet connected to the local I/O line pairs.

[WDE Signal Generating System]

Figure 98:
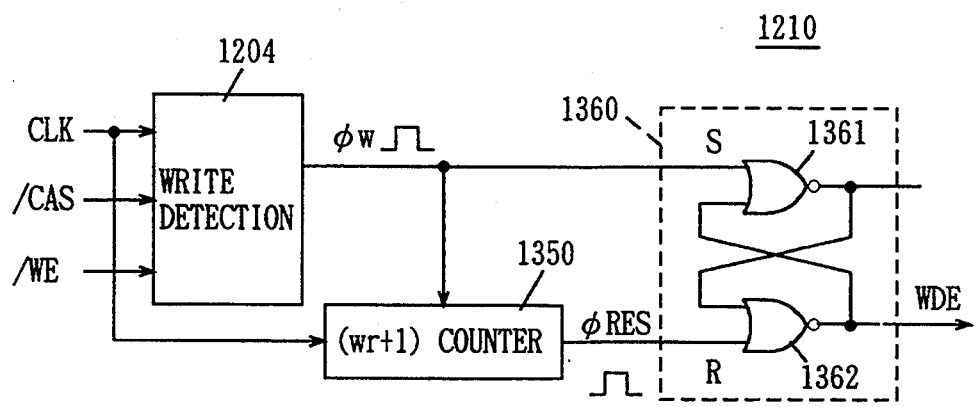
FIG. 98 shows an example of a configuration of a counter circuit shown in FIG. 95.

FIG. 98 shows a specific structural example of the wrap length setting circuit and counter circuit shown in FIG. 95. In FIG. 98, the wrap length setting circuit and counter circuit includes a (wr+1) counter 1350 counting a clock number (wr+1) in accordance with the wrap data wr, and a flip-flop 1360 which is set in response to the write detection signal φw coming from the write detection circuit 1204 and is reset in response to the count-up signal coming from the (wr+1) counter 1350. The flip-flop 1360 includes a 2-input NOR circuit 1361 which receives at its one input the write detection signal φw, and a 2-input NOR circuit 1362 which receives at its one input the output coming from the (wr+1) counter 1350. The other inputs and outputs of the NOR circuits 1351 and 1362 are cross-coupled. The NOR circuit 1362 supplies the signal WDE.

Figure 99:
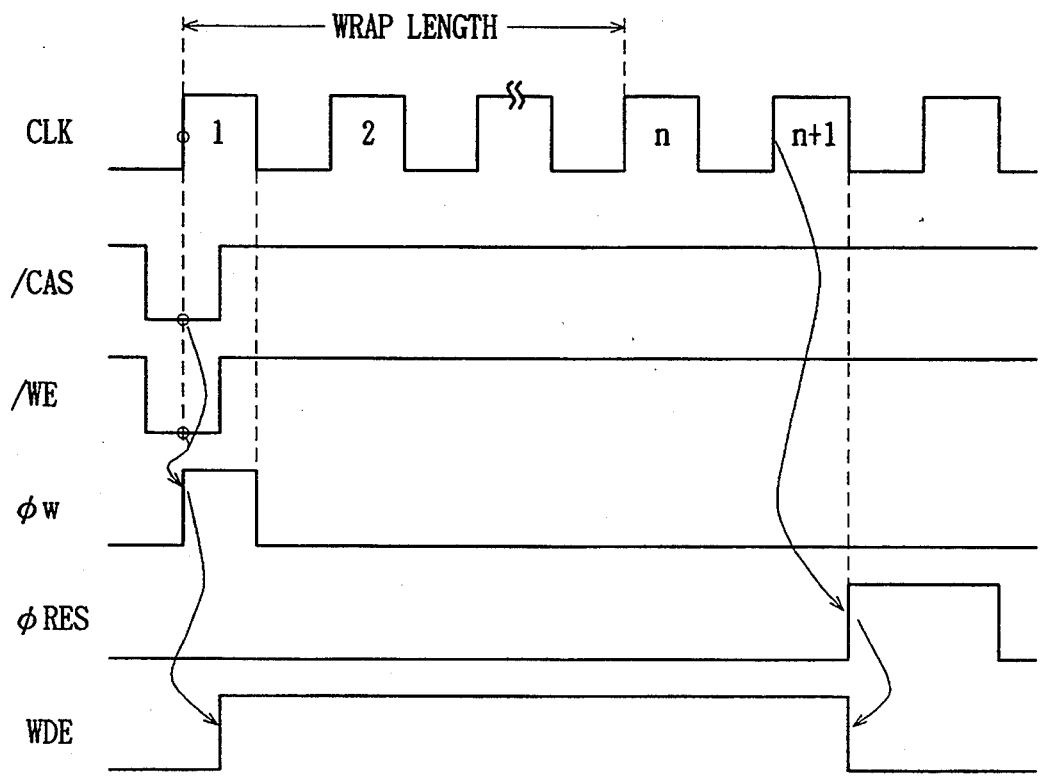
FIG. 99 is a signal waveform diagram showing an operation of a circuit shown in FIG. 98.

The (wr+1) counter 1350 has a configuration similar to that of the shift counter shown in FIG. 85, and counts the clock signal CLK in response to the write detection signal φw. When its count reaches a value which is larger by one than the wrap length indicated by the wrap data wr, it generates the reset signal. The (wr+1) counter 1350 includes a wrap length setting circuit. FIG. 99 is a signal waveform diagram showing an operation of the circuit shown in FIG. 98. An operation of the counter circuit shown in FIG. 98 will be described below with reference to FIG. 99.

In the first clock cycle, the signals /CAS and /WE are set at "L" to designate the write mode. In response to this, the write detecting circuit 1204 generates the write detection signal φw. In response to this, the flip-flop 1360 attains a set state, and the output signal WDE of the NOR circuit 1362 rises to "H". The (wr+1) counter 1350 starts to count the clock signal CLK in response to the write detection signal φw. If the wrap length is n, the (wr+1) counter 1350 generates a reset signal φRES in response to the rise of the clock signal in the (n+1)th cycle. FIG. 99 shows a situation in which the reset signal φRES is generated in synchronization with the fall of the clock signal in the (n+1)th cycle. Thereby, the flip-flop 1360 is reset, and the signal WDE falls to "L".

In the configuration shown in FIG. 98, the NOR-type flip-flop is set in response to the write detection signal φw, and the (wr+1) counter 1350 generates the reset signal φRES in synchronization with the fall of the clock signal CLK. Alternatively, the flip-flop 1360 may receive on its set input S a delayed signal of the write detection signal φw. Further, such a configuration may be employed that the (wr+1) counter 1350 generates the activating signal in synchronization with the rise of the clock signal, and a signal which is formed by delaying the activating signal by a predetermined time period is applied to a reset input R of the flip-flop 1360.

[WEE Signal Generating System]

Figure 100:
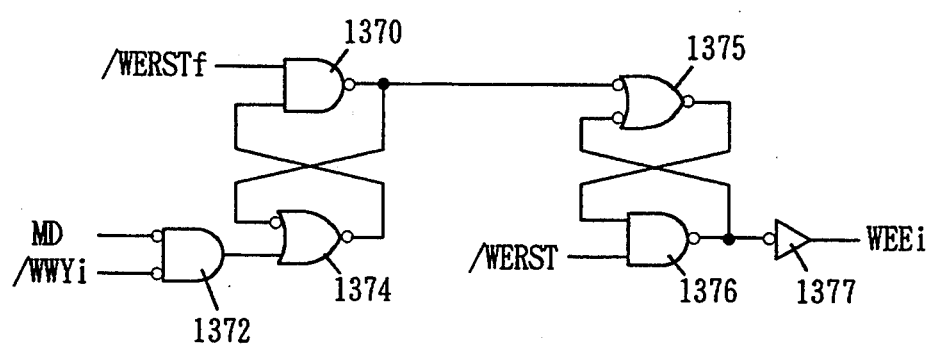
FIG. 100 shows an example of a configuration of a transfer control signal generating circuit shown in FIG. 95.

FIG. 100 shows a specific configuration of the transfer control signal generating circuit shown in FIG. 95. In FIG. 100, the transfer control signal generating circuit 1218 includes a 2-input NAND circuit 1370 receiving on its one input a signal /WERSTf, a 2-input NOR circuit 1372 receiving the mask data MD and wrap address /WWYi, a gate circuit 1374 which receives on its one input an output of the NOR circuit 1372 and receives on the other input an output of the NAND circuit 1370, a 2-input NAND circuit 1376 receiving on its one input a signal /WERST, and a 2-input NAND circuit 1375 receiving on its one input the output of the NAND circuit 1370 and receiving on the other input an output of the NAND circuit 1376.

The NAND circuit 1370 receives on the other input the output of the gate circuit 1374. The NAND circuit 1376 receives on the other input an output of the NAND circuit 1375. An inverter circuit 1377 receiving the output of the NAND circuit 1376 generates the signal WEEi. The signal /WERST is a delayed signal of the signal WERSTf.

The signal MD is write mask data, and the data write is masked when the data MD attains "H" (see FIG. 27). When the mask data MD is "H", the output of the NOR circuit 1372 is fixed at "L". Whichever the state (i.e., "H" or "L") the signals /WERSTf and /WERST may be in, the output of the NAND circuit 1375 is fixed at "L", and the signal WEEi attains "L". Thus, the data transference is not executed if the mask data MD is active and the data write is masked. An operation of the transfer control signal generating circuit shown in FIG. 100 will be described below with reference to operation waveform diagrams of FIGS. 101 and 102.

Figure 101:
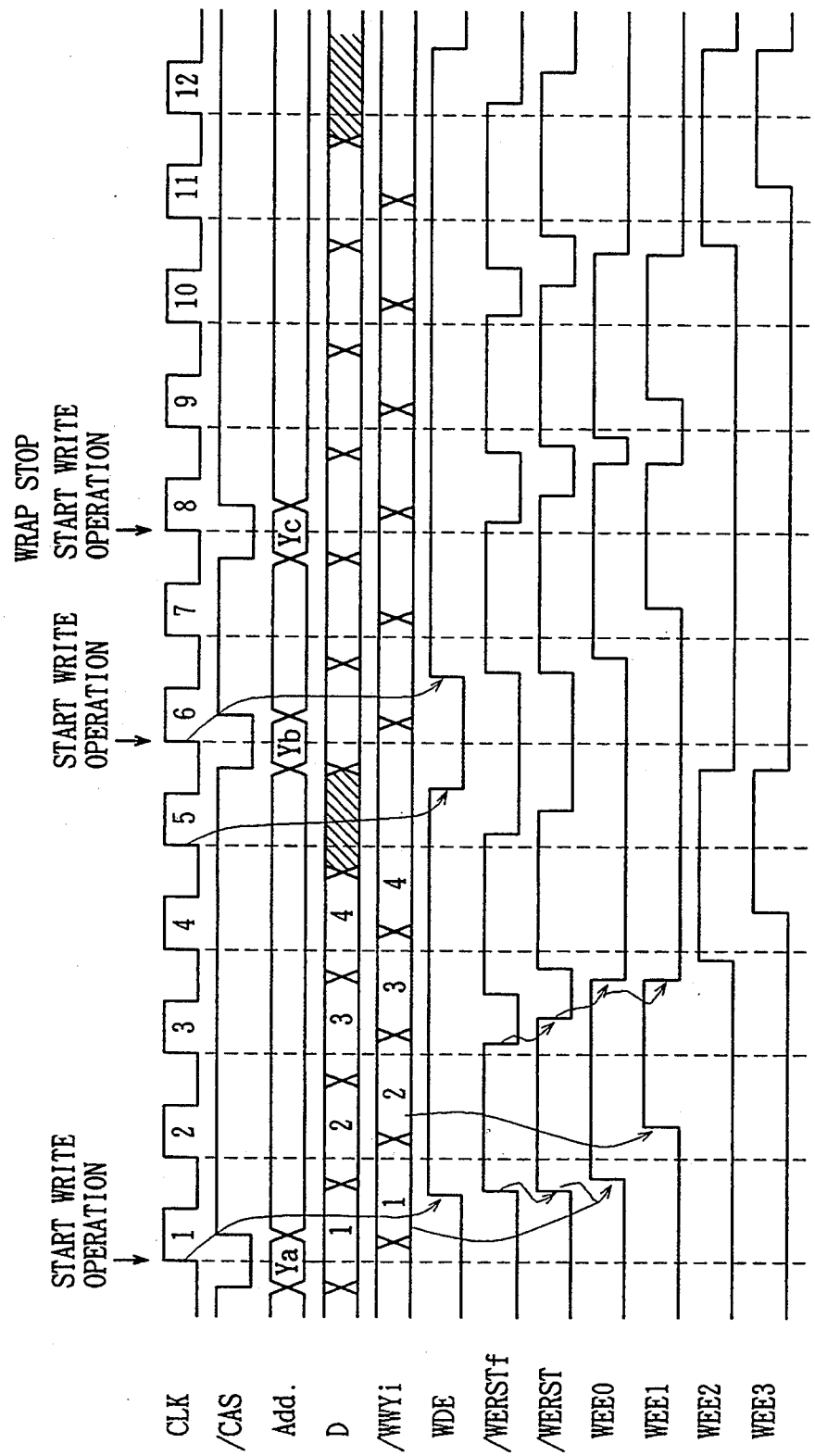
FIG. 101 is a timing chart showing an operation of the write control circuit shown in FIG. 95.

FIG. 101 shows an operation waveform in the case where the wrap length is 4 and the wrap stop bit length is set at 2. The mask data MD is "L".

In the first clock cycle, the signal /CAS falls to "L", so that the start of column selecting operation and the data write operation are designated. In response to this, the wrap address/WWYi is generated, and the signal WDE rises to "H". In response to the rise of the signal WDE, the signal /WERSTf rises to "H" indicative of the inactive state, and then, the signal /WERST rises to "H" with a predetermined delay time. If the wrap address /WWYi is "L" at this time, the output of the NOR circuit 1372 rises to "H", and correspondingly, the output of the gate circuit 1374 rises to "H". When the signal /WERSTf attains "H", the output of the NAND circuit 1370 changes to "L", and correspondingly, the output of the NAND circuit 1375 attains "H". Then, the signal /WERST rises to "H", the output of the NAND circuit 1376 attains "L" and the signal WEEi coming from the inverter circuit 1377 rises to "H".

The signal /WERSTf falls to "L" after clock cycles of a predetermined wrap stop length elapse from the start of the column access, i.e., designation of the data write. In FIG. 101, the wrap stop length is set to 2, and the signal /WERSTf falls to "L" in response to the rising edge of the clock signal CLK in the third clock cycle. Thereby, the output of the NAND circuit 1370 rises to "H", the output of the NAND circuit 1376 rises to "H" with a predetermined delay time, and the signal WEEi falls to "L". This completes data transference (data writing) from the write register and write circuit designated by the wrap address WWYi to the corresponding global I/O lines GIOi and /GIOi. Upon elapse of a predetermined time, if the signal WDE is "H" again, both the signals WERSTf and /WERST rise to "H". The next introduction of the wrap address and next generation of the signal WEEi are executed.

While the signal /WERSTf is "H", the wrap address /WWYi may change from "L" to "H". Even in this case, the gate circuit 1374 receives on its false input the signal of "L" and the output of the NAND circuit 1370 does not change. Thus, when the signal /WERSTf changes to "H", the wrap address which is activated at this time is latched. The signal /WERSTf latches the wrap address WWY at every two clock cycles in the embodiment of shown in FIG. 101.

The reason why signal WERST is activated after activation of the signal /WERSTf as described above is to ensure the time for writing data into the selected memory cells. In the embodiment shown in FIG. 101, it is assumed that data is written in units of 2 bits. In this case, the data can be written into the selected memory cells even in the third clock cycle, and a sufficient data write time can be ensured. Since the data is written in units of 2 bits, the wrap stop can be executed at every 2 clock cycles.

For example, in the configuration shown in FIG. 101, column accessing and data writing start at the sixth clock cycle, and, at the eighth clock cycle, the wrap stop will be applied and new column accessing will start. In this case, the signals WEE0 and WEE1 are active, and data are written from the write registers corresponding to these signals into the memory cells of 2 bits. Therefore, even if the new column accessing operation starts in this situation, the data of 2 bits which were previously written remains in the selected memory cells.

Figure 102:
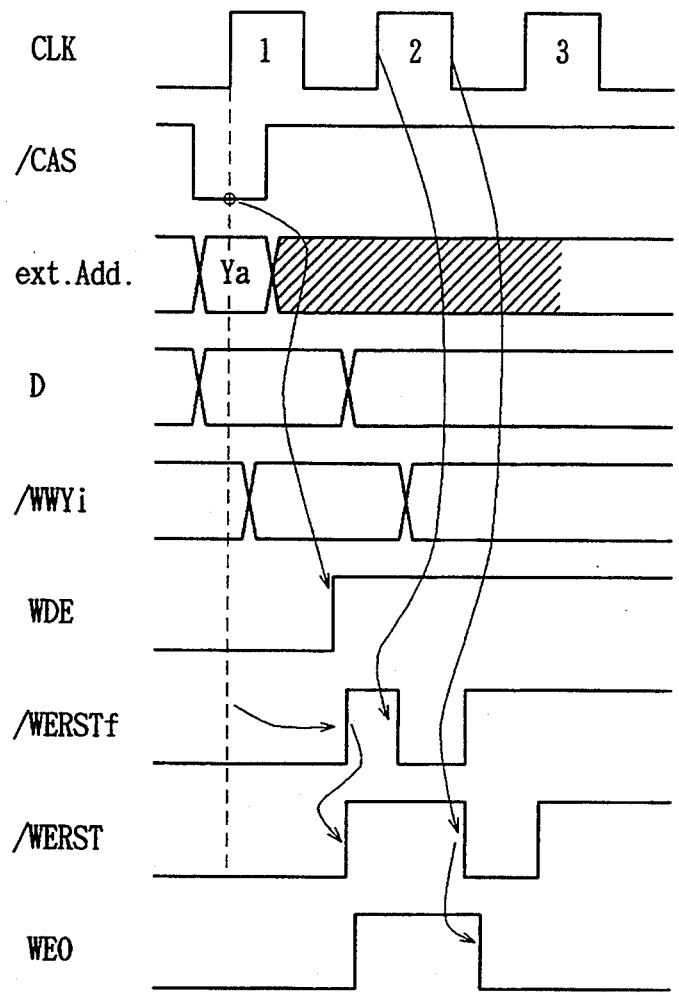
FIG. 102 is a timing chart showing an operation of a write control circuit shown in FIG. 95.

FIG. 102 is a signal waveform diagram showing a data write operation in the case of the wrap length of 1. If the wrap length is 1, input data of only 1 bit is externally applied. Therefore, data must be written into the selected memory cells in units of 1 bit. Therefore, as shown in FIG. 102, the signal /WERSTf is set in the inactive state ("H") at a timing earlier by 1 clock cycle that the case of the wrap length of 2. The signal /WERST maintains the inactive state even in the second clock cycle. In this situation, data is written from the write register into the selected memory cells. Thus, in the case shown in FIG. 102, the signals /WERSTf and /WERST attained the inactive state ("H" state) in the first clock cycle, the signal /WERSTf is activated upon start of the second clock cycle, and the signals /WERST and WE0 fall to "L" in response to the fall of the clock signal CLK in the second clock cycle.

[Transfer Timing Generating System]

Figure 103:
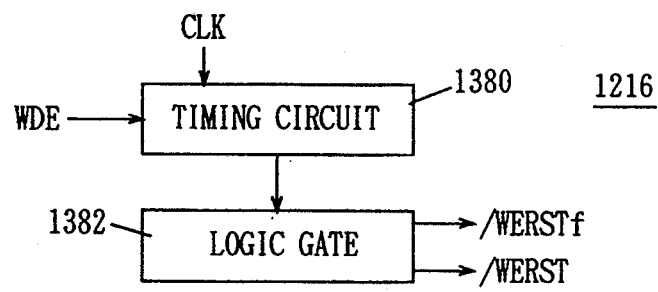
FIG. 103 shows a functional configuration of a transfer timing generating circuit shown in FIG. 95.

FIG. 103 shows a circuit configuration for generating control signals /WERSTf and /WERST. The circuit shown in FIG. 103 corresponds to the transfer timing generating circuit 1216 shown in FIG. 95. Referring to FIG. 103, the transfer timing generating circuit 1216 includes a timing circuit 1380 which is responsive to the signal WDE to count the clock signal CLK and generate a timing signal, and a logic gate 1382 which logically processes the timing signal coming from the timing circuit 1380 to generate the signals /WERSTf and /WERST.

Figure 104:
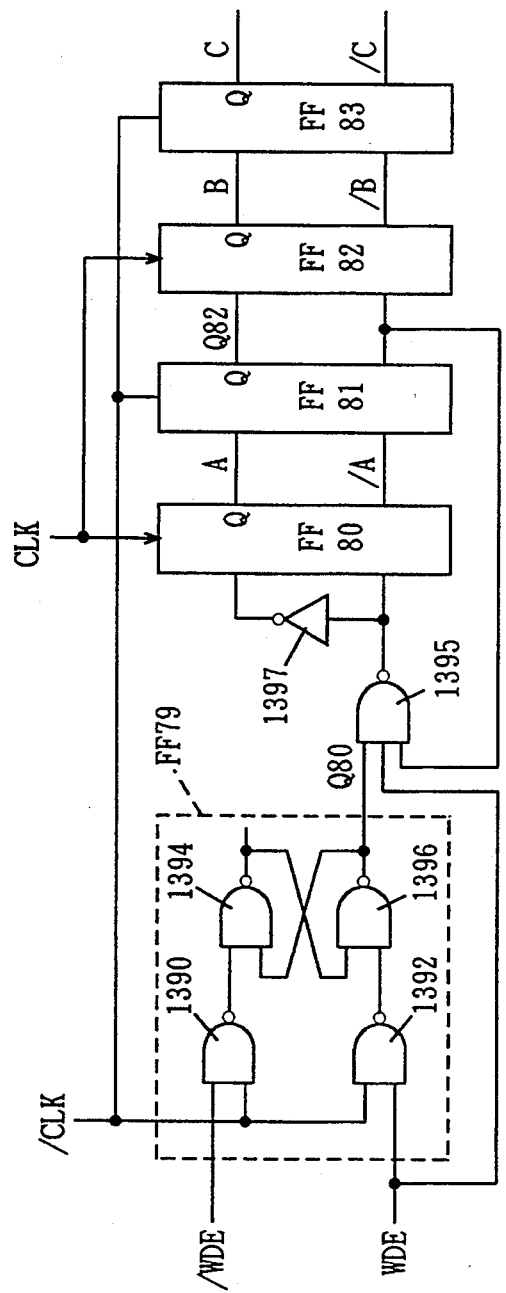
FIG. 104 shows a configuration of a timing circuit shown in FIG. 103.

FIG. 104 shows an example of a configuration of the timing circuit shown in FIG. 103. Referring to FIG. 104, the timing circuit 1380 includes a flip-flop FF79 which takes in the signals WDE and /WDE in response to the clock signal /CLK, a 3-input NAND circuit 1395 which receives the signal WDE and an output Q80 of the flip-flop FF79 and also receives a signal defining the stop bit length, which is 2 in this embodiment, from a complementary output of a flip-flop FF81, an inverter circuit 1397 inverting an output of the NAND circuit 1395, a flip-flop FF80 which takes in the outputs of the NAND circuit 1395 and inverter circuit 1397 in response to the rise of the signal CLK, the flip-flop FF81 which takes in outputs A and /A of the flip-flop FF80 in synchronization with the rise of the clock signal CLK, a flip-flop FF82 which takes in an output of the flip-flop FF81 in synchronization with the rise of the clock signal CLK, and a flip-flop FF83 which takes in outputs B and /B of the flip-flop FF82 in response to the rise of the clock signal /CLK.

The flip-flops FF80–FF83 have the same configurations as the flip-flop FF79. The flip-flop FF79 includes four NAND circuits 1390, 1392, 1394 and 1396. The flip-flop FF79 has the same configuration as the flip-flop shown in FIG. 80, and performs the operation for taking in the applied signal in response to the rise of the applied clock signal. An operation of the timing circuit shown in FIG. 104 will be described below with reference to an operation waveform diagram of FIG. 105.

In the clock cycle 1, the signal WDE rises to "H". Simultaneously, the complementary signal /WDE falls to "L". In synchronization with the fall of the clock signal CLK, the output Q80 of the flip-flop FF79 rises to "H". In response to the fall of the clock signal CLK in this first clock cycle, the flip-flop FF81 passes signal potentials of the outputs A and /A of the flip-flop FF80. At this time, the output/A of the flip-flop FF80 is "H". Therefore, all the outputs of the NAND circuit 1395 are "H", so that the output of the NAND circuit 1395 is "L" and the output of the inverter 1397 is "H".

In the second clock cycle, the flip-flop FF80 takes in the outputs of the inverter circuit 1397 and NAND circuit 1395 in response to the rise of the clock signal CLK. Thereby, the potential of the output A of the flip-flop FF80 rises to "H". In response to the fall of the clock signal in the second clock cycle, the flip-flop FF81 takes in the outputs A and /A of the flip-flop FF80, so that the potential of the output Q82 of the flip-flop FF81 attains "H".

In the third clock cycle, the output Q82 of the flip-flop FF81 is "H", so that the output of the NAND circuit 1395 is "H", and the output of the inverter circuit 1397 is "L". Therefore, in this third clock cycle, the output A of the flip-flop FF80 falls to "L".

The output B of the flip-flop FF82 rises to "H". In response to the fall of the clock signal in the third clock cycle, the flip-flop FF83 takes in the outputs B and /B of the flip-flop FF82, so that the output C of the flip-flop FF83 rises to "H". Meanwhile, the flip-flop FF81 takes in the outputs A and /A of the flip-flop FF80, so that the output of the node Q82 falls to "L". Thereafter, this operation is repeated while the signal WDE is "H".

Figure 105:
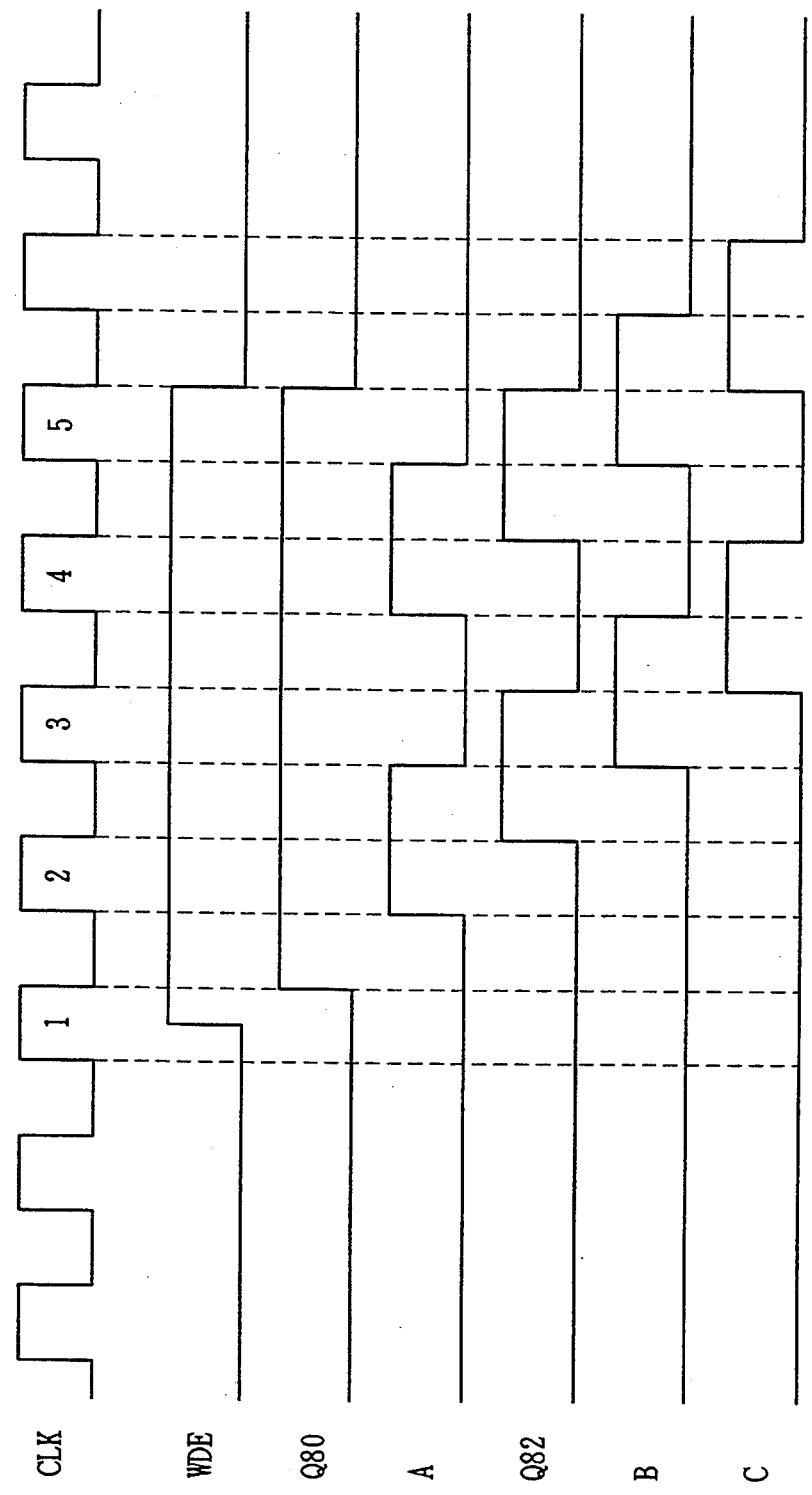
FIG. 105 is a timing chart showing an operation of the timing circuit shown in FIG. 104.

In FIG. 105 showing a case of the wrap length of 4, the signal WDE falls to "L" in response to the rise or fall of the clock signal CLK in the fifth clock cycle. Thereby, the outputs of the flip-flops FF80, FF81, FF82 and FF83 sequentially fall to "L" at the timings shifted by a half clock cycle from each other. These flip-flops FF80–FF83 are responsive to the signal WDE to generate the pulse signals, which have phases shifted by a half of cycle of the clock signal CLK from each other and have pulse widths equal to twice the pulse width of the clock signal CLK. By combining the output signals of the flip-flops FF80–FF83, the signals /WERSTf and /WERST can be generated with a stop bit length of 2. Since the stop bit length is 2, the output of the flip-flop FF81 is fed back to the NAND circuit 1395. If a larger stop bit length is to be used, further flip-flop(s) is connected, and an output of the flip-flop at a last stage is applied to the NAND circuit 1395.

Figure 106:
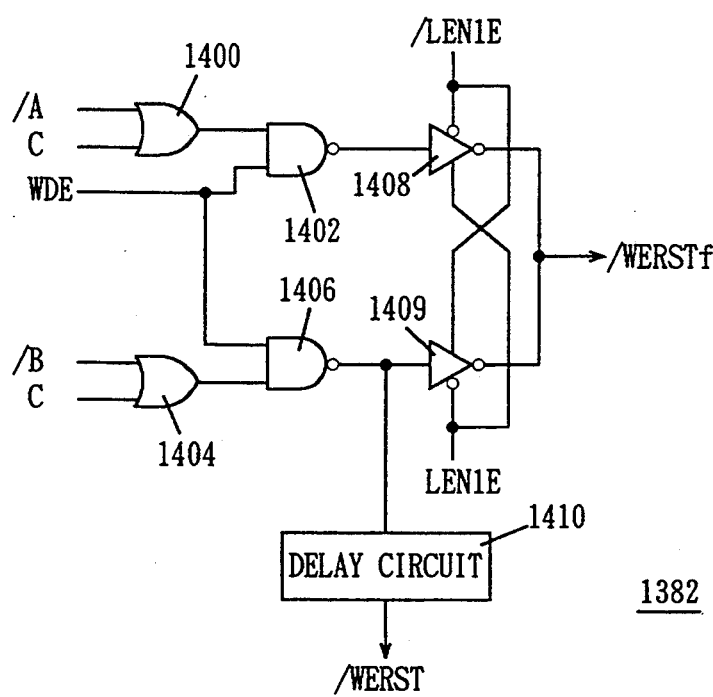
FIG. 106 shows a configuration of a logic gate shown in FIG. 103.

FIG. 106 shows a specific configuration of the logic gate 1382 shown in FIG. 103. Referring to FIG. 106, the logic gate 1382 includes an OR circuit 1400 which receives a complementary output/A of the flip-flop FF80 and an output C of the flip-flop FF83 in the timing circuit shown in FIG. 104, a 2-input NAND circuit 1402 receiving the signal WDE and an output of the OR circuit 1400, a tri-state inverter buffer 1408 which is responsive to the wrap length designating signals LEN1E and /LEN1E to invert and amplify an output of the NAND circuit 1402, an OR circuit 1404 receiving the inverted output/B of the flip-flop FF82 shown in FIG. 104 and the output C of the flip-flop FF83, a 2-input NAND circuit 1406 receiving the signal WDE and an output of the OR circuit 1404, a delay circuit 1410 delaying an output of the NAND circuit 1406 by a predetermined time, and a tri-state inverter buffer 1409 which is activated in response to the wrap length designating signals LEN1E and /LEN1E to invert and amplify the output of the NAND circuit 1406.

Figure 107:
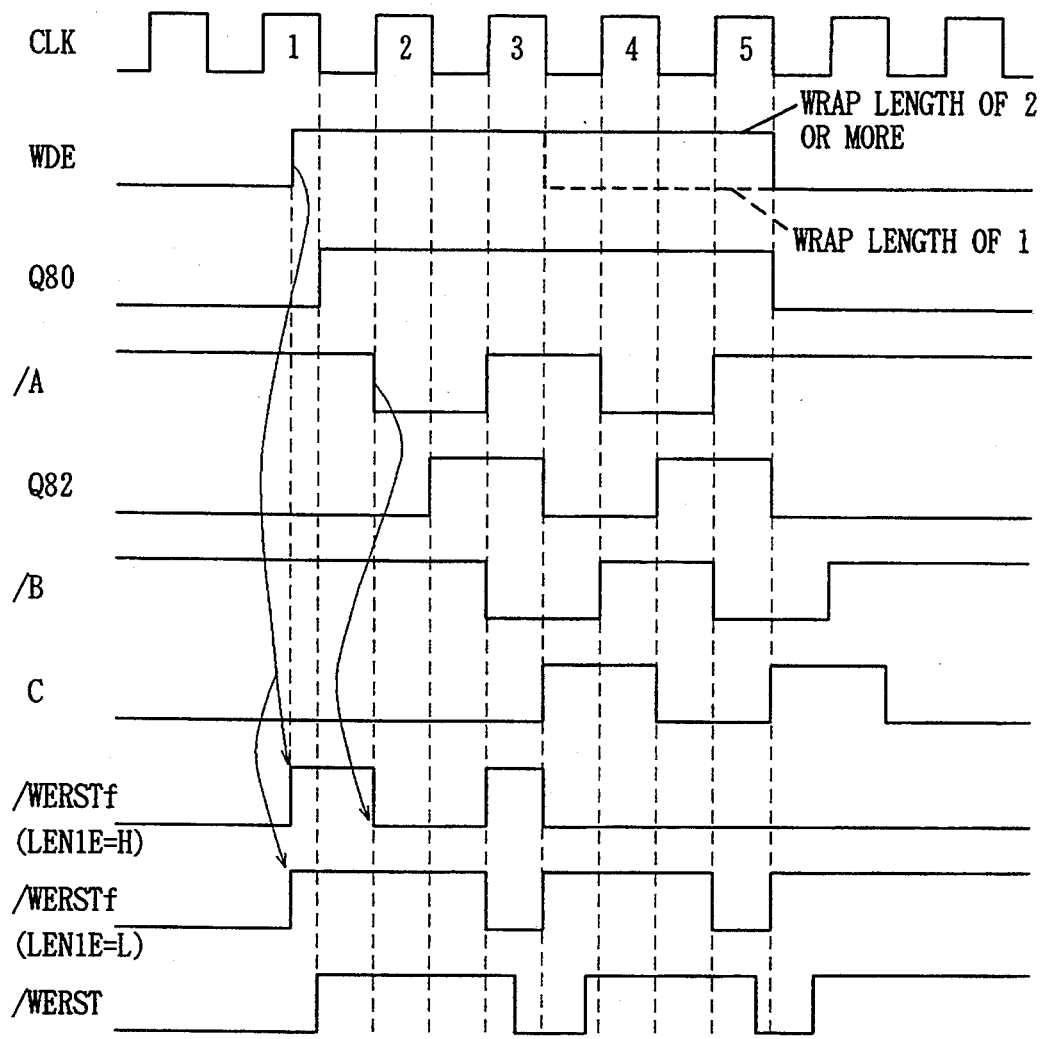
FIG. 107 is a signal waveform diagram showing an operation of the logic gate shown in FIG. 106.

The signal LEN1E is "H" if the wrap length is 1. Thus, if the wrap length is designated to be 1, the inverter buffer 1408 is activated. If the wrap length is 2 or more, the inverter buffer 1409 is activated. An operation of the logic gates shown in FIG. 106 will be described below with reference to an operation waveform diagram of FIG. 107.

When the signal WDE rises to "H", the NAND circuits 1402 and 1406 function as inverter circuits. At this time, the nodes /A and /B have still maintained the state of "H", and thus the outputs of the NAND circuits 1402 and 1406 fall to "L" in response to the rise of the signal WDE. Whichever of "H" and "L" the wrap length designating signal LEN1E may be, the potential of the signal /WERSTf rises to "H". Thereby, the signal /WERST coming from the delay circuit 1410 rises to "H" with delay of a predetermined time. If the wrap length is 1, the inverter buffer 1408 is activated. In the second clock cycle, when the node/ A falls to "L", the output of the OR circuit 1400 attains "L", and correspondingly, the output of the inverter buffer 1408 falls to "L".

If the wrap length is 2 or more, the inverter buffer 1409 is activated. Therefore, in response to the rise of the clock signal CLK in the third clock cycle in which the potential of the node/B falls to "L", the output of the inverter buffer 1409 falls to "L". Thereby, such configurations can be achieved that data is written while latching the wrap address at every 2 clock cycles in the case of the wrap stop length of 2, and that data is written bit by bit in the case of the wrap length of 1. The signal /WERST causes the NAND circuit 1406 to generate the output through the delay circuit 1410. Alternatively, such a configuration may be employed that the signal /WERSTf is generated through the delay circuit 1410. In this case, the signal /WERST is maintained in the inactive state of "H" for a period from the falling edge of the clock signal in the first clock cycle to the falling edge of the clock signal in the second clock cycle, if the wrap length is 1.

By utilizing the write control circuit of the configurations described above, the wrap stop operation can be performed, and the high speed access can be achieved in the SDRAM.

[Control of Precharge/Equalize Timing of Global I/O Line]

As can be seen from FIGS. 18 and FIG. 19, the global I/O line pair GIO is provided with the equalize transistor GEQ. The global I/O line pair GIO is coupled, as shown in FIGS. 63 and 94, to the read register and write register for transmitting internal data between the selected memory cell and the read register or write register.

For transmitting internal data at a high speed with low power consumption, the global I/O line pair is precharged to an intermediate potential (i.e., potential intermediate the logical high level and logical low level) by equalizing the potential of each global I/O line of the global I/O line pair using the equalize transistor GEQ which is responsive to the equalize signal φGEQ. The local I/O line pair LIO provided for the selected memory block must be equalized similarly. The local I/O line pairs LIO provided for the unselected memory blocks are maintained in the standby state because no internal data is transmitted thereto.

In the following description, the equalizing operation for the global I/O line pair will be described below. However, control of the equalize timing is performed on the local I/O line pair provided for the selected memory block similarly to the control for the global I/O line pair. The equalize timing control will be described below.

(i) Controlling Method 1

FIG. 108 is a timing chart showing a method of control timings for equalizing the first internal data line. In the following description, the term "internal data line" means both the global I/O line and the local I/O line provided for the selected memory block. The equalize timing control shown in FIG. 108 corresponds to the write controlling method shown in FIGS. 97 through 99.

As shown in FIGS. 97 through 99, if the external column address strobe signal /CAS (ext/CAS) is at the low level when the external clock signal CLK (ext.CLK) rises, start of the column selecting operation is instructed. If the write enable signal /WE is at the low level at this time, data write is designated. If the write enable signal /WE is at the high level, data read is designated. As shown in FIG. 99, the write circuit contained in the write register writes data into the internal data line in accordance with the write enable signal WEEi and signal WDE. The write control signal WDE is inactivated in the clock cycle subsequent to elapsing of the clock cycles equal to the wrap length after the application of the data write instruction. In FIG. 108, there is shown a data write operation sequence in the case of the wrap length of 4. As the internal data lines, there are representatively shown only four global I/O line pairs GIO1–GIO4. An operation will be described below.

In the standby state (i.e., before application of the column selecting instruction), the equalize signal φGEQ is at the high level. In this state, all the global I/O line pairs GIOi have been equalized (i.e., precharged) to the intermediate potential.

In clock cycle 1, if the external column address strobe signal ext/CAS is at the low level when the external clock signal ext.CLK rises, the column selection start instruction (column access start instruction) is applied. Although not shown, it is assumed that the write enable signal /WE is also at the low level, so that data write is designated.

In this state, data D1 applied to the data I/O terminal D/Q is stored in the write register in accordance with the wrap address /WWY (see FIG. 96). At this time, the internal write control signal WDE is also set to the active state, i.e., high level in response to the write command indicative of data write. The write control signal WDE starts to count the wrap lengths upon application of the write command, and will be activated in the next clock cycle.

At this time, if the column selection start instructing signal (write command) is applied, the equalize signal φGEQ is inactivated to attain the low level. Thereby, the global I/O line pairs GIO1–GIO4 are set to the floating state. Simultaneously, the column selecting signal CSL is internally changed to the high level in response to the column selection start instructing signal, so that data in the selected memory cell block is transmitted through the local I/O lines to the global I/O lines in accordance with the column selecting signal CSL.

Then, in the first clock cycle, the taken data D1 is transmitted to the global I/O line pair GIO1.

In each clock cycle after the above operation, data D2, D3 and D4 applied to the data I/O terminal D/Q are stored in the write register and then transmitted to the internal data lines, i.e., global I/O line pairs GIO2, GIO3 and GIO4 in accordance with the transfer control signal WEE.

When the wrap length data D1–D4 are transmitted onto the internal data lines GIO1–GIO4 and are written into the selected memory cells through the local I/O line pairs, the column selecting signal CSL will be inactivated in the cycle immediately after the clock cycles equal to the wrap length elapse after application of the column selection start instruction (write command).

Also at this time, the equalize signal φGEQ is activated to attain the high level in synchronization with the clock signal. Thereby, the global I/O line pairs GIO1–GIO4 are precharged and equalized to have the intermediate potential. Also, the write enable signal WDE attains the inactive state, i.e., low level at this time.

As described above, upon application of the column selection start instruction, the equalize signal φGEQ is inactivated, and will be changed into the high level (active state) setting the standby state in the cycle immediately after elapsing of the clock cycles equal to the wrap lengths after application of the column selection start instructing signal. Thereby, it is not necessary to equalize the global I/O line pair before writing the data, so that data write can be performed at a high speed.

If the wrap length is changed, the equalize signal φGEQ is activated in accordance with the wrap length data. Therefore, the equalize signal φGEQ can be always generated at the appropriate timings.

Figure 109:
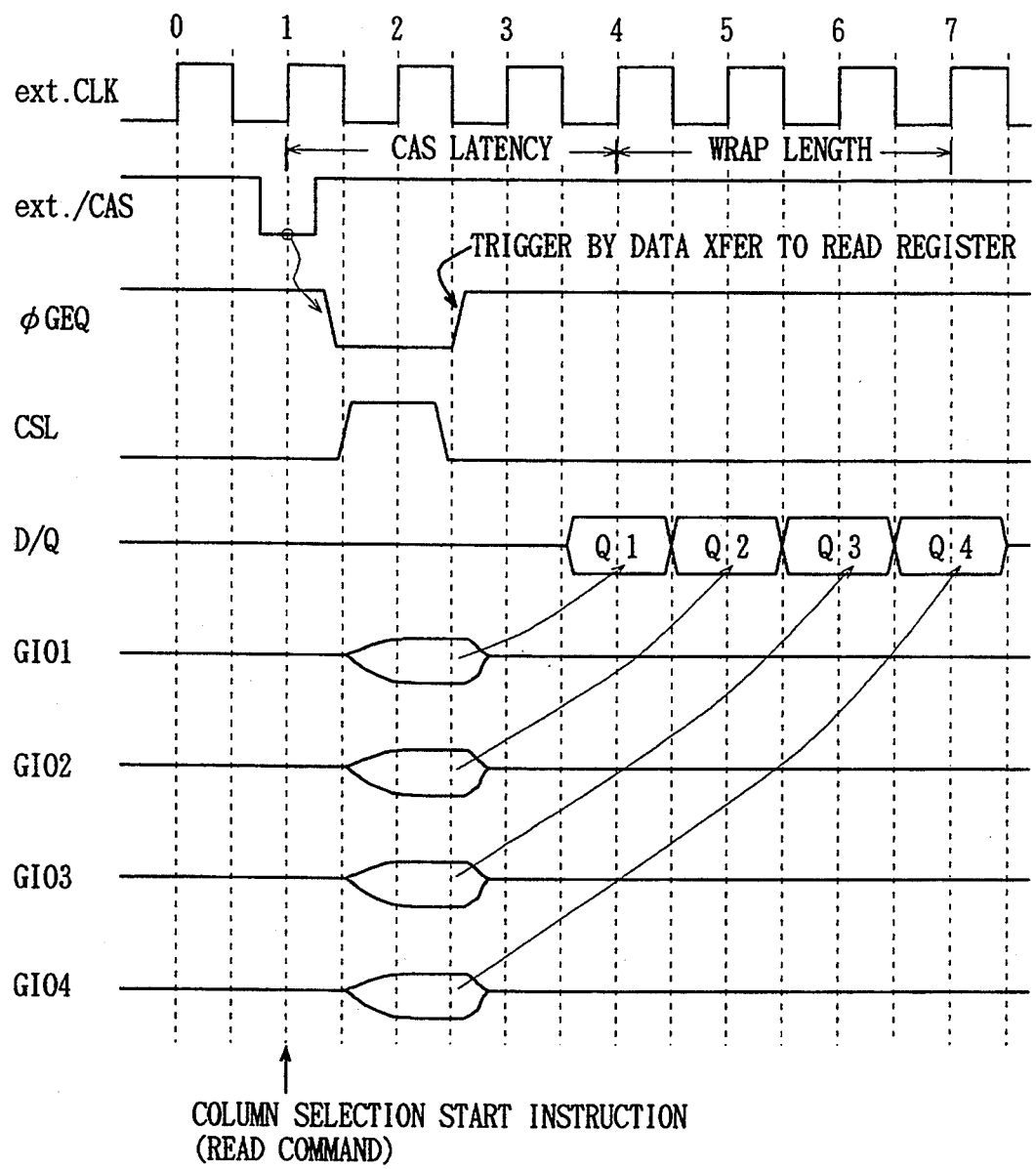
FIG. 109 is a timing chart showing a first equalize signal timing controlling method in a data reading operation.

FIG. 109 shows a method of controlling the equalizing in the data read operation. FIG. 109 shows the equalize controlling operation in the case where the CAS latency is 3 and the wrap length is 4.

An equalize timing controlling operation during data reading will be described below with reference to FIG. 109.

In clock cycle 1, the external column address strobe signal /CAS is set at the low level at the rising edge of the external clock signal ext.CLK. The write enable signal /WE (not shown in FIG. 109) is set at the high level. Thereby, the column selection start instruction is applied and the data read is designated (i.e., read command is applied). In response to the column selection start instruction, the equalize signal φGEQ is inactivated to attain the low level. Thereby, the global I/O line pair GIO attains the floating state maintaining the equalize potential.

When the column selecting signal CSL rises to the high level, data of the memory cells on the corresponding columns in the selected memory cell block is transmitted to the global I/O line pairs GIO1–GIO4 through the local I/O line pairs LIO.

The data appeared on the global I/O line pairs GIO1–GIO4 are transmitted in parallel to the read registers (through preamplifiers) as shown in FIG. 64.

After transfer of data on the global I/O line pairs GIO1–GIO4 to the read registers, the equalize signal φGEQ is activated to attain the high level, and the global I/O line pairs GIO1–GIO4 are equalized to have an intermediate potential. Data stored in the read registers are sequentially transmitted as output data Q1, Q2, Q3 and Q4 to the data I/O terminal D/Q in synchronization with the clock signal ext.CLK at and after the clock cycle (i.e., cycle 4) at which the CAS latency elapses.

As shown in FIG. 109, since the global I/O line pairs GIO1–GIO4 are equalized after transfer of data on the global I/O line pairs GIO1–GIO4, it is not necessary to equalize the global I/O line pairs before the data is read thereto, so that high-speed reading of data is allowed.

FIG. 110 shows a structure for generating the equalize signals shown in FIGS. 108 and 109. In FIG. 110, an equalize signal generating part includes a column access determining circuit 2000 which takes in the external signals /CS, /CAS and /WE in synchronization with the external clock signal CLK to determine whether the column selection start instruction is present or not, and whether it is the read mode or write mode, a wrap length setting circuit 2003 which takes in the signals /WE and CAS as well as the address signal Add in synchronization with the external clock signal CLK and, when the WCBR condition is designated, decodes the current address signal Add to store the same as the wrap length data, a counter 2001 which is activated in response to the column selection start instruction detection signal coming from the column access determining circuit 2000, and thereby counts the external clock signal CLK to generate the count-up signal when the count becomes equal to the wrap length set in the wrap length setting circuit 2003, and an equalize signal generating circuit 2002 which generates the equalize signal φGEQ in response to the output of the column access determining circuit 2000, preamplifier enable signal PAE (see FIGS. 63–65) and count-up signal sent from the counter 2001. The equalize signal φGEQ sent from the equalize signal generating circuit 2002 is applied to the gate of the equalize transistor GEQ provided in the global I/O line pair GIOi and /GIOi.

The counter 2001 may employ a structure similar to that of the latency counter shown in FIG. 85. The counter 2001 also may employ a structure similar to that shown in 79. The wrap length setting circuit 2003 corresponds to the WCBR detecting circuit 862 and wrap length decode latch 870 shown in FIG. 70.

Figure 111:
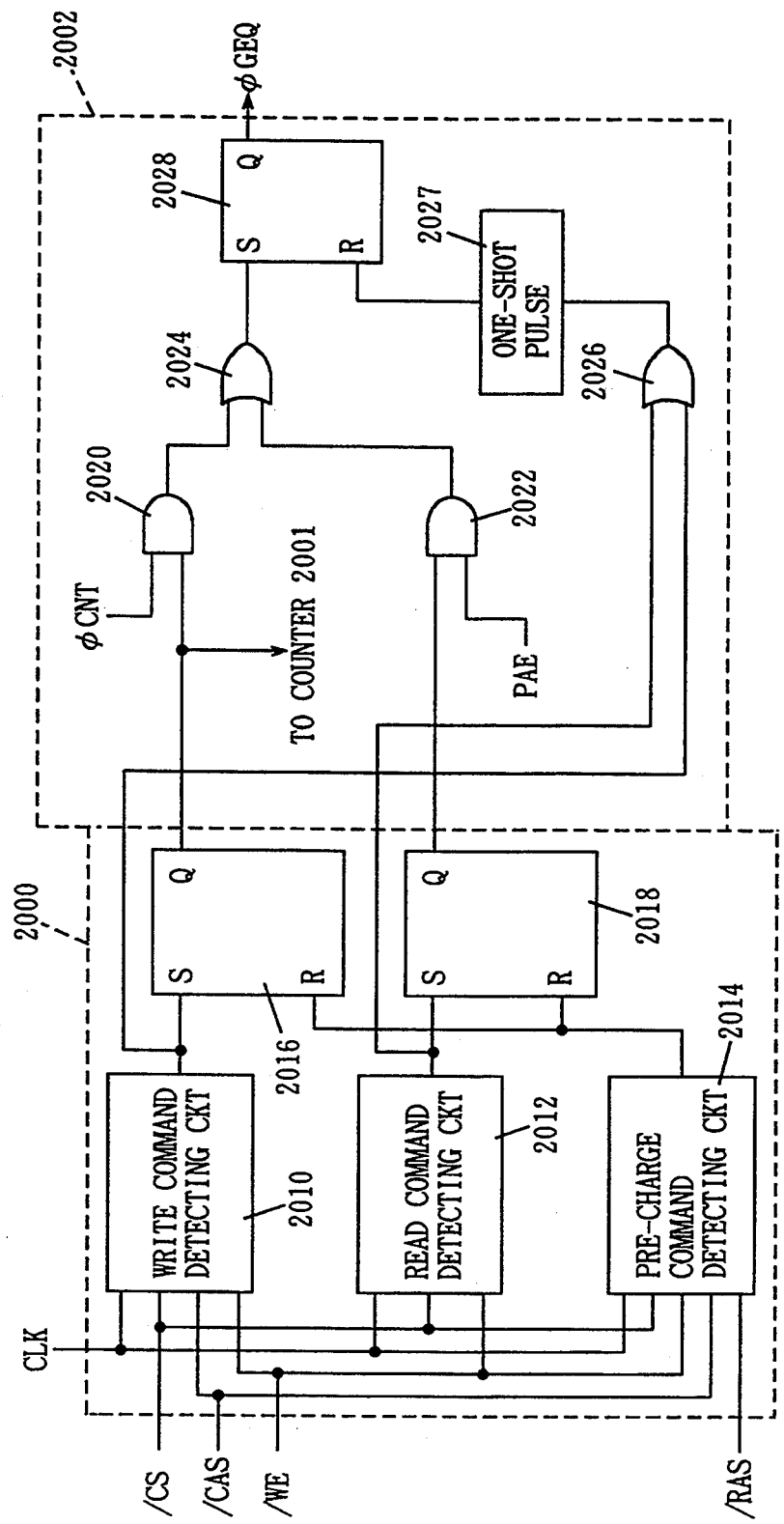
FIG. 111 shows an example of a structure of a column access determining circuit and an equalize signal generating circuit shown in FIG. 110.

FIG. 111 shows an example of the structure of the column access determining circuit and equalize signal generating circuit shown in FIG. 110. In FIG. 111, the column access determining circuit 2000 includes a write command detecting circuit 2010 which takes in the signals /CS, /CAS and /WE in synchronization with the internal clock signal CLK to determine whether the write command is applied or not, a read command detecting circuit 2012 which takes in the signals /CS, /CAS and /WE in synchronization with the external clock signal CLK to determine whether the read command is applied or not, a precharge command detecting circuit 2014 which takes in the signals /CS, /CAS, /WE and /RAS in synchronization with the external clock signal CLK to determine whether the precharge command is applied or not, a set/reset flip-flop 2016 which is set in response to the write command detection signal sent from the write command detecting circuit 2010 and is reset in response to the precharge command detection signal sent from the precharge command detecting circuit 2014, and set/reset flip-flop 2018 which is set in response to the read command detection signal sent from the read command detecting circuit 2012 and is reset in response to the precharge command detection signal sent from the precharge command detecting circuit 2014.

The flip-flops 2016 and 2018 send signals at the high level from their Q-outputs when set, and send signals at the low level from the Q-outputs when reset. Manners, in which the write command detecting circuit 2010, read command detecting circuit 2012 and precharge command detecting circuit 2014 detect the commands, respectively, will be understood from combination of states of external control signals shown in FIG. 39.

The Q-output of the flip-flop 2016 is applied to the counter 2001 shown in FIG. 110 as a count start instructing signal (counter activating signal). The counter 2001 counts the external clock signal CLK when the Q-output sent from the flip-flop 2016 is at the high level, and generates a count-up signal φCNT in response to the next clock signal after its count reaches the wrap length contained in the wrap length setting circuit 2003.

The equalize signal generating circuit 2002 includes an AND circuit 2020 which receives the count-up signal φCNT, which indicates the count-up (i.e., count value of wrap length plus one), sent from the counter 2001 shown in FIG. 110, as well as the Q-output sent from the set/reset flip-flop 2016, an AND circuit 2022 receiving the Q-output of the set/reset flip-flop 2018 and the preamplifier enable signal PAE (see FIGS. 64, 55 and 57), an OR circuit 2024 receiving outputs of the AND circuits 2020 and 2022, an OR circuit 2026 receiving outputs of the command detecting circuits 2010 and 2012, and a set/reset flip-flop 2028 which is set in response to an output of the OR circuit 2024 and is reset in response to an output of the OR circuit 2026.

The set/reset flip-flop 2028 receives on its reset input R an output of an one-shot pulse generating circuit 2027 which receives the output of the OR circuit 2026. The signals φCNT and PAE are pulse signals, and the set signal is generated from the OR circuit 2024 only for a predetermined period. The one-shot pulse generating circuit 2027 is provided for changing the reset pulse into the pulse having a predetermined time width. The set/reset flip-flop 2028 generates the equalize signal φGEQ. Then, an operation will be briefly described below.

When the write command or read command is applied, the Q-output of the flip-flop 2016 or 2018 attains the high level, and the output of the OR circuit 2026 attains the high level, so that the one-shot pulse generating circuit 2027 generates the pulse of one shot having a predetermined time width, which is applied to the reset input R of the set/reset flip-flop 2028. Thereby, the equalize signal φGEQ sent from the Q-output of the flip-flop 2028 attains the low level.

When the write command is applied, the output Q of the flip-flop 2016 attains the high level. Thereby, the counter 2001 shown in FIG. 110 is activated to count the internal clock signal CLK. When the count of the counter 2001 exceeds by one the wrap length data stored in the wrap length setting circuit 2003 shown in FIG. 110, the count-up signal φCNT is generated. Thereby, the output of the AND circuit 2020 attains the high level, and the set/reset flip-flop 2028 is set through the OR circuit 2024, so that the equalize signal φGEQ attains the high level.

When the read command is applied, the Q-output of the flip-flop 2018 attains the high level. At this time, since the flip-flop 2016 is not yet set, its Q-output is at the low level, and the counter 2001 does not carry out the count-up operation. When the preamplifier enable signal PAE is raised to and maintained at the high level for a predetermined period, the output of the AND circuit 2022 attains the high level, and the set/reset flip-flop 2028 is set through the OR circuit 2024, so that the equalize signal φGEQ attains the high level.

When one memory cycle is completed and the precharge command is applied, the flip-flops 2016 and 2018 are reset, and the Q-outputs of them attain the low level. At this time, the set/reset flip-flop 2028 is already set, so that the equalize signal φGEQ maintains the high level in a standby state.

In one memory cycle, i.e., in the state where the active command has been applied, such an operation mode may be conducted that the read command is applied and then the write command is applied. In this case, since the precharge command is not applied, both the flip-flops 2016 and 2018 are in the set state. However, in such a case that the write operation is carried out after the read operation, the preamplifier enable signal PAE is not generated in the write operation, so that the equalize signal φGEQ can be set in accordance with each of the signals PAE and φCNT. The one-shot pulse generating circuit 2027 can set the equalize signal φGEQ to the low level in accordance with each of the read command and write command.

In the case where the read operation is carried out after the write operation, the counter 2001 maintains the active state even in the read operation. In this case, the counter 2001 may generate the count-up signal φCNT even in the read operation. In order to prevent this, the Q-outputs of the flip-flops 2016 and 2018 are connected to inputs of the AND circuit 2022 and 2020 to allow such an operation that the AND circuit 2020 is disabled when the Q-output of the flip-flop 2018 is at the high level and that the AND circuit 2022 is disabled when the Q-output of the flip-flop 2016 is at the high level.

Figure 112:
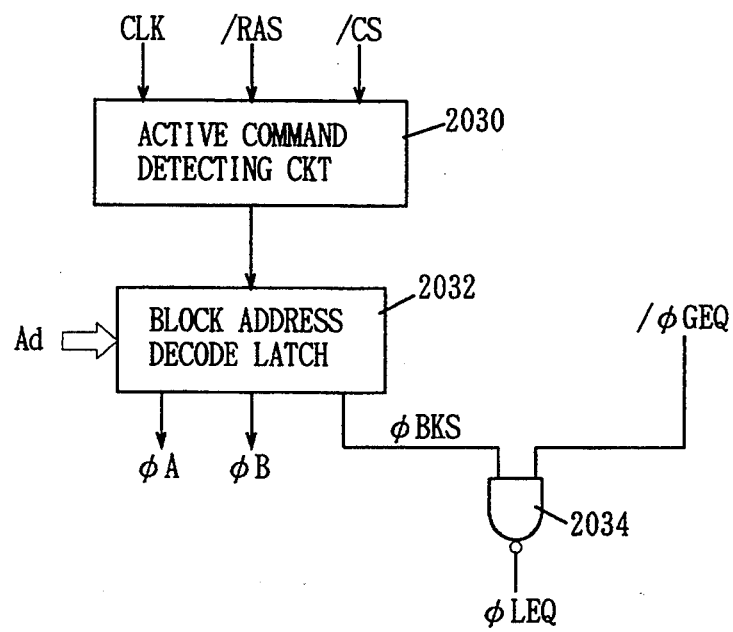
FIG. 112 shows a structure of an equalize signal generating system for local I/O line pairs.

FIG. 112 shows a circuit structure generating the equalize signal φLEQ for equalizing the local I/O line. In FIG. 112, the system generating the equalize signal φLEQ for the local I/O line includes an active command detecting circuit 2030 which takes in the signals /RAS and /CS in synchronization with the clock signal CLK to determine whether the active command is applied or not, a block address decode latch 2032 which is responsive to an active command detection signal sent from the active command detecting circuit 2030 to latch and decode predetermined bits (block address) of the currently applied address signal, and a NAND circuit 2034 which receives a block instructing signal φBKS from the block address decode latch 2032 and an inverted equalize signal φGEQ.

The block address decode latch 2032 generates a block selection control signal φB for connecting the local I/O line to the global I/O line as well as a memory block selection control signal φA for connecting the selected memory cell block to the sense amplifier. The block selecting signal φBKS is similar to these block selection control signals. The NAND circuit 2034 generates the equalize signal φLEQ for the local I/O line pair. An operation of the circuit shown in FIG. 112 will be described below with reference to an operation waveform diagram of FIG. 113.

Figure 113:
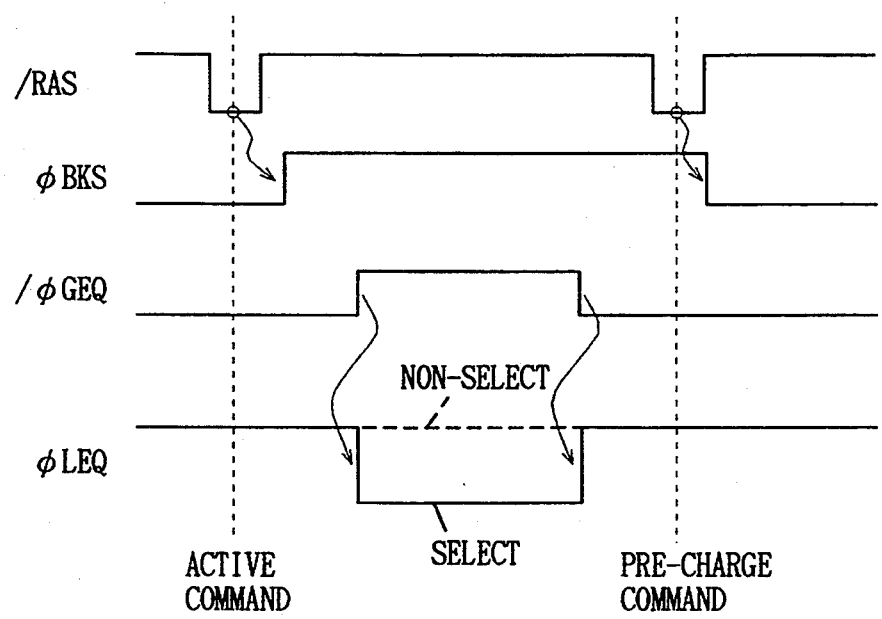
FIG. 113 is a signal waveform diagram showing an operation of a structure shown in FIG. 112.

If both the signals /RAS and /CS are at the low level when the clock signal CLK rises, the active command is applied to designate the cycle for accessing the memory array. In FIG. 113, however, the signals CLK and /CS are not shown. According to the active command, the block address decode latch 2032 generates the block selecting signal φBKS in accordance with a predetermined timing. The block selecting signal φBKS only for the selected memory block attains the high level, and those for the unselected memory blocks attain the low level. During standby, the block selecting signal φBKS is at the low level, so that the equalize signal φLEQ generated from the NAND circuit 2034 is at the high level, and thus the local I/O line pair is initialized.

When the read command or write command is applied, the global I/O line pair equalize signal /φGEQ rises to the high level at the predetermined timing. The global I/O line pair equalize signal /φGEQ is the inverted signal of the global I/O line pair equalize signal φGEQ shown in FIG. 111, and is generated, for instance, from the complementary output /Q of the flip-flop 2028. In accordance with the high level and low level of the block selecting signal φBKS, the equalize signal φLEQ attains the low level and high level, respectively.

For the selected memory block, since the block selecting signal φBKS is at the high level, the local I/O line pair equalize signal φLEQ attains the low level when the global I/O line pair equalize signal /φGEQ attains the high level, so that the equalizing of the local I/O line pair is inhibited. In the unselected memory block, the signal φBKS is in the low level, so that the local I/O line pair equalize signal φLEQ is at the high level.

When the global I/O line pair equalize signal /φGEQ attains the low level, the local I/O line pair equalize signal φLEQ attains the high level, so that equalizing of the local I/O line pair is executed.

Owing to the above structures, activation and inactivation of the equalizing of the local I/O line pair can be carried out at the same timing as that for the global I/O line pair only for the selected memory block.

Figure 114:
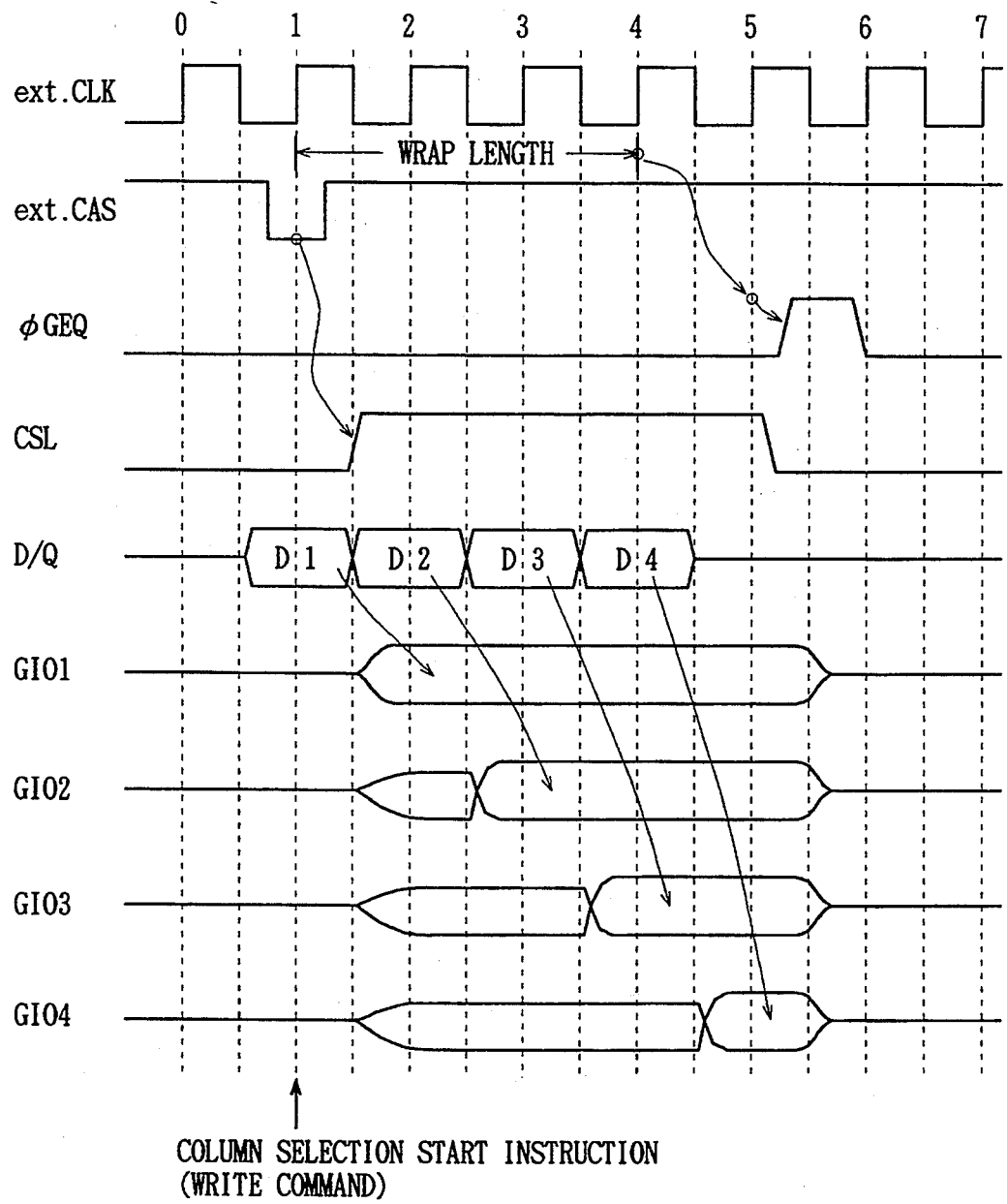
FIG. 114 shows a modification of a first equalize signal timing controlling method.

FIG. 114 shows a modification of a first equalize timing controlling method. FIG. 114 shows a generating form of the equalize control signal in the data write operation in the case where the equalize signal φGEQ is inactive, i.e., at the low level during standby. In the equalize timing controlling method shown in FIG. 114, after the column selection start instructing signal (write command) was applied and the clock cycles equal to the wrap length elapsed, the equalize signal φGEQ in the form of the one-shot pulse is generated in response to the subsequent clock signal. Therefore, the equalizing is carried out only for the predetermined period after the data write operation. During such standby, the equalize signal φGEQ in the form of an one-shot pulse is generated even if the equalize signal φGEQ is inactive and hence at the low level after the data write operation, whereby the global I/O line pair can be surely equalized in accordance with the predetermined timing. It is not necessary to equalize the global I/O line pair before the data writing, so that the data can be written at a high speed.

Figure 115:
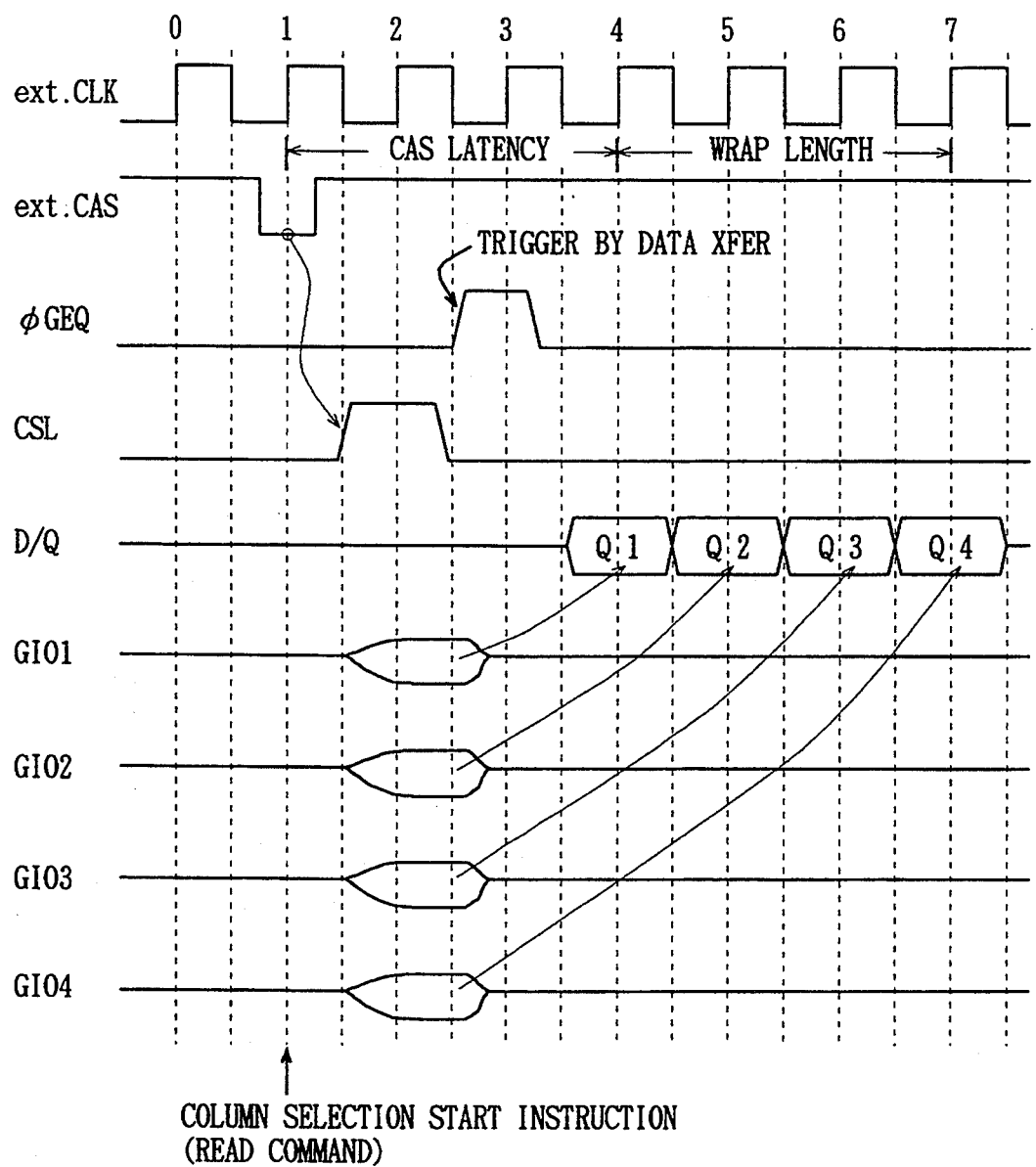
FIG. 115 shows a modification of a first equalize signal timing controlling method during data reading.

FIG. 115 shows an equalize signal generating method during the data read operation in the modification of the first equalize timing controlling method. In the equalize timing controlling method shown in FIG. 115, the equalize signal φGEQ is inactive at the low level in the standby state. In the data read operation, the column selection start instructing signal (read command) is applied, and data of the selected memory cells appears on the global I/O line pairs GIO1-GIO4. After the data appearing on the global I/O line pairs GIO1-GIO4 is transferred to the read register, the equalize signal φGEQ is generated in the form of the one-shot pulse. Also in this case, the global I/O line pair and local I/O line pair are equalized after the data is transferred from the global I/O line pair to the read register, so that it is not necessary to equalize the internal data lines (including both the global I/O line pair and local I/O line pair) before the data of selected memory cells appear on the global I/O line pair, which enables reading of data at a high speed.

The method of controlling the equalize signal shown in FIGS. 114 and 115 can be realized by using the one-shot pulse generating circuit, which generates a pulse of one shot in response to the output of the OR circuit 2024, instead of the flip-flop 2028 shown in FIG. 111. In this case, it is not necessary to use the OR circuit 2026 and one-shot pulse generating circuit 2027 shown in FIG. 111.

(ii) Second Method of Controlling Equalize Timing

Figure 116:
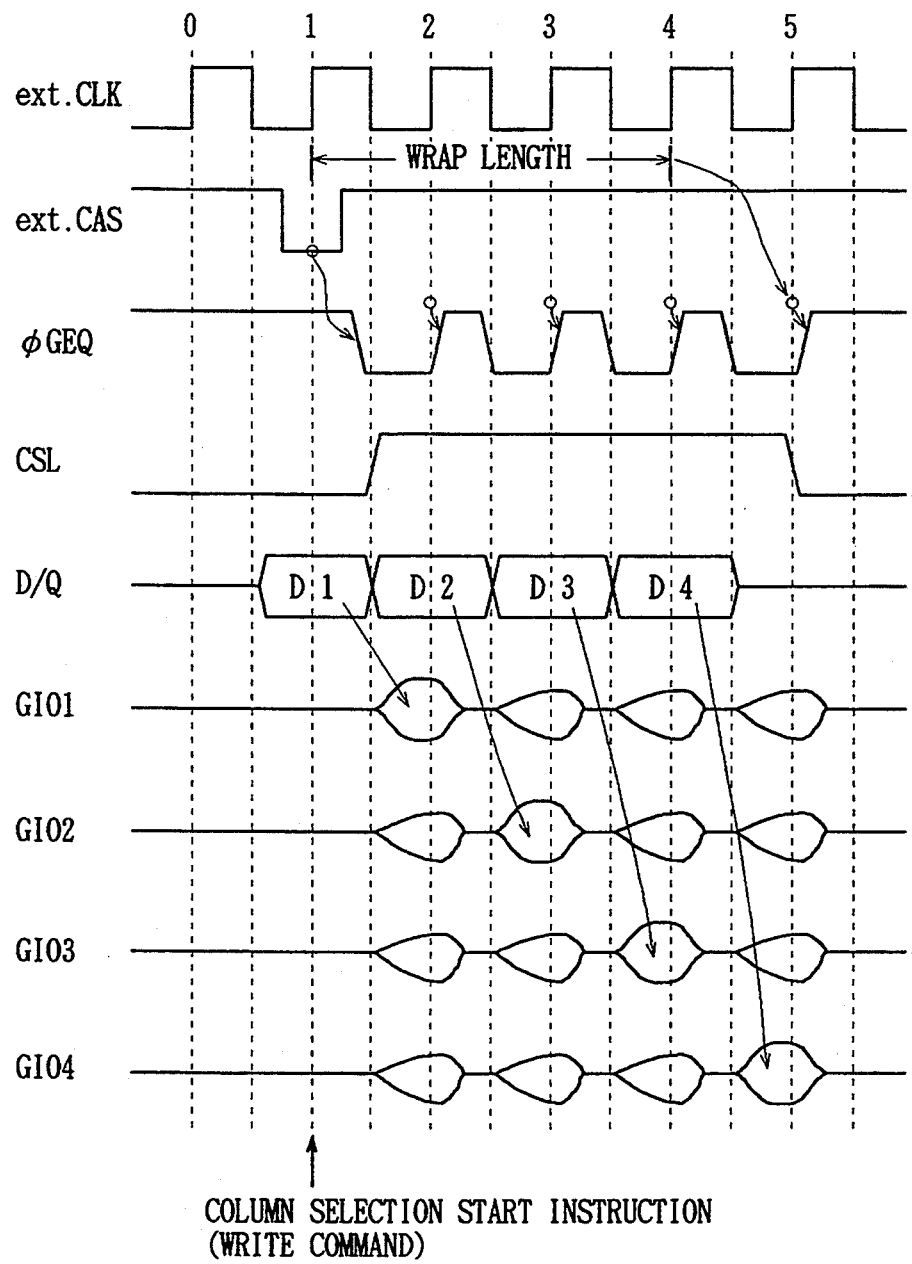
FIG. 116 is a timing chart showing a second equalize signal timing controlling method during data writing.

FIG. 116 is a timing chart showing a second equalize timing controlling method. According to the structure shown in FIG. 116, the equalize signal φGEQ is set inactive to attain the low level when the column selection start instructing signal is applied (i.e., write command is applied) in the data write operation. Then, the equalize signal φGEQ is activated in synchronization with each clock signal CLK and is maintained in the active state for a predetermined period, so that, the global I/O line pairs GIO1-GIO4 are equalized. After clock cycles equal to the wrap length elapse, activation of the equalize signal φGEQ synchronized with the clock signal CLK is inhibited. In the clock cycle next to the wrap length cycle, the equalize signal φGEQ is activated to attain the high level in response to the count-up signal of the wrap length plus 1 (one) sent from the counter (FIG. 110).

As described above, the global I/O line pair and local I/O line pair (internal data line) are equalized in every clock cycle in the data writing operation, so that the high speed access is allowed even if the wrap stop operation is carried out.

Figure 117:
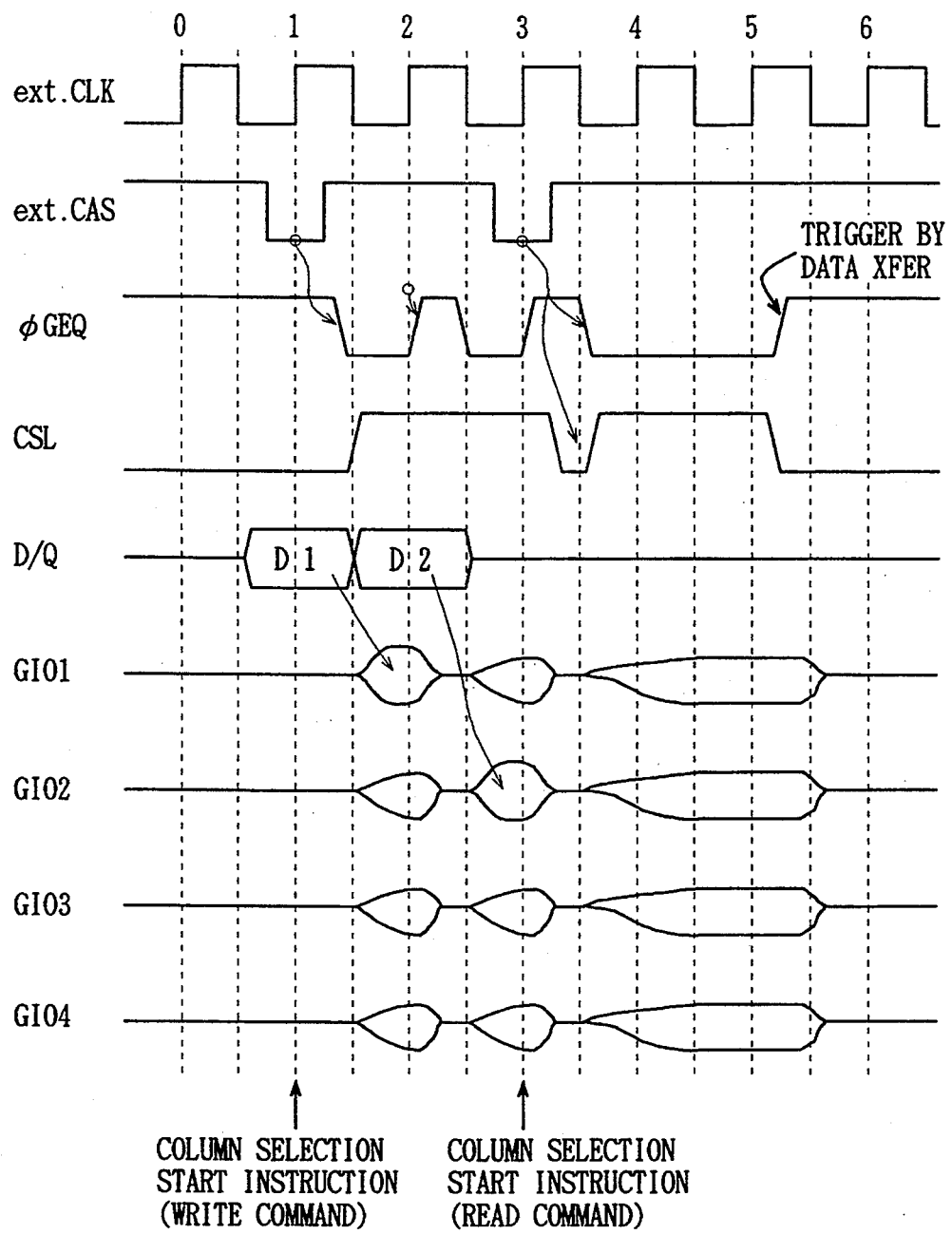
FIG. 117 is a timing chart showing a wrap stop operation in a second equalize signal timing controlling method.

In the following description, it is assumed that, as shown in FIG. 117, the wrap length is 4, two data are written, a read command is applied in the third clock cycle, and thereby the wrap stop is designated. In this case, when the write command is applied in the clock cycle 1 as shown in FIG. 117, data D1 and data D2 currently applied in clock cycle 2 are sequentially transmitted to the global I/O line pairs GIO1 and GIO2. The equalize signal φGEQ is activated in every clock cycle, and the global I/O line pairs GIO1-GIO4 are equalized.

In the third clock cycle, the wrap length is not yet counted up, so that the equalize signal φGEQ is active and hence at the high level, and equalization of the global I/O line pairs GIO1-GIO4 is executed.

In clock cycle 3, the read command is applied, whereby the equalize signal φGEQ is inactivated. According to the read command, the column selecting signal CSL rises to the high level to select another columns. In this operation, memory cell data read onto the selected columns are transmitted to the global I/O line pairs GIO1-GIO4. However, they have already been equalized by the equalize signal φGEQ, so that the data can be transmitted to the global I/O line pairs GIO1-GIO4 at a high speed. Accordingly, data can be read at a high speed even if the wrap stop operation is executed. After application of the read command, the data is transferred from the global I/O line pairs GIO1-GIO4 to the read register, and thereafter the equalize signal φGEQ is activated to attain the high level.

In the case where the read command was first applied and the wrap stop operation is to be operated, the wrap stop operation can be executed in accordance with the timing already described with reference to FIG. 109, because, in an external data reading operation, equalization of the global I/O line pairs GIO1-GIO4 is already completed upon starting of transfer of internal data.

Figure 118:
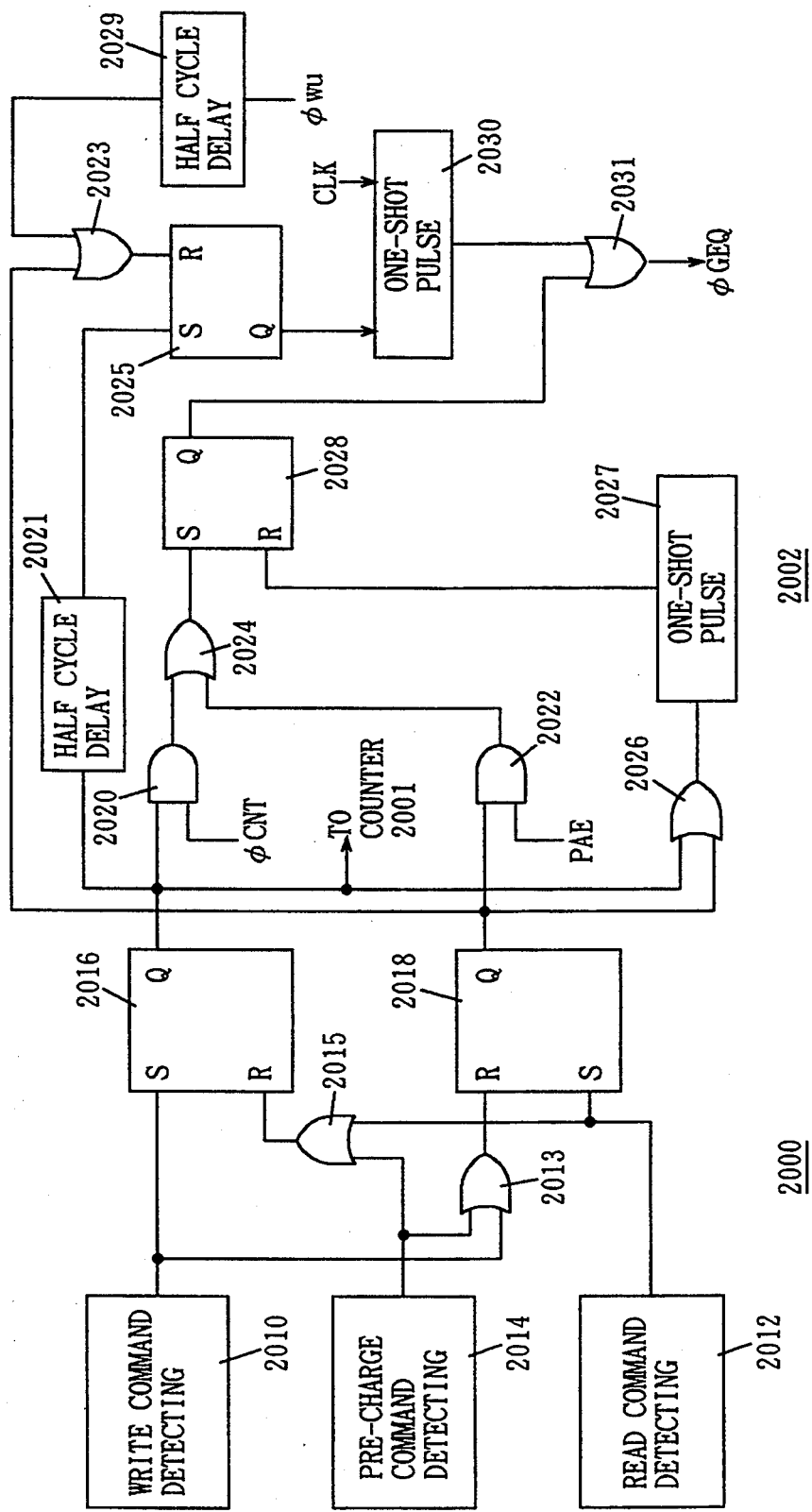
FIG. 118 shows a structure of a column access determining circuit and an equalize signal generating circuit achieving a second equalize signal timing controlling method.

FIG. 118 shows a circuit structure for controlling equalize timings as shown in FIG. 117. In FIG. 118, parts and portions corresponding to those in FIG. 111 bear the same reference numbers.

In FIG. 118, the column access determining circuit 2000 further includes an OR circuit 2013 which receives the output of the write command detecting circuit 2010 and the output of the precharge command detecting circuit 2014 and resets the flip-flop 2018, and an OR circuit 2015 which receives the output of the read command detecting circuit 2012 and the output of the precharge command detecting circuit 2014 and resets the flip-flop 2016. Other structures are similar to those shown in FIG. 111.

In the structure shown in FIG. 118, the flip-flop 2016 is reset when the read command or precharge command is applied. The flip-flop 2018 is reset when the write command or the precharge command is applied. Thereby, control of the equalize signal according to the count-up signal $\phi$CNT coming from the counter 2001 is inhibited when the read command is already applied. Similarly, control of activation and inactivation of the equalize signal $\phi$GEQ according to the preamplifier enable signal PAE is inhibited when the write command is already applied.

The equalize signal generating circuit 2002 includes a half-cycle delay circuit 2021 which delays the output of the set/reset flip-flop 2016 by half a cycle of the clock signal CLK for transmission, an AND circuit 2020 which receives the output of the flip-flop 2016 and the (wrap length+1) count-up signal $\phi$CNT sent from the counter 2001 (FIG. 110), an AND circuit 2022 which receives the Q-output of the flip-flop 2018 and the preamplifier enable signal PAE, an OR circuit 2024 receiving outputs of the AND circuits 2020 and 2024, an OR circuit 2026 receiving the outputs of the flip-flops 2016 and 2018, an one-shot pulse generating circuit 2027 which is responsive to rise of an output of the OR circuit 2026 to generate a pulse of one shot having a predetermined time width, and a set/reset flip-flop 2028 which is set by the output of the OR circuit 2024 and is reset by the output of the one-shot pulse generating circuit 2027. An output Q of the flip-flop 2028 changes similarly to the signal $\phi$GEQ already described with reference to FIG. 111.

The equalize signal generating circuit 2002 further includes a half-cycle delay circuit 2029 which delays a wrap length count-up signal $\phi$wu sent from the counter 2001 by half a cycle of the clock signal CLK, an OR circuit 2023 receiving the output of the flip-flop 2018 and an output of the half-cycle delay circuit 2029, a set/reset flip-flop 2025 which is set in response to rise of the output of the half-cycle delay circuit 2021 and is reset in response to rise of the output of the OR circuit 2023, an one-shot pulse generating circuit 2030 which is active when the Q-output of the flip-flop 2025 is active and is responsive to the rise of the clock signal CLK to generate a pulse of one shot having a predetermined time width, and an OR circuit 2031 receiving an output of the one-shot pulse generating circuit 2030 and the output of the flip-flop 2028. The OR circuit 2031 generates an equalize signal $\phi$GEQ.

The wrap length count-up signal $\phi$wu is generated from the counter 2001 when it counts the wrap length during operation of applying the write command. Thus, the wrap length count-up signal $\phi$wu is generated at the time preceding the count-up signal $\phi$CNT by one clock cycle. Then, an operation of the circuit shown in FIG. 118 will be described below with reference to FIG. 119 which is an operation waveform diagram.

In clock cycle 1, the set/reset flip-flop 2016 is set and its output Q rises to the high level when the column selecting instruction, i.e., write command is applied. The half-cycle delay circuit 2021 delays the Q-output of the flip-flop 2016 by half a clock cycle of the clock signal CLK and passes the same. The half-cycle delay circuit 2021 is designed, for example, such that it latches an input which is applied when the clock signal CLK is at the high level, and supplies the latched data therefrom when the clock signal attains the low level. Therefore, the output of the half-cycle delay circuit 2021 is responsive to the fall of the clock signal CLK to rise according to the output of the flip-flop 2016. Thereby, the set/reset flip-flop 2025 is set, and the one-shot pulse generating circuit 2030 is enabled. At this time, the clock signal CLK is already at the low level, and the one-shot pulse generating circuit 2030 does not generate a pulse.

The counter 2001 is activated in response to the Q-output of the flip-flop 2016 to count the clock signal CLK. Meanwhile, the output of the OR circuit 2026 rises in response to the Q-output of the flip-flop 2016, the one-shot pulse generating circuit 2027 generates a pulse of one shot, the flip-flop 2028 is reset, and its Q-output falls to the low level. Thereby, the equalize signal $\phi$GEQ is sent through the OR circuit 2031 to fall to the low level.

In clock cycle 2, the clock signal CLK rises to the high level. In response to this, the one-shot pulse generating circuit 2030, which is already activated by the output of the flip-flop 2025, generates a pulse of one shot having a predetermined time width. Thereby, the equalize signal $\phi$GEQ is sent through the OR circuit 2031 to be raised to the high level.

Upon elapsing of the clock cycles equal to the wrap length 4, the counter 2001 generates the wrap length count-up signal $\phi$wu. The wrap length count-up signal $\phi$wu is sent through the half-cycle delay circuit 2029 to be delayed by half a clock cycle and is fed to the OR circuit 2023. Therefore, the output of the OR circuit 2023 rises to the high level in response to the fall of the clock signal CLK in clock cycle 4, and thereby the flip-flop 2025 is reset. Thereby, the one-shot pulse generating circuit 2030 is inactivated.

In clock cycle 5, the count-up signal $\phi$CNT is generated from the counter 2001, whereby the flip-flop 2028 is set by virtue of the AND circuit 2020 and OR circuit 2024, and its Q-output rises to the high level. Thereby, the equalize signal $\phi$GEQ rises to the high level in response to the count-up signal $\phi$CNT. Through a series of the operations described above, the equalize signal $\phi$GEQ can attain the high level after the writing of data of wrap length 4, and the equalize signal $\phi$GEQ can be raised to the high level in every clock cycle.

In clock cycle 11, the write command is applied again, whereby the output of the flip-flop 2016 similarly rises to the high level, and the output of the flip-flop 2028 falls to the low level. Correspondingly, the equalize signal $\phi$GEQ falls to the low level. The flip-flop 2025 is set after elapsing of a half cycle, and the one-shot pulse generating circuit 2030 is set.

In clock cycle 12, when the clock signal CLK is applied, the one-shot pulse generating circuit 2030 generates an one-shot pulse having a predetermined time width, and correspondingly, the equalize signal $\phi$GEQ rises to the high level.

In clock cycle 13, a wrap stop operation is carried out and the read command is applied, whereby the flip-flop 2016 is reset. At this time, the counter 2001 is still carrying out the counting operation. However, the Q-output of the flip-flop 2018 is set by the output of the read command detecting circuit 2012, and correspondingly, the flip-flop 2025 is reset by means of the OR circuit 2023.

In clock cycle 13, the one-shot pulse generating circuit 2030 already generated a pulse signal of one shot in response to the rise of the clock signal CLK, and the equalize signal φGEQ is maintained at the high level for a predetermined period.

In the read operation, when the preamplifier enable signal PAE is generated, the flip-flop 2028 is set, and correspondingly the equalize signal φGEQ rises to the high level.

In the aforementioned manner, the equalize signal φGEQ is maintained at the high level for a predetermined period in each clock cycle, whereby the wrap stop operation can be carried out even if the write command is applied. In the case where the read command is applied, equalization is carried out in accordance with the preamplifier enable signal PAE after transfer of data from the global I/O line pair to the read register, so that the wrap stop operation can be executed without increasing the access time.

Figure 119:
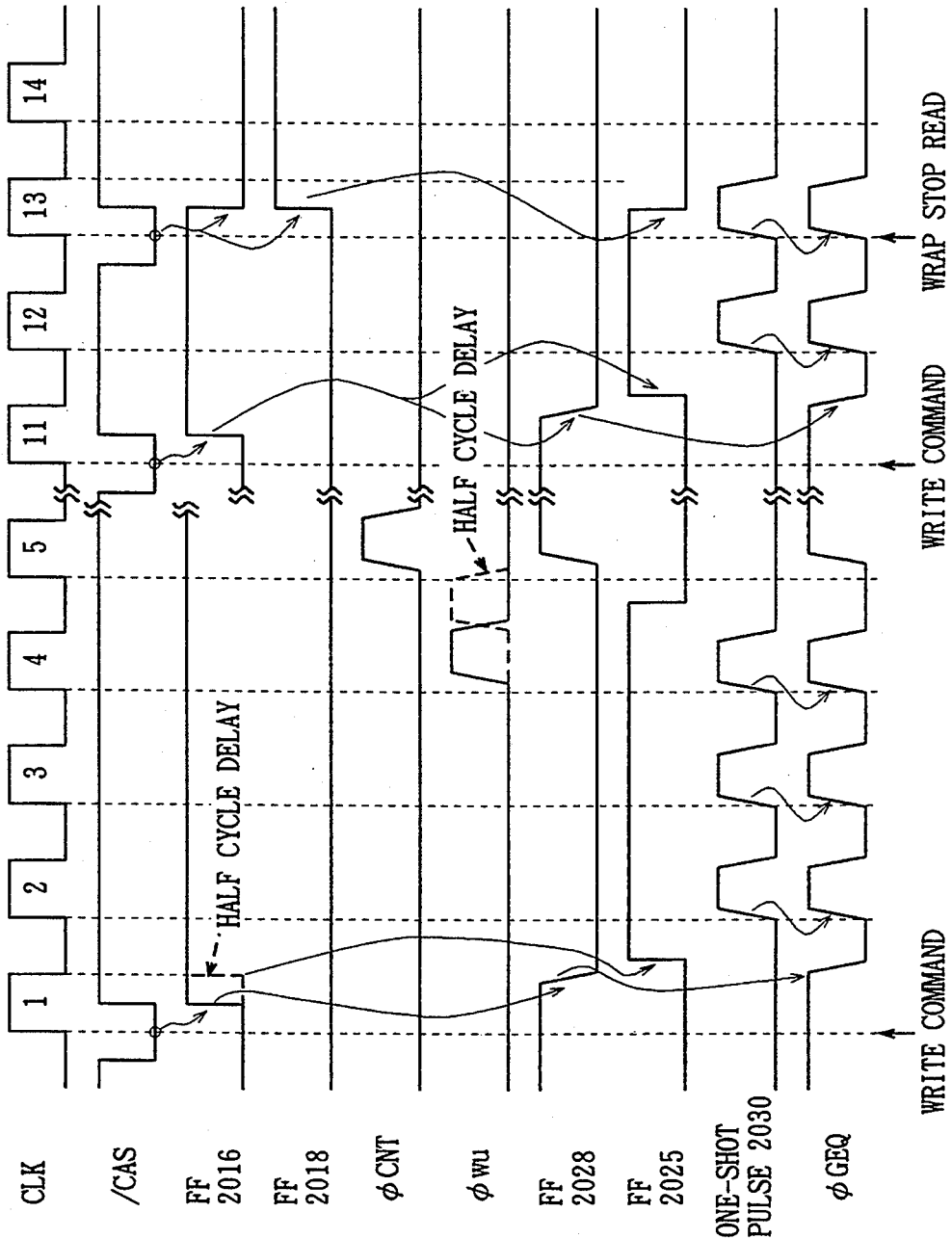
FIG. 119 is a signal waveform diagram showing an operation of a circuit shown in FIG. 118.

Also in the equalize signal controlling method shown in FIGS. 118 and 119, the operation is effected on the local I/O line pair LIO in such a manner that only the local I/O line pair for the selected memory block is positively activated and inactivated similarly to the first controlling method. For the unselected memory block, the local I/O line pairs LIO maintain the standby state.

(a) Modification 1

Figure 120:
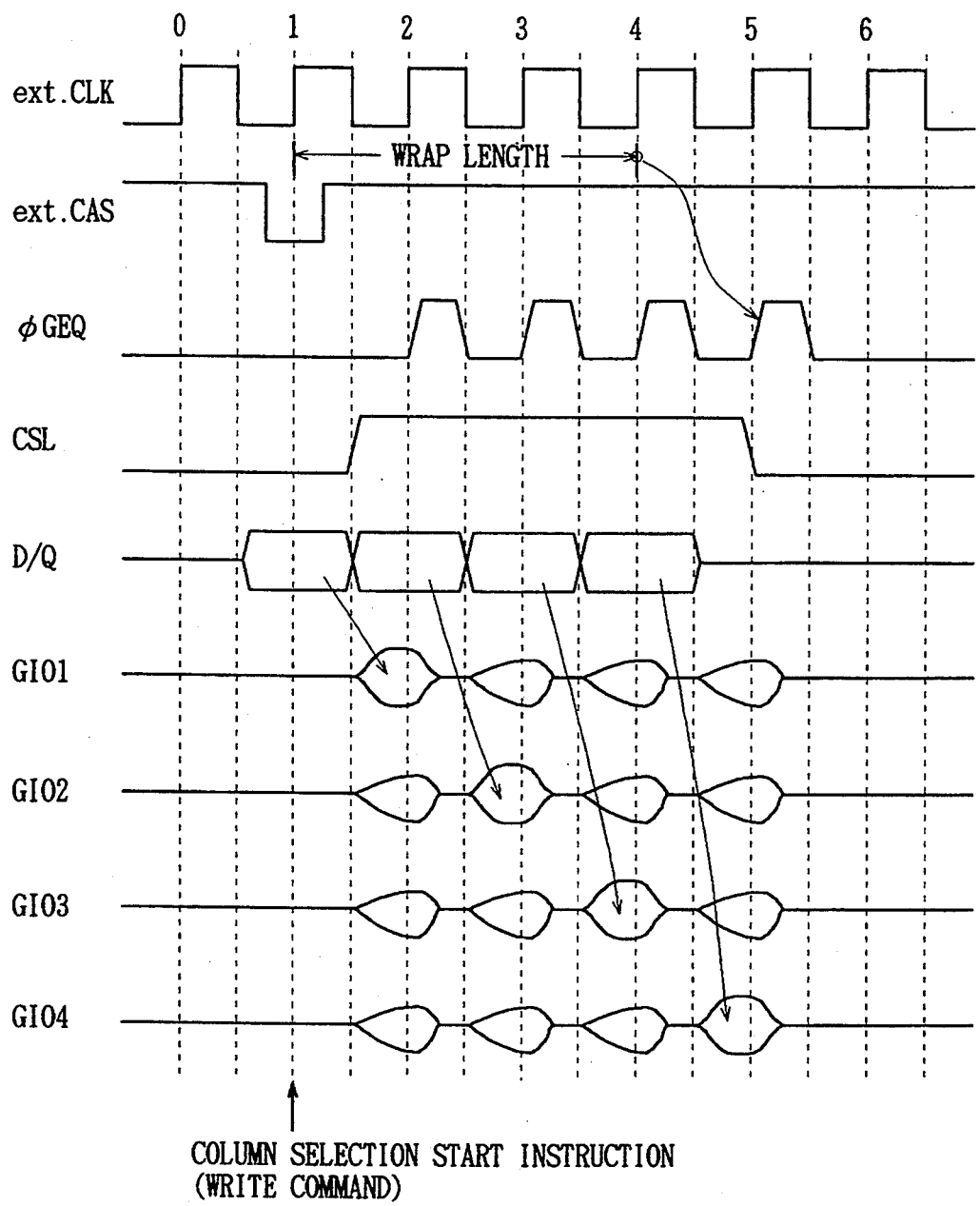

FIG. 120 is a timing chart showing a first modification of the second equalize signal controlling method. In FIG. 120, the equalize signal φGEQ (and the local equalize signal φLEQ) are set at the low level during standby. Thus, equalization of the internal data lines including the global I/O line pairs and local I/O line pairs is not executed during standby. Only when the column selection starting instruction is applied, the equalize signals φGEQ and φLEQ are activated.

In the operation shown in FIG. 120, the write command is applied in clock cycle 1. Thereby, the equalize signal φGEQ is activated to attain the high level in response to the rise of the next clock signal CLK (in clock cycle 2).

Then, in each of clock cycles 3 and 4, the equalize signal φGEQ attains and is maintained at the high level for a predetermined period in response to the rise of the clock signal CLK. When the wrap length counter counts the wrap length, the equalize signal φGEQ is activated and is maintained at the same level for a predetermined period in response to the rise of the clock signal CLK in the next clock cycle (clock cycle 5).

FIG. 121 shows an example of the circuit structure for achieving the equalize signal controlling method shown in FIG. 120. In FIG. 121, the column access determining circuit 2000 has a structure similar to the circuit structure shown in FIG. 118. In the column access determining circuit 2000 shown in FIG. 121, portions and elements corresponding to those in FIG. 118 bear the same reference number.

The equalize signal generating circuit 2002 includes a half-cycle delay circuit 2021 which delays the output of the flip-flop 2016 by half a clock cycle, an OR circuit 2035 which receives the output of the flip-flop 2018 and the count-up signal φCNT, a set/reset flip-flop 2025 which is set in response to rise of the output of the half-cycle delay circuit 2021 and is reset in response to rise of output of the OR circuit 2035, an AND circuit 2022 which receives the output of the flip-flop 2018 and the preamplifier enable signal PAE, an one-shot pulse generating circuit 2036 which generates the pulse signal of one shot having a predetermined time width in response to an output of the AND circuit 2022, an one-shot pulse generating circuit 2030 which is activated when the Q-output of the flip-flop 2025 is at the high level and is responsive to the rise of the clock signal CLK to generate a pulse signal of one shot having a predetermined time width, and an OR circuit 2037 which receives outputs of the one-shot pulse generating circuits 2036 and 2030. The OR circuit 2037 generates an equalize signal φGEQ. An operation will be described below.

Upon application of the write command, the output of the half-cycle delay circuit 2021 rises to the high level in response to the fall of the clock signal CLK during the clock cycle at which the write command is applied, and the flip-flop 2024 is set. Thereby, the one-shot pulse generating circuit 2030 is activated. At this time, the clock signal CLK is already lowered to the low level, and the one-shot pulse generating circuit 2030 does not generate the one-shot pulse during the first clock cycle shown in FIG. 120.

In clock cycles 2, 3 and 4, the one-shot pulse generating circuit 2030 generates one-shot pulse having a predetermined time width in synchronization with the rise of the clock signal CLK. In response to this, the equalize signal φGEQ attains and is maintained at the high level for a predetermined period in synchronization with the clock signal CLK.

Once the wrap length data is written, the counter 2001 generates the count-up signal φCNT in response to the rise of the clock signal in the next clock cycle after elapsing of the clock cycles equal to the wrap length. Thereby, the output of the OR circuit 2035 rises to the high level, and the output Q of flip-flop 2025 lowers to the low level. Prior to the fall of the output Q of flip-flop 2025 to the low level, the clock signal CLK is already at the high level, so that the one-shot pulse generating circuit 2030 generates the pulse signal having a predetermined time width. According to this, the equalize signal φGEQ rises to and maintains the high level for a predetermined period in response to the rise of the clock signal CLK in clock cycle 5 (see FIG. 120).

When the count-up signal φCNT attains the high level to reset the flip-flop 2025, the one-shot pulse generating circuit 2030 is inactivated. However, the one-shot pulse generating circuit 2030 may be provided with a transmission gate which passes the clock signal CLK when the output Q of flip-flop 2025 is at the high level. This ensures that the generating circuit 2030 can generate the pulse of one shot having a predetermined time width even if the output Q of flip-flop 2025 is reset to attain the low level.

When the read command is applied, the one-shot pulse generating circuit 2036 generates the pulse of one shot having a predetermined time width in response to the preamplifier enable signal PAE. Thereby, the equalize signal φGEQ is maintained at the high level for a predetermined time by the OR circuit 2037.

If the write command is applied and the wrap stop operation is designated, the flip-flop 2025 is reset by the OR circuit 2035. Also in this case, the one-shot pulse generating circuit 2030 generates the pulse of one shot having a predetermined time width in response to the clock signal CLK in the clock cycle designating the wrap stop operation. This ensures that the equalize signal φGEQ can be set at the high level for a predetermined period even if the wrap stop operation is designated.

(b) Modification 2

In the aforementioned structures, data of 64 bits is simultaneously transferred to the read registers, or is sequentially written from the write registers into the internal data lines. This architecture corresponds to the structure in which a register of 8 bits is provided for each data I/O terminal. Another architecture may be contemplated. Without providing the register, latches may be internally provided, and data are grouped and sequentially (i.e., in a time division manner) transmitted through the internal data lines. In this case, data is sequentially transmitted through the internal data bus even in the data read operation. In this case, the internal data lines are equalized after transmission of data whichever of the read command and write command may be applied. A controlling method for the above purposes will be described below with reference to FIGS. 122 and 123.

Figure 122:
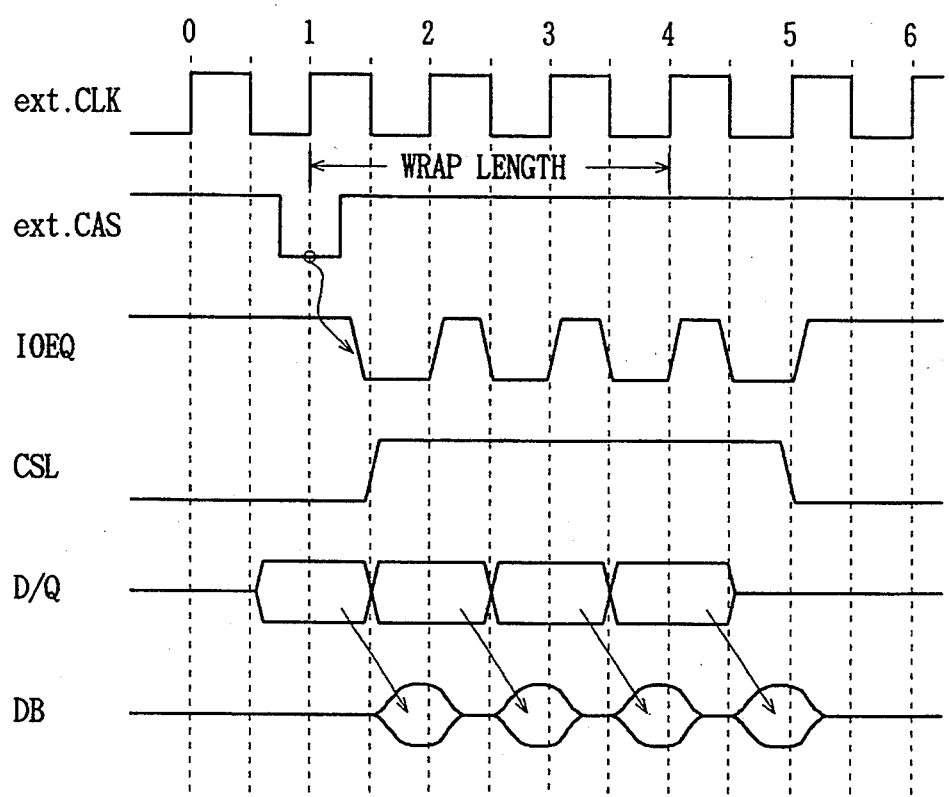

In an equalize signal controlling method shown in FIG. 122, only one internal data line DB (i.e., data line of 8 bit width) is utilized. The equalize signal IOEQ activates and inactivates the equalize transistor provided in the internal data line DB. When the equalize signal IOEQ is at the high level, the internal data line DB is equalized. When the equalize signal IOEQ is at the low level, the internal data line DB is not equalized.

As shown in FIG. 122, if the internal data line DB is to be equalized in the standby state, the equalize signal IOEQ is at the high level during standby. In clock cycle 1, when the column selection instructing signal (write command) is applied, the equalize signal IOEQ attains the low level. Thereafter, the wrap length is counted, and the equalize signal IOEQ is raised to the high level in synchronization with the rise of the clock signal CLK during the counting operation and is kept at the high level for a predetermined period. After elapsing of the clock cycles equal in number to the wrap length, the equalize signal IOEQ attains the high level in response to the rise of the clock signal CLK in the next clock cycle.

When the data read instruction was applied, the equalize signal IOEQ is inactivated to attain the low level after the read command is applied. Data which have appeared on the internal data line DB are sequentially transmitted to the data output. Accordingly, in the data dividing and transmitting architecture, a signal corresponding to the preamplifier enable signal PAE indicative of the transfer of read data is generated for transmission of read data if the read command is applied. Therefore, the read data transfer signal corresponding to the preamplifier enable signal PAE is used as a trigger, and the equalize signal IOEQ is kept at the high level for a predetermined period. Thereby, whichever of the write command and read command may be applied, the internal data line DB can be equalized after each transmission of data. A method of controlling the equalize signal shown in FIG. 122 can be achieved by using the circuit shown in FIG. 118.

Figure 123:
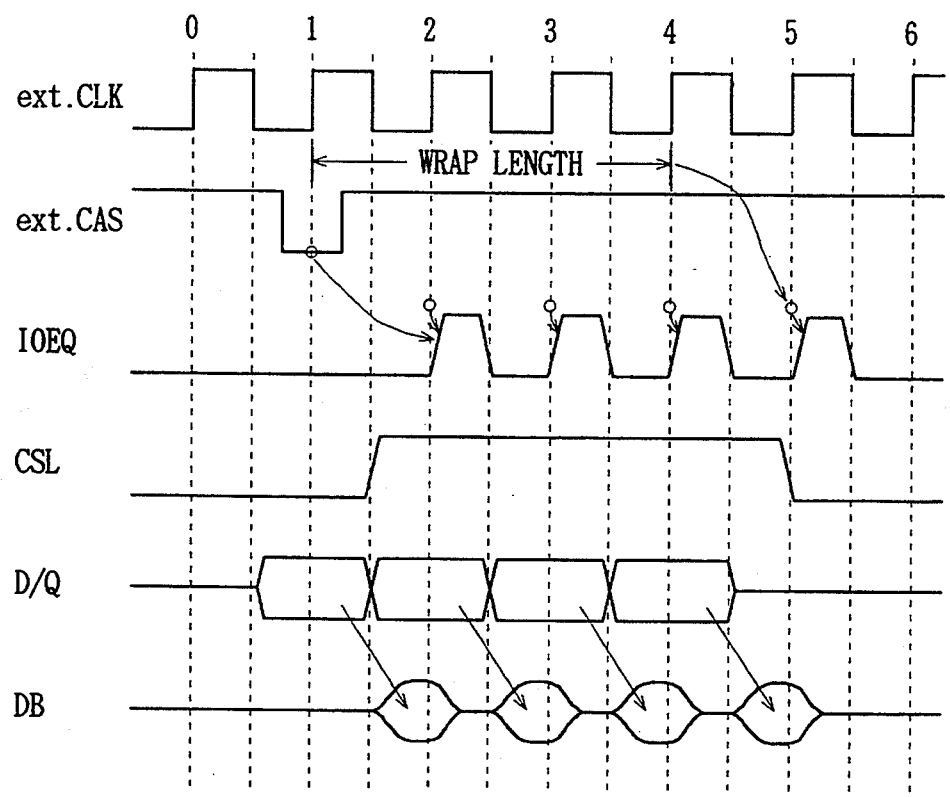

In FIG. 123, the equalize signal IOEQ is at the low level during standby, and the internal data line DB is in the floating state. In clock cycle 1 shown in FIG. 123, when the column selecting instruction (write command) is applied, the equalize signal IOEQ maintains the high level for a predetermined period in synchronization with the rise of the clock signal CLK in the next clock cycle. After elapsing of the clock cycles equal to the wrap length, the equalize signal IOEQ maintains the high level for a predetermined period in response to the rise of the clock signal CLK in the next clock cycle. Also in the timing controlling method shown in FIG. 123, when the read command is applied, the equalize signal IOEQ is maintained at the high level for a predetermined period after read data is transferred from the data bus to the data output. Also in this case, a signal corresponding to the preamplifier enable signal PAE is generated, and, using the signal as a trigger, the equalize signal IOEQ is maintained at the high level for a predetermined period.

In the timing control shown in FIG. 123, the timing for generating the equalize signal IOEQ after all the wrap length data is written is slightly delayed from the timing for generating the equalize signal IOEQ in clock cycles 2, 3 and 4. This structure can be achieved by using, in the circuit structure shown in FIG. 118, a pulse generating circuit generating a pulse of one shot in response to the output of the OR circuit 2024 instead of the flip-flop 2028. This structure does not use the OR circuit 2026 and one-shot pulse generating circuit 2027.

As described above, the internal data lines DB, or global I/O line pairs and local I/O line pairs are equalized in every clock cycle, whereby the wrap stop operation can be executed without adversely affecting the data transfer, and thus high speed access can be achieved.

(iii) Third Method of Controlling Equalize Signal Timing

Figure 124:
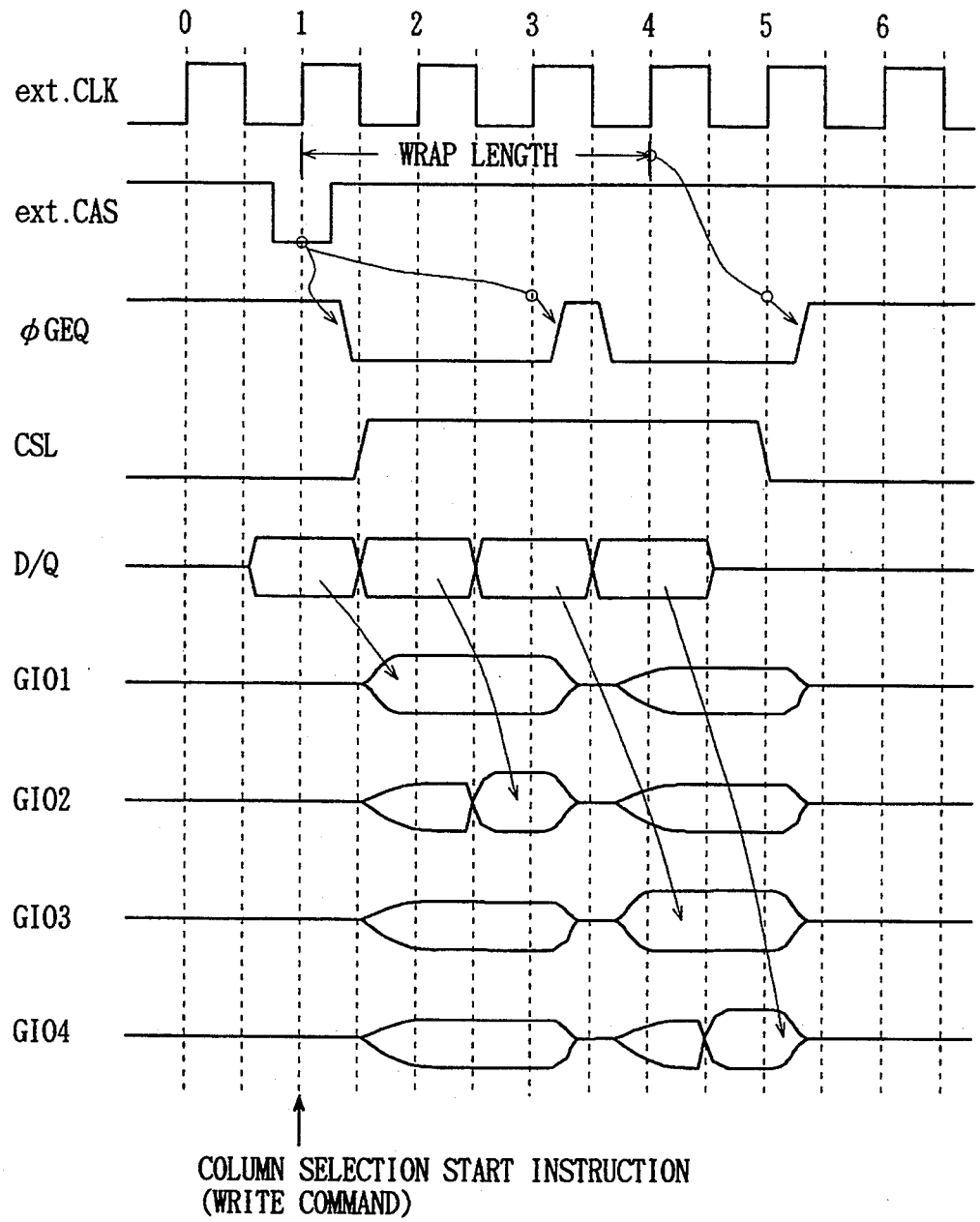

FIG. 124 is a timing chart showing a third method of controlling the equalize timing. In the controlling method shown in FIG. 124, the equalize signal φGEQ is activated in every two clock cycles during wrap data writing operation. Since the internal data lines, i.e., the global I/O line pairs GIO1–GIO4 are equalized in every two clock cycles, the operations for transferring data from the write register to the global I/O line pair and writing the same into the memory cells are executed during two clock cycles. Even in the case where the clock cycle is short, therefore, the operation for transferring data from the write register to the global I/O line pair and writing the same into the memory cells can be executed with a sufficient margin, so that the operation can be carried out with a high speed clock.

In FIG. 124, the equalize signal φGEQ is active and hence at the high level during standby.

In clock cycle 1, when the column selection start instructing signal (write command) is applied, the equalize signal φGEQ is inactivated to attain the low level. In response to the clock signal CLK, the data is written and sequentially transmitted onto the global I/O line pair. When the write command is applied, the equalize signal φGEQ attains the high level in response to the rise of the clock signal CLK when two clock cycles elapses after the column selecting operation was designated, and maintains the high level for a predetermined period. Thereby, the global I/O line pairs GIO1–GIO4 are equalized.

When the clock cycles equal to the wrap length elapse after the column selection start instructing signal is applied, the equalize signal φGEQ rises to the active state, i.e., high level in the next clock cycle (cycle 5).

As described above, the equalize signal φGEQ is activated and maintained at the high level for a predetermined time period for equalizing the global I/O line pair in every two clock cycles. Therefore, even in the case where the clock cycle is short, operations for writing data and equalizing the global I/O line pairs and local I/O line pairs can be executed with a sufficient margin, so that operations can be carried out in synchronization with the high speed clock signal.

Figure 125:
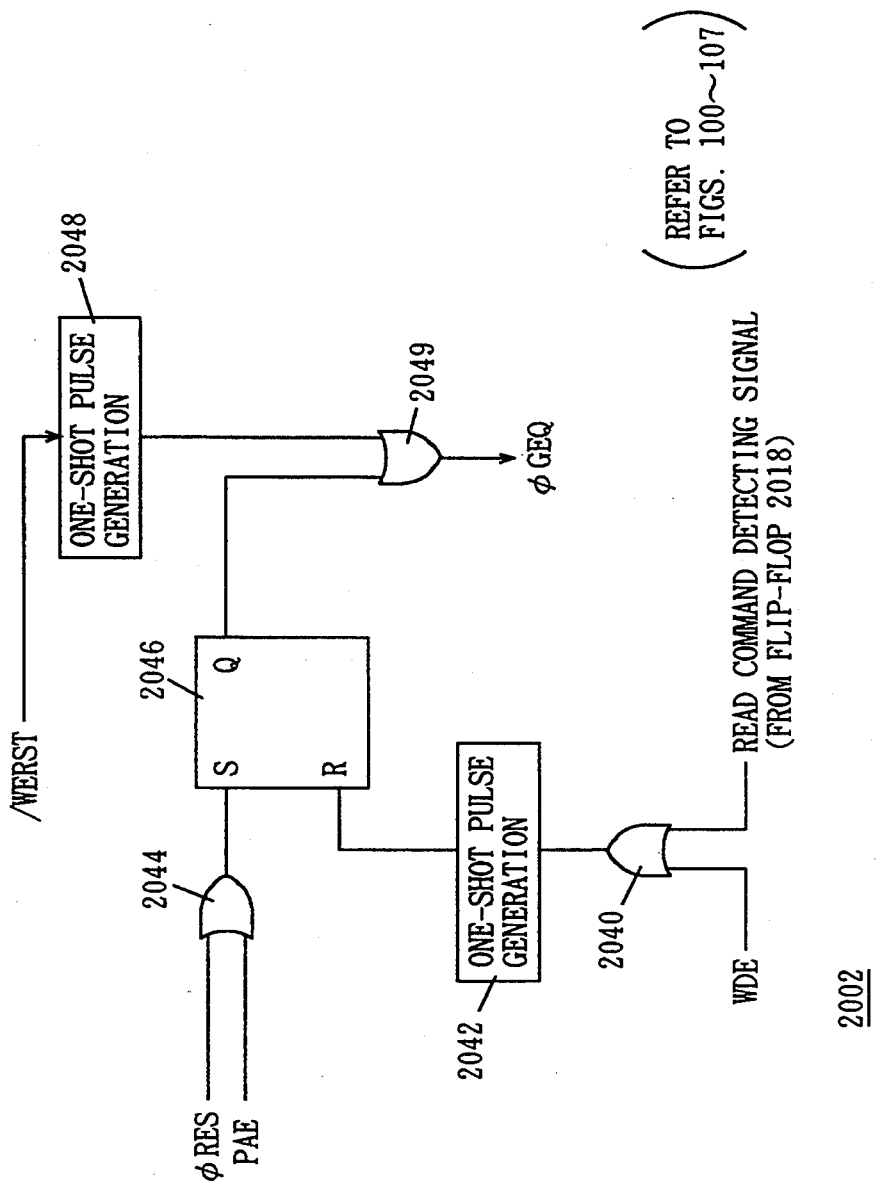

FIG. 125 shows a structure of the equalize signal control system shown in FIG. 124. In FIG. 125, there are used signals WDE, /WERST and $\phi$RES shown in FIGS. 100–107. In the operation of write circuit, which is already described with reference to FIGS. 100–FIG. 107, data writing is carried out in units of two bits. Therefore, the control signal used therein may be utilized, whereby the equalize signal $\phi$GEQ can be easily activated to attain the high level in every two clock cycles.

Referring to FIG. 125, the equalize signal generating circuit 2002 includes an OR circuit 2040 which receives the write control signal WDE and the read command detection signal applied from the flip-flop 2018 shown in FIG. 121, an one-shot pulse generating circuit 2042 which generates a pulse of one shot having a predetermined time width in response to rise of an output of the OR circuit 2040, an OR circuit 2044 receiving the reset signal $\phi$RES (see FIG. 98) and the preamplifier enable signal PAE, a flip-flop 2046 which is set in response to rise of an output of the OR circuit 2044 and is reset in response to an output of the one-shot pulse generating circuit 2042, an one-shot pulse generating circuit 2048 which generates a pulse signal of one shot having a predetermined time width in response to fall of the write control signal /WERST, and an OR circuit 2049 which receives an output Q of the flip-flop 2046 and an output of the one-shot pulse generating circuit 2048. The OR circuit 2049 generates the equalize signal $\phi$GEQ.

The reset signal $\phi$RES is driven to the high level, as shown in FIG. 98, when cycles of the clock signal equal to the wrap length plus one are counted after application of the write command, and is maintained at the high level for a predetermined period. The write enable signal WDE maintains the high level, i.e., active state during a period from application of the write command to application of the reset signal $\phi$RES.

As can be understood from the operation waveform diagram of FIG. 101, the write control signal /WERST is maintained at the low level for a predetermined period in every two clock cycles, when the write command is applied. At every fall of the write control signal /WERST, the one-shot pulse having a predetermined width is generated to drive the equalize signal $\phi$GEQ to the high level, i.e., active state. An operation will be briefly described below.

When the write command is applied, the write instructing signal WDE is activated to attain the high level, and the one-shot pulse generating circuit 2042 is driven through the OR circuit 2040 to generate the pulse of one shot. In response to this, the flip-flop 2046 is reset, and the Q-output thereof attains the low level.

When the write enable signal WDE is active and hence at the high level, the signal /WERST falls to and maintains the low level for a predetermined period in every two clock cycles after the write command is applied. In response to this fall, the one-shot pulse generating circuit 2048 generates the pulse signal of one shot having a predetermined time width. Thereby, the equalize signal $\phi$GEQ is activated through the OR circuit 2049 and is maintained at the high level for a predetermined period.

When the clock cycles equal to the wrap length elapses after the write command is applied, the reset signal $\phi$RES is driven to maintain the high level for a predetermined period in response to the rise of the clock signal in the next clock cycle. In response to this, the flip-flop 2046 is set to have its Q-output at the high level, and the equalize signal $\phi$GEQ is set at the high level.

Thereby, the equalize signal $\phi$GEQ can be driven to the high level for a predetermined period at every two clocks, and the equalize signal $\phi$GEQ can be maintained at the high level in accordance with the reset signal $\phi$RES when writing of all the wrap length data is completed.

In the case where the wrap length is 4, the write control signal /WERST is driven to the low level in response to the rise of the clock signal CLK at the fifth clock, and similarly, the reset signal $\phi$RES is generated. In this case, and particularly in the case where the equalize signal $\phi$GEQ is activated in accordance with the reset signal $\phi$RES, such a structure may be used that the operation of one-shot pulse generating circuit 2048 is inhibited when the clock cycles equal in number to the wrap length elapse after application of the write command. Thereby, the fall of the write control signal /WERST in the fifth clock cycle can be neglected, and the equalize signal $\phi$GEQ is activated to attain the high level in accordance with the reset signal $\phi$RES.

Instead of the control signal /WERST, the control signal /WRSTf as shown in FIG. 101 may be used.

Figure 126:
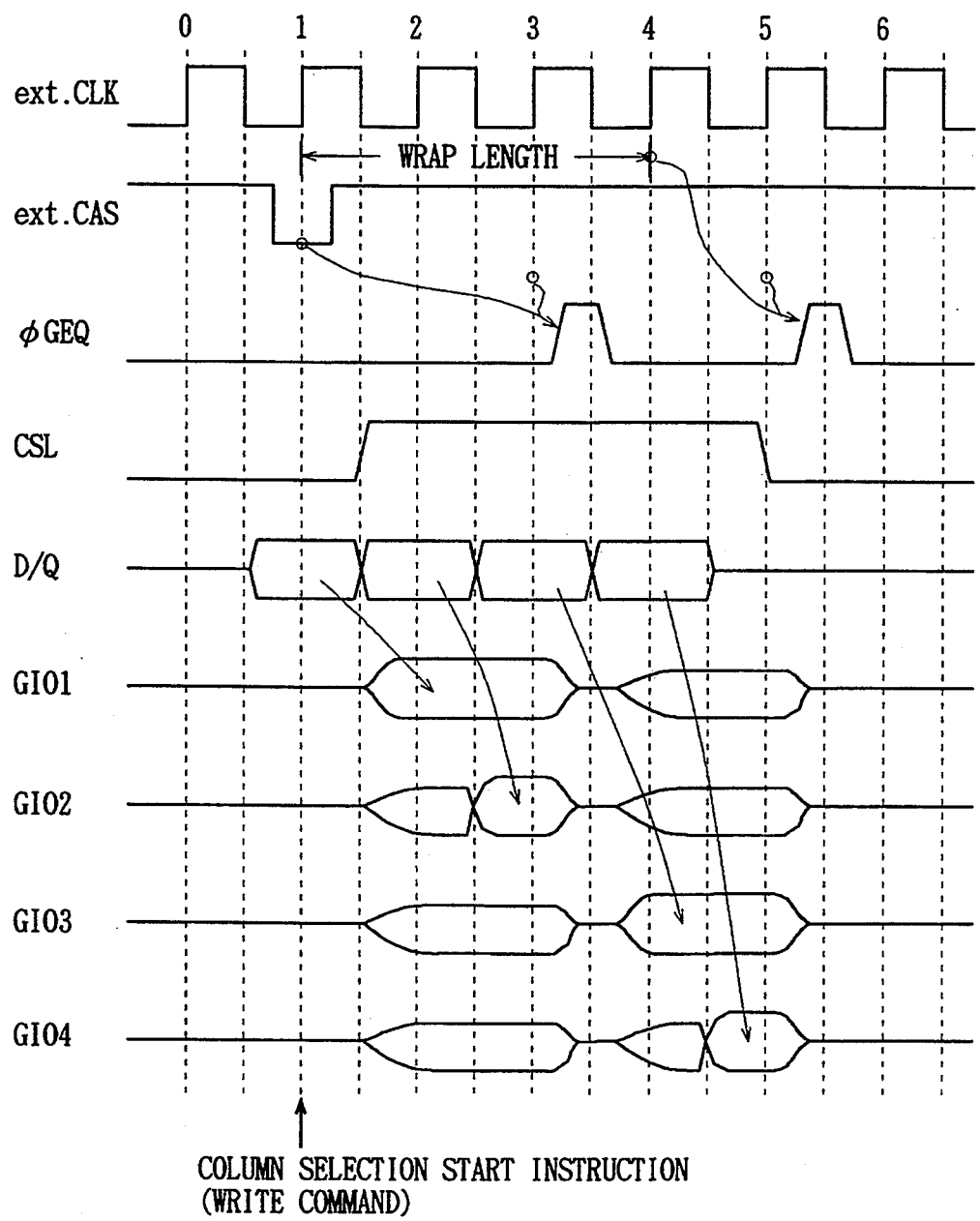
Figure 127:
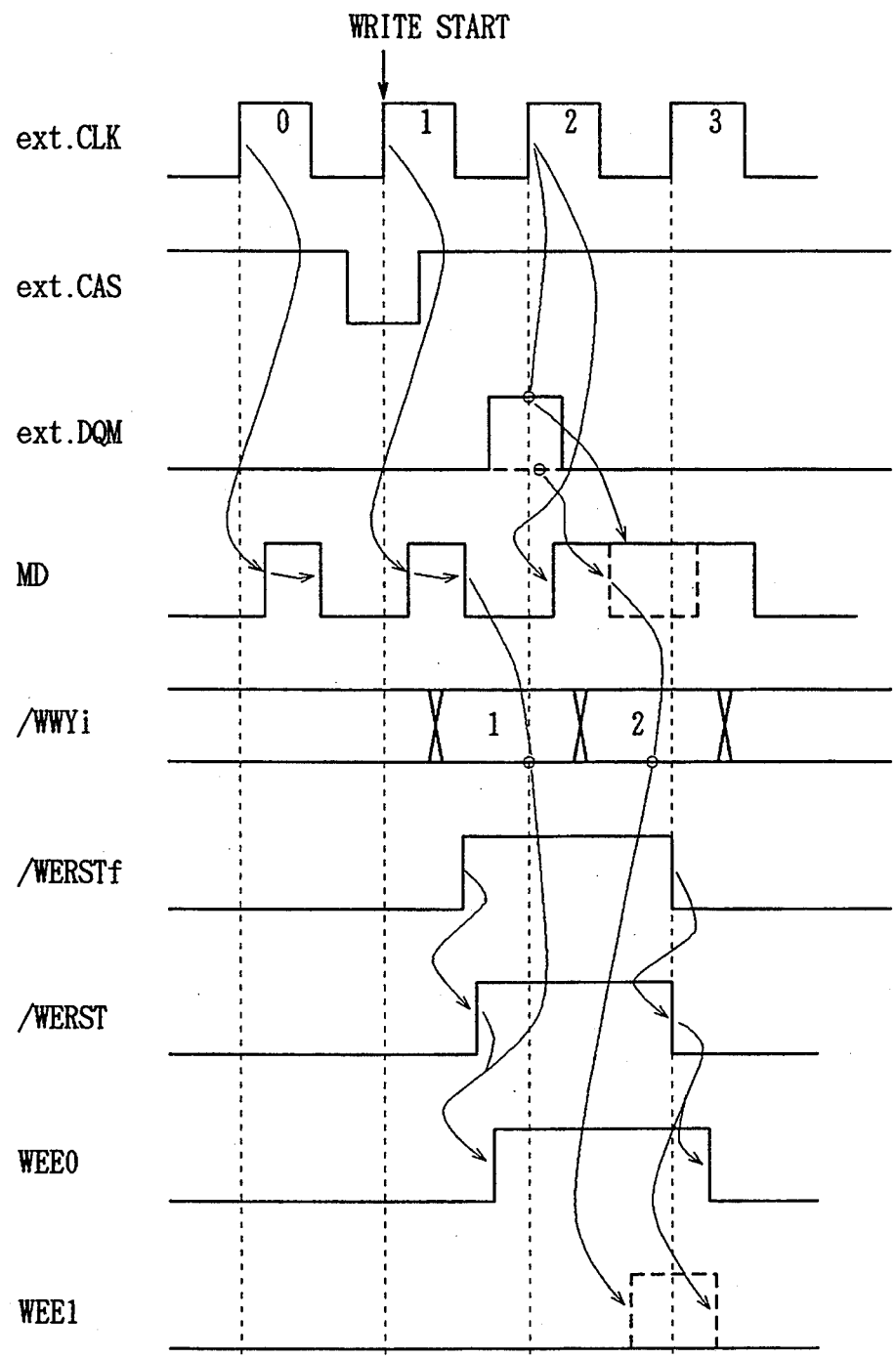

FIG. 126 shows a timing controlling method for the case where the equalize signal $\phi$GEQ is maintained at the low level, i.e., inactive state during standby. In the structure shown in FIG. 126, when the column selection start instructing signal (write command) is applied, the equalize signal $\phi$GEQ is raised to and maintained at the high level for a predetermined period after elapsing of two clock cycles, i.e., in clock cycle 3. Upon elapsing of the clock cycles equal in number to the wrap length, the equalize signal $\phi$GEQ is raised to and maintained at the high level for a predetermined period in response to rise of the next clock signal CLK. In order to achieve the structure shown in FIG. 126, the flip-flop 2046 in the structure shown in FIG. 125 may be replaced with the one-shot pulse generating circuit which generates a pulse of one shot having a predetermined time width. In this case, the one-shot pulse generating circuit 2042 and OR circuit 2040 are not utilized.

Such a structure may also be employed that uses an one-shot pulse generating circuit which receives the signal /WERST, an one-shot pulse generating circuit which generates a pulse of one shot in response to the signal PAE, and an OR gate which receives an output of this one-shot pulse generating circuit and generates the equalize signal $\phi$GEQ. In this case, burst (wrap) stop is required to be carried out in every even clock cycles after application of the write command.

According to the first to third methods of controlling the equalize signal timing as described above, it is not necessary to equalize the internal data line prior to the data writing or reading, and thus the input and output of data can be carried out at a high speed. Since the internal data lines are in the equalized state after the transfer of read data to the output or writing of write data into the memory cells (specifically, after transmission of write data onto the internal data lines), the equalize signal can be activated at the optimum timing.

[Write Mask Circuit]

A structure of a write mask circuit will be described below with reference to the structure of the write circuit control system shown in FIGS. 100-107. The following description will be made a structure of generating the write control signal, in which the wrap length is 2 or more, and the wrap stop length is set to 2. If the wrap stop length is set to 2, the signal /WERSTf falls to the low level in response to the rise of the clock signal CLK in the third clock cycle after two clocks elapsed from the start of the column access, i.e., application of the write command. Thereafter, when the wrap length data is being written, the signal /WERSTf falls to and is maintained at the low level for a predetermined period in every two clock cycles. If both the signals /WERSTf and /WERST are at the high level, the wrap address/-WWYi is latched, and the write data is taken into the write circuit and transferred to the write register, and the data is transferred onto the global I/O line pair GIO in accordance with the wrap address/WWYi thus latched.

Specific structures of the write circuit and write register can be understood from FIG. 96. When the signal WEEi is at the high level, data is transferred from the write circuit WGi to the write register WRi and further transferred onto the data the global I/O line pair GIO if the signal WDE is at the high level as shown in 96. At this time, as shown FIG. 100, if the internal write mask signal MD is at the high level, the wrap address /WWYi is neglected and the internal write instructing signal WEEi maintains the low level.

The internal write mask signal MD is maintained at the high level, i.e., active state indicating that writing of data is inhibited for a predetermined period in each clock cycle. If the external write mask signal DQM is at the high level at the rising edge of the clock signal CLK, the internal write mask signal MD is maintained at the high level. Thereby, data writing is inhibited. The data writing is executed when the internal write mask signal MD is inactive at the low level.

As described above, the internal write mask signal MD is set at the active state, i.e., high level in each clock cycle, and the internal write mask signal MD is set at the low level for executing the data writing after elapsing of a predetermined period when the write mask is not set. This structure provides the following advantage.

After determining whether the external write mask signal DQM is at the high level i.e., active state or the low level, i.e., inactivated state, the internal write mask signal MD may activated to attain the high level, in which case it is necessary to suspend the writing of internal data until the result of determination of the write mask is decided. In this case, decision of the write control signal must be delayed until the internal write mask signal MD is decided. Also in this case, it is necessary to provide a timing margin between decision of the internal write mask data MD and generation of the internal write instructing signal such as the signal WEEi in order to prevent erroneous writing. Therefore, data cannot be written at a high speed.

Alternatively, the internal write mask signal MD may be maintained at the high level for a predetermined period in each clock cycle, during which the active and inactive states of the external write mask signal DQM are determined, and the internal write mask signal MD is controlled to be active or inactivated according to the result of determination, whereby the write control signal /WERSTf and others can be always generated at constant timings, resulting in writing of data at a high speed. Therefore, if the external write mask signal DQM is inactive and hence at the low level, the data can be written at a high speed.

FIG. 128 shows an example of a circuit structure generating the internal write mask signal. Referring to FIG. 128, the internal write mask generating system includes a dynamic latch 2050 taking in a write mask signal ext.DQM which is externally applied in response to the external clock signal ext.CLK, an one-shot pulse generating circuit 2052 which generates a pulse signal of one shot having a predetermined time width in response to rise of the external clock signal ext.CLK, a delay circuit 2054 which delays an output of the one-shot pulse generating circuit 2052 by a predetermined time, a gate circuit 2056 which receives an output OUT of the dynamic latch 2050 and an output of the delay circuit 2054, and a set/reset flip-flop 2058 which is set in response to the output of the one-shot pulse generating circuit 2052 and is reset in response to an output of the gate circuit 2056. The set/reset flip-flop 2058 generates the internal write mask signal MD. The internal write mask signal MD is fed to the circuit 1218 shown in FIG. 100.

The one-shot pulse generating circuit 2052 includes a delay circuit 2053 which delays the internal clock signal ext.CLK by a predetermined time, and a gate circuit 2055 which receives an output of the delay circuit 2053 and the external clock signal ext.CLK. The gate circuit 2055 generates a signal at the high level when the output of the delay circuit 2053 is at the low level and the external clock signal ext.CLK is at the high level. Therefore, the gate circuit 2055 generates a pulse of one shot having a time width equal to the delay time of the delay circuit 2053. The delay time of the delay circuit 2053 is smaller than the delay time T of the delay circuit 2054. The purpose of the above is to prevent simultaneous application of the signals at the high level to both the set input S and reset input R of the flip-flop 2058. The gate circuit 2056 outputs the signal at the high level when the output of the delay circuit 2054 is high and the output OUT of the dynamic latch 2050 is low.

Figure 129:
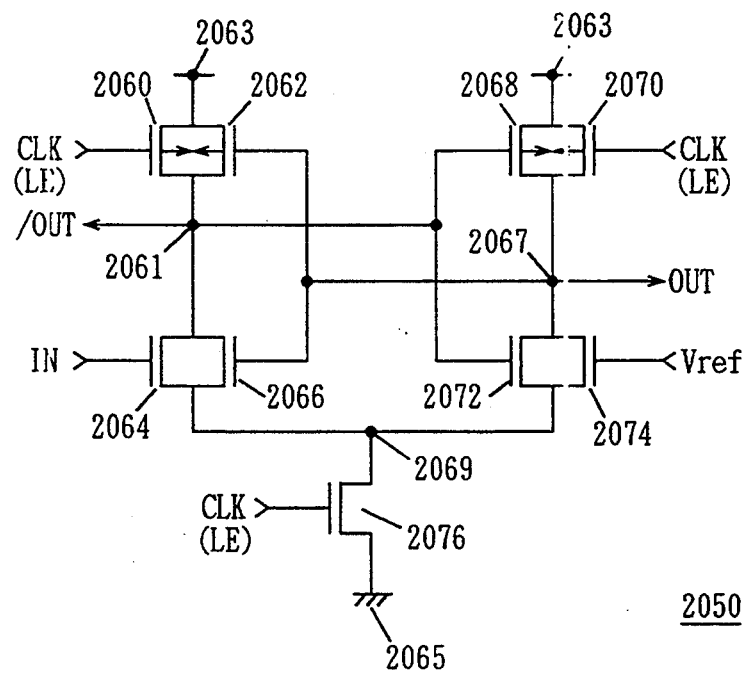

FIG. 129 shows an example of a specific structure of the dynamic latch shown in FIG. 128.

In FIG. 129, the dynamic latch 2050 includes a p-channel MOS transistor 2060 which is disposed between a supply potential node 2063 and the output node 2061 and becomes conductive in response to the clock signal CLK, a p-channel MOS transistor 2062 which is disposed between the supply potential node 2063 and the output node 2061 and becomes conductive in response to the output signal OUT, an n-channel MOS transistor 2064 which is disposed between the output node 2061 and internal node 2069 and becomes conductive in response to the input signal IN (external mask signal DQM), an n-channel MOS transistor 2066 which is disposed between the output node 2061 and internal node 2069 and becomes conductive in response to the output signal OUT, and an n-channel MOS transistor 2076 which is disposed between the internal node 2069 and ground potential node 2065 and becomes conductive in response to the clock signal CLK.

The transistors 2062 and 2066 become conductive in a complementary manner.

Figure 130:
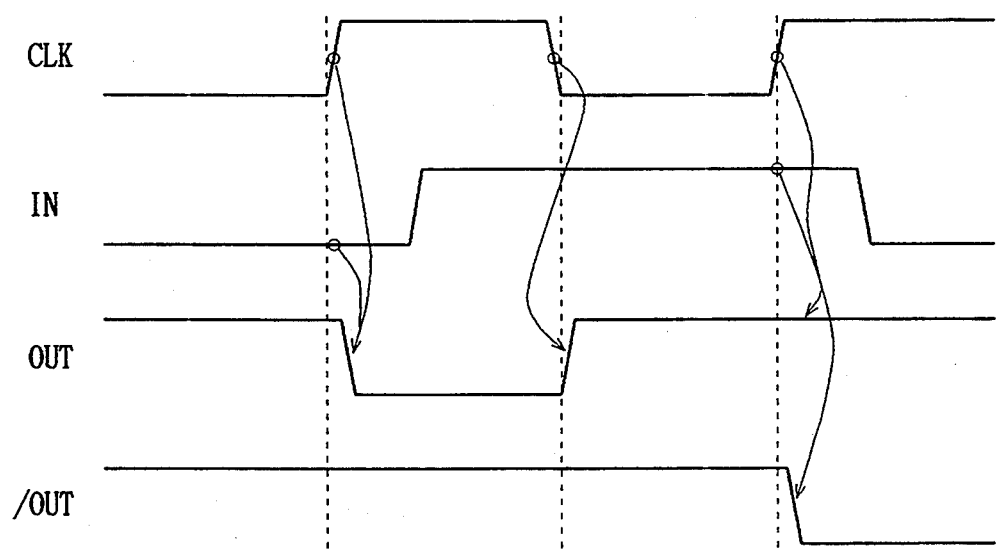

The dynamic latch 2050 further includes a p-channel MOS transistor 2070 which is disposed between the supply potential node 2063 and output node 2067 and becomes conductive in response to the clock signal CLK, a p-channel MOS transistor 2068 which becomes conductive in response to the complementary output signal /OUT (i.e., potential on the node 2061), an n-channel MOS transistor 2074 which is disposed between the output node 2067 and the internal node 2069 for receiving on its gate the reference potential Vref, and an n-channel MOS transistor 2072 which is disposed between the output node 2067 and the internal node 2069 and becomes conductive in response to the complementary output signal /OUT. The reference potential Vref is intermediate the potential applied to the power supply potential node 2063 and the potential applied to the ground node. An operation of the dynamic latch shown in FIG. 129 will be described below with reference to an operation waveform diagram of FIG. 130.

When the clock signal CLK is at the low level, both the transistors 2060 and 2070 are off and the transistor 2076 is on. In this state, the dynamic latch is in the precharged state, and both the output nodes 2061 and 2067 are precharged to the supply potential level applied to the supply potential node 2063.

When the clock signal CLK is at the high level, both the transistors 2060 and 2070 are off and the transistor 2076 is on. When the input signal IN is at the low level lower than the reference potential Vref, the conductance of transistor 2064 is smaller than the conductance of transistor 2074, so that the output node 2067 is discharged through the output node 2061 at a high speed. When the potential of the output node 2067 lowers, the transistor 2062 is turned on, and the transistor 2066 is turned off, so that the output node 2061 is charged to the supply potential level at a high speed.

Meanwhile, in response to the rise of potential of the output node 2061, the transistor 2068 is turned off, and the transistor 2072 is turned on, so that the potential at the output node 2067 rapidly lowers to the low level. Thereby, the output signal OUT maintains the low level, and the complementary output signal /OUT maintains the high level. Meanwhile, after the potential levels of the output signals OUT and /OUT are once fixed at the low and high levels, respectively, those states do not change even if the input signal IN rises from the low level to the high level during the operation, because the current drive powers of transistors 2062, 2066, 2068 and 2072 are larger than the current drive powers of transistors 2064 and 2074.

When the clock signal CLK thereafter falls to the low level again, the output nodes 2061 and 2067 are charged by the transistors 2060 and 2070 to the supply potential level. During this, the transistor 2076 is off, and there is no discharging path for the nodes 2061 and 2067, so that the output nodes 2061 and 2067 are charged at a high speed.

When the clock signal CLK rises to the high level while the input signal IN is at the high level, the signal OUT sent from the output node 2067 attains the high level, and the signal /OUT sent from the output node 2061 attains the low level.

Owing to the above structures, the input signal IN can be taken in and latched at the rising edge of the clock signal CLK.

Figure 131:
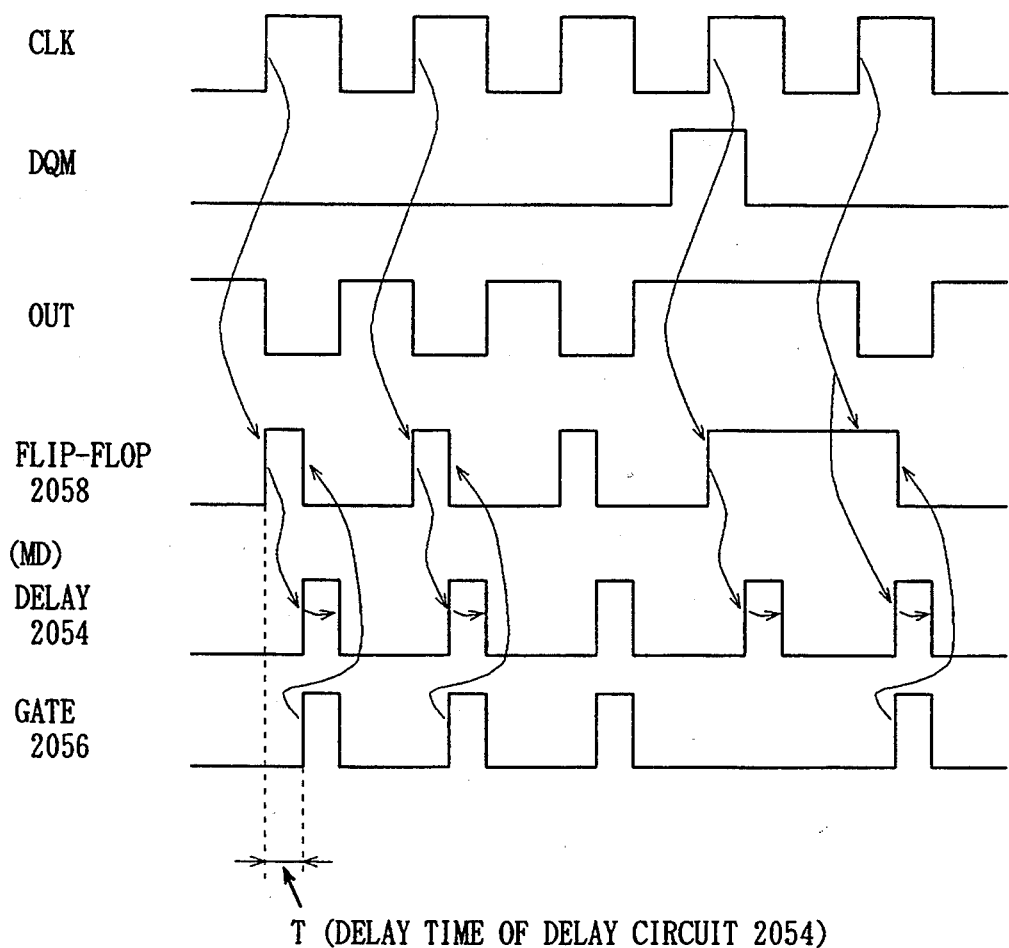

Then, an operation of the circuit shown in FIG. 128 will be described below with reference to an operation waveform diagram of FIG. 131. The output OUT of dynamic latch 2050 is precharged and maintained at the high level when the external clock signal ext.CLK is at the low level. At the rising edge of the clock signal CLK, the state of the external mask data ext.DQM applied to the input IN of latch 2050 is latched. If the external mask signal ext.DQM is at the low level at the rising edge of the external clock signal ext.CLK, the output signal OUT of latch 2050 maintains the low level while the clock signal CLK is at the high level.

The one-shot pulse generating circuit 2052 generates a pulse signal of one shot having a predetermined time width at the rising edge of the external clock signal ext.CLK. Since the flip-flop 2058 is set in response to the one-shot pulse coming from the one-shot pulse generating circuit 2052, the internal write mask signal MD sent from its Q-output rises to the high level.

When a predetermined time T elapses after the one-shot pulse generating circuit 2052 generated the one-shot pulse, the delay circuit 2054 generates a pulse of one shot. At this time, if the signal sent from the output OUT of dynamic latch 2050 is at the low level, the gate circuit 2056 passes the output of the delay circuit 2054. Thereby, the flip-flop 2058 is reset and supplies from its output Q the internal write mask signal MD at the low level.

If the external clock signal ext.CLK is at the high level, the output OUT of the dynamic latch 2050 is at the high level. In this state, the output of gate circuit 2056 is at the low level.

When the external write mask signal DQM is set at the high level at the rising edge of the external clock signal ext. CLK, the output OUT of dynamic latch 2050 does not change and maintains the high level even if the clock signal CLK rises. In this state, the output of gate circuit 2056 is fixed at the low level. Therefore, the flip-flop 2058 is not reset at this cycle, even if the one-shot pulse generating circuit 2052 generates a pulse of one shot and the flip-flop 2058 is set. Therefore, the internal write mask signal MD maintains the high level during the clock cycle at which this write mask signal DQM is applied, because the gate circuit 2056 neglects the one-shot pulse signal generated from the delay circuit 2054.

At the next cycle, if the external write mask signal ext.DQM is at the low level, the flip-flop 2058 is reset through the delay circuit 2054 and gate circuit 2056 after being set by the one-shot pulse sent from the one-shot pulse generating circuit 2052.

Owing to the aforementioned structure, the internal write mask signal MD is generated in every clock cycle, and the resetting of the internal write mask signal MD is inhibited if the external write mask signal ext.DQM is active and designates the write mask. Thereby, all the timings for writing internal data can be set based on periods from the rising edge of the internal clock signal CLK, so that data can be written at a high speed. Timings for activating other write control signals can be set by taking the delay time, which are provided by the delay circuit 2054, into consideration, and it is not necessary to take timing margins of the internal write control signal and internal write mask signal MD into consideration, so that data can be written at a high speed.

Even if the internal write mask signal MD is different in pulse width, for example, due to variation of manufacturing process parameters, the data writing is carried out when both of another internal write control signal and mask signal MD indicate the write state, so that it is not necessary to provide a margin in the timings for other internal write control signals.

FIG. 132 shows a modification of the dynamic latch. In FIG. 132, an n-channel MOS transistor 2080, which becomes conductive in response to an array active command instructing signal φAA, is disposed between an enabling transistor 2076 in the dynamic latch 2050 and the ground potential node 2065. The array active instructing signal φAA is active only during a period for which the access to the memory cells is designated. Therefore, the dynamic latch 2050 is active only when the access to the array is designated. The dynamic latch 2050 does not have a discharging path when the transistor 2080 is off, and thus both of its outputs OUT and /OUT maintain the high level. This can reduce power consumption in the dynamic latch 2050.

FIG. 133 shows a modification of the one-shot pulse generating part for setting the flip-flop which generates the internal write mask. In FIG. 133, an AND circuit 2081 which receives the array active detection signal φAA and external clock signal ext.CLK is disposed upstream the one-shot pulse generating circuit 2052. The AND circuit 2081 passes the external clock signal ext.CLK only when the array active detection signal φAA is at the high level. When the array active detection signal φAA is at the low level, the AND circuit 2081 supplies an signal at the low level. Therefore, the one-shot pulse generating circuit 2052 generates the pulse of one shot and thereby the setting and resetting of the flip-flop are executed only during the array active operation. Thereby, the one-shot pulse generating circuit 2052 can be restricted to generate the pulse only during the array active operation period, resulting in reduction of power consumption.

FIG. 134 is a modification of the one-shot pulse generating circuit. In FIG. 134, the one-shot pulse generating circuit 2052 includes a p-channel MOS transistor 2090 which receives an inverted signal /φAA of the array active detection signal φAA, a p-channel MOS transistor 2091 which receives an inverted signal of the output of the delay circuit 2053, and a p-channel MOS transistor 2092 which receives the inverted signal /CLK of the clock signal CLK. The transistors 2090–2092 are connected in series between the supply potential node 2063 and output node 2096.

The one-shot pulse generating circuit 2052 further includes an n-channel MOS transistor 2093 which receives on its gate the inverted clock signal /CLK, an n-channel MOS transistor 2094 which receives on its gate an inverted signal of the output of the delay circuit 2053, and an n-channel MOS transistor 2095 which receives on its gate the inverted array active detection signal /φAA. The transistor 2093–2095 are connected in parallel between the output node 2096 and ground potential node 2065.

If the delay circuit 2053 is formed of inverters coupled in tandem, an inverted signal of the output of delay circuit 2053 can be produced by the last odd inverter in the delay circuit 2053. In the structure of the one-shot pulse generating circuit shown in FIG. 134, when the array active detection signal φAA is at the high level and the array active command is applied, the signal /φAA is at the low level, the transistor 2090 is on, and the transistor 2095 is off. Thereby, the signal at the high level is output when both the inverted signal of the output of the delay circuit 2053 and the inverted clock signal /CLK attain the low level.

Meanwhile, in the precharged state, the array active detection signal φAA is at the low level, and the inverted array active detection signal /φAA is at the high level. In this state, the transistor 2090 is off, and the transistor 2095 is on, so that the output node 2096 is fixed at the ground potential level.

When the transistor 2090 is off, a connection node between the transistors 2090 and 2090, and a connection node between the transistors 2091 and 2092 mat be prevented from attaining the floating state by such a structure that an n-channel MOS transistors, which become conductive in response to the signal φAA, are provided between the output node 2096 and these nodes.

FIG. 135 shows a circuit structure for generating the array active detection signal φAA. In FIG. 135, the array active detection signal generating system includes an active command detecting circuit 2085 which detects application of the active command according to the signals /RAS and /WE, a precharge command detecting circuit 2086 which detects application of the precharge command according to the row address strobe signal /RAS and write enable signal /WE, and a set/reset flip-flop 2087 which is set according to an output of the active command detecting circuit 2085 and is reset according to an output of the precharge command detecting circuit 2086. The flip-flop 2087 sends from its Q-output the array active detection signal φAA. The active command detecting circuit 2085 and precharge command detecting circuit 2086 determine whether the active command and precharge command are applied or not based on combination of states of the signals /RAS and /WE shown in FIG. 39.

The structure shown in FIG. 135 may further utilize the chip select signal /CS. The signals /RAS and /WE may be internal signals or external signals. If these signals are external signal, the active command detecting circuit 2085 and precharge command detecting circuit 2086 take in states of these signals at the rising edge of the clock signal CLK for determining them. In this structures, the detecting circuits 2085 and 2086 do not essentially require the latch circuit. They can be formed of only logic gates, because the flip-flop 2087 is used, and the flip-flop 2087 can be set and reset by the pulse signal.

If there is a margin in timings, such a structure may be used that this flip-flop 2058 operates only when the write command is applied.

FIGS. 136A and 136B show a modification of the internal mask data generating circuit and its operation waveform.

Referring to FIG. 136A, the internal mask data generating circuit includes an one-shot pulse generating circuit 2100 generating a pulse signal φCK which becomes high for a predetermined period in response to the rise of the external clock signal ext.CLK, a dynamic latch 2102 which receives on it latch enable input LE the one-shot pulse signal φCK and also receives on its input IN the external write mask signal ext.DQM, an inverter circuit 2106 which inverts the one-shot pulse signal φCK, a delay circuit 2104 which delays an output OUT of the dynamic latch 2102 by a predetermined time, and a flip-flop 2108 which is set in response to the fall of the signal /φCK coming from the inverter circuit 2106 and is reset when the output signal DQM coming from the delay circuit 2104 is low. The flip-flop 2108 supplies from its Q-output the internal write mask signal MD.

The dynamic latch 2102 has a structure similar to that of the circuit already described with reference to FIG. 129. The dynamic latch 2102 takes in the external write mask signal ext.DQM applied to its input IN when the signal $\phi$CK applied to the latch enable input LE is high, and supplies the same from its output node OUT. If the signal $\phi$CK is low, the output OUT of the dynamic latch 2102 attains the high level. The flip-flop 2108 raises its output MD to the high level when the signal /$\phi$CK applied to its set input /S attains the low level. The flip-flop 2108 is reset when the signal DQM applied to its reset input /R is low, and thereby lowers the internal write mask signal MD to the low level. An operation of the internal write mask signal generating circuit shown in FIG. 136A will be described below with reference to an operation waveform diagram shown in FIG. 136B.

When the internal clock signal ext.CLK rises to the high level, the signal $\phi$CK is generated in response to this. This signal $\phi$CK maintains the high level during a predetermined time width which is determined by a delay time of the delay circuit included in the one-shot pulse generating circuit 2100. Thereby, the dynamic latch 2102 takes in the currently applied external write mask signal ext.DQM. The inverter circuit 2106 inverts the signal $\phi$CK to generate the signal /$\phi$CK. Thereby, the flip-flop 2108 is set, and the internal write mask signal MD rises to the high level. The delay circuit 2104 delays the signal generated from the output OUT of the dynamic latch 2102 by a predetermined time. When the external write mask signal ext.DQM is at the low level and the signal $\phi$CK is at the high level, the output OUT of the dynamic latch 2102 attains the low level. When the signal /$\phi$CK rises to the high level, the flip-flop 2108 is reset because the signal DQM supplied from the delay circuit 2104 is at the low level. Thereby, the internal write mask signal MD falls to the low level.

If the external write mask signal ext.DQM is at the high level when the external clock signal ext.CLK rises, the output DQM of the delay circuit 2104 maintains the high level during this clock cycle period. Therefore, the flip-flop 2108 is not reset, and the internal write mask signal MD maintains the high level.

Owing to the aforementioned structure, activation and inactivation of the internal write mask signal MD can be decided according to activation and inactivation of the external write mask signal ext.DQM.

As described above, the internal write mask signal is set at the active state in synchronization with the external clock CLK, and the internal write mask signal will be continuously maintained at the active state only when the write mask signal is externally applied. Owing to this structure, it is not necessary to take a timing relationship between the internal write mask signal and other write control signals into consideration, and thus data can be written at a high speed.

[Reference Voltage Generating Circuit]

FIG. 137 shows a configuration of a data output part of the SDRAM. In FIG. 137, output buffer circuits OB0–OB7 are provided for the data output terminals Q0–Q7, respectively. Each of the output buffer circuits OB0–OB7 may be formed of the output buffer 12 shown in FIG. 1 or the output buffer 702 shown in FIG. 45, and further may include the latch circuit LA and tri-state inverter buffer TB8 as well as the output buffer shown in FIGS. 46 and 47. It may includes the latch circuit LA and advance-reading latch circuit 820 as well as the output buffer 702 shown in FIG. 63.

The output buffer circuits OB0–OB7 are activated in response to the output enable signal $\phi$OE to produce read data from internal data and transmit the produced read data to the corresponding data output terminals Q0–Q7, respectively.

The output buffer circuits OB0–OB7 operate with operation supply voltages formed of a boosted voltage supplied from an internal voltage generating circuit 1500 which supplies an internal voltage in response to the clock signal CLK. The internal voltage generating circuit 1500 raises the voltage Vcc, which is supplied from the power supply terminal, in response to the clock signal CLK. By operating the output buffer circuits OB0–OB7 with the boosted voltage, the output buffer circuits OB0–OB7 are operated at a high speed.

FIG. 138 shows a specific configuration of the output buffer circuit, and particularly, shows only a circuit portion connected to the data output terminal Qi. In FIG. 138, the output buffer circuit OBi includes a preamplifying stage 1502 which is activated in response to the output enable signal $\phi$OE for inverting and amplifying an internal read data IQi, and an output stage 1504 which is activated in response to the output enable signal $\phi$OE to invert and amplify an output signal of the preamplifying stage 1502 for transmitting the same to the data output terminal Qi. The preamplifying stage 1502 and output stage 1504 receive, as the operation supply voltage, the supply voltage Vc transmitted from the internal voltage generating circuit 1500 shown in FIG. 137.

The preamplifying stage 1502 includes a p-channel MOS transistor 1510 which is interposed between the power supply voltage supply node Vc ("Vc" is used to indicate both the supply voltage and the signal line transmitting the same) and an output node 1518 and is turned on in response to the internal read data IQi, a p-channel MOS transistor 1512 which is arranged in parallel to the transistor 1510 and receives on its gate the output enable signal $\phi$OE, an n-channel MOS transistor 1514 which has one conduction terminal (drain) connected to the output node 1518 and a gate receiving the internal read data IQi, and an n-channel MOS transistor 1516 which is arranged between the other conduction terminal (source) of the transistor 1514 and the ground potential supply node and receives on its gate the output enable signal $\phi$OE.

The output stage 1504 includes a p-channel MOS transistor 1520 which receives on its gate the complementary output enable signal /$\phi$OE and has one conduction terminal connected to the supply voltage supply node Vc, an n-channel MOS transistor 1526 which receives on its gate the output enable signal $\phi$OE and has one conduction terminal connected to the ground potential supply node, and a p-channel MOS transistor 1522 and an n-channel MOS transistor 1524 which are complementarily connected between the transistors 1520 and 1526 and receive on their gates the output of the preamplifying stage 1502. An operation will be briefly described below.

If the output enable signal $\phi$OE is "L" and the data output is inhibited, the transistor 1516 is in the OFF state and the transistor 1512 is in the ON state. In the head preamplifying stage 1502 in this state, the output node 1518 is charged to the supply voltage (raised voltage) Vc level regardless of the state of the internal read data IQi. In the output stage 1504, both the transistors 1520 and 1526 are in the OFF state and hence the output high-impedance state is maintained.

When the signal $\phi$OE rises to "H", the data output enable state is attained. In this state, the transistor 1516 is in the ON state, and the transistor 1512 is in the OFF state, so that the preamplifying stage 1502 functions as an inverter to invert and amplify the internal read data IQi for transmitting the same to the output node 1518. In the output stage 1504, both the transistors 1520 and 1526 are turned on to function as an inverter, and thus invert and amplify the signal applied to the output node 1518 from the preamplifying stage 1502 for transmitting the same to the data output terminal Qi. An operation speed of the MOS transistors depends on the supply voltage, and in particular, the level of their gate voltage. Owing to the fact that the boosted voltage Vc is supplied from the internal voltage generating circuit 1500 as the operation supply voltage, the output stage 1504 operates at a high speed, and the data output terminal Qi can be charged and discharged at a high speed.

FIG. 139 shows another structural example of an output buffer circuit OBi. In FIG. 139, the output buffer circuit OBi includes a two-input NAND circuit 1530 which receives the output enable signal $\phi$OE and internal read data IQi, an inverter circuit 1531 inverting an output of the NAND circuit 1530, a p-channel MOS transistor 1533a disposed between the raised supply voltage node Vc and a transistor 1535a, and a p-channel MOS transistor 1533b disposed between the raised supply voltage node Vc and a transistor 1535b.

The transistor 1535a receives on its gate an output signal of the NAND circuit 1530. The n-channel MOS transistor 1535b receives on its gate an output of the inverter circuit 1531. The transistors 1533a and 1533b have drains and gates cross-coupled to form a latch circuit.

The output buffer OBi further includes an inverter circuit 1537 which inverts and amplifies a signal on a connection node between the transistors 1533b and 1535b, and an n-channel MOS transistor 1534 which receives on its gate an output signal of the inverter circuit 1537. The transistor 1534 is disposed between the operation supply voltage supply node Vcc and the output node. The inverter circuit 1537 operates using the raised supply voltage Vc as the operation supply voltage.

The output buffer OBi further includes a gate circuit 1532 which receives the output enable signal $\phi$OE and internal read data IQi, a buffer circuit 1539 including two inverters connected in tandem for delaying an output of the gate circuit 1532 by a predetermined time, and an n-channel MOS transistor 1536 which becomes conductive in response to an output of the buffer circuit 1539. The transistor 1536 is disposed between the output node and ground potential node. The gate circuit 1532 receives on its false input the output enable signal $\phi$OE and receives on its true input the internal read data IQi. The gate circuit 1532 outputs a signal at the low level when the output enable signal $\phi$OE is at the low level or the internal read data IQi is at the high level.

The purpose of the buffer circuit 1539 is to establish such a relationship that the delay time determined by the inverter latch and inverter circuit disposed between the NAND circuit 1530 and output driving transistor 1534 is equal to the delay time between the gate circuit 1532 and the output driving transistor 1536. Then, an operation will be briefly described below.

When the output enable signal $\phi$OE is low, the output of the NAND circuit 1530 is high and the output of the gate circuit 1532 is low. In this state, the transistor 1535a is on and thereby turns on the transistor 1535b. The transistor 1535b is off because it receives on its gate the output signal of the inverter circuit 1531. Therefore, the transistor 1533a is also off. Therefore, the inverter circuit 1537 supplies a signal at the low level, and the n-channel MOS transistor 1534 is off.

Similarly, the gate circuit 1532 supplies the signal at the low level, whereby the n-channel MOS transistor 1536 is off, and the output high impedance state is attained.

When the output enable signal $\phi$OE attains the high level, the NAND circuit 530 functions as an inverter, and the gate circuit 1532 similarly functions as an inverter. If the internal read data IQi is high, the output of the NAND circuit 1530 becomes low, and the output of gate circuit 1532 also becomes low. In this state, the transistor 1536 is off. Meanwhile, the transistor 1535a is off, and the transistor 1535b is on, so that the transistor 1533b is off, and the transistor 1533a is on. Thereby, the potential of the connection node between the transistors 1533b and 1535b is quickly discharged by the transistor 1535b. The inverter 1537 outputs the signal at the high level, i.e., the level of the raised supply voltage Vc. Thereby, the n-channel MOS transistor 1534 produces on its output terminal the output signal Qi at the level of the operation supply potential Vcc without causing loss of its threshold voltage.

If the internal read voltage IQi is low, outputs of both the NAND circuit 1530 and gate circuit 1532 are high. Thereby, the transistor 1536 is on. Meanwhile, the transistor 1535a is on and the transistor 1535b is off, so that the transistor 1533b is on and the transistor 1533a is off. Therefore, the inverter 1537 receives on its input node the signal at the raised supply voltage Vc level through the transistor 1533b. The output of the inverter 1537 attains the ground potential level, i.e., low level, and the n-channel MOS transistor 1534 is turned off. The transistor 1536 is turned on in response to the signal at the high level sent from the gate circuit 1536, and thereby the output signal Qi at the ground potential level is produced.

Also in the structure shown in FIG. 139, the internal signal can be quickly raised owing to utilization of the raised supply voltage Vc, and thus the output data Qi can be output at a high speed. Even if both the transistors 1534 and 1536 at the output stage are formed of n-channel MOS transistors, loss of the threshold voltage does not occur in the drive transistor 1534 and thus the signal at the operation supply voltage Vcc level can be output, because the operation supply voltage of the inverter circuit 1537 is the raised supply voltage Vc.

In either of the structures shown in FIGS. 138 and 139, the raised supply voltage Vcc is utilized in the output buffer, whereby the internal node can be charged quickly in accordance with the internal data, and thus data can be read at a high speed.

FIG. 140 shows a configuration of an internal voltage generating circuit shown in FIG. 137. In FIG. 140, the internal voltage generating circuit 1500 includes a frequency-dividing circuit 1600 which performs the frequency dividing on the clock signal CLK to produce the internal clock signals CLK1–CLK4 having equal frequencies and shifted phases with each other, and charge-pump circuits 1602a, 1602b, 1602C and 1602d performing charge-pump operation in response to the clock signals CLK1, CLK2, CLK3 and CLK4 coming from the frequency dividing circuit 1600 for generating boosted voltages, respectively. The charge-pump circuits 1602a–1602d supply output voltages commonly to an output node 1603.

FIG. 141 is a waveform diagram showing an operation of the internal voltage generating circuit shown in FIG. 140. The operation will be described below with reference to FIG. 141.

The frequency dividing circuit 1600 frequency-divides by four the clock signal CLK to produce the clock signals CLK1–CLK4 having quartered frequencies. The clock signals CLK1–CLK4 have phases shifted by a ¼ cycle (i.e., one cycle of the clock signal CLK) from each other. These internal clock signals CLK1–CLK4 are applied to the charge pump circuits 1602a–1602d, respectively. Therefore, the charge pump circuits 1602a–1602d generate the boosted voltages of which phases are shifted by a ¼ cycle from each other. The internal clock signals CLK1–CLK4 have phases synchronized with that of the clock signal CLK. The boosted voltage is generated in synchronization with the rise of the clock signal CLK. In each cycle of the clock signal CLK, one of the charge-pump circuits operates to generate the boosted voltage. Therefore, the boosted voltage can always be generated stably at the rising edges of the clock signal CLK. The valid data is read at the rising edge of the clock signal CLK. Therefore, the output buffer circuit can always and stably output data at a high speed.

If a ring oscillator in which inverters are arranged in odd stages were used to generate the internal clock signal for driving the charge-pump circuit, following disadvantage would generate. The cycle time of the clock signal generated by the ring oscillator changes in accordance with the supply voltage and the operation temperature. Therefore, the timing of generation of the boosted voltage by the charge pump circuit also changes, so that the boosted voltage cannot be stably supplied. Therefore, the potential level of the data supplied from the output buffer circuit changes, and hence it is impossible to successively output the valid data at a high speed.

According to the structure shown in FIG. 140, the boosted voltage can be always and stably supplied at the rising edges of the clock signal CLK at which the valid data is output, as described before. Therefore, the data can be successively output at a high speed. Then, specific configurations of respective circuits will be described below.

FIG. 142 shows an example of a specific configuration of the frequency dividing circuit shown in FIG. 140. In FIG. 142, the frequency dividing circuit 1600 includes four flip-flops FF100, FF101, FF102 and FF103 connected in series. A output Q94 of the flip-flop FF103 is coupled to a complementary input /IN of the flip-flop FF100 in the first stage, and is also coupled to an input IN of the flip-flop FF100 through an inverter circuit 1650. The flip-flops FF100 and FF102 receive on their clock inputs K the clock signal CLK. The flip-flops FF101 and FF103 receive on their clock inputs K the clock signal CLK through an inverter circuit 1652. The frequency dividing circuit 1600 forms a quadary ring counter circuit. The flip-flops FF100–FF104 each have a configuration shown in FIG. 143.

In FIG. 143, the flip-flop FF (FF100–FF103) includes NAND circuits 1660, 1662, 1664 and 1666. The NAND circuits 1660 and 1662 invert and pass signals currently applied to their inputs IN and /IN when the clock signal applied to the clock input K is "H". The NAND circuits 1664 and 1666 invert and latch outputs of the NAND circuits 1660 and 1662. The flip-flop FF shown in FIG. 143 has the same configuration as the flip-flop shown in FIG. 80. The flip-flop FF attains a through state allowing passage of the signal in response to the rise of the signal applied to the clock input K, and attains the latch state for outputting the signal already applied thereto in response to the rise of the signal applied to the clock input K regardless of the signal potential applied to the inputs IN and /IN. An operation of the frequency dividing circuit shown in FIGS. 142 and 143 will be described below with reference to an operation waveform diagram of FIG. 144.

The flip-flops FF100–FF103 receive on the clock inputs K the clock signal CLK. Therefore, change of the output of the flip-flop FF100 is sequentially transmitted to the outputs of the respective flip-flops FF101–FF103 with delay of 1 clock cycle. When the clock signal CLK rises to "H", the flip-flops FF100 and FF102 attain the through state and pass the signals applied to their inputs IN and /IN. Thereby, an output Q91 of the flip-flop F101 rises to "H". An output of the flip-flop FF102 does not change because the output Q92 of the flip-flop FF101 is "L".

When the clock signal CLK falls, the flip-flops FF101 and FF103 attain the through state. In response to this, the output Q92 of the flip-flop FF101 rises to "H". An output Q94 of the flip-flop FF103 does not change because an output Q93 of the flip-flop FF102 is "L".

When the clock signal CLK rises to "H" again, the output Q93 of the flip-flop FF102 rises to "H" in accordance with the output Q92 of the flip-flop FF101. Since the output Q94 of the flip-flop FF103 is still "L", the output Q91 of the flip-flop FF100 maintains "H". When the clock signal CLK falls again, the output Q94 of the flip-flop F103 rises to "H" in accordance with the output Q93 of the flip-flop FF102. In response to this, the output of the inverter circuit 1650 changes to "L". Therefore, the output Q91 of the flip-flop FF100 falls to "L" in response to the next rise of the clock signal CLK, and then the outputs Q92–Q94 sequentially fall to "L" at timings shifted by a half of cycle of the clock signal CLK.

In the frequency dividing circuit 1600, outputs Q91 and Q93 are used as the internal clock signals CLK1 and CLK2, and the complementary outputs /Q91 and /Q93 of the flip-flops FF100 and FF102 are utilized as the internal clocks CLK3 and CLK4, respectively, whereby the internal clock signals CLK1–CLK4 can have the signal waveforms shown in FIG. 141. By utilizing the frequency dividing circuit thus constructed, two clock signals can be active in any cycle of the clock signal CLK and the charge pump operation can be executed.

FIG. 145 shows a specific structural example of the charge pump circuit shown in FIG. 140. In FIG. 145, the charge pump circuits 1602a–1602d shown in FIG. 140 are representatively indicated by a reference number 1602.

In FIG. 145, the charge pump circuit 1602 includes an inverter circuit 1670 receiving the clock signal K (i.e., one of the clock signals CLK1–CLK4), a capacitor 1672 capacitance-coupling an output of the inverter circuit 1670 to a node N100, a capacitor 1674 capacitance-coupling the clock signal K to a node N102, a capacitor 1676 transmitting the clock signal K to a node N104 by virtue of capacitance-coupling, a diode-coupled n-channel MOS transistor 1678 charging the node N100 to a predetermined potential, n-channel MOS transistors 1680 and 1682 charging the nodes N104 and N102 in response to the signal potential on the node N100, respectively, and an n-channel MOS transistor 1684 which has one conduction terminal connected to the node N104, a gate connected to the node N102 and the other conduction terminal connected to the output node OUT. An operation of the charge pump circuit shown in FIG. 145 will be described below with reference to an operation waveform diagram of FIG. 146.

The node N100 has been charged by the transistor 1678 to have a potential level of Vcc-VTH, where VTH is a threshold voltage of the transistor 1678. In the following description, it will be assumed that the transistors 1680, 1682 and 1684 have the same threshold voltage VTH. Owing to the potential Vcc-VTH on the node N100, the transistors 1680 and 1682 are turned on to charge the nodes N102 and N104 to Vcc-2.VTH, respectively. When the clock signal K falls to "L", the potential of the node N100 rises to the level of 2.Vcc-VTH. Thereby, the transistors 1680 and 1682 transmit the power supply voltage Vcc to the nodes N102 and N104, respectively. In response to the fall of the clock signal K, the potential level of the nodes N104 and N102 lower through the capacitors 1672 and 1674, respectively. The lowering of the potentials are compensated for by the transistors 1682 and 1680, and they are restored to the supply potential Vcc level.

The transistor 1684 transmits the potential of the node N104 to the output node OUT. The output node OUT in the initial state has been charged to a level of Vcc-3.VTH. In response to the rise of the clock signal K, the potential levels of the nodes N102 and N104 rise to the Vcc level, so that the potential level of the output node OUT rises to the level of Vcc-2.VTH.

When the clock signal K rises to "H", the potential of the node N100 temporarily lowers, and then is restored to the level of Vcc-VTH. Thereby, the voltage levels transmitted by the transistors 1680 and 1682 attain the potential level of Vcc-2.VTH. In response to this rise of the clock signal K, the potentials of the nodes N102 and N104 rise to the level of 2.Vcc-2.VTH. Thereby, the potential level of the output node OUT attains the potential level of 2.Vcc-3.VTH.

Thereafter, when the clock signal K falls to "L" again, the potential level of the node N100 is raised by Vcc, and the potential levels of the nodes N102 and N104, to which the current is supplied from the power supply node, are restored to the supply potential Vcc level. By repeating the above operation, the nodes N102 and N104 in the stable state change in potential between the levels of 2.Vcc and Vcc. In this stable state, the output node OUT is stabilized at the potential level of 2.Vcc-VTH. In accordance with the rise of the clock signal K, the charge is supplementally supplied from the node N104 through the transistor 1684 to the output node OUT so as to compensate for the potential lowering of the output node OUT. When the nodes N102 and N104 are at the supply voltage Vcc level, the potential level of the output node OUT is 2.Vcc-VTH level, so that the transistor 1684, of which gate and drain are maintained at the same voltage, functions as a diode and is turned off.

Therefore, by generating the internal voltage with the charge pump circuit shown in FIG. 145, the charge pump operation is performed in response to the rise of each of the internal clock signals CLK1-CLK4, and the charge is supplementally supplied to the output node of the charge pump circuit while the internal clock signal is "H", so that the internal boosted voltage can be stably generated. Also, in the cycle in which one charge pump operation by the precharge pump circuit is terminated, another charge pump circuit performs the charge pump operation in response to the rise of the clock signal CLK, and the boosted voltage can be surely and stably produced at the rising edge of the clock signal CLK defining the timing of the valid data reading.

[Another Internal Voltage Generating Circuit]

FIG. 147 shows a configuration of another internal voltage generating circuit. In FIG. 147, the internal voltage generating circuit 1800 includes the frequency dividing circuit 1600 which divides the clock signal CLK, a switch circuit 1802 which selectively deactivates the internal clock signal supplied from the frequency dividing circuit 1600 in response to an output bit size selecting signal /BS, and charge pump circuits 1602a–1602d which perform the charge pump operations to produce the boosted voltage in accordance with the internal clock signals CLK1-CLK4 coming from the switch circuit 1802. The frequency dividing circuit 1600 and charge pump circuit 1602a–1602d have the same configurations as those shown in FIG. 140. The switch circuit 1802 deactivates some of the internal clock signals CLK1-CLK4 in accordance with the output bit size selecting signal /BS.

The SDRAM is generally constructed to perform input and output of data in units of 8 bits. By utilizing wire bonding, the SDRAM may be constructed to have a x4-bit configuration. In the case of x4-bit configuration, only the output buffers which are related to the four data output terminals actually operate. The remaining output buffers do not operate, so that they do not require the boosted voltage. A driving capability of the internal voltage generating circuit 1800 is determined so that it can stably drive the output buffers in the case of the x8-bit configuration. Therefore, if SDRAM were changed into the x4-bit configuration, the driving capability would be excessively large, resulting in superfluous consumption of power. In view of this, there is provided the switch circuit 1802 shown in FIG. 147 to adjust the driving capability of the internal voltage generating circuit 1800 so as to comply with the output bit size. For example, when the x4-bit configuration is designated, operations of the two charge pump circuits are inhibited. Thereby, the power consumption is reduced.

FIG. 148 shows an example of a specific configuration of the switch circuit shown in FIG. 147. In FIG. 148, the switch circuit 1802 includes an AND circuit 1810 which receives the output bit size selecting signal /BS as well as the internal clock signal CLK2 coming from the frequency dividing circuit, and an AND circuit 1812 which receives the output bit size selecting signal /BS as well as the internal clock signal CLK4 coming from the frequency dividing circuit. The internal clock signals CLK1 and CLK3 do not gated and pass therethrough. The clock signals from the switch circuit 1802 are transmitted to the corresponding charge pump circuits. If the output bit size selecting signal /BS is "L", both the AND circuits 1810 and 1812 fix their outputs at "L". In this case, since the internal clock signals CLK2 and CLK4 applied to the charge pump circuits are "L", the charge pump circuits 1602b and 1602d do not perform the charge pump operation. Only the charge pump circuits 1602a and 1602c alternately perform the charge pump operation. The stability of the raised voltage at the rise of the clock signal CLK is ensured.

If the output bit size selecting signal /BS is "H", the AND circuits 1810 and 1812 function as the buffer circuits. In this case, the charge pump circuits 1602a–1602d each perform the charge pump operation.

FIG. 149 shows a configuration of an output bit size selecting signal generating circuit. In FIG. 149, the output bit size selecting signal generating circuit 1820 detects a potential of a bonding pad 1822 to generate the output bit size selecting signal /BS. The circuit 1820 includes a resistor 1824 of a high resistance interposed between a supply voltage Vcc supply node and an internal node 1829, an inverter circuit 1826 inverting and amplifying a signal potential of the internal node 1829, and an inverter circuit 1828 inverting and amplifying an output of the inverter circuit 1826. The pad 1822 is normally in a floating state. In this case, the output bit size is set at the maximum output bit size, e.g., of x8 bits. When the pad 1822 is in the floating state, the internal node 1829 is maintained at the supply potential Vcc level through the high-resistance resistor 1824, so that the selecting signal /BS is "H".

If the output bit size is reduced, e.g., to 4 bits, the pad 1822 is coupled to the ground potential Vss through a bonding wire 1830. In this situation, the potential level of the internal node 1829 is "L" and the selecting signal /BS is "L". Since the resistor 1824 has a high resistance, only a minute current, which is substantially negligible, flows from the supply voltage Vcc supply node through the high-resistance resistor 1824 and bonding wire 1830.

Although the output bit sizes of 8 bits and 4 bits have been described, other bit sizes can be combined in any manner. The logic of the selecting signal /BS may be reversed. Without using the high-resistance resistor, such a configuration may be used that the pad 1822 is connected to the supply voltage Vcc level or the ground potential Vss level in accordance with the output bit size.

[Further Internal Voltage Generating Circuit]

FIG. 150 shows a configuration of a further embodiment of an internal voltage generating circuit of the invention. In FIG. 150, an internal voltage generating circuit 1900 includes an AND circuit 1902 receiving the clock signal CLK and a read mode instructing signal φread, and the internal voltage generating circuit 1500 having a configuration similar to that of the internal voltage generating circuit shown in FIG. 140. The read mode instructing signal φread is activated only in the data read mode. Therefore, the internal voltage generating circuit 1900 shown in FIG. 150 generates the boosted voltage Vc only in the data read operation. The output buffer circuit operates only in the data read operation. Therefore, the operation of the internal voltage generating circuit 1500 is controlled in accordance with the read mode instructing signal φread, whereby the charge pump operation can be performed only when required, and thus the power consumption can be reduced.

FIG. 151 shows a circuit configuration for generating the read mode instructing signal φread. In FIG. 151, the read mode instructing signal generating circuit includes a read detecting circuit 1904 which detects the fact that the read mode is designated in response to the clock signal CLK and signals /CAS and /WE, and a signal generating circuit 1906 generating a signal, which maintains the active state for a predetermined period, in response to the read detection signal φR coming from the read detecting circuit 1904. A signal generating circuit 1906 generates the read mode instructing signal φread. An operation of the circuitry shown in FIG. 151 will be described below with reference to an operation waveform diagram of FIG. 152.

First, the signal /CAS falls to "L" at the rise of the clock signal CLK and the signal /WE is set at "H", so that the read mode is designated. In response to this, the read detecting circuit 1904 generates the pulse signal φR of one-shot. The signal generating circuit 1906 generates the clock signal CLK in response to the read detection signal φR. The active state of the signal φread is required only for a period for outputting data, and, in an example shown FIG. 152, the clock cycle period in which the read mode detection signal φread is inactive is equal in number to a sum of the latency and the wrap length. The signal OEM already described in connection with FIG. 84 may be utilized as the read mode detection signal φread.

[Further Another Internal Voltage Generating Circuit]

FIG. 153 shows a further another structure of the internal voltage generating circuit of the invention. In FIG. 153, the internal voltage generating circuit 1910 includes an internal voltage generating circuit 1914 provided for the bank #A, an internal voltage generating circuit 1916 provided for the bank #B, and a switch circuit 1912 which selectively transmits the clock signal CLK to the internal voltage generating circuits 1914 and 1916 in accordance with the bank selecting signals BAA and BAB. The SDRAM shown in FIG. 1 includes independent output buffers which are provided for the banks #A and #B, respectively. Therefore, the internal raised voltage can be supplied only to the selected bank, when required, so that the power consumption can be reduced. This internal voltage generating circuit may not be used to supply the supply voltage for driving the output buffer circuit, but may be used to generate the boosted word line drive signal, as will be described below, in which case the internal boosted voltage can be generated with an appropriate power consumption in accordance with the operation modes of the banks #A and #B. For example, if the banks #A and #B are activated in an overlapped manner and in a pipelined form, the internal voltage generating circuits 1914 and 1916, which are provided for the banks #A and #B, respectively, can be driven to stably supply the internal voltage as required even when a plurality of banks simultaneously operate.

FIG. 154 shows a configuration of a switch circuit 1912 shown in FIG. 153. In FIG. 154, the switch circuit 912 includes an AND circuit 1920 receiving the bank selecting signal BAA and clock signal CLK, and an AND circuit 1922 receiving a clock signal CLK and the bank selecting signal BAB. The AND circuit 1920 supplies its output to the internal voltage generating circuit 1914 for the bank #A. The AND circuit 1922 supplies its output to the internal voltage generating circuit 1916 for the bank #B. The bank selecting signals BAA and BAB attain the active state of "H" when the banks #A and bank #B are designated, respectively. For the unselected bank, the output of the AND circuit is fixed at "L", and the corresponding internal voltage generating circuit does not receives the clock signal, so that the charge pump operation is not executed.

The bank selecting signals BAA and BAB are generated by latching the bank address BA at the fall of the signal /CAS, if the internal voltages VCA and VCB generated by the internal voltage generating circuits 1914 and 1916 are operation supply voltages of the output buffer. In the case where the internal voltage generating circuit is used to generate the voltage for driving the word line, the bank selecting signals BAA and BAB are generated by latching the bank address BA at the fall of the signal /RAS. The bank designating signal already discussed may be utilized.

[Another Application of Internal Voltage Generating Circuit]

FIG. 155 shows an example of practical application of the internal voltage generating circuit of the invention. In FIG. 155, the internal voltage generating circuit 1950 is used to generate the word line drive signal for the selected word line in the memory cell array 1958. By raising the potential of the word line above the supply voltage Vcc, the data of the selected memory cells can be read at a high speed without signal loss which may be caused by the threshold of the access transistors in the memory cells. Particularly in recent years, the level of the operation supply voltage Vcc has been lowered to 3 V or 1.25 V in some cases for the purposes of increasing the storage capacity of the semiconductor memory device, increasing the operation speed and reducing the power consumption. In such cases, it is necessary for the accurate memory operation to read a sufficient read voltage onto a bit line at a high speed. For this purpose, word line drive signals prepared by further boosting the supply voltage have been used. FIG. 155 representatively shows one word line WL and one bit line BL as well as one memory cell MS arranged at a crossing between them in the memory cell array 1958.

In the memory cell array 1958, there is provided an x-decoder circuit 1954 which decodes the X-address (row address) for selecting the word line, and a word line drive circuit 1956 which transmits the word line drive signal onto the selected word line in accordance with the output of the X-decoder circuit 1954. FIG. 155 shows, as an example, a configuration of an AND-type decoder circuit provided correspondingly to one word line in the X-decoder circuit 1954. A NAND-type decoder circuit may be used. In connection with the word line drive circuit 1956, there is representatively shown circuit elements related to one word line. The word line drive circuit 1956 receives a boosted word line drive signal through a high voltage generating circuit 1952. The high voltage generating circuit 1952 transmits, as the word line drive signal, the boosted voltage Vc generated by the internal voltage generating circuit 1950 in response to a word line drive timing defining signal $\phi X$.

The word line drive circuit 1956 includes a gate transistor 1962 which functions as a resistor passing an output coming from a unit decode circuit 1960, an n-channel MOS transistor 1966 which is turned on in response to an output of the gate transistor 1962 and transmits the boosted word line drive signal applied from the high voltage generating circuit 1952 to the word line WL related thereto, an inverter circuit 1964 inverting the output of a unit decoder circuit 1960, and an n-channel MOS transistor 1968 which is responsive to an output of the inverter circuit 1964 to discharge the potential of the word line WL to the ground potential level. An operation will be briefly described below.

The internal voltage generating circuit 1950 operates in accordance with the clock signal CLK and the internal supply voltage (or internally down-converted voltage) Vcc (i.e., it operates in accordance with the configuration of the embodiment described before), and generates the boosted voltage Vc. In the X-decoder circuit 1954, if the unit decode circuit 1960 is selected, its output signal attains the "H" level. Thereby, the transistor 1966 is turned on, and the transistor 1968 is turned off. The high voltage generating circuit 1952 generates the word line drive signal at the boosted voltage VC level in accordance with the timing signal $\text{SM} X$. The transistor 1966 receives the boosted word line drive signal from the high voltage generating circuit 1952 and transmits the same onto the word line WL. In this operation, owing to the self-bootstrap effect of the transistor 1966, its gate voltage rises to the boosted voltage level, and the word line drive signal of which voltage is boosted is transmitted onto the selected word line WL. The access transistor in the memory cell MS is turned on at a high speed, and information stored in the memory cell capacitor is transmitted onto the corresponding bit line BL. The gate transistor 1962 is provided for the purpose of preventing an adverse effect on the unit decode circuit 1960 by the boosted voltage of the gate due to the self-bootstrap effect of the transistor 1966. Therefore, the gate of the gate transistor 1962 receives the voltage at the operation supply voltage Vcc level. As for unselected word line, the transistor 1966 is turned off, and the transistor 1968 is turned on. The potential level of the unselected word line is maintained at the ground potential level.

In the configurations described above, the internal voltage generating circuit 1950 may be formed of the internal voltage generating circuit which has already been described in connection with the first to fourth embodiments, whereby the boosted word line drive signal can be stably generated for driving the selected word line.

[Modification of the Charge Pump Circuit]

FIG. 156 shows a modification of the charge pump circuit. A charge pump circuit 1980 shown in FIG. 156 generates a negative voltage VBB. Generally, in the semiconductor memory device, a negative voltage is applied to P-type substrate regions or P-type well regions for the purposes of preventing soft error, reduction of junction capacitance of MOS transistors and/or generation of a parasitic MOS transistor. A circuit for generating such a negative voltage may be formed of an internal voltage generating circuit in the first to fifth embodiments described before. In FIG. 156, the charge pump circuit 1980 includes a capacitor 1982 receiving the clock signal CLK, an n-channel MOS transistor 1984 which is diode-coupled and interposed between one electrode node 1985 of the capacitor 1982 and the ground potential, an n-channel MOS transistor 1986 which is diode-coupled and interposed between a node 1985 and an output node 1987.

The transistor 1986 is in the ON state when the potential of the node 1987 is higher than the potential of the node 1985. The transistor 1984 is in the ON state when the potential of the node 1985 is higher than the ground potential level (exactly, not lower than its threshold voltage). An operation of the charge pump circuit 1980 shown in FIG. 156 will be briefly described below.

When the clock signal CLK rises to "H", the potential of the node 1985 rises to "H". The potential of the node 1985 is discharged through the transistor 1984, and its potential attains the threshold voltage VTH level of the transistor 1984. When the clock signal CLK falls to "L", the potential of the node 1985 lowers to the VTH-Vcc level. Thereby, the transistor 1986 is turned on, and the potential of the output node 1987 is lowered. When the clock signal CLK rises to "H", the potential of the node 1985 rises again and the transistor 1986 is turned off. The potential of the node 1985 is discharged by the transistor 1984. When the clock signal CLK falls to "L", the potential of the node 1985 lowers, so that the transistor 1986 is turned on, and the potential of the node 1987 lowers again. By repeating these operations, the potential of the output node 1987 lowers to -(Vcc-2.VTH) level. If the internal voltage circuit is formed using the charge pump circuit which generates such a negative voltage, the substrate bias potential VBB can be stable, and thus the semiconductor memory device can operate stably.

The configuration of the internal voltage generating circuit can be applied to devices other than the SDRAM. The configuration of the internal voltage generating circuit can be applied to various semiconductor memory devices which receive a repetitive external signal.

Main features of the invention are as follows.

(1) Since the local I/O line is precharged through the dummy bit line, components for driving the local I/O line can be reduced in number, and an area of the memory array can be reduced.

(2) The local I/O line related to one activated array is divided into multiple lines, and the local I/O lines are precharged through the dummy bit lines. Therefore, data of many memory cells can be transmitted onto the global I/O lines without increasing the area occupied by the memory arrays.

(3) Since the local I/O line and the global I/O line are connected together in accordance with the sense amplifier activating signal, it is not necessary to provide a signal line for controlling the connection between the local I/O line and global I/O line, so that the array occupied area can be reduced.

(4) The activation section of the memory array and the activation section of the global I/O line are different from each other. Therefore, in the memory mats including the memory arrays of the shared sense amplifier configuration of the alternate arrangement type, the number of connection elements for connecting the global I/O lines and local I/O lines as well as the number of control signal lines can be reduced, so that the array occupied area can be reduced.

(5) The local I/O line related to the memory array to be activated is divided into multiple lines, and the global I/O line is arranged in the word line shunt region of the memory array region. The global I/O lines and the multi-divided local I/O lines are connected by means of the array selecting signals. Therefore, many memory cells can be accessed in parallel through the global I/O lines without increasing the array occupied area.

(6) Data is read in the pipelined form from the registers storing the memory cell data, which are read in parallel, to the data output terminals. Therefore, the data can be read at a high speed.

(7) Since the wrap address for designating the read address is generated in synchronization with the external clock signal, the data reading can be performed accurately.

(8) The wrap address is generated at a cycle preceding by two clock cycles the clock cycle at which the valid data appears, and thereby the data can be read into the front stage of the output buffer, so that the data can be read at a high speed.

(9) Since the read register is formed so as to latch both the data read in the former access cycle and the current access cycle, the same bank can be successively accessed for reading the data without causing destruction of the data.

(10) Since the data is transferred in the read register at a cycle preceding the clock cycle at which valid data appears, the data can be advancingly read into a front stage of the output buffer, and subsequently the data can be read in a pipelined form from the read registers. Therefore, the data can be read at a high speed.

(11) Since the output stage is active for a period from a clock preceding the clock cycle at which the valid data appears to termination of the clock cycle at which all the valid data is output, only the valid data can be surely read at a high speed.

(12) Since the data transference from the read register to the output circuitry is active only for a predetermined clock period in accordance with the bank designating signal, the power consumption of the circuit for this transference can be minimized.

(13) Since such a configuration is employed that data is written into the memory array in units of predetermined number of bits, the wrap stop operation is allowed, and the semiconductor memory device can read and write the data at a high speed.

(14) Since the write register is formed of latches in two stages, the latches can hold the data in the former access cycle and the data in the current access cycle, respectively. Therefore, data writing can be surely performed at a high speed without causing destruction of data, even if the data is successively written into the same bank.

(15) The frequency division and phase shift are effected on the constantly applied signals to generate the drive signals, and thereby the charge pump operation is performed to generate the internal voltage. Therefore, the required reference voltage can be stably generated without being affected by the change of the supply voltage and the operation temperature.

(16) Since the driving capability of the reference voltage generating circuit is adjusted in accordance with the data I/O bit width, unnecessary power consumption can be prevented.

(17) The reference voltage generating circuit is provided for each bank, and only the reference voltage generating circuit for the selected bank is driven. Therefore, the power consumption can be reduced.

(18) Since internal data bus lines are equalized/precharged after data are transferred between selected memory cells and data registers, no particular precharge/equalize period is necessary, resulting in high speed access.

(19) Since internal write mask signal is once made active and kept active in the cycle only when the external write mask is active, there is no need for considering timing margin between the internal write mask signal and other write control signals, resulting in high speed access.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of memory cell array blocks each including (a) a plurality of memory cells arranged in rows and columns, (b) a plurality of pairs of bit lines arranged corresponding to the columns and each connecting memory cells on a corresponding column, and (c) a dummy bit line located at an end of an associated memory array block in parallel with said plurality of pairs of bit lines;
a plurality of local IO lines provided corresponding to said plurality of memory cell array blocks, each for supplying and receiving data to and from a selected memory cell in a corresponding memory cell array block;
a global IO line commonly provided to said plurality of local IO lines, for transferring data with a local IO line provided corresponding to a memory cell array block designated by a block designating signal; and
precharge means responsive to a precharge instructing signal for electrically connecting said dummy bit lines to corresponding local IO lines and for supplying a predetermined precharge potential onto said dummy bit lines.

2. A semiconductor memory device, comprising:
a plurality of memory array blocks each including (a) a plurality of memory cells arranged in rows and columns, (b) a plurality of pairs of bit lines arranged corresponding to the columns and connecting memory cells on corresponding columns, and (c) a dummy bit line located at an end of an associated memory array block in parallel with the bit lines, and each said memory array block grouped into groups of columns;
a plurality of local IO lines provided corresponding to the groups of columns of respective memory array blocks, for transferring data to and from selected memory cells in corresponding groups of columns;
a plurality of global IO lines provided common to said plurality of memory array blocks and corresponding to said groups of columns of each of said plurality of memory array blocks;
connection means responsive to a block selection signal for connecting local IO lines provided for a selected memory array block to said plurality of global IO lines;
means responsive to a precharge signal for connecting each of said dummy bit line to a corresponding local IO line; and
means responsive to said precharge signal for precharging each of said dummy bit line to a predetermined potential.

3. A semiconductor memory device, comprising:
a plurality of memory array blocks each including a plurality of memory cells arranged in rows and columns;
a plurality of sense amplifiers provided corresponding to said columns, each said sense amplifier responsive to a sense amplifier activation signal for sensing and amplifying a signal on a corresponding column;
a plurality of local IO lines provided for respective memory array blocks, each for transferring data to and from a selected memory cell in a corresponding memory array block;
a global IO line provided common to said plurality of local IO lines; and
connection means provided corresponding to each of said plurality of memory array blocks and responsive to the sense amplifier activation signal for connecting a corresponding local IO line and said global IO line.

4. A semiconductor memory device, comprising:
a plurality of memory blocks arranged to form a matrix of rows and columns, each said memory block including a plurality of memory cells arranged in a matrix of rows and columns;
a plurality of local I/O lines provided corresponding to said plurality of memory blocks, for effecting data transfer to and from selected memory cells in corresponding memory blocks;
a plurality of global I/O lines provided common to memory blocks aligned in the column direction,
a plurality of sense drive signal lines provided corresponding to said plurality of memory blocks for transferring sense drive signals;
a plurality of sense amplifier means provided corresponding to said plurality of memory blocks and responsive to sense drive signals on corresponding sense drive signal lines for sensing and amplifying data signals of memory cells selected in corresponding memory blocks; and
connection means provided corresponding to said plurality of memory blocks and responsive to said sense drive signals for connecting local I/O lines for corresponding memory blocks to said plurality of global I/O lines.

5. The device according to claim 4, wherein each of said plurality of sense means includes a plurality of sense amplifiers provided corresponding to the columns of memory cells in a corresponding memory block, for sensing and amplifying data signals of memory cells selected in corresponding columns.

6. The device according to claim 4, wherein said plurality of local I/O lines includes local I/O lines shared between two memory blocks adjacent in the column direction.

7. The device according to claim 4, wherein said plurality of memory blocks are divided into two groups each including adjacent memory blocks in the column direction, and said plurality of global I/O lines includes a first global I/O lines includes a first global I/O line provided for memory blocks aligned in the column direction and included in one group of said two group and a second global I/O lines provided for the memory blocks aligned in the column direction and included in the other group of said two groups, and wherein said connection means includes means provided for particular memory blocks in said one group and adjacent to said the other group, for connecting corresponding local I/O lines to said first global I/O lines and means provided for memory blocks other than said particular memory blocks, for connecting corresponding local I/O lines to said second global I/O lines.

8. The device according to claim 4, wherein said plurality of global I/O lines includes global I/O lines disposed between memory blocks adjacent in the row direction.

9. A semiconductor memory device, comprising:

a plurality of memory array blocks each including a plurality of memory cells arranged in rows and columns, and grouped into a first group of blocks and a second group of blocks;

a plurality of sense amplifiers provided, on both sides of respective memory array blocks, corresponding to said columns, one sense amplifier for each said column for sensing and amplifying a signal on a corresponding column;

a plurality of local IO lines arranged corresponding to said plurality of memory array blocks;

a first global line;

a second global IO line; and connection means responsive to a block designating signal for connecting one block in each of said first and second group with said first and second global IO lines;

said connection means including (a) first connecting means provided for at least one memory array block in said first group and responsive to said block designating signal for connecting a corresponding local IO line to said first global IO line;

(b) second connecting means provided for the memory array blocks other than said at least one memory array blocks in said first group and responsive to said block designating signal for connecting a corresponding global IO line to said second global IO line;

(c) third connecting means provided for at least one memory array block in said second group and responsive to said block designating signal for connecting a corresponding local IO line to said second global IO line; and (d) fourth connecting means provided for the memory array blocks other than said at least one memory array block in said second group and responsive to said block designating signal for connecting a corresponding local IO line with said first global IO line.

10. A semiconductor memory device, comprising:

a plurality of memory arrays each including a plurality of memory cells arranged in rows and columns and each grouped into a plurality of blocks in a row direction, and including a word line shunt region provided between blocks adjacent in the row direction;

a plurality of local IO lines provided corresponding to said plurality of blocks and each for transferring a data signal to and from a selected memory cell in a corresponding block;

a plurality of global IO lines, one for a predetermined number of memory arrays, provided commonly to respective blocks in the predetermined number of memory arrays and in said word line shunt regions; and connection means responsive to an array designation signal designating a memory array for connecting a corresponding local IO line in the designated memory array to a corresponding global IO line.

11. The device according to claim 10, further comprising a plurality of sense means provided for the respective blocks for sensing and amplifying data signals of memory cells selected in associated memory blocks in response to a sense drive signal, and wherein said connection means receives said sense drive signal as said array designation signal for operation.

12. A synchronous type semiconductor memory device operating in synchronization with an external clock signal and including a data output terminal, comprising:

a plurality of data registers provided commonly to said data output terminal and receiving data in parallel from a plurality of simultaneously selected memory cells;

selection means responsive to a data read designation signal for sequentially selecting said data registers in a predetermined sequence;

latch means for latching data from a selected data register;

read means for transferring data latched in said latch means to said data output terminal; and drive means responsive to said data read designation signal for driving said latch means and said read means.

13. The device according to claim 12, wherein said drive means drives said latch means and said read means in a pipelined manner.

14. The device according to claim 12, wherein said read means includes another latch means responsive to said drive means for latching data from said latch means.

15. The device according to claim 12, wherein said latch means includes a plurality of buffer means provided corresponding to said plurality of data registers and responsive to said selection means for transferring data of corresponding data registers, and a latch circuit for latching data from a selected buffer means.

16. The device according to clam 12, wherein each of said plurality of data registers includes, a preamplifier for amplifying a data signal from a selected memory cell, a master latch for latching the data signal from said preamplifier, transfer gate responsive to a transfer instruction signal generated after activation of said preamplifier, for transferring the latched data signal of said master latch, and a slave latch for latching the data signal transferred from said transfer gate.

17. The device according to claim 12, wherein said selection means includes wrap address generation means responsive to said data read designation signal for generating a wrap address designating a data register in synchronization with said external clock signal.

18. The device according to claim 17, wherein said drive means includes latency storage means for storing a latency data defining the number of clock cycles required for appearance of a valid data at said data output terminal from application of a column selection instructing signal;

wrap length data storage means for storing a wrap length data defining the number of valid data successively read out from said data output terminal;

control means responsive to said column selection instructing signal and said data read designating signal for activating said wrap address generation means in synchronization with a clock signal of a clock cycle preceding by at least two clock cycles the clock cycle specified by the latency specified by the latency data and for deactivating said wrap address generation means after elapse of clock cycles of the number of wrap length specified by said wrap length data since activation of said wrap address generation means.

19. The device according to claim 16, further including data lines coupled to each said preamplifier for transferring data signal from the simultaneously selected memory cells to each said preamplifier, and means for driving said data lines to a predetermined potential in response to activation of each said preamplifier.

20. A synchronous semiconductor memory device operating in synchronization with an external clock signal having a predetermined pulse width, comprising:
a plurality of banks each including a plurality of memory cells arranged in rows and columns;
a data output terminal provided in common to said plurality of banks;
cell selection means responsive to a bank designation signal designating a bank output of said plurality of banks and an address signal, for simultaneously selecting a plurality of memory cells in the designated bank;
a plurality of pipeline means provided corresponding to said plurality of banks and responsive to said bank designation signal and a data read designation signal instructing a data read operation for transferring data from the simultaneously selected memory cells sequentially in response to said external clock signal, and
read means provided in common to said plurality of pipeline means for transferring data from the designated pipeline means to said data output terminal in response to said data read designation signal and said external clock signal.

21. A synchronous type semiconductor memory device for taking an external signal and data in synchronization with a clock of a series of pulses, including a data output terminal and a plurality of data registers provided for said data output terminal for receiving and storing data read out from a plurality of simultaneously selected memory cells, said device comprising:
wrap address generator means responsive to a data read designation signal and said clock for generating a wrap address for selecting a data register; and
read means responsive to said wrap address for transferring data in a data register selected by said wrap address to said data output terminal.

22. A synchronous type semiconductor memory device taking in a control signal, an address signal and data in synchronization with a clock of a predetermined pulse width, including a data output terminal and a plurality of data registers provided for said data output terminal for receiving in parallel and storing data of a plurality of simultaneously selected memory cells in a memory cell array having memory cells arranged in rows and columns, said device comprising:
latency storage means for storing a latency data defining the number of clock cycles required for appearance of a valid data at said data output terminal from application of a column selection instructing signal;
wrap length data storage means for storing a wrap length data defining the number of valid data successively read out from said data output terminal;
wrap address generation means responsive to said clock and a data read designating signal for generating a wrap address for selecting said plurality of data registers in a predetermined sequence;
control means responsive to said column selection instructing signal and said data read designating signal for activating said wrap address generation means in synchronization with a clock of a clock cycle preceding by at least two clock cycles the clock cycle specified by the latency specified by the latency data and for deactivating said wrap address generation means after elapse of clock cycles of the number of wrap length specified by said wrap length data since activation of said wrap address generation means.

23. A synchronous type semiconductor memory device taking in a control signal, an address signal and data in synchronization with a clock signal of a series of pulses and in which a plurality of memory cells are simultaneously selected in a memory cell array having a multiplicity of memory cells arranged in rows and columns, comprising:
first latch means responsive to a first control signal for latching in parallel data read out of said plurality of memory cells simultaneously selected;
second latch means responsive to a second control signal for latching data latched in said first latch means;
output means for sequentially supplying externally data latched in said second latch means in a predetermined sequence and in synchronization with said clock; and
control means responsive to a column selecting instruction applied in synchronization with said clock for generating said first and second control signal sequentially in this order.

24. A synchronous type semiconductor memory device taking in a control signal, an address signal and a data in synchronization with a clock of a series of pulses and including a memory cell array having a plurality of memory cells among which a predetermined number of memory cells are simultaneously selected, a valid data of a selected memory appearing at an output terminal upon elapse of a clock cycle or cycles specified by a latency after application of a column selection designating signal, said device comprising:
first latch means for receiving in parallel and latching data read out from said predetermined number of memory cells simultaneously selected;
counting means activated in response to said column selection designating signal for counting a clock pulse;
second latch means for receiving and latching data latched in said first latch means;
output means for reading out data latched in said second latch means in a predetermined sequence for transference to said output terminal; and
transfer means responsive to a count of said counting means being less than the latency for transferring data latched in said first latch means to said second latch means.

25. The device according to claim 24, wherein said transfer means performs the transfer operation when said count is equal to the latency less two.

26. A synchronous type semiconductor memory device taking in an external signal and data in synchronization with a clock of a series of pulses and including a plurality of data registers for receiving in parallel and latching data read out from a plurality of memory cells simultaneously selected in a memory cell array having memory cells arranged in rows and columns and a data output terminal provided commonly to said plurality of data registers, comprising:

latency storage means for storing a latency data indicating the number of clock cycles required for a valid data to appear at said data output terminal from when a column selection designating signal is applied;

wrap length data storage means for storing a wrap length data indicating the number of valid data successively read out from said data output terminal;

selection means responsive to said column selection designating signal for selecting a data register out of said plurality of data registers in a predetermined sequence;

output means for receiving data of a data register selected by said selection means to produce a read out data for transmission to said data output terminal; and control means responsive to said column selection designating signal to be activated for counting a clock pulse and for bringing said output means into a data output enable state during a period in which a count is in a predetermined range.

27. The device according to claim 26, wherein said predetermined range covers the range between the latency minus one and a count not less than said wrap length.

28. The device according to claim 26, wherein said predetermined range is a range between a count equal to the latency minus one and a count equal to the wrap length plus one.

29. The device according to claim 26, wherein said control means includes divider means for frequency-dividing said clock by a predetermined dividing ratio and for shifting in phase the frequency-divided clock to generate a plurality of drive signals;

reference means responsive to said plurality of drive signals for generating and applying reference voltage to said output means as an operating power supply voltage thereof, and adjust means for adjusting a driving capability of said reference means at least during a period in which said output means is enabled.

30. The device according to claim 29, wherein said reference means includes charge pump circuits provided corresponding to said plurality of drive signals in parallel with each other for generating said reference voltage through charge pumping operation responsive to corresponding drive signals.

31. The device according to claim 29, wherein said adjust means includes means responsive to a data read designating signal indicating data read mode of operation for transferring said clock to said divider means.

32. A synchronous type semiconductor memory device taking in an external signal and data in synchronization with a clock of a series of pulses, and including a plurality of banks each including (a) a memory array having a plurality of memory cells arranged in rows and columns and (b) a plurality of data registers for receiving in parallel and storing data read out from memory cells simultaneously selected in said memory array, and a data output terminal provided commonly to said plurality of banks, said device comprising:

data transfer means provided corresponding to said plurality of data registers in each of said plurality of banks for transferring data received from corresponding data registers;

output means provided commonly to said plurality of banks for receiving data from a selected data register to produce a read out data for transmission to said data output terminal; and control means activated in response to a column selection designating signal and a bank designating signal for counting a pulse of said clock to enable data transfer means provided for a bank designated by said bank designating signal during a period in which a count of said pulse is within a range of predetermined values.

33. The device according to claim 32, wherein said control means enables said data transfer means after said control means counts one clock pulse in response to application of said column selection designating signal.

34. The device according to claim 32, wherein said control means disables said data transfer means when said control means counts the clock pulses by a wrap length indicating a number of data successively read out after enabling said data transfer means.

35. A synchronous type semiconductor memory device taking in an external signal and input data in synchronization with a clock of a series of pulses and having a plurality of memory cells selected simultaneously in a memory array including a multiplicity of memory cells arranged in rows and columns, comprising:

a data input terminal for receiving said input data;

a plurality of data registers provided receiving data from said data input terminal, for storing data to be written into the plurality of memory cells simultaneously selected;

register selection means responsive to a column selection instructing signal applied in synchronization with said clock for sequentially selecting said data registers in a predetermined order to couple a selected data register to said data input terminal; and transfer means responsive to said column selection designating signal for transferring data in said data registers to corresponding memory cells on a unit of a predetermined number of data registers.

36. A synchronous type semiconductor memory device taking in external signals including a control signal, an address signal and an input data in synchronization with a clock of series of pulses and having a plurality of memory cells selected simultaneously in a memory array including memory cells arranged in rows and columns, comprising:

a data input terminal for receiving said input data;

a plurality of first latch means sequentially coupled to said data input terminal in a predetermined order for storing data received at said data input terminal;

a plurality of second latch means provided corresponding to said plurality of first latch means for receiving and latching data latched in corresponding first latch means;

a plurality of data lines provided corresponding to the respective second latch means for transferring data to the corresponding memory cells in the simultaneously selected memory cells from corresponding second latch means; and transfer control means responsive to a column selection instructing signal for generating a transfer control signal by which data is once latched in a first latch means and then the data is transferred to corresponding second latch means from said first latch means.

37. The device according to claim 36, wherein said transfer control means includes
wrap data storage means for storing a wrap data indicating the number of data to be successively written in,
wrap address generator responsive to a data write designating signal designating a data write mode of operation for generating a wrap address for selecting and enabling said first latch means sequentially,
enable signal generator responsive to said wrap data and said clock for generating an enable signal for a period of clock cycles not less in number than the wrap data, and
transfer enable means responsive to said enable signal and said wrap address for enabling data transfer between the first and second latch means designated by the wrap address.

38. The device according to claim 36, wherein said transfer control means includes means enabling data transfer from second latch means and said data lines in units of a predetermined number of second latch means.

39. The device according to claim 36, wherein said transfer control means includes
equalize means for driving said data lines to a predetermined potential level each data transfer of said predetermined number of second latch means to corresponding data line or lines.

40. The device according to claim 38, wherein said predetermined number is one.

41. The device according to claim 38, wherein said predetermined number is two.

42. The device according to claim 35, wherein said transfer control means includes means for bringing said data lines into an electrically floating state in a standby state.

43. The device according to claim 35, wherein said transfer control means includes means for maintaining said data lines to the predetermined potential in a standby state, and means responsive to said column selection designating signal for bringing said data lines into an electrically floating state.

44. A synchronous type semiconductor memory device taking in external signals including an external control signal, an address signal and an input data in synchronization with a clock of a series of pulses, comprising:
divider means for frequency-dividing said clock and for shifting in phase a frequency-divided clock to generate a plurality of drive signals; and
generation means responsive to said plurality of drive signals for producing a reference voltage.

45. The device according to claim 44, further including output means coupled to a data output terminal and operating with said reference voltage as an operating power supply voltage, for effecting data output to said data output terminal.

46. The device according to claim 44, further including a memory cell array having memory cells arranged in rows and columns and a plurality of word lines arranged corresponding to said rows of memory cells, and wherein said reference voltage is supplied to a selected word line as a boosted word line drive signal.

47. The device according to claim 44, wherein said reference voltage is a negative voltage applied to a substrate layer, as a bias voltage, on which said synchronous type semiconductor memory device is formed.

48. The device according to claim 44, wherein said generation means includes a plurality of charge pump circuits provided i parallel and corresponding to said plurality of drive signals for producing said reference voltage through charge pumping operation responsive to the drive signals.

49. The device according to claim 45, further including control means for adjusting a charge supply capability of said generation means in response to a data read designation signal designating data output through said output means.

50. The device according to claim 49, wherein said control means includes means responsive to said data read designation signal for transferring said clock to said divider means.

51. The device according to claim 44, wherein said synchronous type semiconductor memory device includes a plurality of bank having the same configuration with each other and operable independently from each other, and said divider means includes a plurality of frequency-dividers provided corresponding to said plurality of banks, each for frequency-dividing said clock to generate the plurality of drive signals, and a plurality of generators provided corresponding to said plurality of frequency-dividers for generating the reference voltage, and wherein said synchronous semiconductor memory device further includes means responsive to a bank designation signal designating a bank in said plurality of banks for enabling only a frequency-provided corresponding to the designated bank.

52. The device according to claim 44, further including a plurality of data output terminals and a plurality of output circuits provided corresponding to said plurality of data output terminals and receiving said reference voltage as an operating power supply voltage, setting means for setting data determining the number of data output terminals available among said plurality of data output means, and adjust means responsive to said setting means for adjusting a charge supply capability of said generation means.

53. The device according to claim 52, wherein said adjust means includes means responsive to said setting means for selectively transferring a predetermined number of clock signal or signals to said generation means.

54. A synchronous type semiconductor memory device taking in external signals including a control signal, an address signal and an input data in synchronization with a clock of a series of pulses, comprising:
setting means for setting data determining the number of data input and output terminals for receiving input and output data;
means for frequency-dividing said clock by a predetermined dividing ratio and for shifting in phase the frequency-divided clock to generate a plurality of drive signals;
reference means responsive to said plurality of drive signals for generating a reference voltage; and
means for adjusting a driving capability of said reference means in accordance with the data set by setting means.

55. A synchronous type semiconductor memory device taking in a control signal, an address signal and an input data in synchronization with a clock of a series of pulses, comprising:
a plurality of banks having the same configuration with each other and operable independently from each other and each including a memory array of a plurality of memory cells; and
a plurality of reference means provided corresponding to said plurality of banks and responsive to said clock for generating reference voltages for corresponding banks.

56. A synchronous semiconductor memory device operating in synchronization with a clock signal having a predetermined pulse width, comprising:
a memory array having a plurality of memory cells,
a data input terminal receiving a write data,
a plurality of data latch means sequentially coupled to receive data from said data input terminal,
a data bus provided for said plurality of data latch means for transferring data between said plurality of data latch means and memory cells simultaneously selected in said memory array,
drive means responsive to a data write designation signal and said clock signal for driving said data bus to a predetermined potential each predetermined number of clock signal or signals since application of said data write designation signal.

57. The device according to claim 56, wherein said drive means includes storage means for storing a wrap data indicating the number of data to be written successively, and counter means responsive to said data write designation signal for counting said clock signal, and means for driving said data bus to said predetermined potential when said counter means counts said clock signal a number of times equal in number to said wrap data after application of said data write designating signal.

58. The device according to claim 56, wherein said drive means includes means responsive to said data write designation signal for bringing the data bus into an electrically floating state, and means for driving the data bus at the predetermined potential.

59. The device according to claim 56, wherein said drive means includes means for bringing said plurality of data bus into an electrically floating state in a standby state.

60. The device according to claim 56, wherein said predetermined number is one.

61. The device according to claim 56, wherein said predetermined number is two.

62. The device according to claim 56, wherein said data bus includes a plurality of data lines provided corresponding to the respective data latch means and each said data line includes a pair of signal lines transferring data signals complementary to each other, and said drive means includes means for electrically connecting the signal lines in each said pair of signal lines.

63. The device according to claim 56, wherein said plurality of data latch means comprises a plurality of data registers provided in parallel with each other and sequentially coupled to said data input terminal.

64. The device according to claim 56, further including,
a data output terminal,
a read data bus for transferring data from the selected memory cells,
read latch means for receiving data from said read data bus for output to said data output terminal,
transfer means for transferring data from said read data bus to said read latch means, and
bus drive means for driving said read data bus to the predetermined potential when said transfer means transfer data from said read data bus to said read latch means.

65. The device according to claim 64, wherein said read latch means comprises a plurality of read data registers sequentially coupled to said data read terminal, and said read data bus comprises a plurality of data lines provided corresponding to said plurality of read data registers for transfer in parallel data to said plurality of read data registers.

66. The device according to claim 64, wherein said bus drive means includes means responsive to a data read designation signal for bringing said read data bus into an electrically floating state, and means for driving said read data bus to the predetermined potential in a standby state.

67. The device according to claim 64, wherein said drive means includes means for maintaining said read data bus in an electrically floating state in a standby state.

68. A synchronous type semiconductor memory device operating in synchronization with a clock signal having a predetermined pulse width, comprising:
a data input terminal receiving a write data;
a mask data input terminal for receiving a mask data indicating whether the write data at said data input terminal should be masked;
internal mask means responsive to said clock signal for generating an internal mask signal;
control means responsive to said clock signal and said mask data for resetting said internal mask signal when said mask data permits writing of the write data.

69. The device according to claim 68, wherein said internal mask means comprises flip-flop means set in response to a leading edge of said clock signal, and said control means includes latch means responsive to said leading edge of said clock signal for latching the mask data received at said mask data input terminal, and delay means for delaying an output of said latch means for application to said latch means for resetting said flip-flop when said mask data permits the writing of the write data.

70. The device according to claim 69, wherein said latch means comprises a dynamic latch responsive to the leading edge of said clock signal for latching said mask data and responsive to a trailing edge of said clock signal for being reset to bring complementary outputs thereof at a predetermined potential.

71. The device according to claim 70, wherein said latch means is adapted to be operable only when an access is made to said synchronous type semiconductor memory device is made.

* * * * *